(12) United States Patent
Ueno et al.

(10) Patent No.: US 6,498,077 B2
(45) Date of Patent: Dec. 24, 2002

(54) SEMICONDUCTOR DEVICE AND METHOD OF MANUFACTURING SAME

(75) Inventors: Shuuichi Ueno, Tokyo (JP); Katsuyuki Horita, Tokyo (JP); Takashi Kuroi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/816,519

(22) Filed: Mar. 26, 2001

(65) Prior Publication Data

US 2002/0028568 A1 Mar. 7, 2002

(30) Foreign Application Priority Data

Sep. 6, 2000 (JP) ........................................ 2000-270040

(51) Int. Cl.[7] .............................................. H01L 21/425
(52) U.S. Cl. ...................................... 438/514; 438/528
(58) Field of Search ................................ 438/510, 522, 438/514, 526, 528, 529, 530, 533, 659, 534, 658

(56) References Cited

U.S. PATENT DOCUMENTS 5,245,208 A * 9/1993 Eimori
5,641,980 A * 6/1997 Yamaguchi et al.

FOREIGN PATENT DOCUMENTS

JP          8-181314          7/1996

* cited by examiner

Primary Examiner—David Nelms
Assistant Examiner—Phuc T. Dang
(74) Attorney, Agent, or Firm—Oblon, Spivak, McClelland, Maier & Neustadt, P.C.

(57) ABSTRACT

Provided are a semiconductor device having a MOS transistor of a structure capable of obtaining a good characteristic particularly about assurance of resistance to punch-through and leak current reduction, as well as a method of manufacturing the same. That is, in addition to the usual MOS transistor structure, a channel dope region (1) is disposed at a predetermined depth so as to extend substantially the entire surface of a flat surface in a P well region (22) including a channel region. In the channel dope region (1), it is set so that the maximum value of the P type impurity concentration (MAX of P) ranges from $1 \times 10^{18}$ to $1 \times 10^{19}$, and the maximum value of the N type impurity concentration (MAX of N) of a source/drain region (31 (32)) is not less than 10% and not more than 100%. Note that the surface proximate region of the P well region (22) is to be beyond the object.

25 Claims, 170 Drawing Sheets

F I G . 12
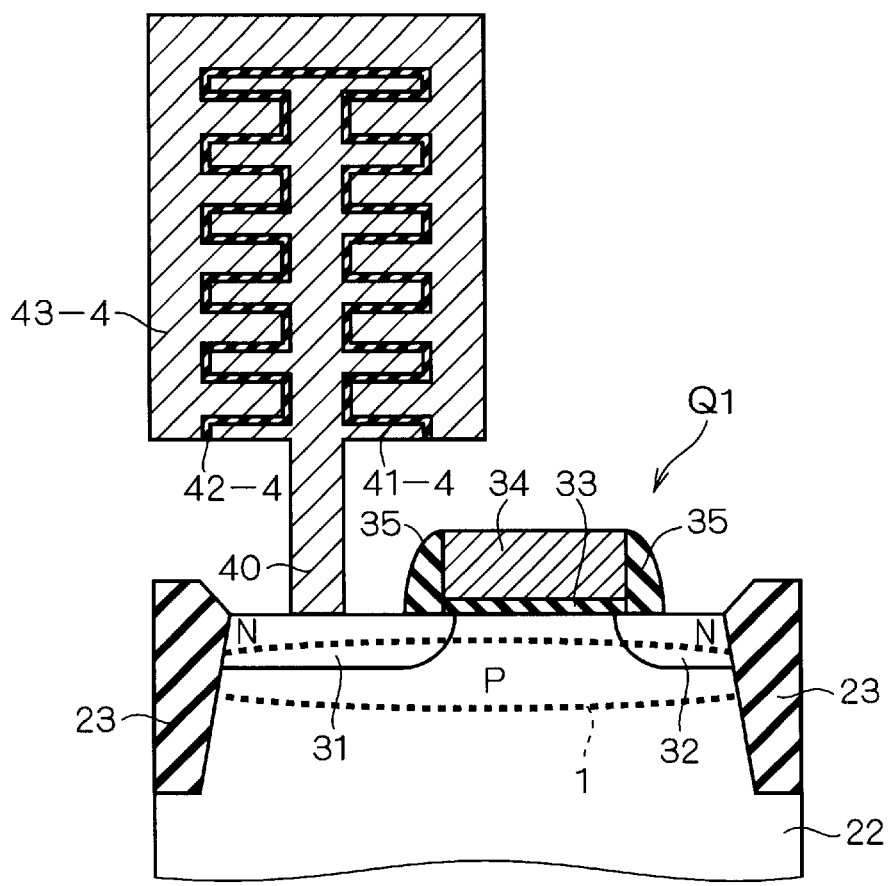
F I G . 13
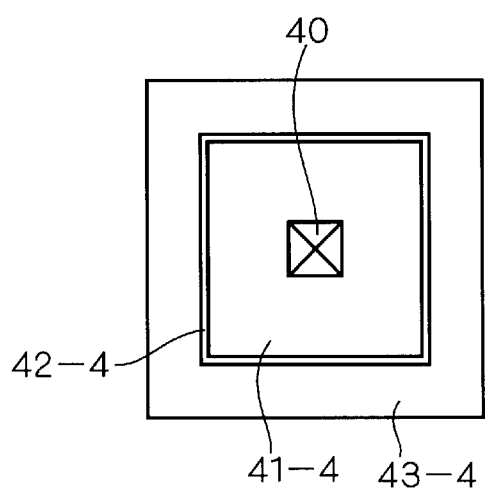

F I G. 15
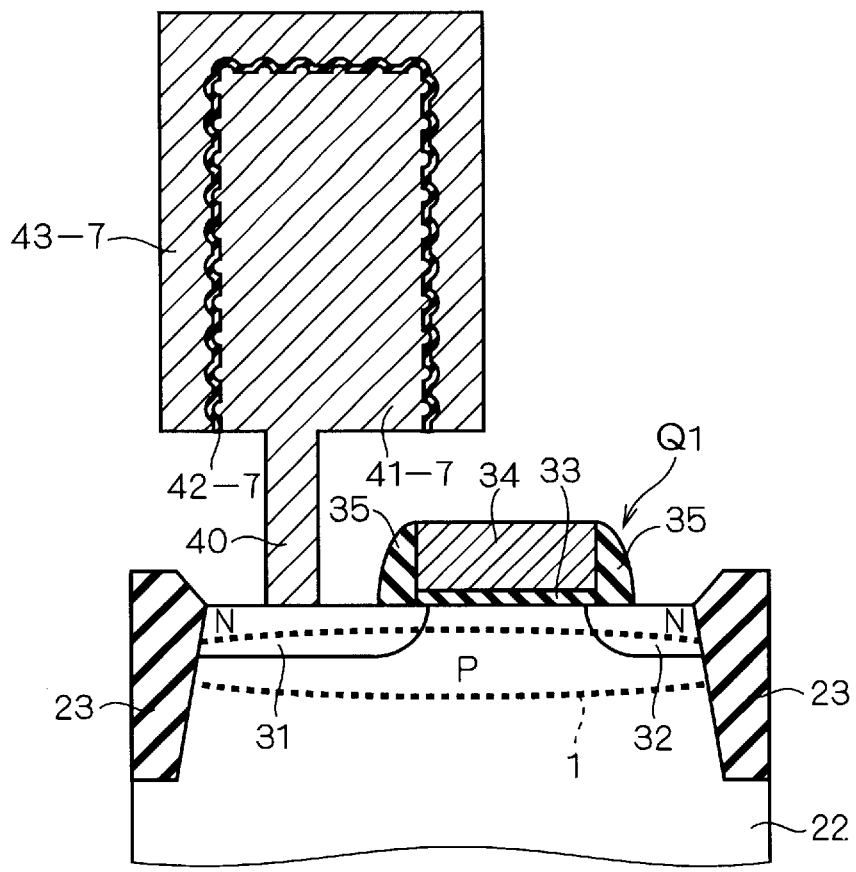
F I G. 16
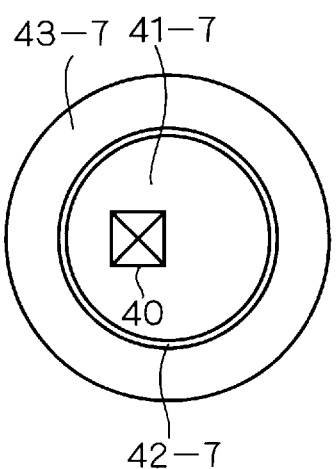

F I G. 3 1
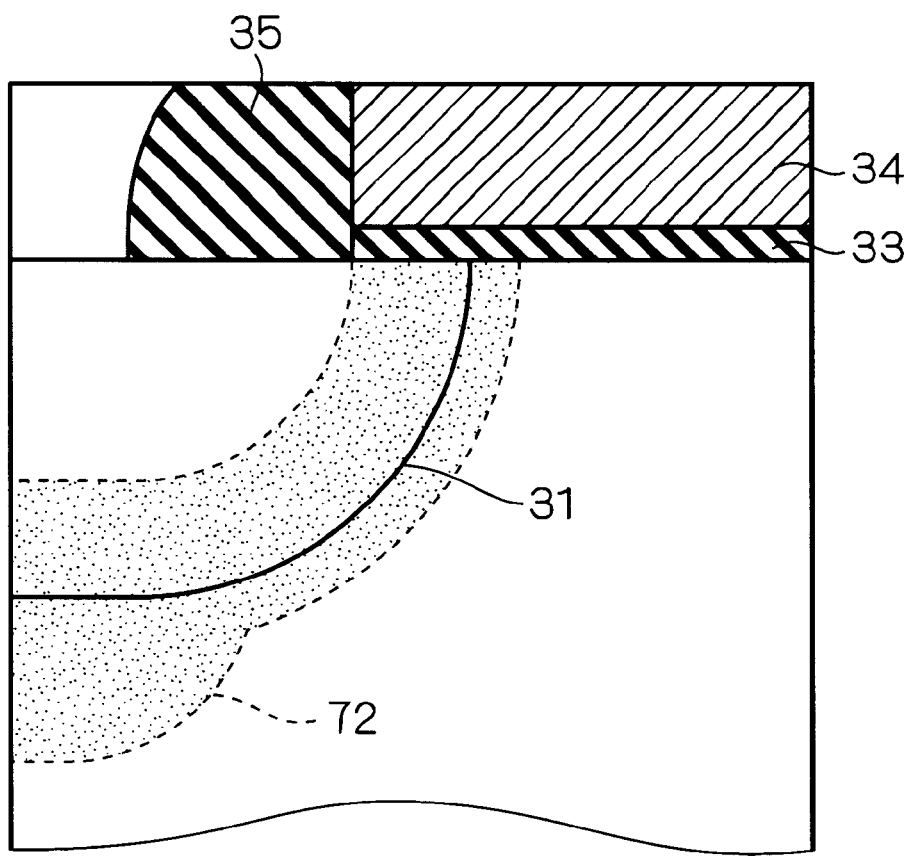

BORON AFFECTING THRESHOLD VALUE

F I G. 3 5
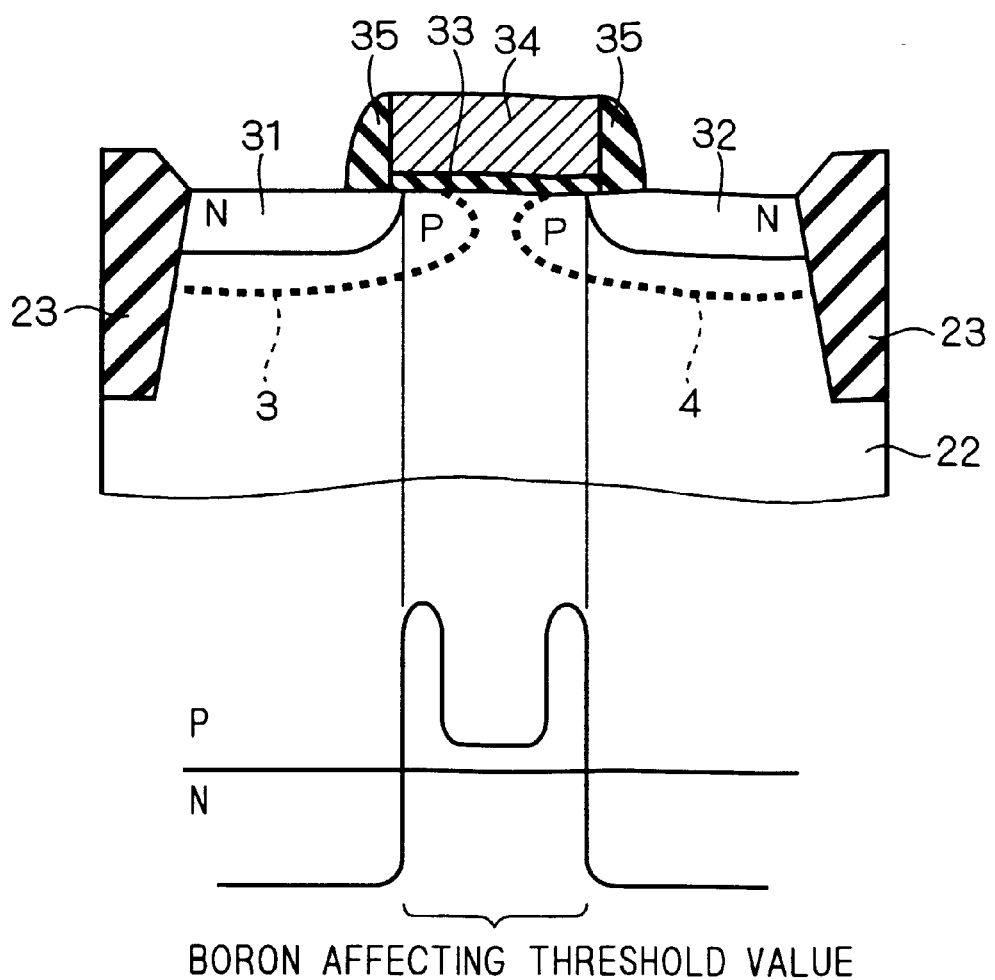
BORON AFFECTING THRESHOLD VALUE

F I G. 3 8
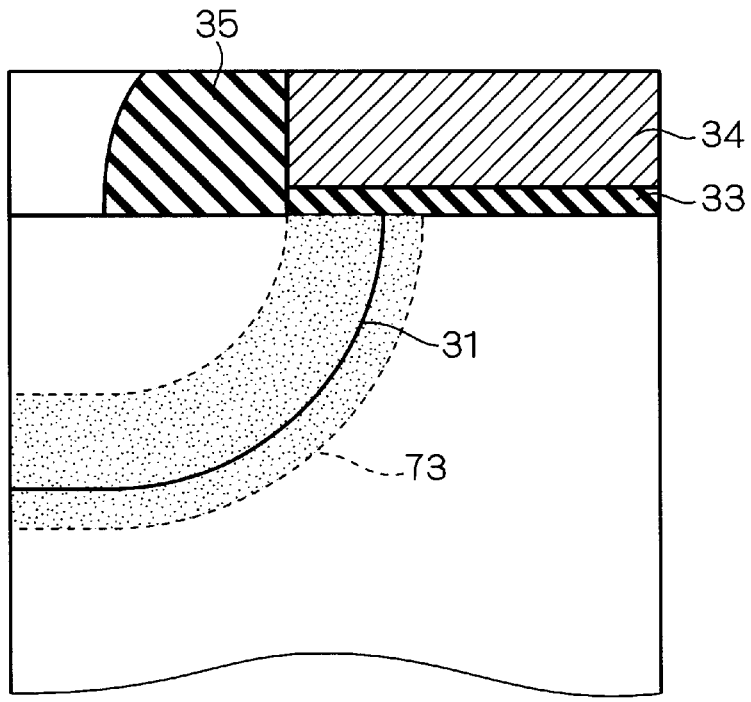
F I G. 3 9
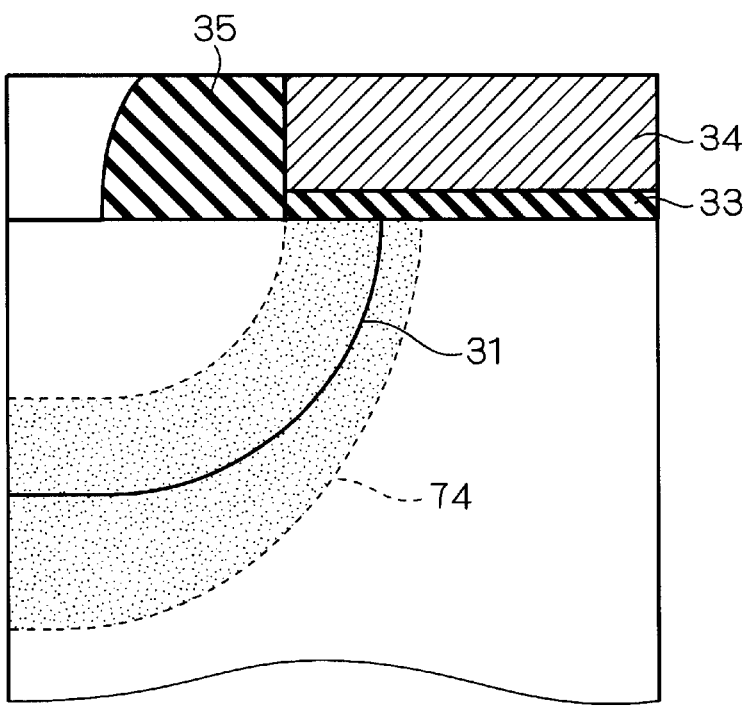

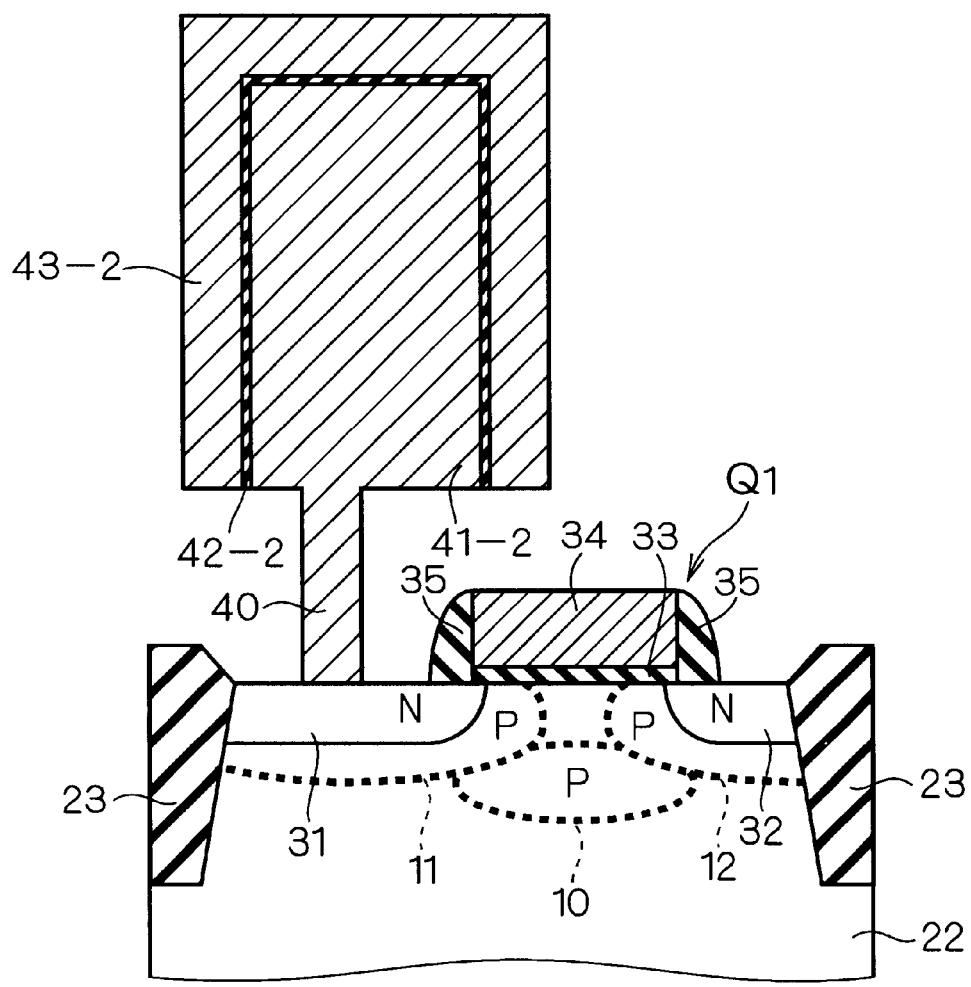
F I G . 5 9

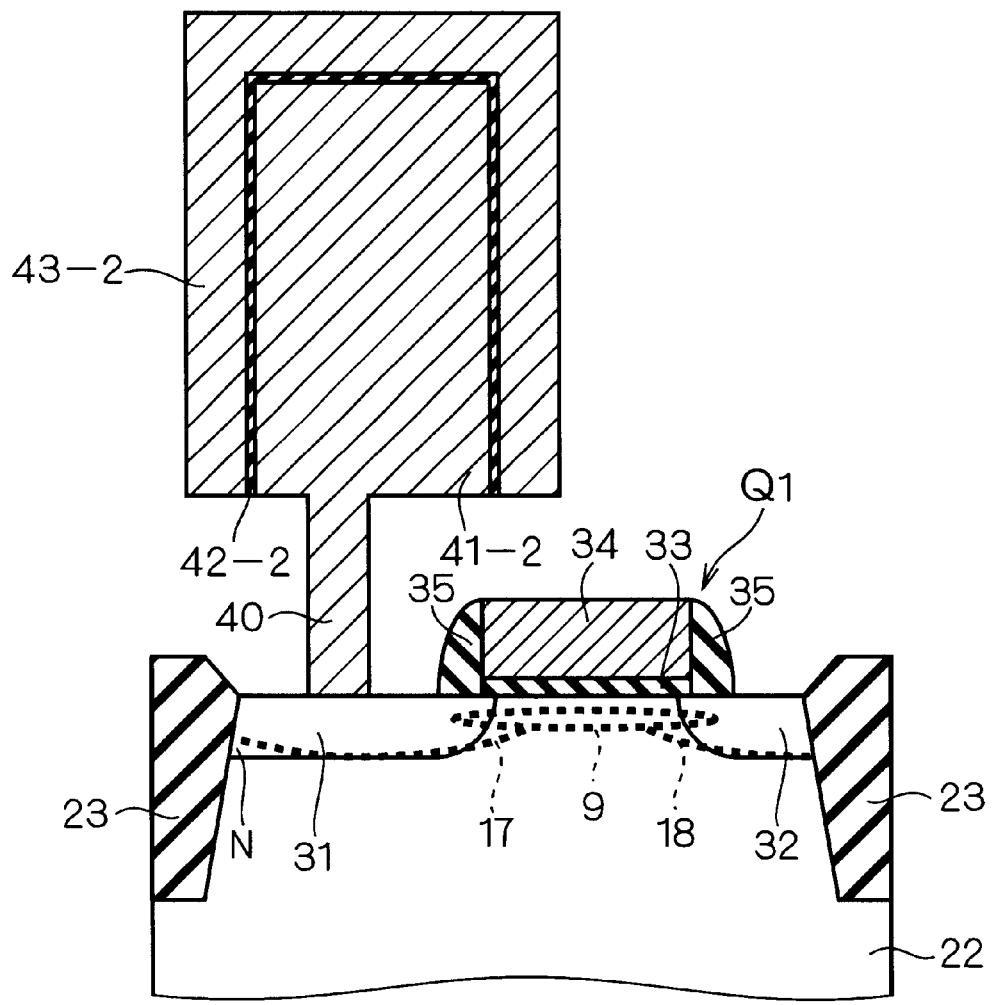
F I G . 6 6

$R_{SD}$    $R_{ch}$

FIG. 80
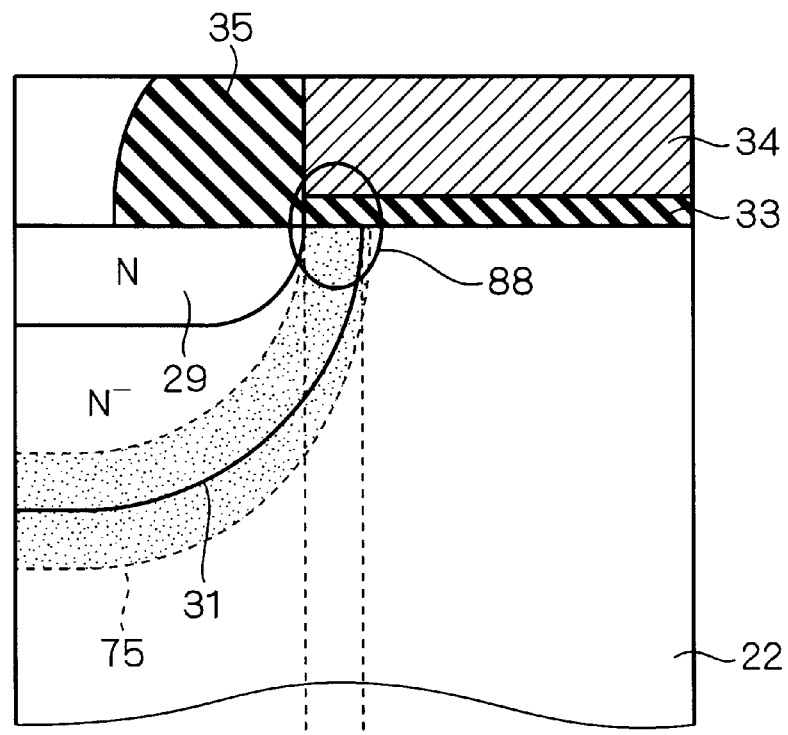
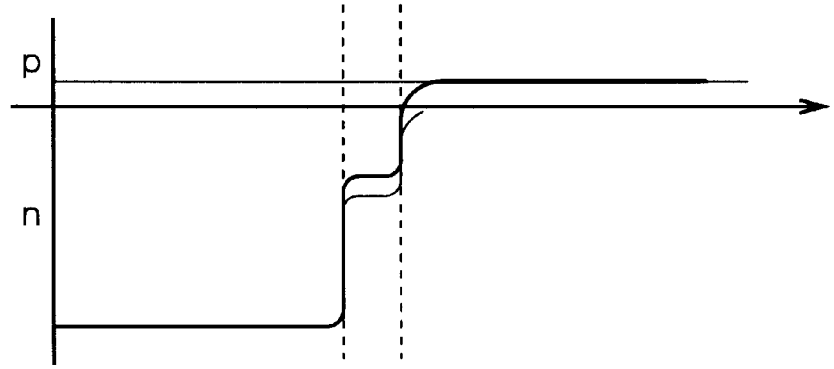
FIG. 81
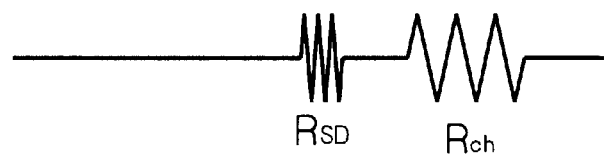

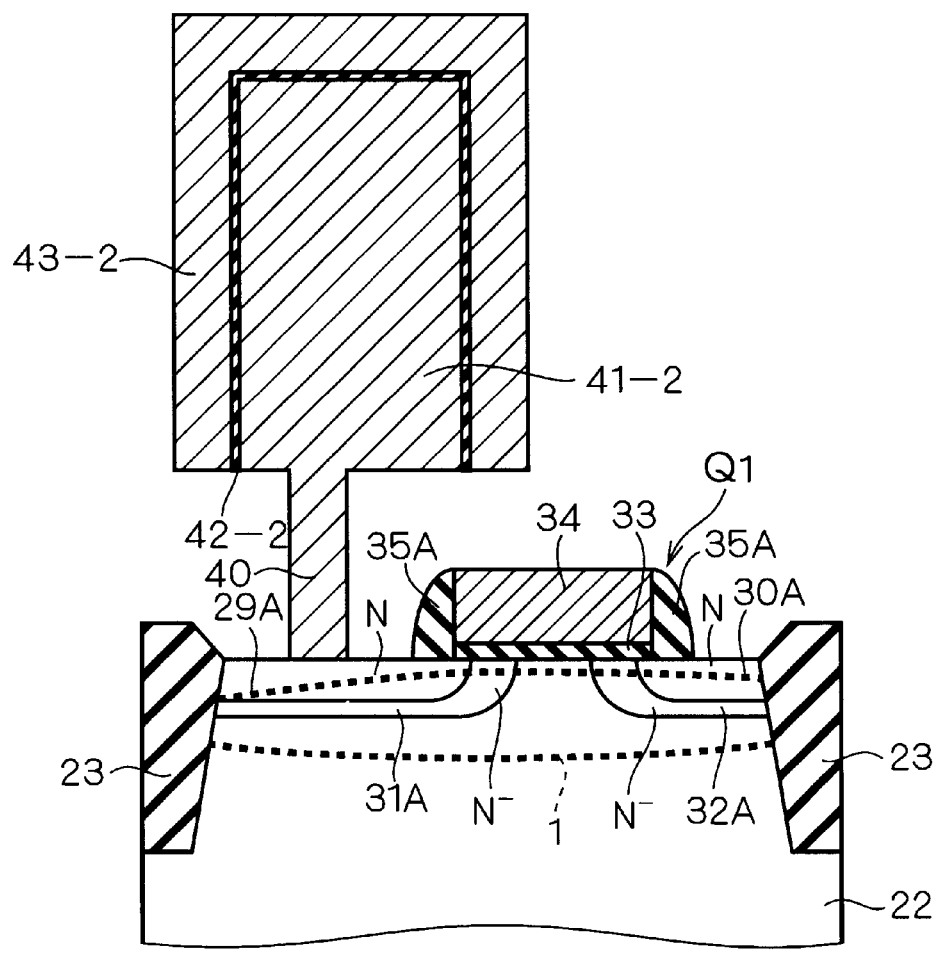
F I G . 8 5

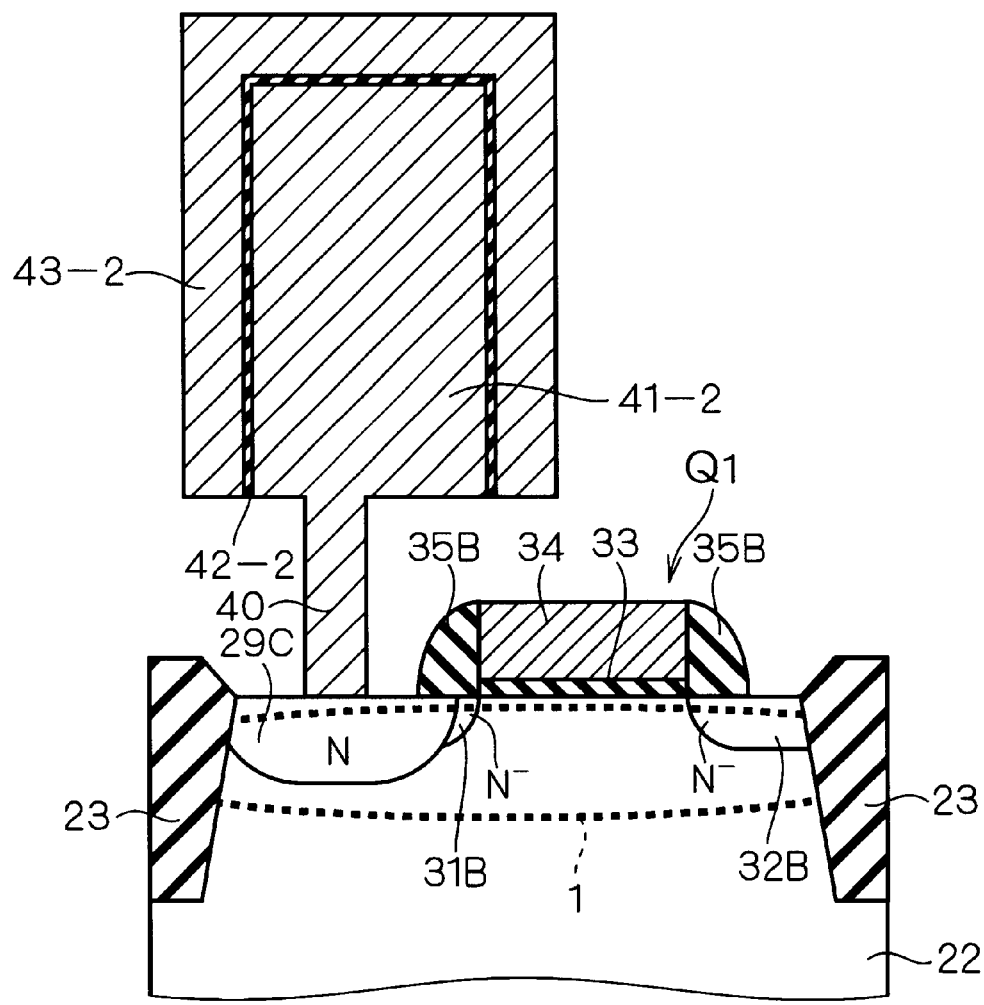
F I G. 110

F I G. 111
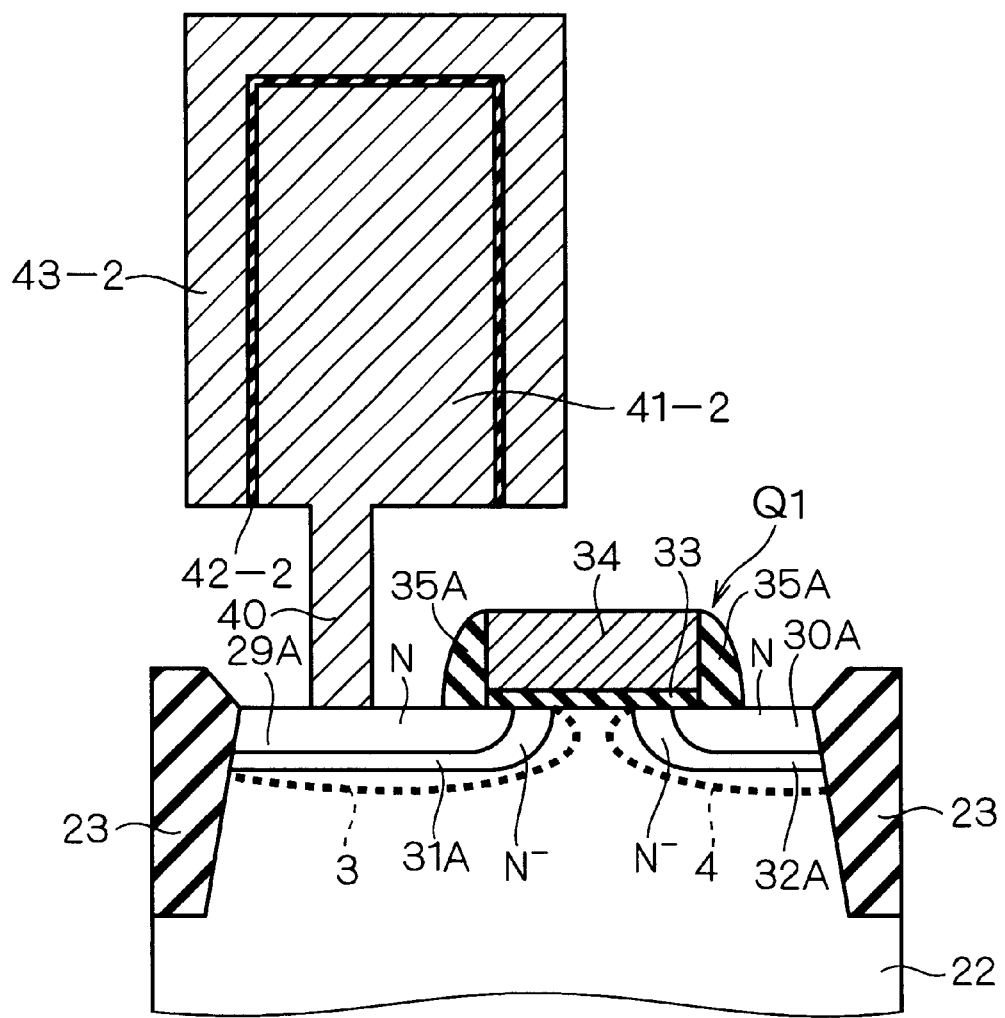

F I G . 1 1 4
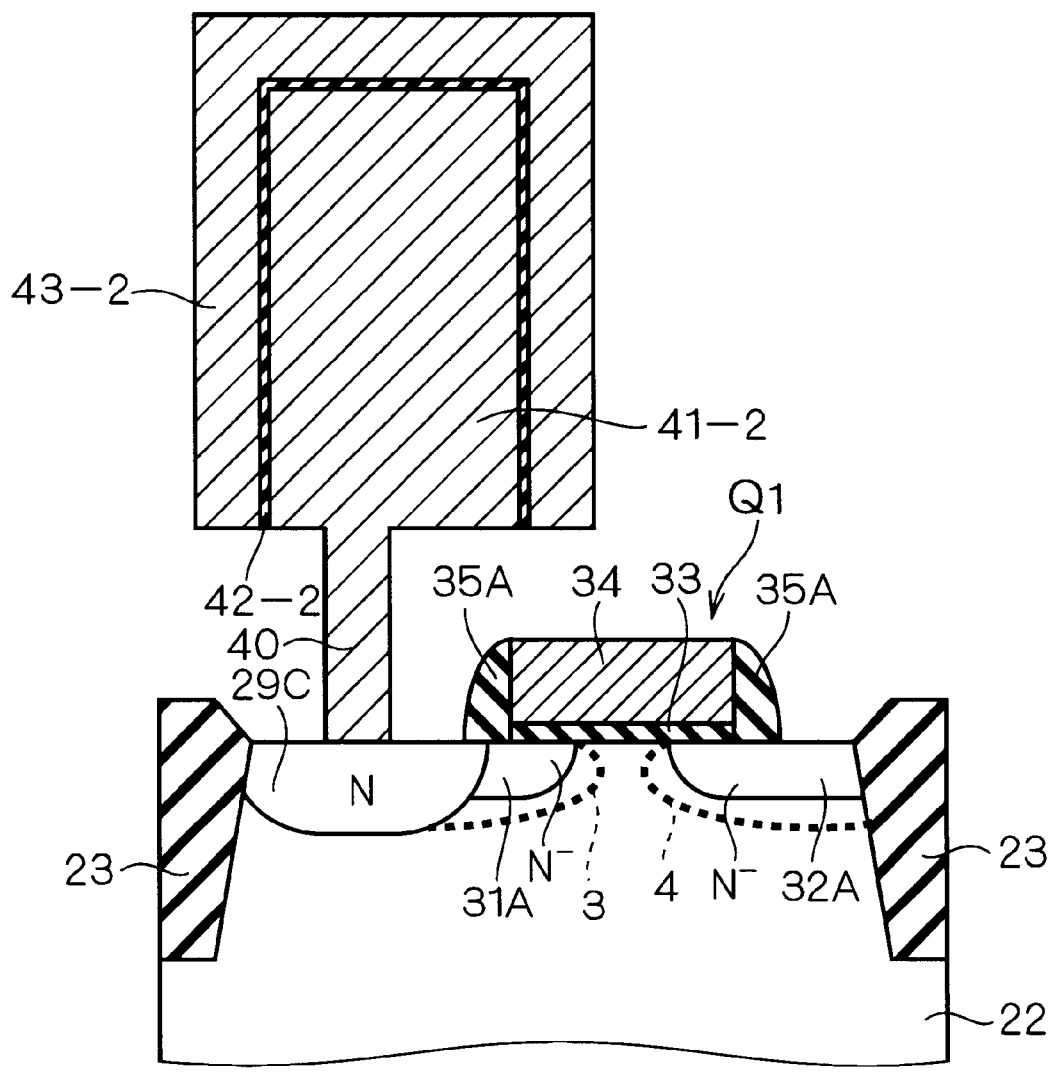

F I G. 116
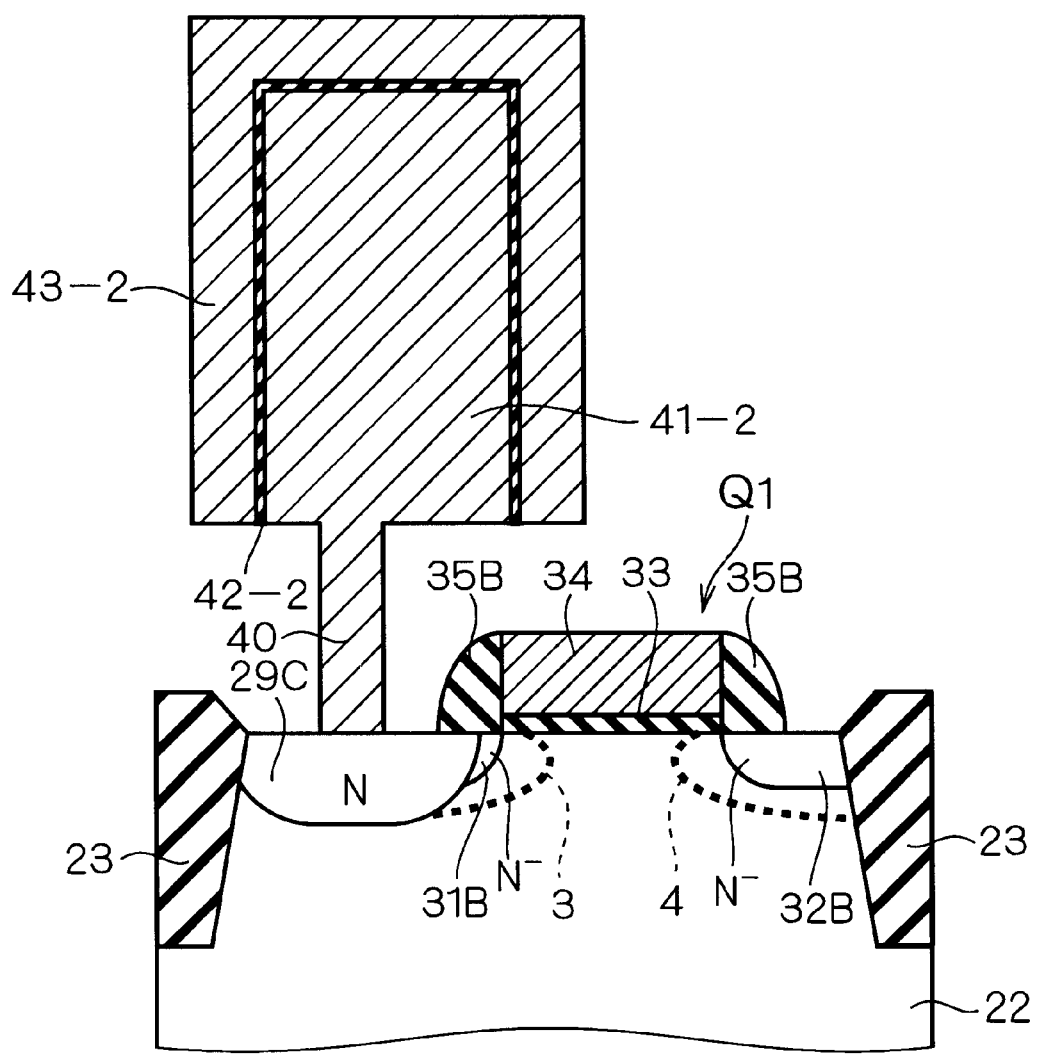

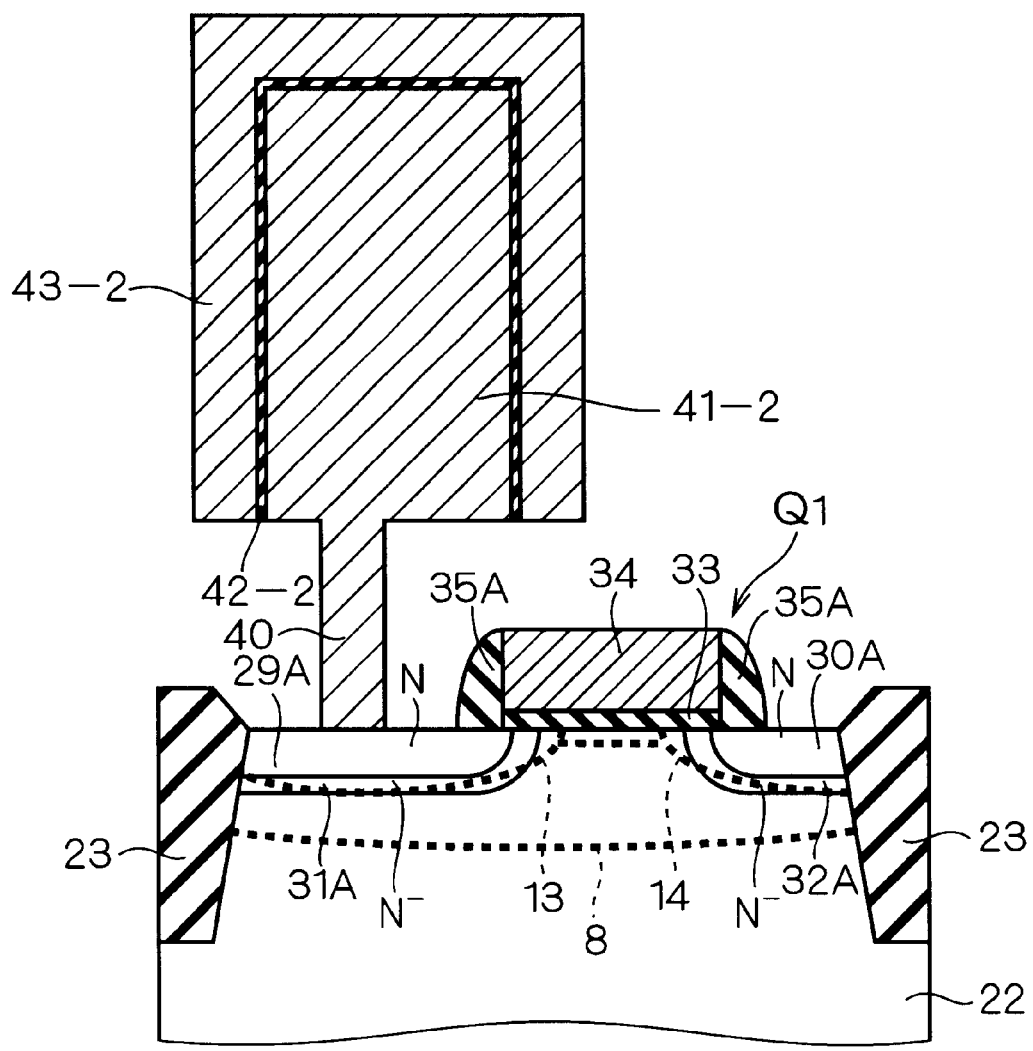
F I G . 1 1 7

F I G. 118
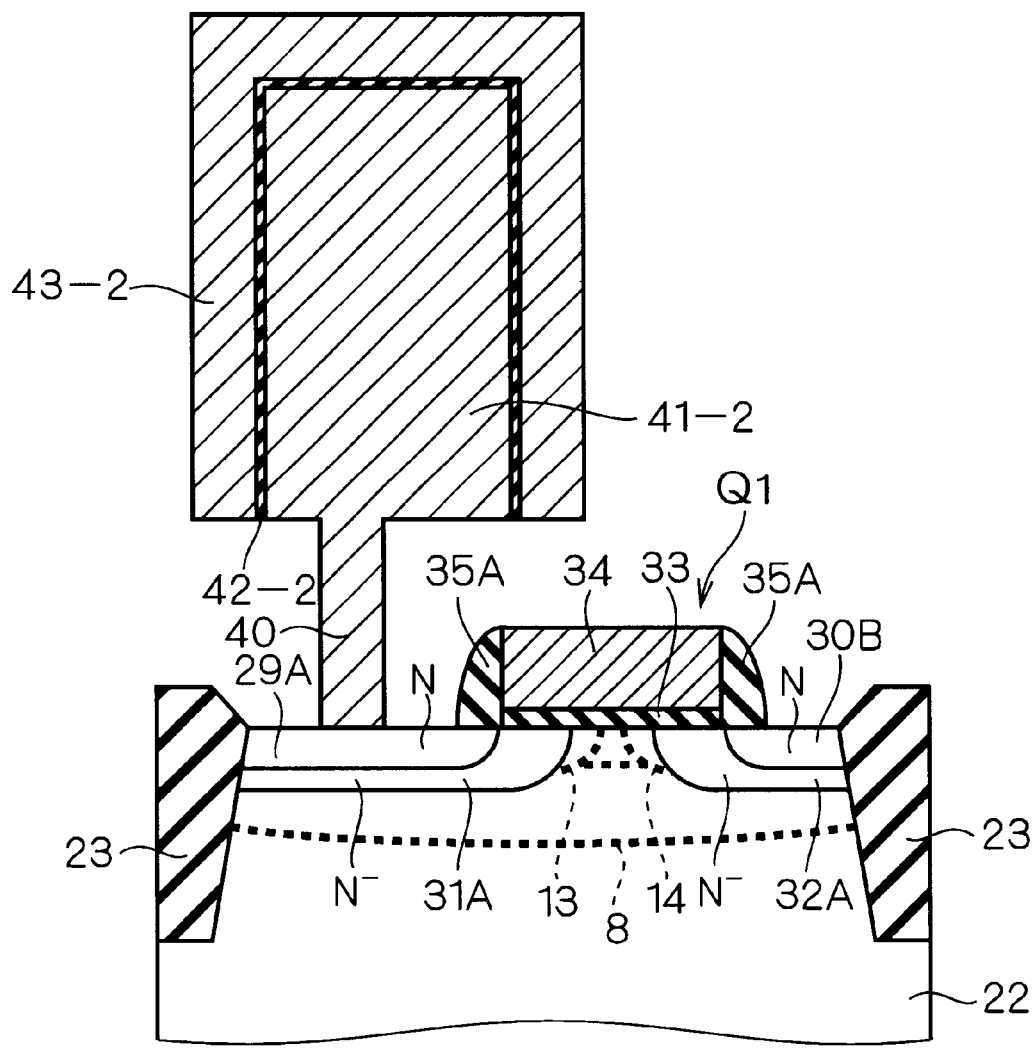

F I G . 1 1 9
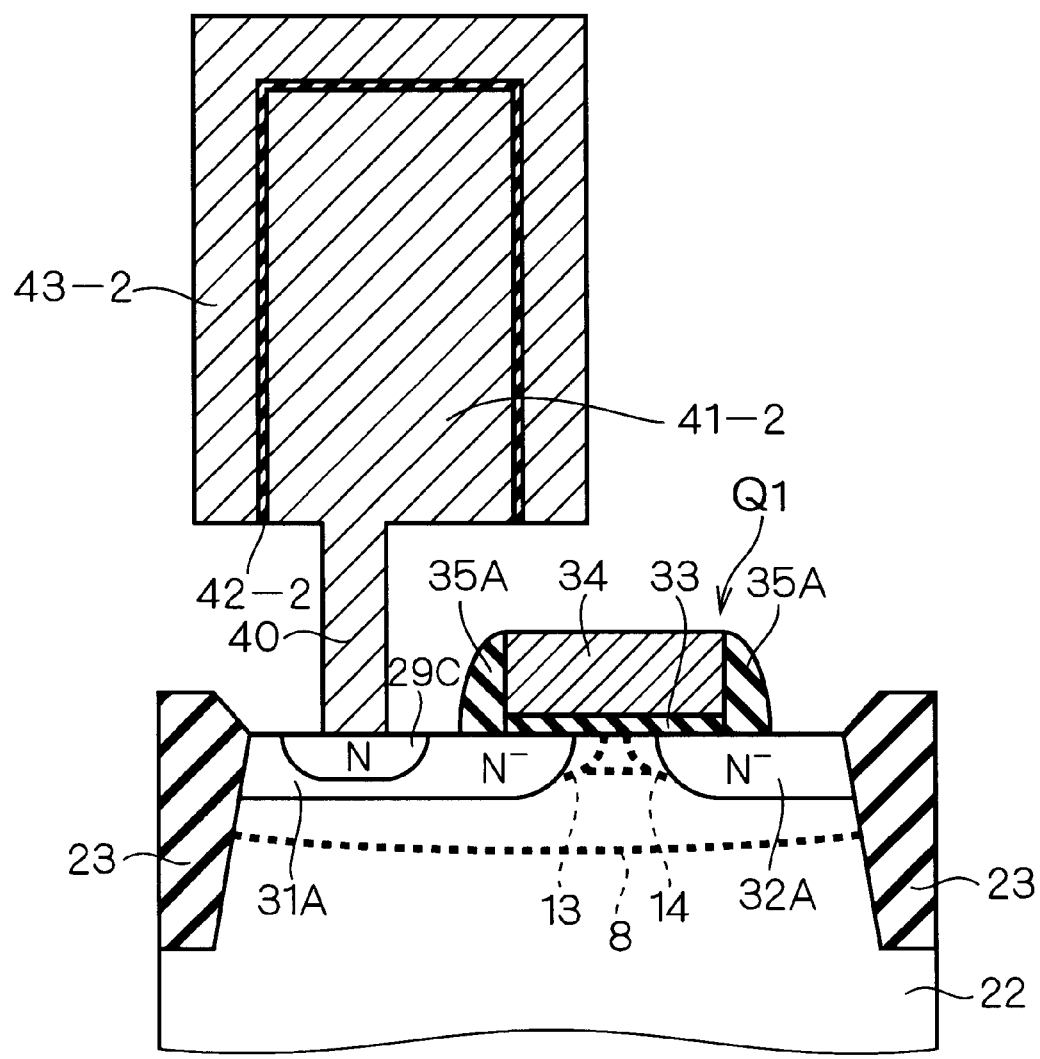

F I G . 1 2 T

F I G . 1 2 9
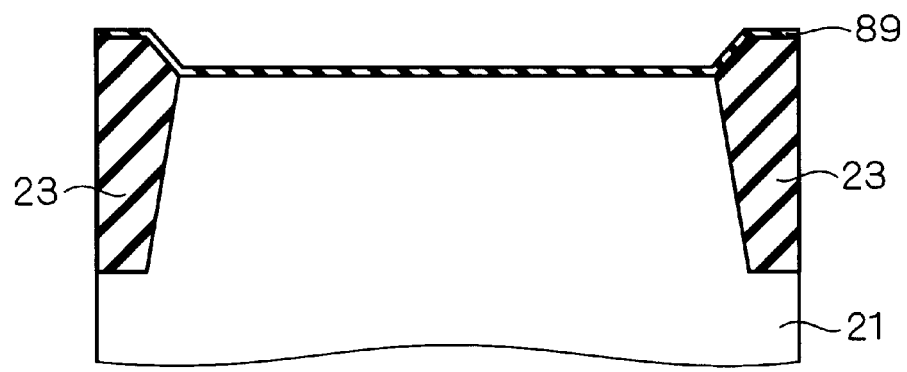
F I G . 1 3 0
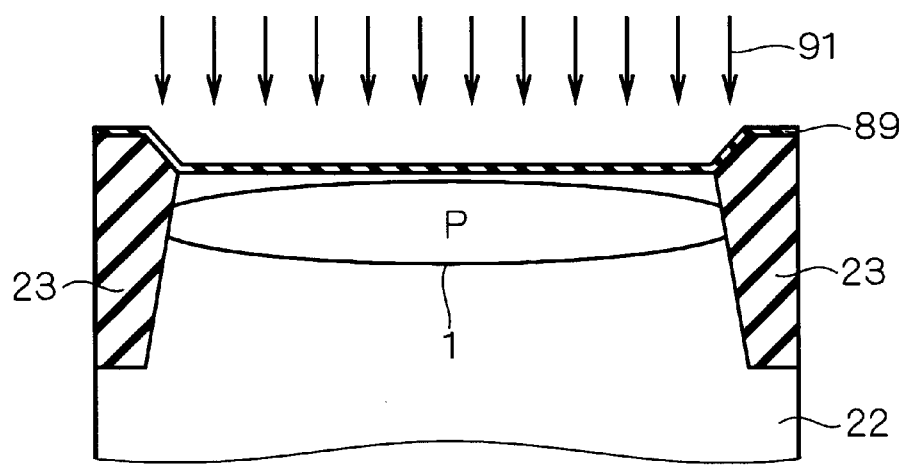

F I G. 1 3 3
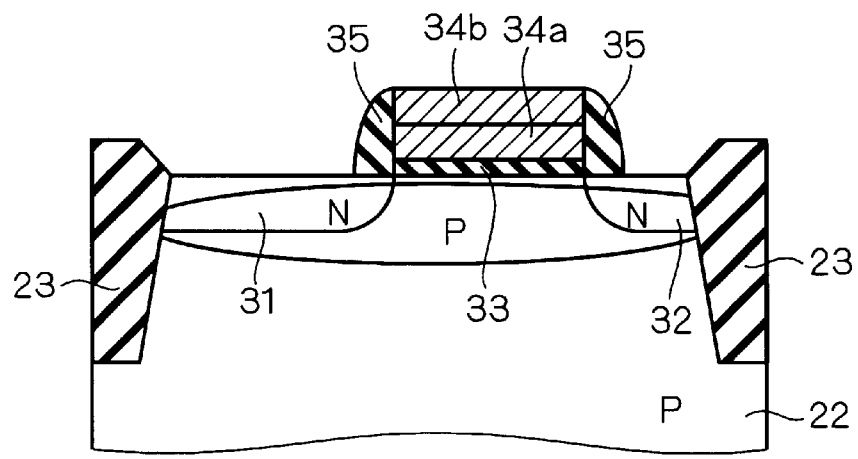
F I G. 1 3 4
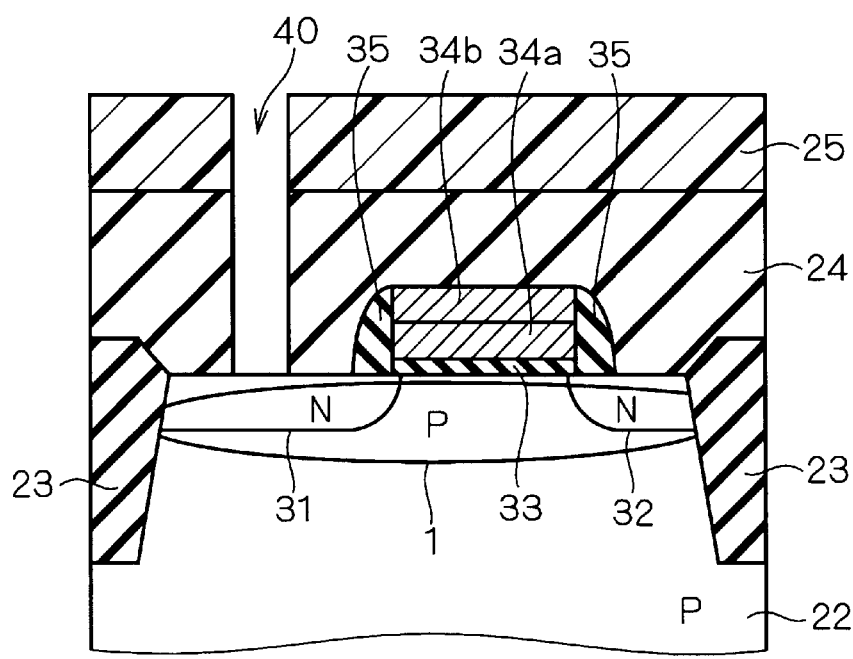

F I G. 135
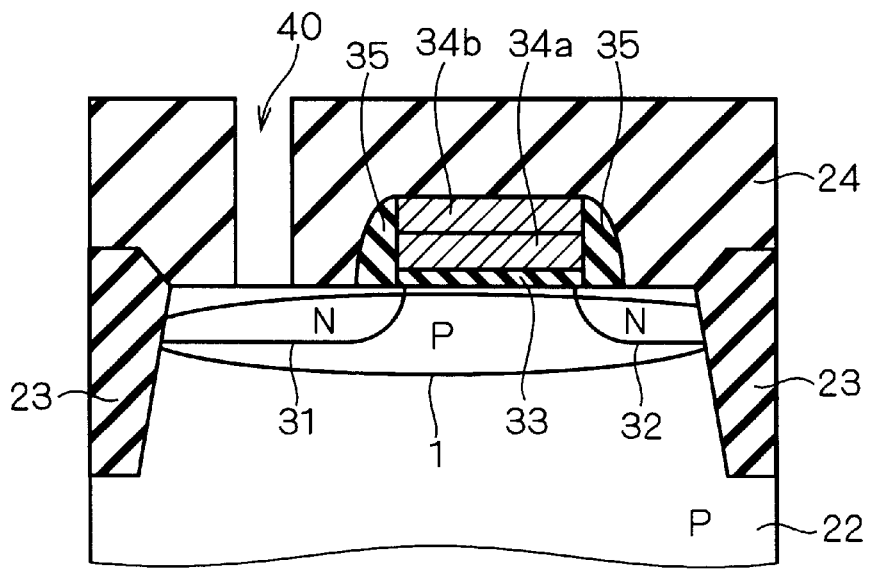
F I G. 136
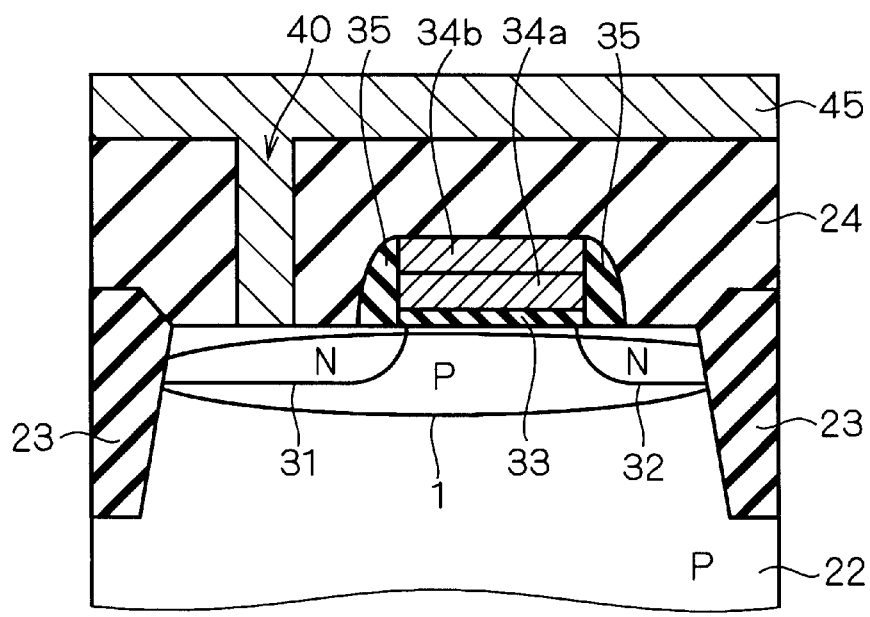

F I G. 1 3 9
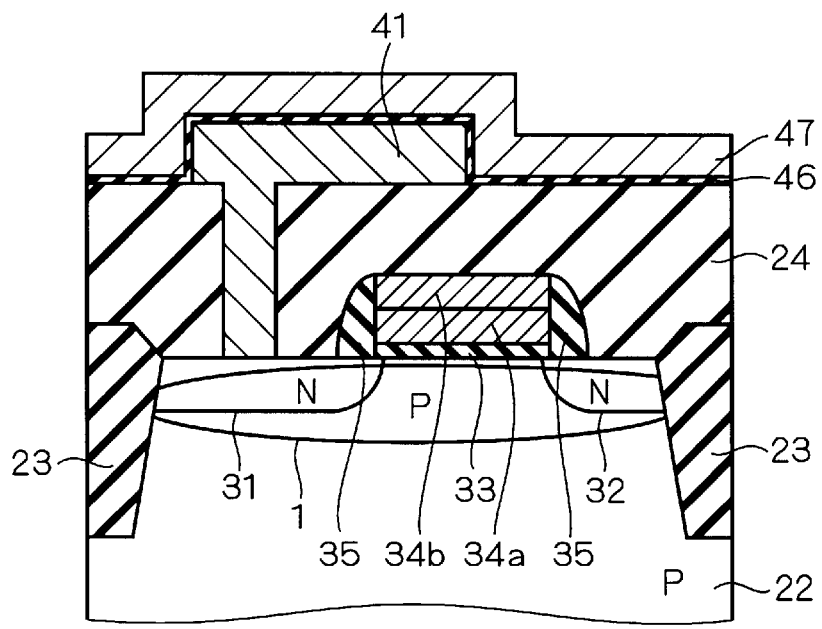
F I G. 1 4 0
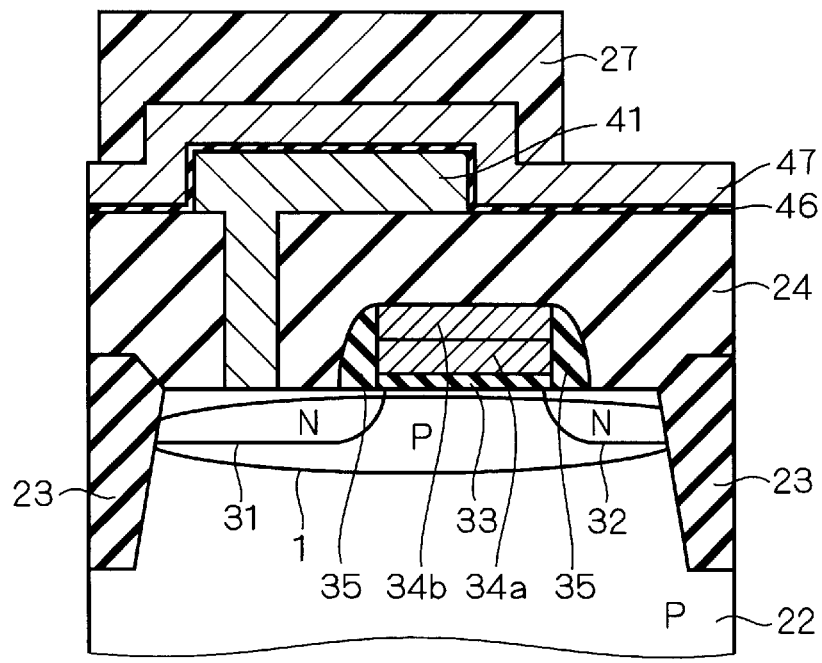

F I G. 143
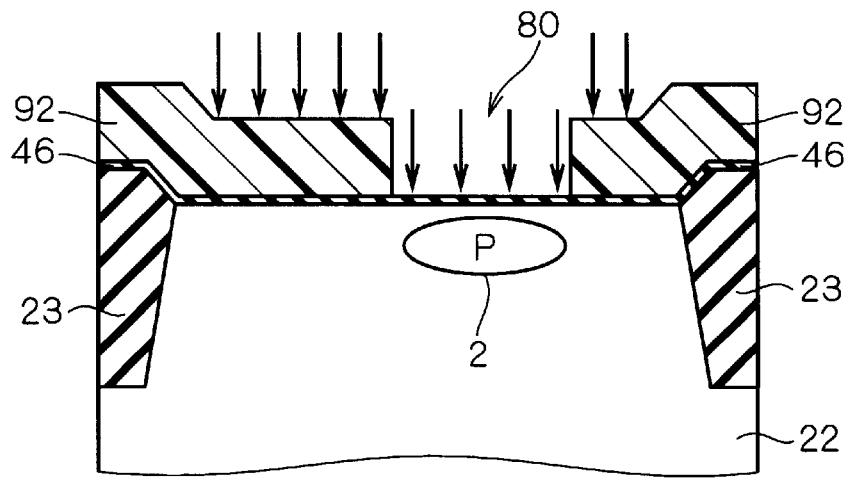
F I G. 144
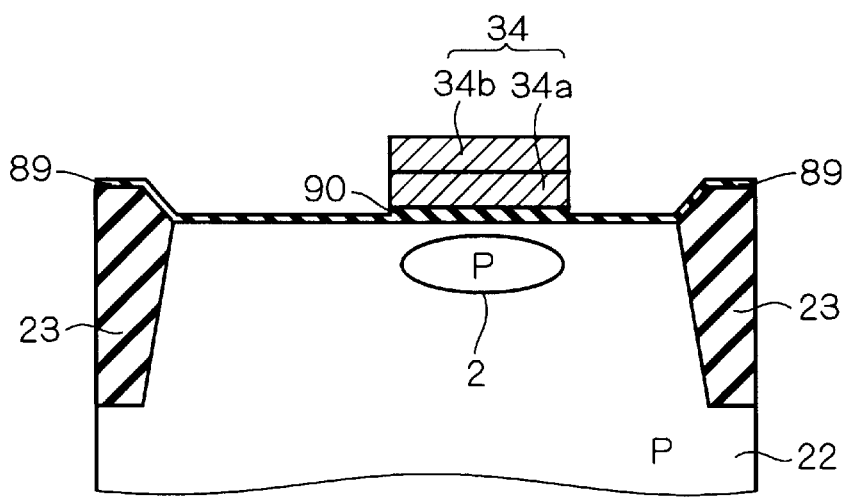

F I G. 1 4 5
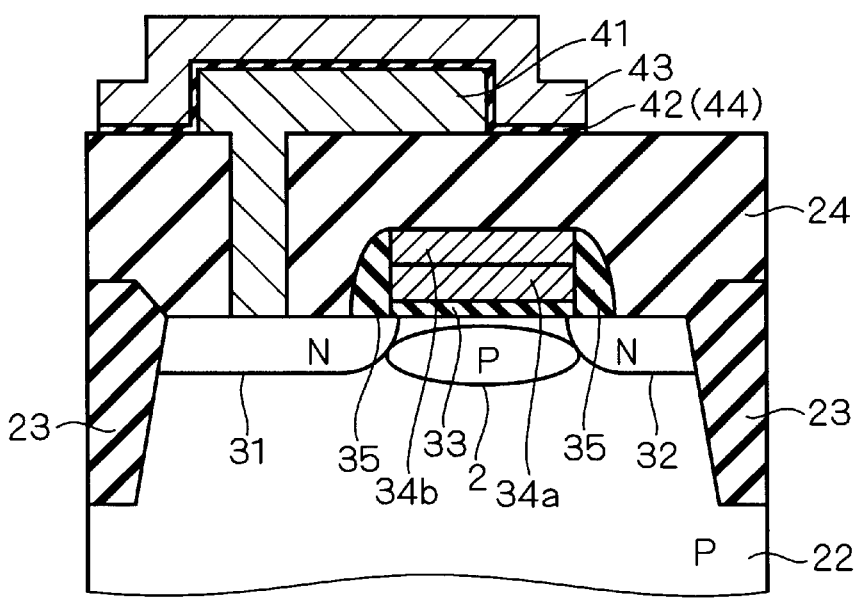
F I G. 1 4 6
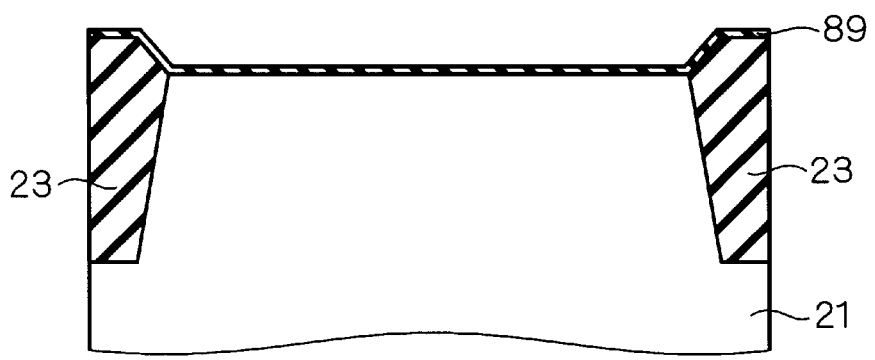

F I G. 1 4 9
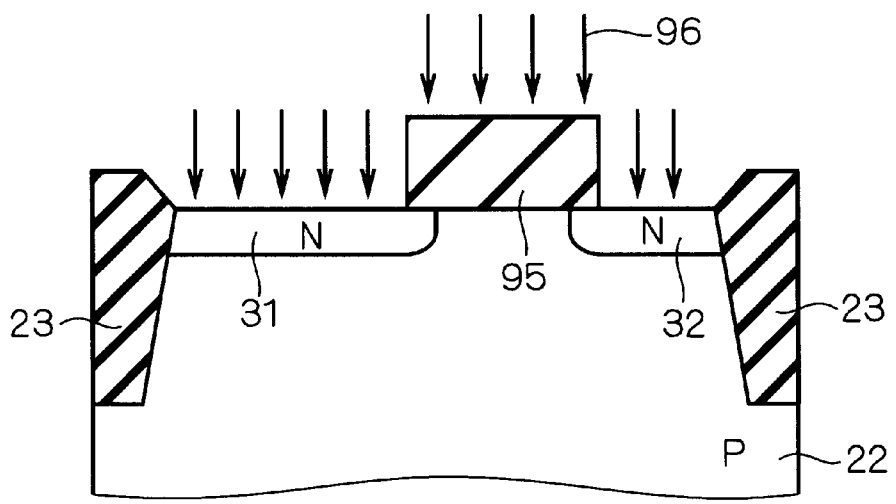
F I G. 1 5 0
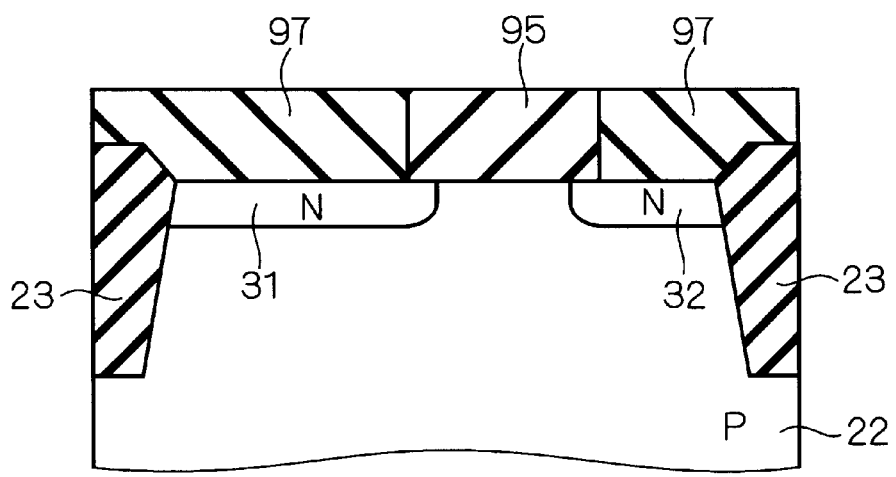

F I G. 1 5 1
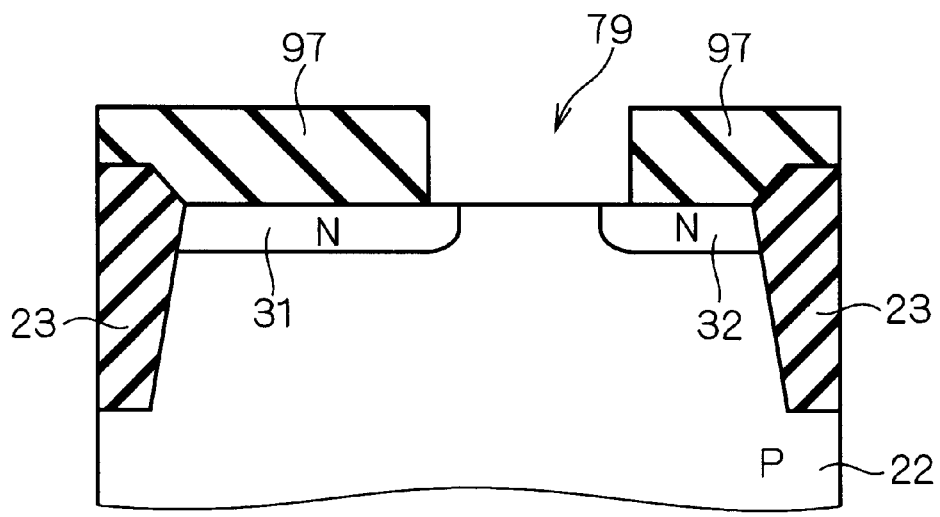
F I G. 1 5 2
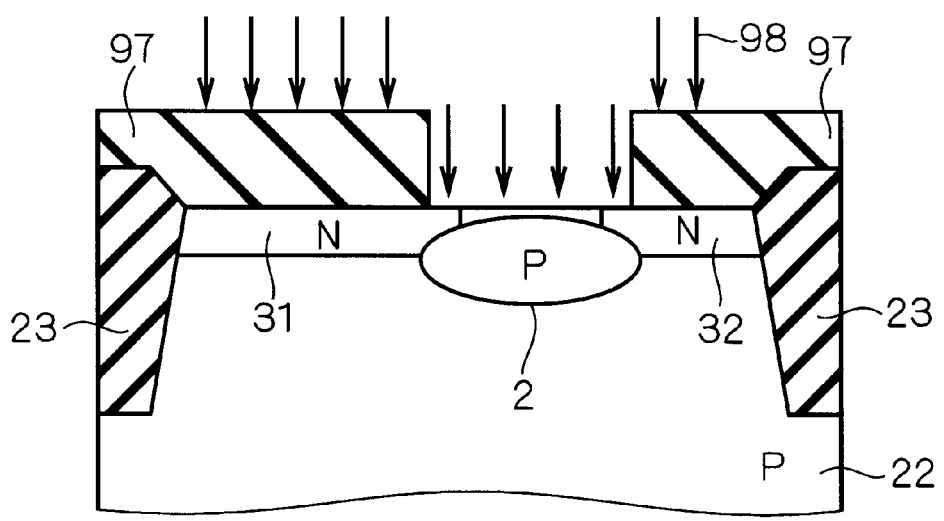

F I G. 1 5 5
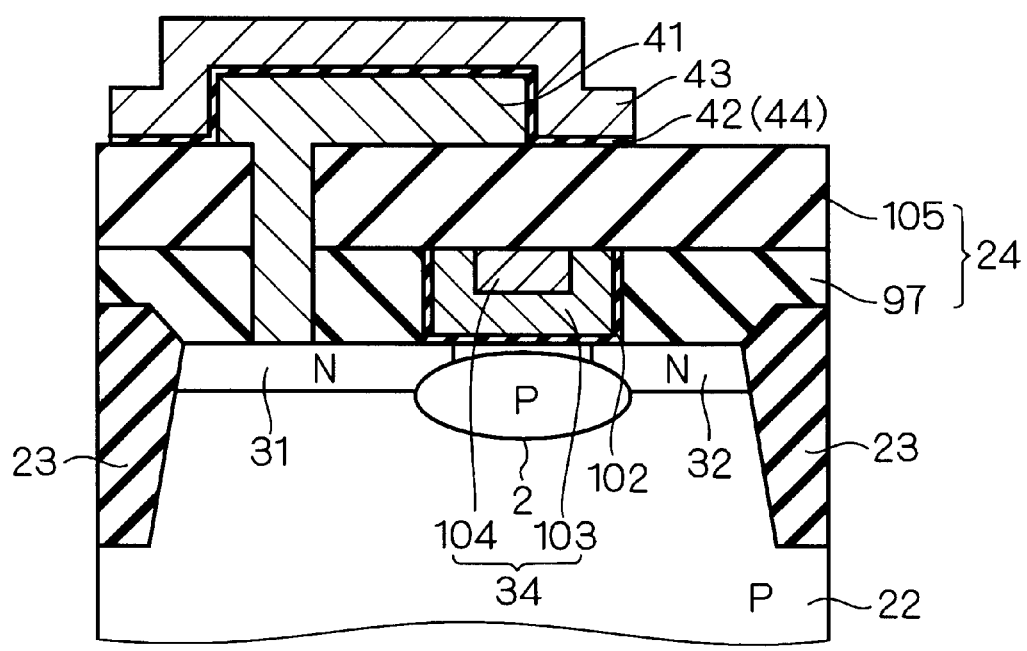
F I G. 1 5 6
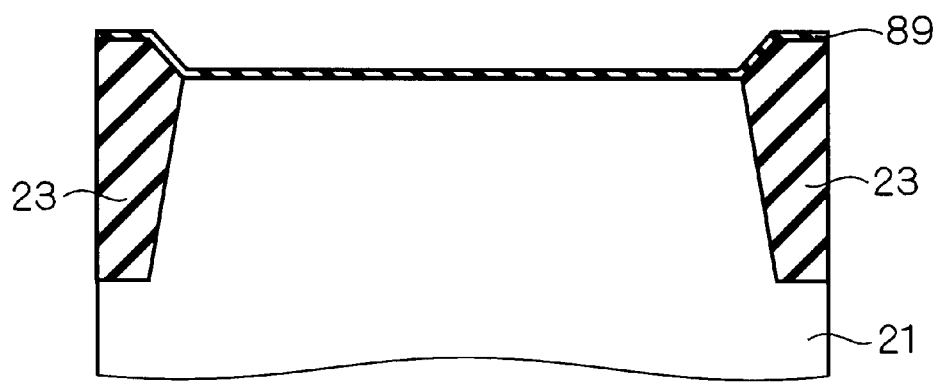

F I G. 1 5 9
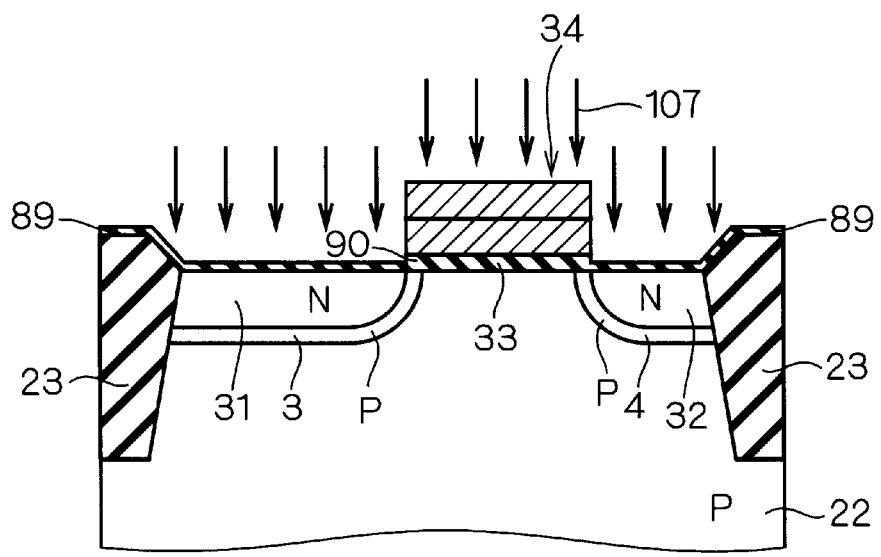
F I G. 1 6 0
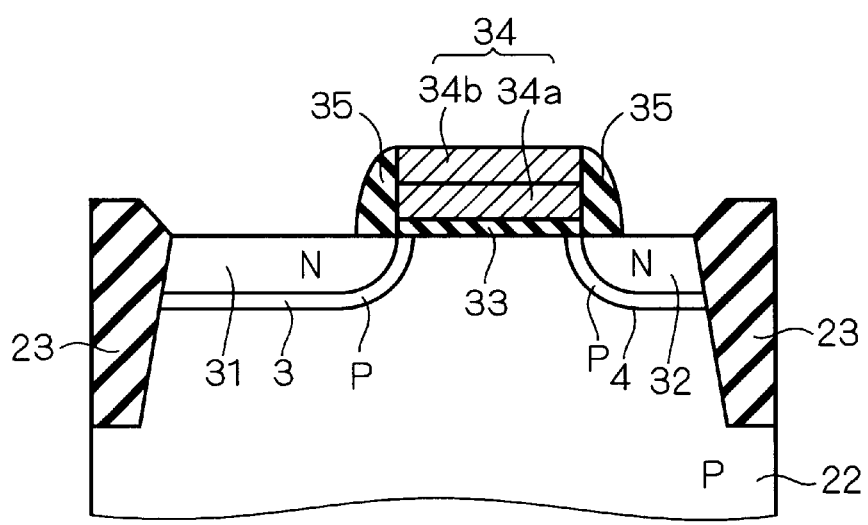

F I G . 1 6 9
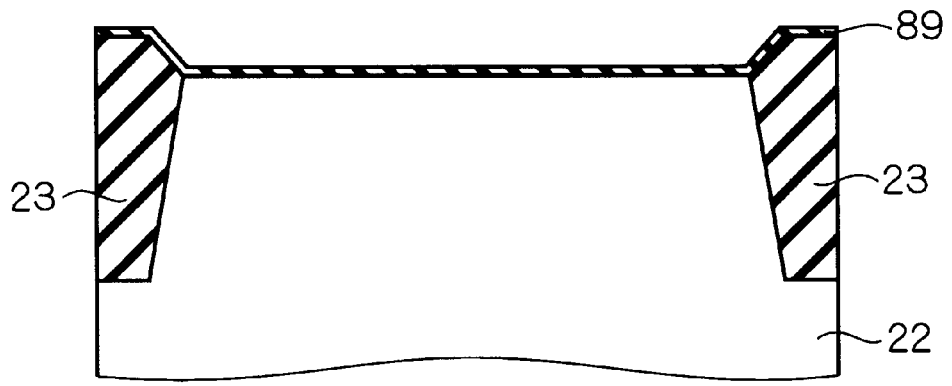
F I G . 1 7 0
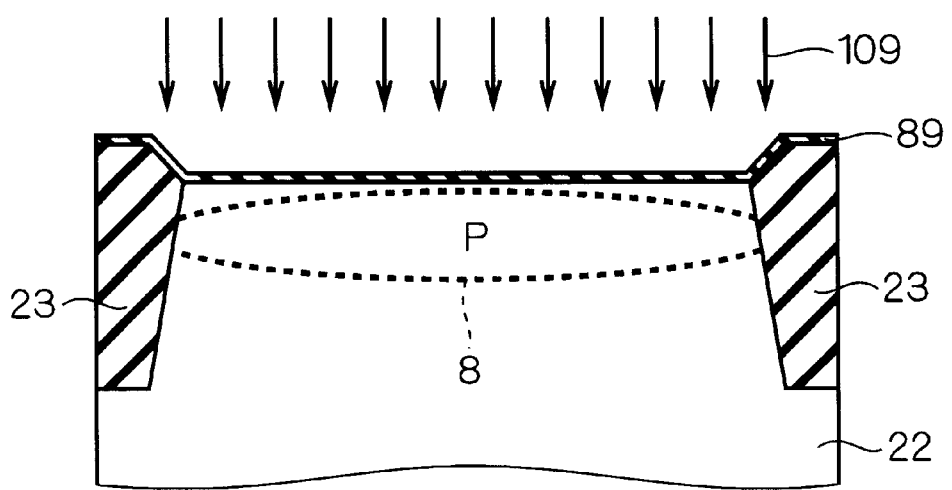

F I G . 1 7 3
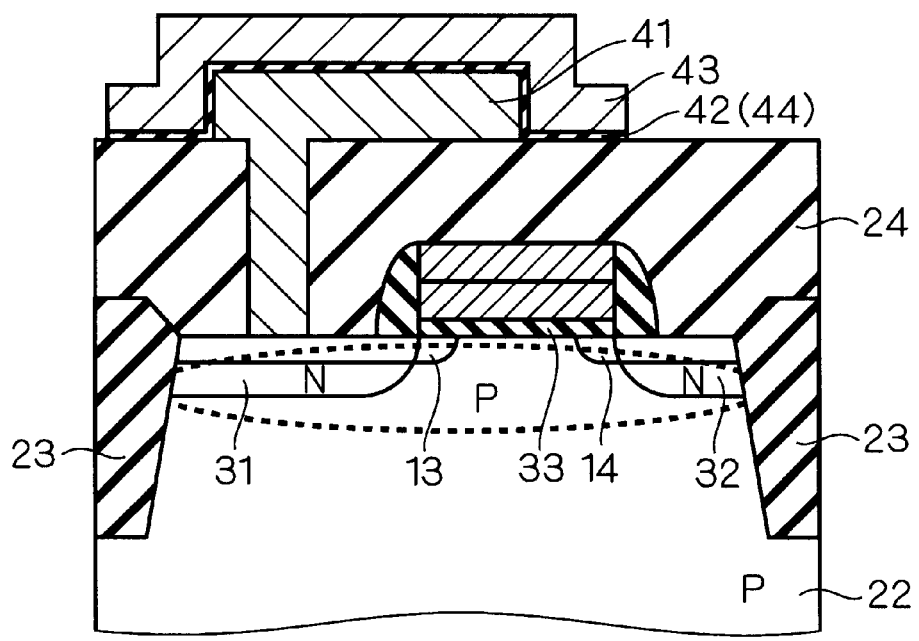
F I G . 1 7 4
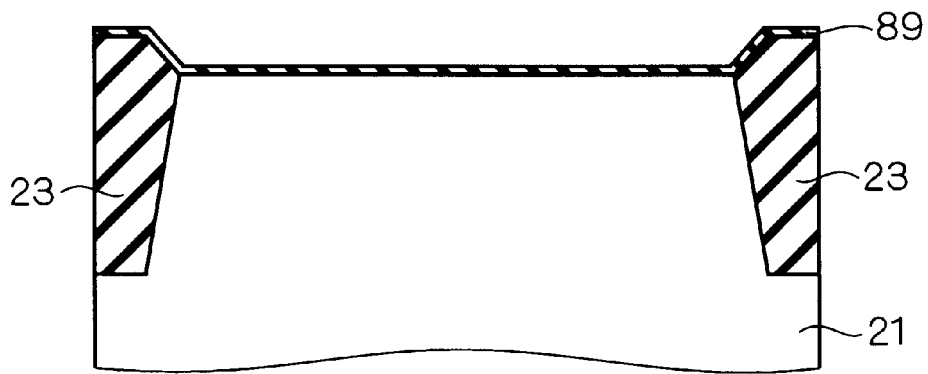

F I G. 1 7 7
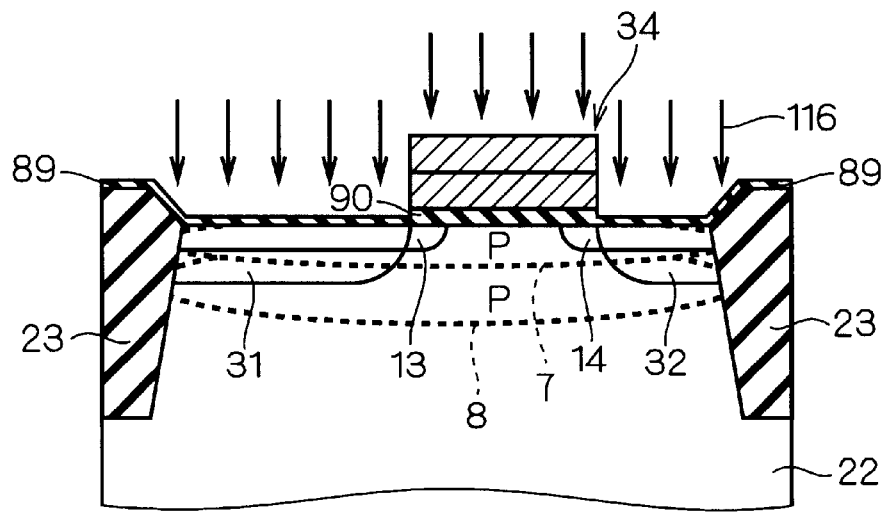
F I G. 1 7 8
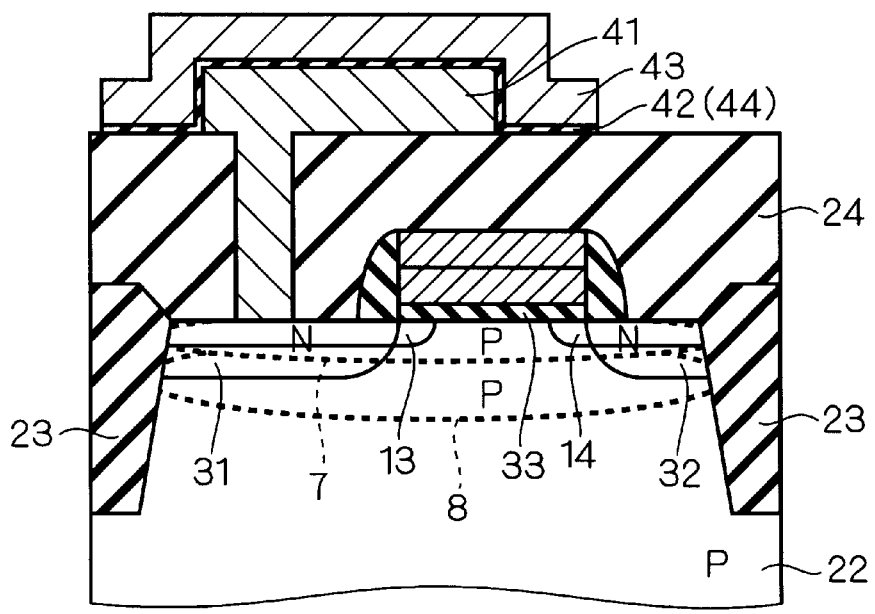

F I G. 1 9 5
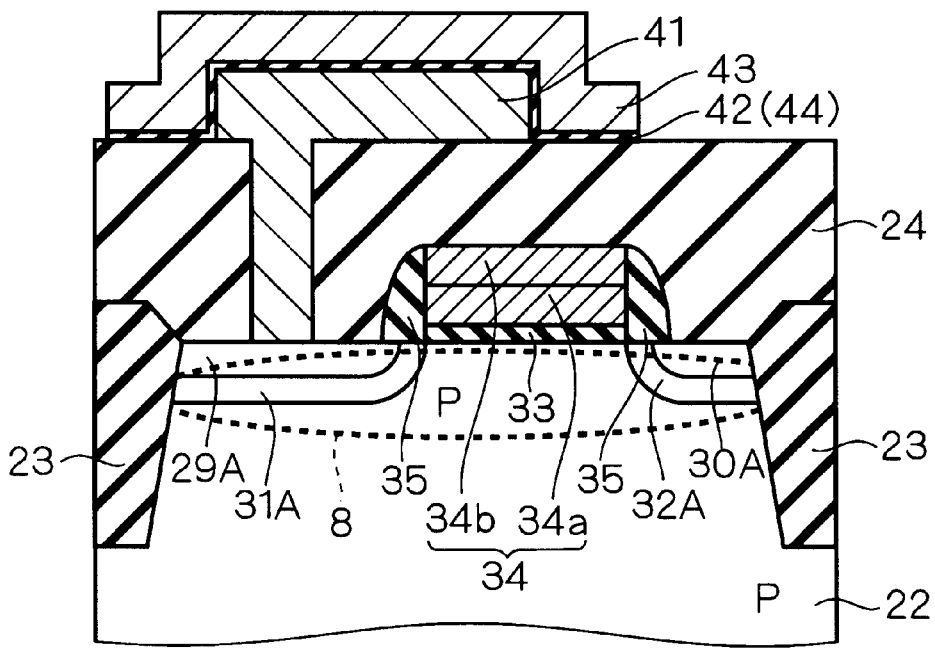
F I G. 1 9 6
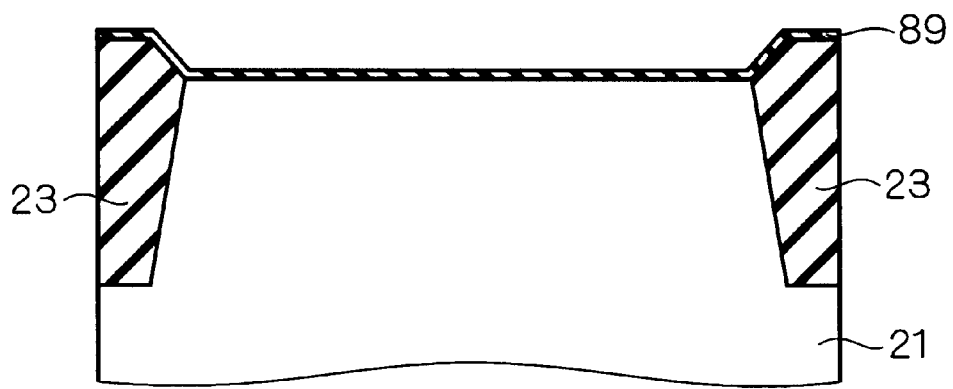

F I G. 211
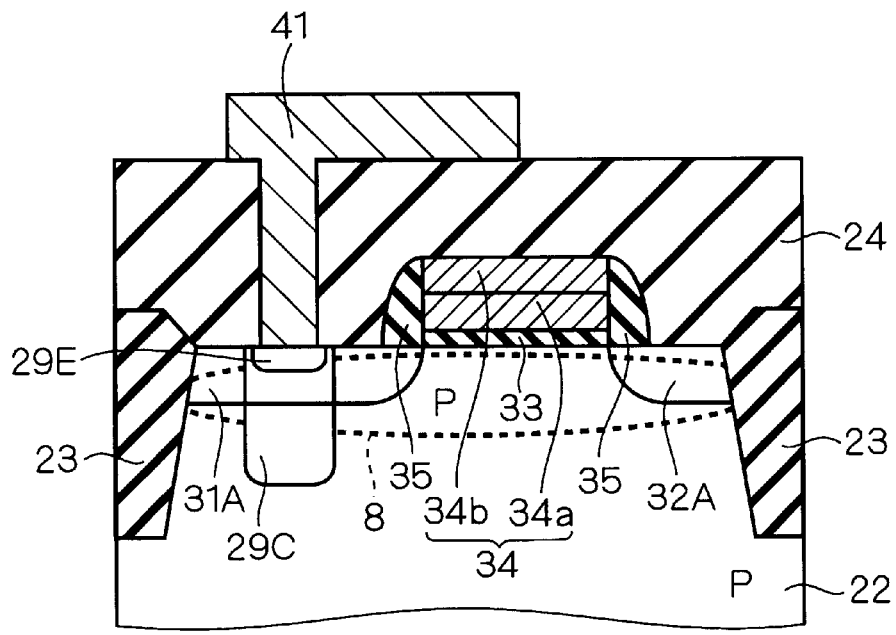
F I G. 212
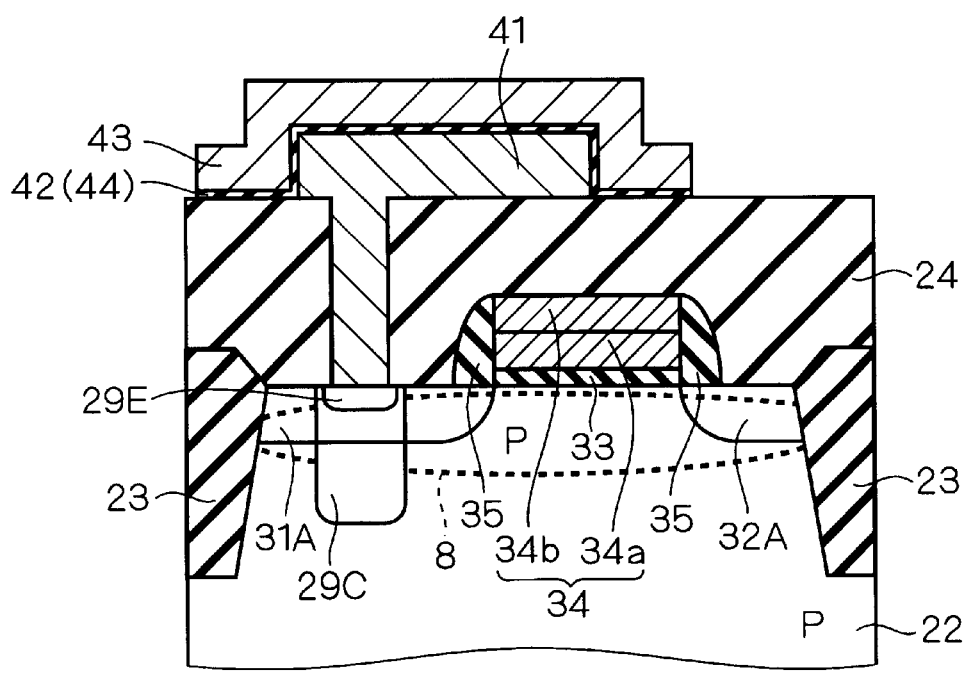

F I G. 217
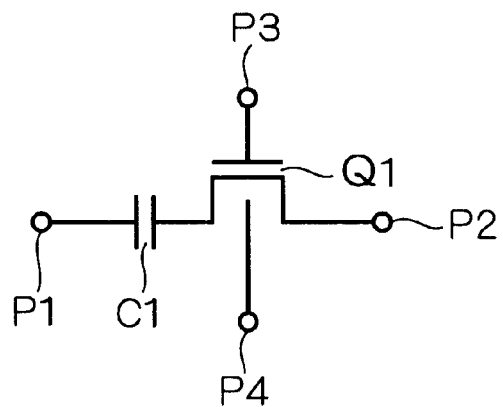
F I G. 218
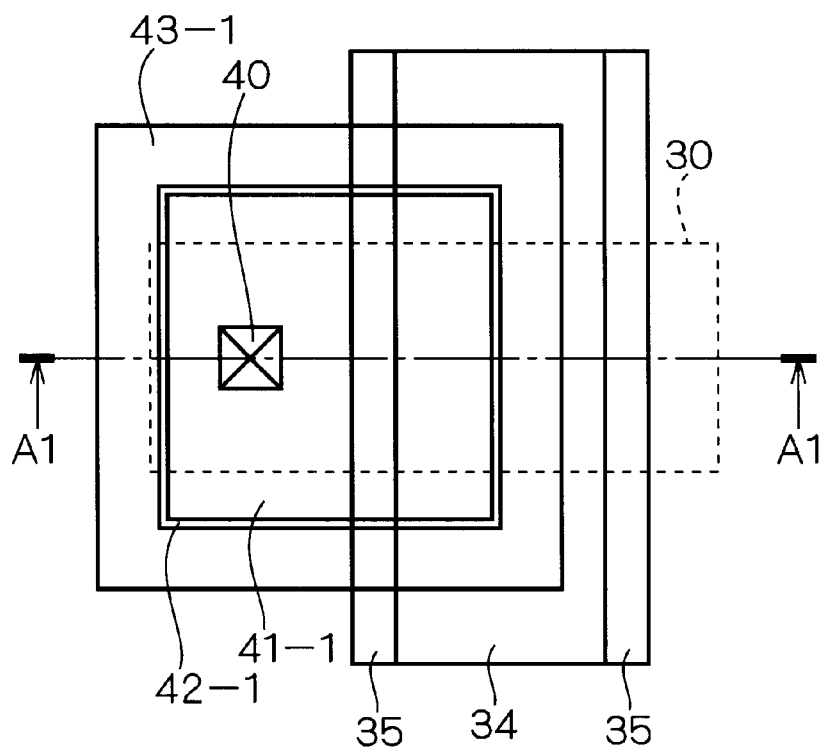

F/G. 235
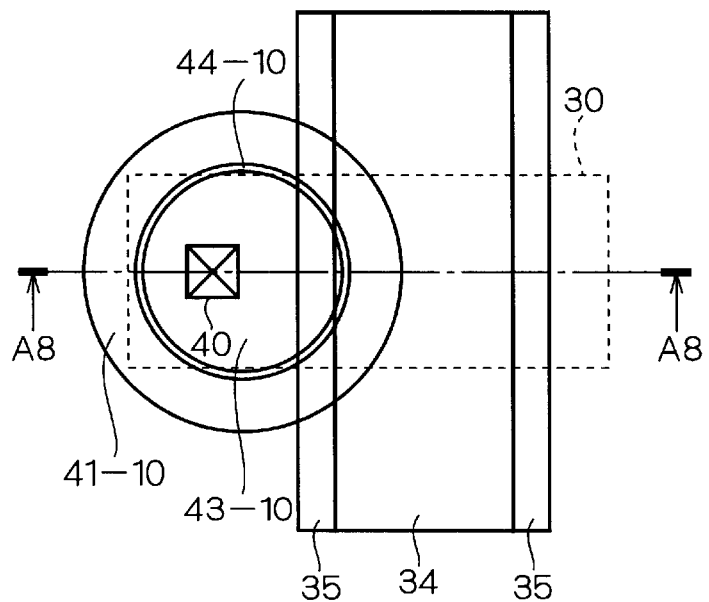
F/G. 236
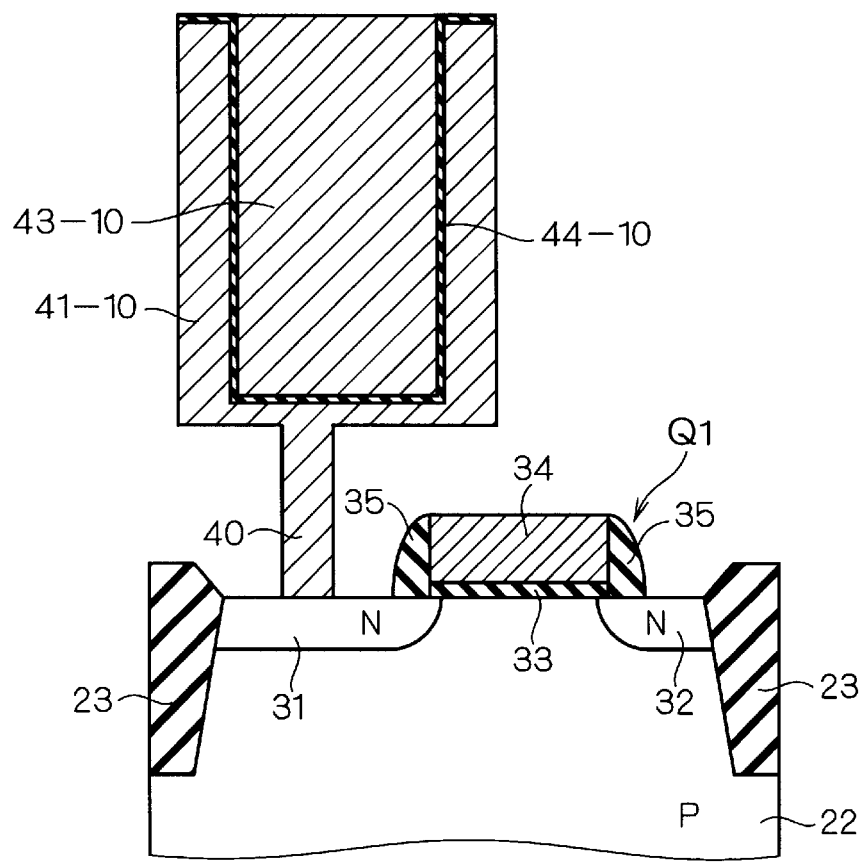

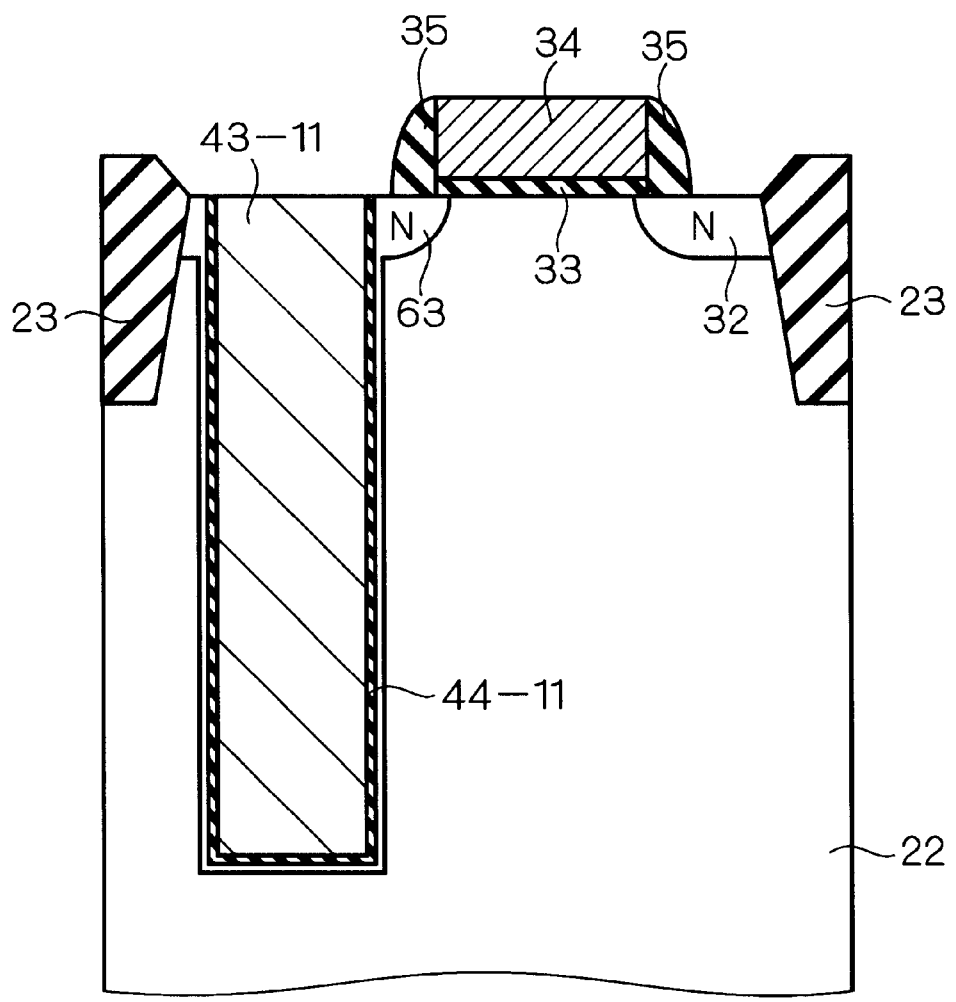
F I G . 2 3 7

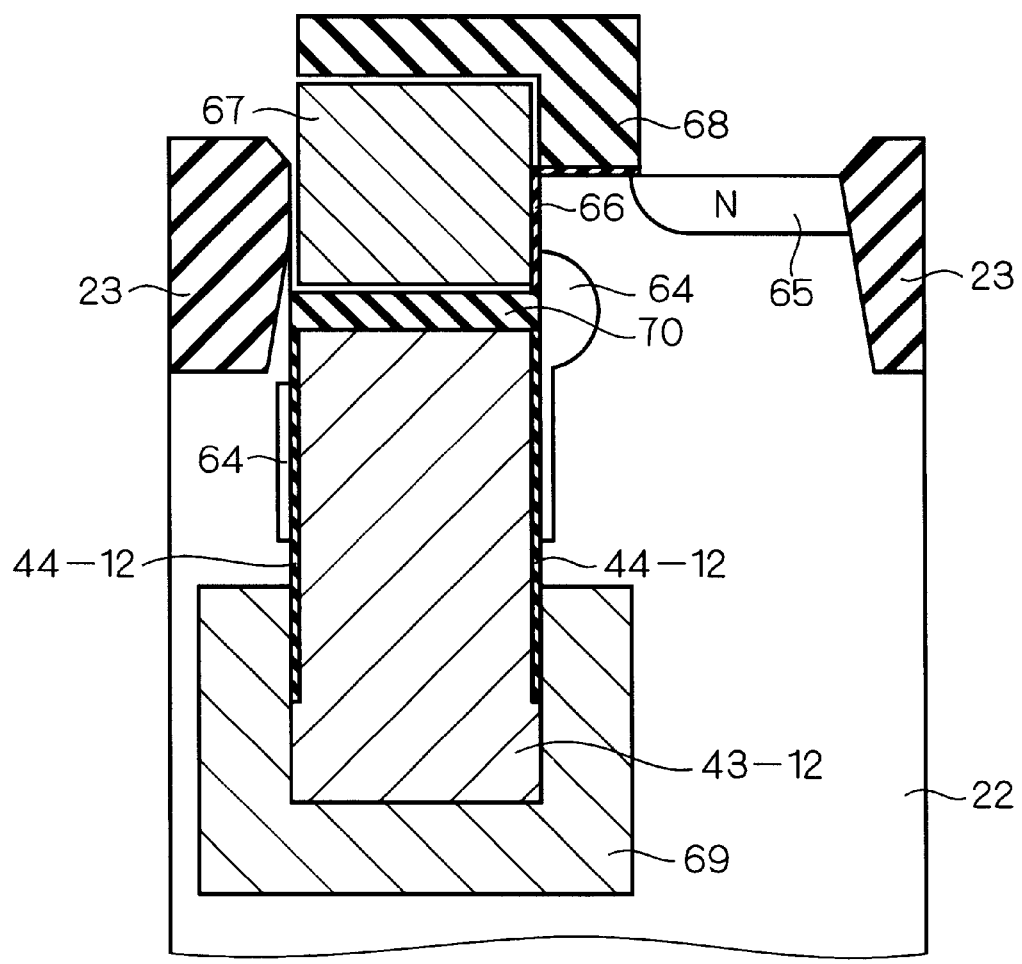
F I G . 2 3 8

F I G. 2 3 9
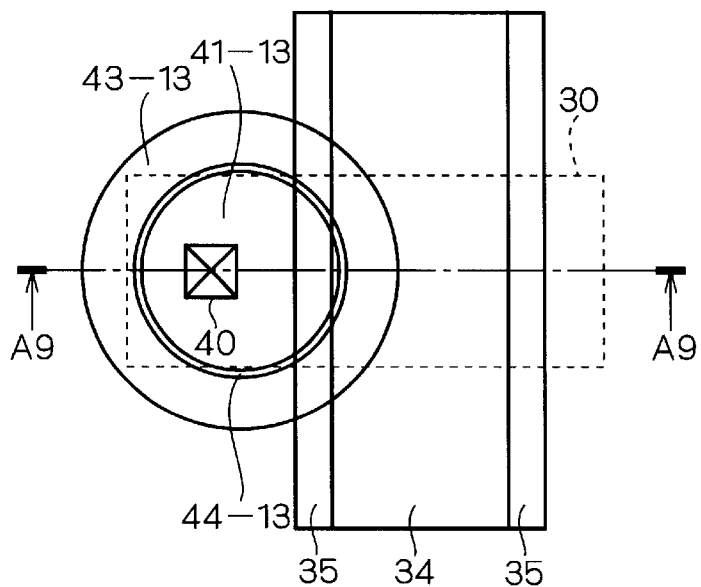
F I G. 2 4 0
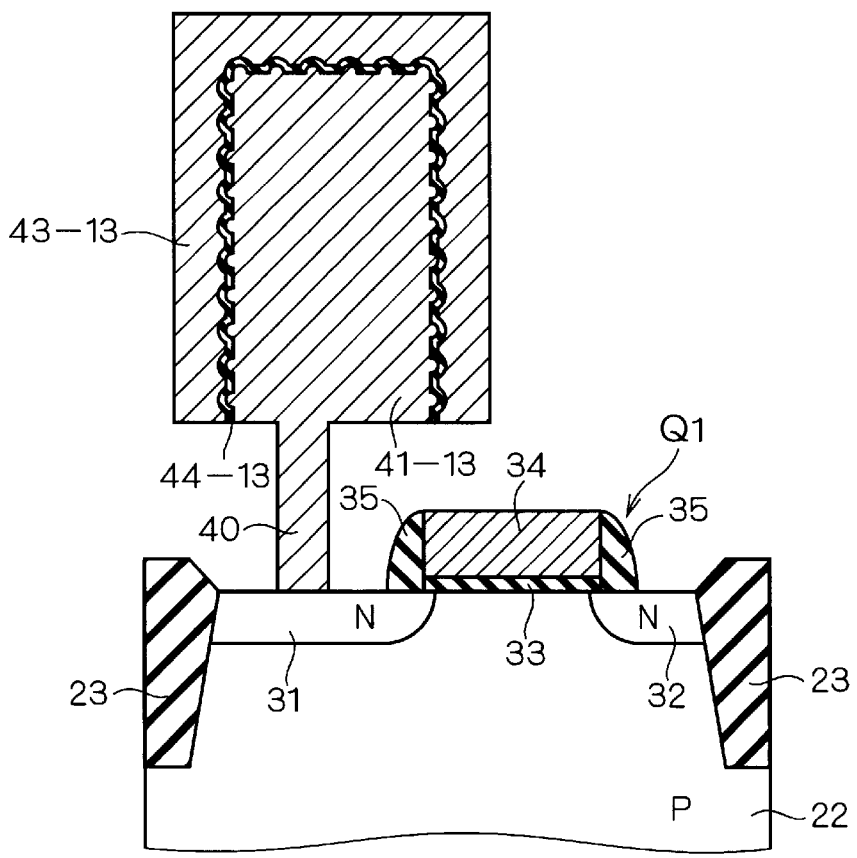

F I G. 2 4 1
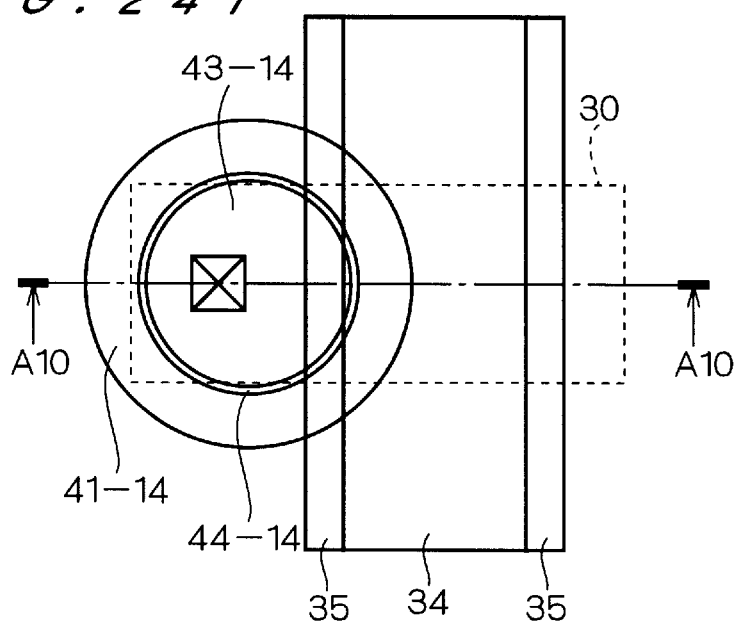
F I G. 2 4 2
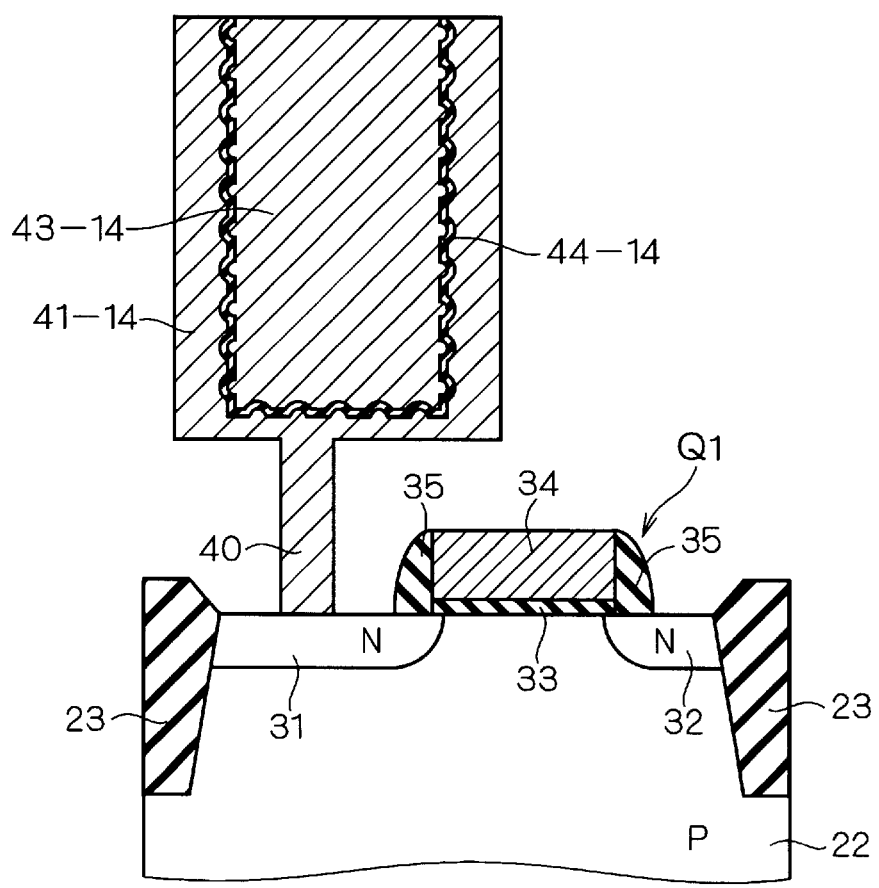

F I G. 243
F I G. 244
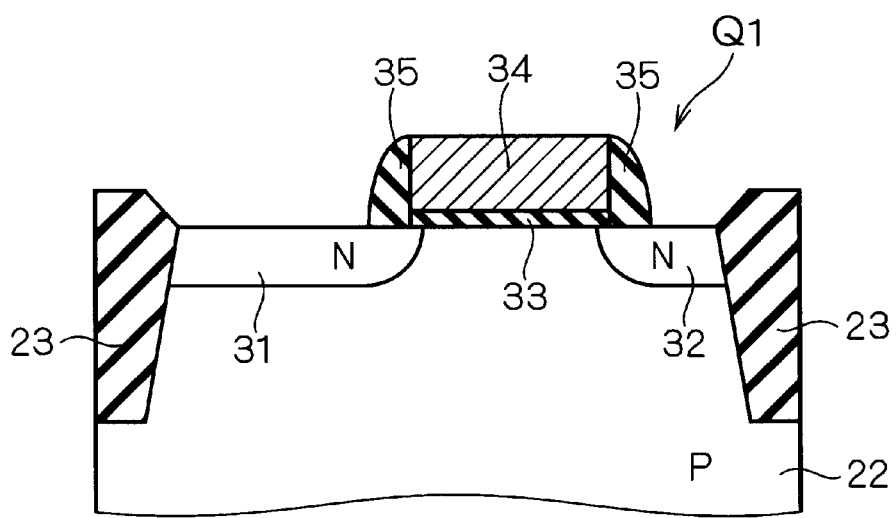

F I G. 247
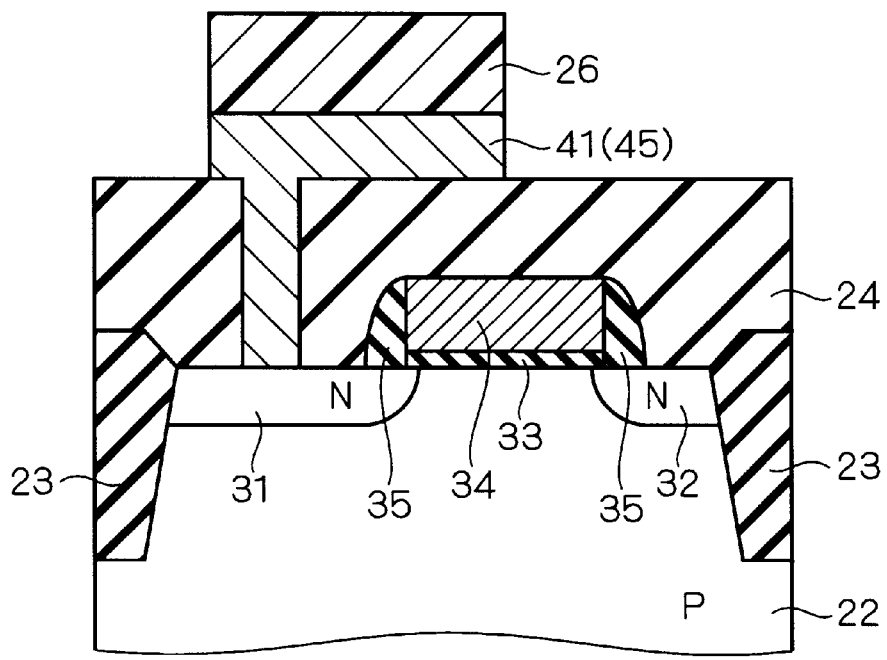
F I G. 248
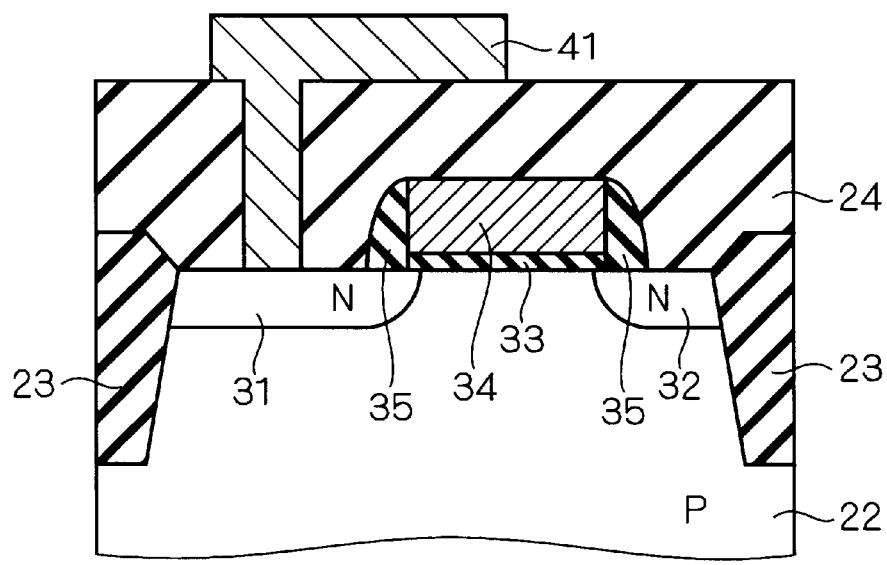

F/G.251
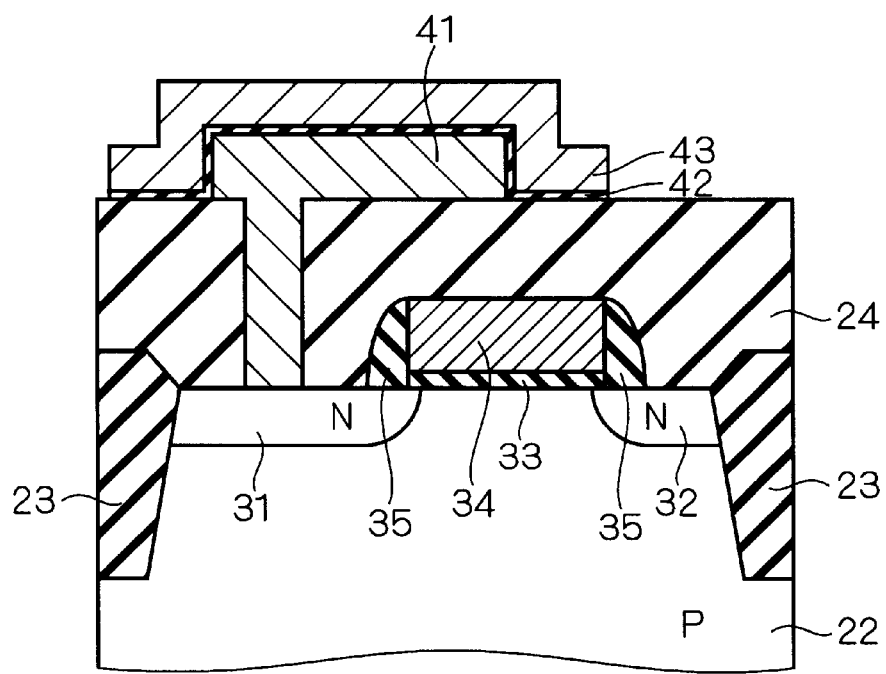

F I G. 2 5 2
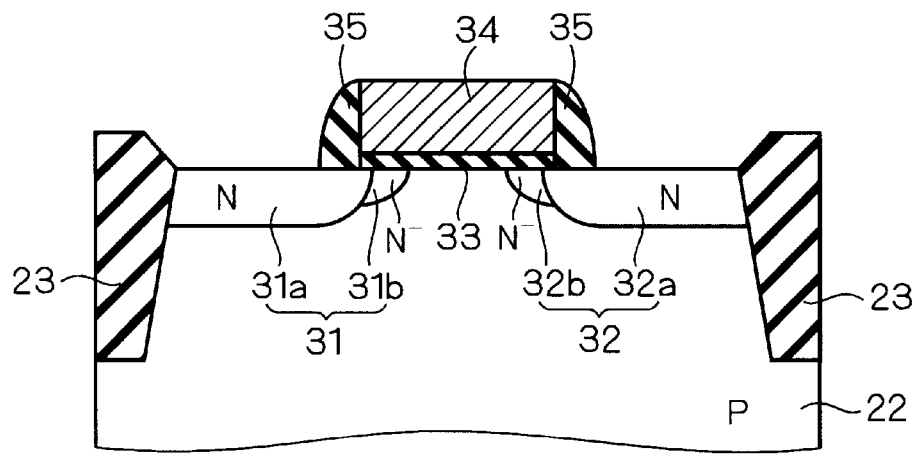
F I G. 2 5 3
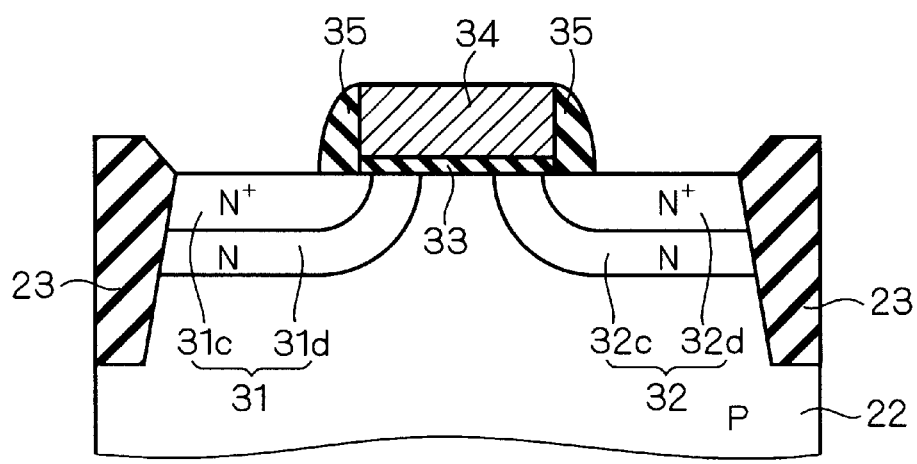

F I G. 254
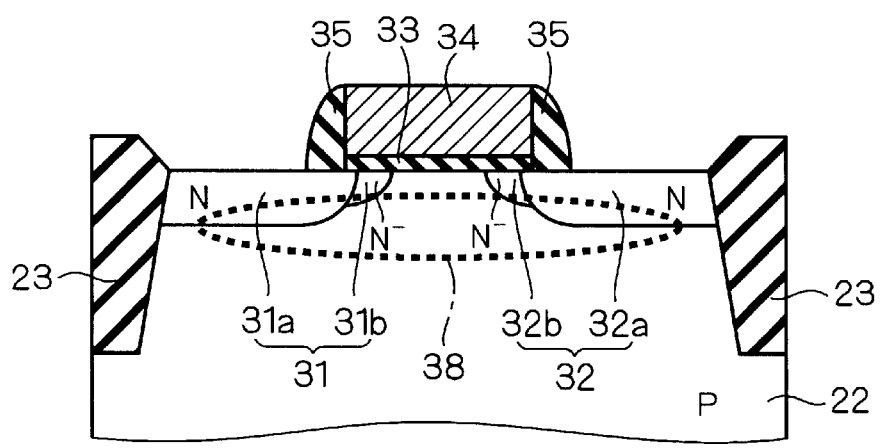
F I G. 255
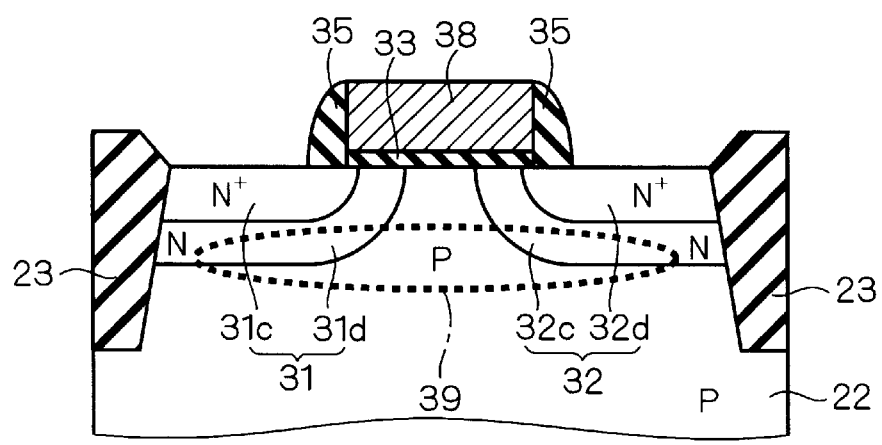

F I G . 2 6 0
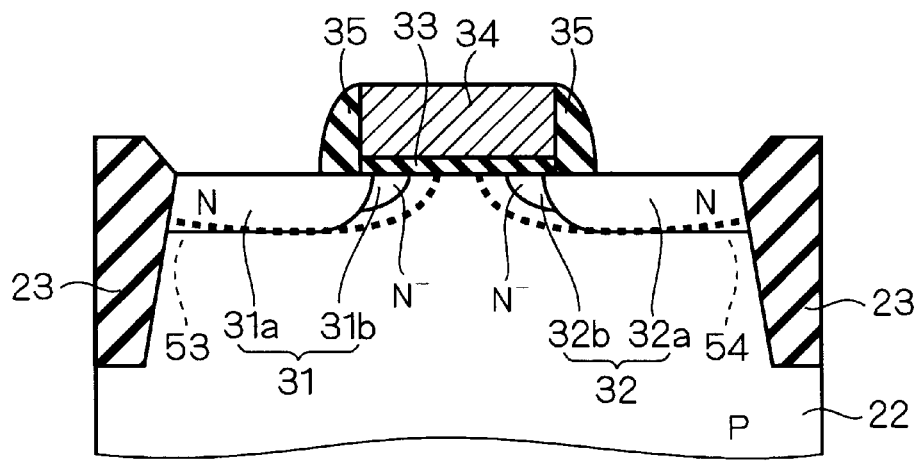
F I G . 2 6 1
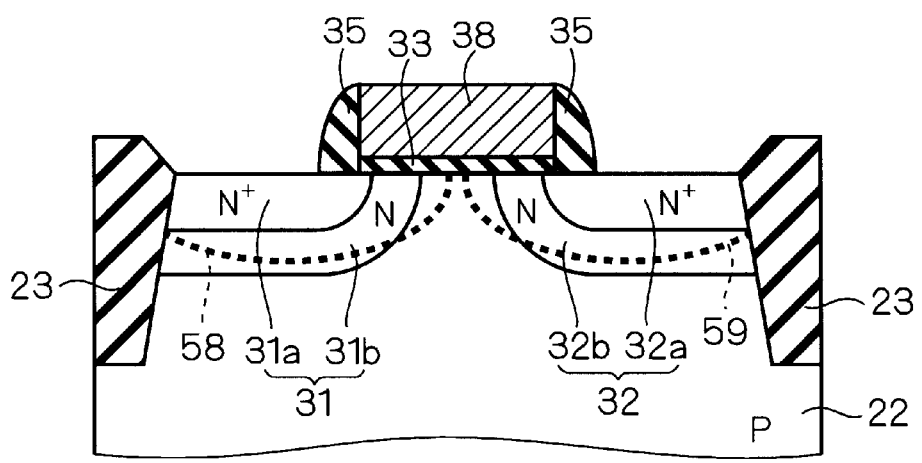

F I G. 266
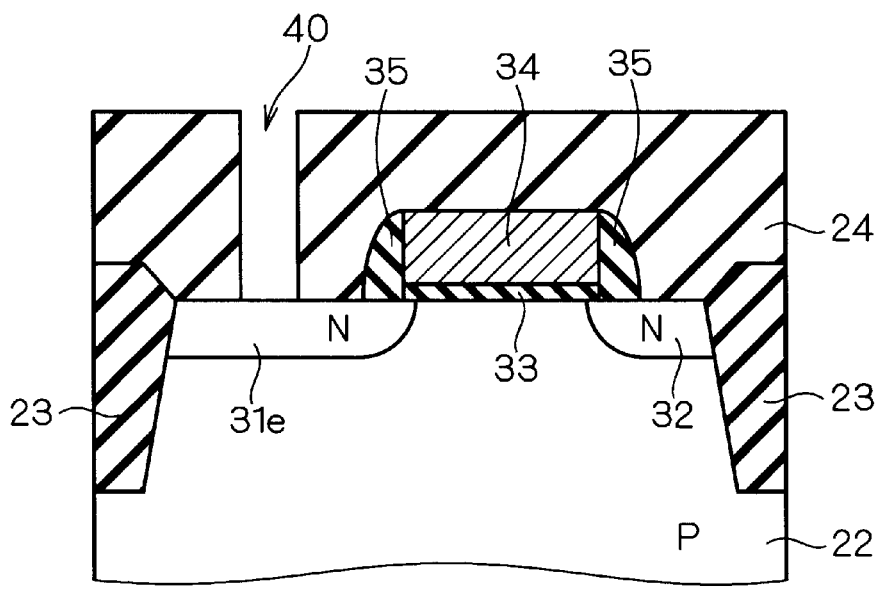
F I G. 267
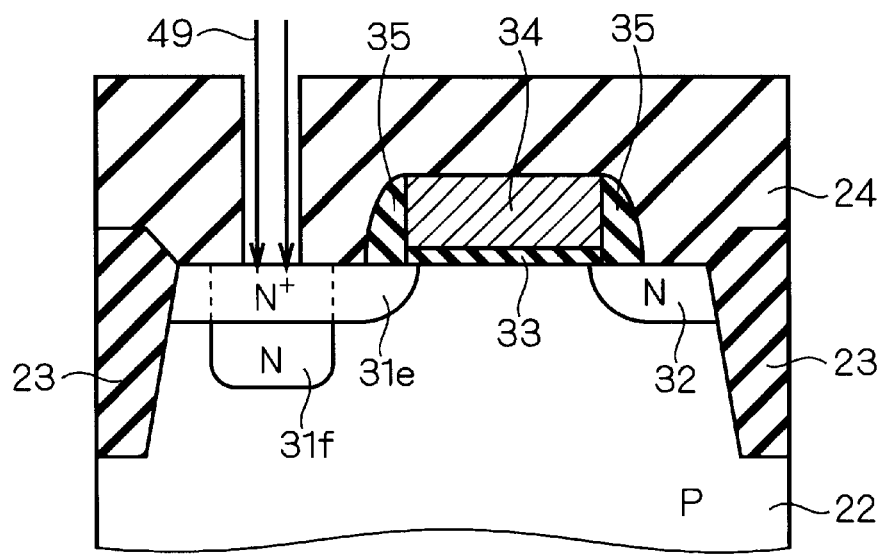

US 6,498,077 B2

SEMICONDUCTOR DEVICE AND METHOD OF MANUFACTURING SAME

BACKGROUND OF THE INVENTION

1. Field of the Invention

The present invention relates to a semiconductor device such as DRAMs and a method of manufacturing the same.

2. Description of the Background Art

FIG. 217 is a circuit diagram illustrating a construction of a memory cell of a DRAM. As shown in FIG. 217, a capacitor C1 and an NMOS transistor Q1 are disposed between terminals P1 and P2. One electrode (a cell plate electrode) of the capacitor C1 is connected to the terminal P1, and the other electrode (a storage node electrode) is connected to one electrode (a source or drain electrode) of the NMOS transistor Q1. The gate of the NMOS transistor Q1 is connected to a terminal P3, and the back gate is connected to a terminal P4. In general, the terminal P1 is provided with a fixed potential, the terminal P2 is connected to a bit line, the terminal P3 is connected to a word line, and the terminal P4 serves as a terminal for setting the potential of a well region where the NMOS transistor Q1 is to be formed. Followings are examples of a memory cell element having a construction of "1 Tr (transistor)+1 capa (capacitor)" shown in FIG. 217.

FIG. 218 is a plan view illustrating a planar structure of a stack-type memory cell (Type 1). FIG. 219 is a sectional view taken along the line A1—A1 in FIG. 218.

Referring to these figures, an NMOS transistor Q1 and a capacitor C1 are formed within a P well region 22 in which elements are isolated by an isolation insulating film 23. The P well region 22 is selectively formed at an upper layer portion of a semiconductor substrate 21, as shown in FIG. 220. With a plurality of isolation insulating films 23, the P well region 22 is isolated transistor by transistor.

As shown in FIGS. 218 and 219, source/drain regions 31 and 32 are selectively formed in the surface of the P well region 22. A gate oxide films 33 and a gate electrode 34 are formed between the source/drain regions 31 and 32, and a sidewall 35 is formed on both side surfaces of the gate oxide film 33 and a gate electrode 34. The NMOS transistor Q1 is made up of the source/drain regions 31 and 32, gate oxide film 33, gate electrode 34 and sidewall 35.

A storage node electrode 41-1 is formed on the source/drain region 31 so as to be electrically connected thereto via a contact hole 40, an insulating film 42-1 is formed on the upper and side surfaces of the storage node electrode 41-1, and a cell plate electrode 43-1 is formed on the upper and side surfaces of the insulating film 42-1. The capacitor C1 is made of up the storage node electrode 41-1, insulating film 42-1 and cell plate electrode 43-1.

The storage node electrode 41-1 is of a plate structure having a square shape in plan configuration.

FIG. 221 is a plan view illustrating a planar structure of a stack-type memory cell (Type 2). FIG. 222 is a sectional view taken along the line A2—A2 in FIG. 221.

Referring to these figures, a storage node electrode 41-2 is formed on a source/drain region 31 of an NMOS transistor Q1 so as to be electrically connected thereto via a contact hole 40, an insulating film 42-2 is formed on the upper and side surfaces of the storage node electrode 41-2, and a cell plate electrode 43-2 is formed on the upper and side surfaces of the insulating film 42-2. A capacitor C1 is made up of the storage node electrode 41-2, insulating film 42-2 and cell plate electrode 43-2.

The storage node electrode 41-1 is of a cylindrical structure having a circular shape in plan configuration. The construction of the NMOS transistor Q1 is the same as that shown in FIGS. 218 and 219, and a description thereof is thus omitted.

FIG. 223 is a plan view illustrating a planar structure of a stack-type memory cell (Type 3). FIG. 224 is a sectional view taken along the line A3—A3 in FIG. 223.

Referring to these figures, a storage node electrode 41-3 is formed on a source/drain region 31 of an NMOS transistor Q1 so as to be electrically connected thereto via a contact hole 40, an insulating film 42-3 is formed on the upper and inner surfaces of the storage node electrode 41-3, and a cell plate electrode 43-3 is formed on the upper and inner surfaces of the insulating film 42-3. A capacitor C1 is made up of the storage node electrode 41-3, insulating film 42-3 and cell plate electrode 43-3.

The storage node electrode 41-3 has a hollow cylindrical structure having a circular shape in plan configuration, and the insulating film 42-3 and cell plate electrode 43-3 are formed within this cylindrical structure. The construction of the NMOS transistor Q1 is the same as that shown in FIGS. 218 and 219, and a description thereof is thus omitted.

FIG. 225 is a plan view illustrating a planar structure of a stack-type memory cell (Type 4). FIG. 226 is a sectional view taken along the line A4—A4 in FIG. 225.

Referring to these figures, a storage node electrode 41-4 is formed on a source/drain region 31 of an NMOS transistor Q1 so as to be electrically connected thereto via a contact hole 40, an insulating film 42-4 is formed so as to cover the convexoconcave part of the storage node electrode 41-4, and a cell plate electrode 43-4 is formed so as to cover the insulating film 42-4. A capacitor C1 is made up of the storage node electrode 41-4, insulating film 42-4 and cell plate electrode 43-4.

The storage node electrode 41-4 has a fin structure made up of a convex part having a large square shape in plan configuration and a concave part having a small area in plan configuration. This allows for a more junction capacitance. The construction of the NMOS transistor Q1 is the same as that shown in FIGS. 218 and 219, and a description thereof is thus omitted.

FIG. 227 is a sectional view illustrating a sectional structure of a trench-type memory cell (Type 1). As shown in the figure, a cell plate electrode 43-5 of trench structure is buried within a P well region 22. The cell plate electrode 43-5 is covered at its surroundings with an insulating film 42-5, and a source/drain region 63 is formed so as to cover the surroundings of the insulating film 42-5.

The source/drain region 63 functions as one electrode of the NMOS transistor Q1 and also functions as a storage node electrode of the capacitor C1. Otherwise, the construction of the NMOS transistor Q1 is the same as that shown in FIGS. 218 and 219, and a description thereof is thus omitted.

FIG. 228 is a sectional view illustrating a sectional structure of a trench-type memory cell (Type 2). As shown in the figure, a cell plate electrode 43-6 of trench structure is buried within a P well region 22. An insulating film 42-6 is formed so as to cover the side surface of the cell plate electrode 43-6, and a source/drain region 64 is formed so as to cover part of the surroundings of the insulating film 42-6.

The gate electrode 67 is partially buried in the P well region 22 and is isolated from the cell plate electrode 43-6 with an insulating region 70 interposed therebetween. A gate oxide film 66 is formed on one side surface of the gate electrode 67, and the side surface end of the gate electrode 67 overlaps in part the end of the source/drain region 64 via the gate oxide film 66.

A sidewall 68 is disposed above the P well region 22 via the gate oxide film 66 and is adjacent to the gate electrode 67. A source/drain region 65 is formed adjacent to the underside of the sidewall 68 in the P well region 22.

Thus, an NMOS transistor Q1 is made up of the source/drain regions 64 and 65, gate oxide film 66, gate electrode 67 and sidewall 68, and a capacitor C1 is made up of the source/drain region 64, insulating film 42-5 and insulating film 42-6. That is, the source/drain region 64 functions as one electrode of the NMOS transistor Q1 and also functions as a storage node electrode of the capacitor C1.

FIG. 229 is a plan view illustrating a planar structure of a stack-type memory cell (Type 5). FIG. 230 is a sectional view taken along the line A5—A5 in FIG. 229.

Referring to these figures, a storage node electrode 41-7 is formed on a source/drain region 31 of an NMOS transistor Q1 so as to be electrically connected thereto via a contact hole 40, an insulating film 42-7 is formed on the upper and side surfaces of the storage node electrode 41-7, and a cell plate electrode 43-7 is formed on the upper and side surfaces of the insulating film 42-7. A capacitor C1 is made up of the storage node electrode 41-7, insulating film 42-7 and cell plate electrode 43-7.

The storage node electrode 41-7 is of a cylindrical structure having a circular shape in plan configuration and it has rough upper and side surfaces. The construction of the NMOS transistor Q1 is the same as that shown in FIGS. 218 and 219, and a description thereof is thus omitted.

FIG. 231 is a plan view illustrating a planar structure of a stack-type memory cell (Type 6). FIG. 232 is a sectional view taken along the line A6—A6 in FIG. 231.

Referring to these figures, a storage node electrode 41-8 is formed on a source/drain region 31 of an NMOS transistor Q1 so as to be electrically connected thereto via a contact hole 40, an insulating film 42-8 is formed on the upper surface and inner side surface of the storage node electrode 41-8, and a cell plate electrode 43-8 is formed on the upper surface and inner side surface of the insulating film 42-8. A capacitor C1 is made up of the storage node electrode 41-8, insulating film 42-8 and cell plate electrode 43-8.

The storage node electrode 41-8 is of a hollow cylindrical structure having a circular shape in plan configuration and it has rough upper and side surfaces. The insulating film 42-8 and cell plate electrode 43-8 are disposed in this hollow cylinder. The construction of the NMOS transistor Q1 is the same as that shown in FIGS. 218 and 219, and a description thereof is thus omitted.

FIG. 233 is a plan view illustrating a planar structure of a stack-type memory cell (Type 7). FIG. 234 is a sectional view taken along the line A7—A7 in FIG. 233.

Referring to these figures, a storage node electrode 41-9 is formed on a source/drain region 31 of an NMOS transistor Q1 so as to be electrically connected thereto via a contact hole 40, an insulating film 44-9 is formed on the upper and side surfaces of the storage node electrode 41-9, and a cell plate electrode 43-9 is formed on the upper and inner surfaces of the insulating film 44-9. A capacitor C1 is made up of the storage node electrode 41-9, insulating film 44-9 and cell plate electrode 43-9.

The insulating film 44-9 is formed from a material having a relatively high relative dielectric constant k. Examples of materials having a high relative dielectric constant are $SiON$, $Si_3N_4$, $Al_2O_3$, $ZrO_2$, $HfO_2$, $Ta_2O_5$, $La_2O_3$, $TiO_2$, and BAS-rTiO$_3$ (BST).

The storage node electrode 41-9 is of a cylindrical structure having a circular shape in plan configuration. The construction of the NMOS transistor Q1 is the same as that shown in FIGS. 218 and 219, and a description thereof is thus omitted.

FIG. 235 is a plan view illustrating a planar structure of a stack-type memory cell (Type 8). FIG. 236 is a sectional view taken along the line A8—A8 in FIG. 235.

Referring to these figures, a storage node electrode 41-10 is formed on a source/drain region 31 of an NMOS transistor Q1 so as to be electrically connected thereto via a contact hole 40, an insulating film 44-10 is formed on the upper surface and inner side surface of the storage node electrode 41-10, and a cell plate electrode 43-10 is formed on the upper surface and inner side surface of the insulating film 44-10. A capacitor C1 is made up of the storage node electrode 41-10, insulating film 44-10 and cell plate electrode 43-10.

Like the insulating film 44-9, the insulating film 44-10 is formed from a material having a relatively high relative dielectric constant k. The storage node electrode 41-10 is of a hollow cylindrical structure having a circular shape in plan configuration. The storage node electrode 44-10 and cell plate electrode 43-10 are formed within this hollow cylinder. The construction of the NMOS transistor Q1 is the same as that shown in FIGS. 218 and 219, and a description thereof is thus omitted.

FIG. 237 is a sectional view illustrating a sectional structure of a trench-type memory cell (Type 3). As shown in the figure, an insulating film 44-11 is disposed between a cell plate electrode 43-11 and source/drain region 63. Like the insulating films 44-9 and 44-10, the insulating film 44-11 is formed from a material having a relatively high relative dielectric constant k. Otherwise, the construction of this memory cell is the same as that shown in FIG. 106, and a description thereof is thus omitted.

FIG. 238 is a sectional view illustrating a sectional structure of a trench-type memory cell (Type 4). As shown in the figure, an insulating film 44-12 is disposed between a cell plate electrode 43-12 and source/drain region 64. Like the insulating films 44-9 to 44-11, the insulating film 44-12 is formed from a material having a relatively high relative dielectric constant k. Otherwise, the construction of this memory cell is the same as that shown in FIG. 106, and a description thereof is thus omitted.

FIG. 239 is a plan view illustrating a planar structure of a stack-type memory cell (Type 9). FIG. 240 is a sectional view taken along the line A9—A9 in FIG. 239. As shown in these figures, an insulating film 44-13 is disposed between a storage node electrode 41-13 and cell plate electrode 43-13. Like the insulating films 44-9 to 44-12, the insulating film 44-13 is formed from a material having a relatively high relative dielectric constant k. Otherwise, the construction of this memory cell is the same as that shown in FIGS. 229 and 230, and a description thereof is thus omitted.

FIG. 241 is a plan view illustrating a planar structure of a stack-type memory cell (Type 10). FIG. 242 is a sectional view taken along the line A10—A10 in FIG. 241. As shown in these figures, an insulating film 44-14 is disposed between a storage node electrode 41-14 and cell plate electrode 43-14. Like the insulating films 44-9 to 44-13, the insulating film 44-14 is formed from a material having a relatively high relative dielectric constant k. Otherwise, the construction of this memory cell is the same as that shown in FIGS. 231 and 232, and a description thereof is thus omitted.

FIGS. 243 to 251 are sectional views illustrating a method of manufacturing a memory cell element of "1 Tr+1 capa type." Referring to these figures, a method of manufacturing a memory cell element having a memory capacitor with a plate structure that is the basis for stack-type ones (see FIGS. 218 and 219) will be described hereinafter with emphasis on the capacitor making process.

Referring to FIG. 243, the elements on a semiconductor substrate are isolated by an isolation insulating film 23, and boron ions are implanted (due to diffusion) at an energy of 300 keV and a dose of $1\times10^{13}/cm^2$, thereby to form a P well region 22. Then, boron ions are successively implanted at an energy of 120 keV and a dose of $5\times10^{12}/cm^2$, then at an energy of 30 keV and a dose of $5\times10^{12}/cm^2$, thereby to form a channel region (not shown).

Referring to FIG. 244, a gate oxide film 33 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 33. By using the gate electrode 34 as a mask, phosphorus ions are implanted at an energy of 30 keV and a dose of $1\times10^{14}/cm^2$. Further, a sidewall 35 composed of a silicon oxide film having a width of 5 to 15 nm is formed on the both side surfaces of the gate electrode 34. By using the gate electrode 34 and sidewall 35 as a mask, arsenic ions are implanted at an energy of 10 keV and a dose of $1\times10^{14}/cm^2$, thereby to obtain source/drain regions 31 and 32.

This results in an NMOS transistor Q1 comprising the source/drain regions 31, 32, gate oxide film 33, gate electrode 34 and sidewall 35.

Referring to FIG. 245, an interlayer insulating film 24 is deposited on the entire surface, and a patterned resist 25 is then formed on the interlayer insulating film 24. By using the resist 25 as a mask, the interlayer insulating film 24 is selectively etched away, thereby to obtain a contact hole 40 having a diameter of 0.2 μm and extending through the interlayer insulating film 24.

Referring to FIG. 246, the resist 25 is removed and a (doped) polysilicon layer 45 is then deposited in a thickness of 500 nm on the entire surface.

Referring to FIG. 247, by using a patterned resist 26 as a mask, the polysilicon layer 45 is etched away to obtain a storage node electrode 41. The resist 26 is then removed as shown in FIG. 248.

Referring to FIG. 249, an insulating film 46 and a polysilicon layer 47 are successively formed on the entire surface. For instance, the insulating film 46 may be of a dual structure which comprises $SiO_2$ having a thickness of 7.5 nm and $Si_3N_4$ having a thickness of 7.5 nm. Alternatively, it may be $TaO_5$ having a thickness of 15 nm, or BST having a thickness of 15 nm. The polysilicon layer 47 is formed in a thickness of 200 nm.

Referring to FIG. 250, a patterned resist 27 is formed on the polysilicon layer 47.

Referring to FIG. 251, by using the resist 27 as a mask, the insulating film 46 and polysilicon layer 47 are selectively removed to obtain an insulating film 42 and a cell plate electrode 43, and the resist 27 is then removed. This results in a memory cell element having plate type memory capacitors (41 to 43).

Various parameters that determine operating characteristics of an NMOS transistor Q1 used in a memory cell element are determined in well-balance taking mutual tradeoff into consideration. Tradeoff factors to be discussed here are (i) relaxation of gate edge field, (ii) suppression of threshold voltage rise, (iii) assurance of resistance to punch-through, and (iv) leak current reduction (relaxation of junction capacitance).

FIG. 252 is a sectional view illustrating a sectional structure of an NMOS transistor having an LDD (lightly doped drain) structure. As shown in the figure, LDD regions 31b and 32b having a low impurity concentration are disposed at an edge proximate region of a gate electrode 34 in source/drain regions 31 and 32. The source/drain regions 31 and 32 are formed by the LDD regions 31b and 32b, together with source/drain primary regions 31a and 32a.

This LDD structure can exhibit the best effect on relaxation of gate edge field, whereas it is less effective on suppression of threshold voltage rise and on leak current reduction, and it acts negatively on assurance of resistance to punch-through.

FIG. 253 is a sectional view illustrating a sectional structure of an NMOS transistor having a DDD (double doped drain) structure. As shown in the figure, a source/drain region 31 (32) is made up of a high concentration region 31c (32c) and a low concentration region 31d (32d) that are formed by double diffusion. The high concentration region 31c is formed at a relatively shallow region except for a gate edge proximate region, and the low concentration region 31d is formed at a relatively deep region of the gate edge proximate region and at relatively deep region except for the gate edge proximate region.

This DDD structure exhibits the best effect on relaxation of gate edge field and provides a relatively good result on leak current reduction, whereas it is less effective on suppression of threshold voltage rise and acts negatively on assurance of resistance to punch-through, similarly to the LDD structure.

Thus, the usual LDD structure and DDD structure suffer from the disadvantage that these are unsuitable for assurance of resistance to punch-through.

FIG. 254 is a sectional view illustrating a sectional structure of an NMOS transistor having an LDD structure employing a channel dope region. As shown in the figure, in addition to the LDD structure, a P type channel dope region 38 is disposed so as to overlap in part a lower layer of a source/drain primary region 31a (32a) and overlap the lowermost part of an LDD region 31b (32b).

The LDD structure employing the channel dope region exhibits the best effect on assurance of resistance to punch-through and exhibits a relatively good effect on relaxation of gate edge field, whereas it acts negatively on suppression of threshold voltage rise and on leak current reduction.

FIG. 255 is a sectional view illustrating a sectional structure of an NMOS transistor having a DDD structure employing a channel dope region. As shown in the figure, in addition to the DDD structure, a P type channel dope region 39 is disposed so as to overlap in part a low concentration region 31d (32d).

The DDD structure employing the channel dope region exhibits the best effect on assurance of resistance to punch-through and exhibits a relatively good effect on relaxation of gate edge field, whereas it acts negatively on suppression of threshold voltage rise and on leak current reduction.

Thus, the LDD structure and DDD structure, each employing the channel dope region, suffer from the disadvantage that these structures are unsuitable for leak current reduction and suppression of threshold voltage rise.

FIG. 256 is a sectional view illustrating a sectional structure of an NMOS transistor having an LDD structure employing a local channel dope region. As shown in the figure, in addition to the LDD structure, a P type local channel dope region 48 is disposed under a gate electrode 34, without overlapping source/drain regions 31 and 32.

The LDD structure employing the local channel dope region exhibits a relatively good effect on assurance of resistance to punch-through and relaxation of gate edge field, and it can be arranged such that this structure does not act negatively on leak current reduction, but acts negatively on suppression of threshold voltage rise.

FIG. 257 is a sectional view illustrating a sectional structure of an NMOS transistor having a DDD structure employing a local channel dope region. As shown in the figure, in addition to the DDD structure, a P type local channel dope region 49 is disposed under a gate electrode 34 in little or no overlap relationship with source/drain regions 31 and 32.

The DDD structure employing the local channel dope region exhibits a relatively good effect on assurance of resistance to punch-through, relaxation of gate edge field, and leak current reduction, whereas it acts negatively on suppression of threshold voltage rise.

Thus, the LDD structure and DDD structure, each employing the local channel dope region, suffer from the disadvantage that these are unsuitable for suppression of threshold voltage rise.

FIG. 258 is a sectional view illustrating a sectional structure of an NMOS transistor having an LDD structure employing a pocket region. As shown in the figure, in addition to the LDD structure, P type pocket regions 51 and 52 are disposed which respectively overlap source/drain regions 31, 32 and extend to a lower region of the source/drain regions 31, 32 and to a channel region in a P well region 22.

The LDD structure employing the pocket region exhibits the best effect on suppression of threshold voltage rise and exhibits a relatively good effect on assurance of resistance to punch-through and on relaxation of gate edge field, whereas it acts negatively on leak current reduction.

FIG. 259 is a sectional view illustrating a sectional structure of an NMOS transistor having a DDD structure employing a pocket region. As shown in the figure, in addition to the DDD structure, P type pocket regions 56 and 57 are disposed which respectively overlap source/drain regions 31, 32 and extend to a lower region of the source/drain regions 31, 32 and to a channel region in a P well region 22.

The DDD structure employing the pocket region exhibits the best effect on suppression of threshold voltage rise and exhibits a relatively good effect on assurance of resistance to punch-through and on relaxation of gate edge field, whereas it acts negatively on leak current reduction.

Thus, the LDD structure and DDD structure, each employing the pocket region, suffer from the disadvantage that these structures are unsuitable for leak current reduction.

FIG. 260 is a sectional view illustrating a sectional structure of an NMOS transistor having an LDD structure employing a shallow pocket region. As shown in the figure, in addition to the LDD structure, P type shallow pocket regions 53 and 54 are disposed which respectively overlap mostly of source/drain regions 31 and 32, extend slightly to a channel region in a P well region 22, and have approximately the same forming depth as the source/drain regions 31 and 32.

The LDD structure employing the shallow pocket region exhibits a relatively good effect on suppression of threshold voltage rise, assurance of resistance to punch-through, and relaxation of gate edge field, and further, it does not act negatively on leak current reduction.

FIG. 261 is a sectional view illustrating a sectional structure of an NMOS transistor having a DDD structure employing a shallow pocket region. As shown in the figure, in addition to the DDD structure, P type shallow pocket regions 58 and 59 are disposed which respectively overlap mostly of source/drain regions 31 and 32, extend slightly to a channel region in a P well region 22, and have a slightly shallower forming depth than the source/drain regions 31 and 32.

The DDD structure employing the shallow pocket region exhibits a relatively good effect on suppression of threshold voltage rise, assurance of resistance to punch-through, and relaxation of gate edge field, and further, it does not act negatively on leak current reduction.

Thus, the LDD structure and DDD structure, each employing the shallow pocket region, suffer from the disadvantage that these fail to exhibit the best characteristic in all the tradeoff factors.

In memory cell elements of DRAMs etc., when less leak current is desired only in a source/drain region to be connected to a storage node electrode of a memory capacitor, it can be considered to increase the forming depth of the source/drain region on the storage node side, as shown in FIGS. 262 and 263.

In the case of FIG. 262, a source/drain region 31 is made up of partial source/drain regions 31e and 31f, and the forming depth of the partial source/drain region 31f is increased.

In the case of FIG. 263, a source/drain region 31 (32) is made up of partial source/drain regions 31e (32e) and 31g (32g), and the forming depth of the partial source/drain region 31g is increased.

Thus, the source/drain regions 31f and 31g having the increased forming depth enables to improve the characteristic about leak current reduction.

If assurance of resistance to punch-through is satisfied, it is unnecessary to form the source/drain regions in the same fashion as with FIG. 263. That is, the partial source/drain region 31g having the increased forming depth may be formed only in the source/drain region 31 on the storage node side as shown in FIG. 262.

FIGS. 264 to 268 are sectional views illustrating a sequence of steps in a method of manufacturing a memory cell element in which the forming depth of a source/drain region on the storage node side is increased. The method will be described hereinafter by referring to these figures.

Referring to FIG. 264, after the elements on a semiconductor substrate are isolated by an isolation insulating film 23, a P well region 22 is formed in the same manner as the step in FIG. 243, and a channel region (not shown) is then formed.

Referring to FIG. 265, in the same manner as the step shown in FIG. 244, there is obtained an NMOS transistor Q1 comprising a source/drain partial region 31e, source/drain region 32, gate oxide film 33, gate electrode 34 and sidewall 35.

Referring to FIG. 266, in the same manner as the step shown in FIG. 245, an interlayer insulating film 24 is deposited on the entire surface, thereby obtaining a contact hole 40 extending through the interlayer insulating film 24.

Referring to FIG. 267, an N type impurity ions 49 such as of phosphorus is implanted from the contact hole 40, thereby to form a source/drain partial region 31f.

Referring to FIG. 268, a storage node electrode 41 is obtained in the same manner as shown in the steps in FIGS. 246 to 248.

Further, the steps shown in FIGS. 249 to 251 are performed to complete a memory cell element shown in FIG. 263.

As described above, the MOS transistor of the LDD structure or DDD structure employing the shallow pocket region enables to obtain such characteristics as not to cause any negative actions on relaxation of gate edge field, suppression of threshold voltage rise, assurance of resistance to punch-through, and leak voltage reduction (relaxation of junction capacitance).

On the other hand, MOS transistors used in memory cells of DRAMs call for the following characteristics:

i) relatively good characteristic about relaxation of gate edge field;

ii) characteristic in such degree as to cause no negative action about suppression of threshold voltage rise;

iii) the best characteristic about assurance of resistance to punch-through; and iv) the best characteristic about leak current reduction.

There has been a problem in that the mentioned characteristics cannot be realized by employing any of the channel dope region, local channel dope region, pocket region and shallow pocket region in MOS transistor structures such as the LDD structure and DDD structure.

SUMMARY OF THE INVENTION

According to a first aspect of the invention, a semiconductor device comprises: a transistor forming region of a first conductivity type disposed in a semiconductor substrate; first and second source/drain regions of a second conductivity type disposed selectively in the surface of the transistor forming region, the transistor forming region between the first and second source/drain regions being defined as a channel region; a gate insulating film disposed on the channel region; a gate electrode disposed on the gate insulating film; and a transistor characteristic adjusting region of the first conductivity type disposed in the transistor forming region so as to at least overlap in part the channel region, wherein an insulating gate type transistor is defined by the first and second source/drain regions, the channel region, the gate insulating film, the gate electrode and the transistor characteristic adjusting region, and the first conductivity type impurity concentration of the transistor characteristic adjusting region and the second conductivity type impurity concentration of the first and second source/drain regions are set so as to satisfy the following conditions: $10^{18} \leq C1 \leq 10^{19}/cm^3$ . . . (I); and $C2/10 \leq C1 \leq C2$ . . . (II) where C1 is the maximum value of the first conductivity type impurity concentration of the transistor characteristic adjusting region except for a surface proximate region of the transistor forming region, and C2 is the maximum value of the second conductivity type impurity concentration of the first and second source/drain regions except for the surface proximate region.

According to a second aspect of the invention, the semiconductor device of the first aspect is characterized in that the transistor characteristic adjusting region includes a channel dope region disposed at a predetermined depth from the surface of the transistor forming region so as to overlap the channel region in a plane view over substantially the entire surface of the channel region.

According to a third aspect of the invention, the semiconductor device of the second aspect is characterized in that the channel dope region includes a normal channel dope region extending over substantially the entire surface of the transistor forming region in a plane view.

According to a fourth aspect of the invention, the semiconductor device of the second aspect is characterized in that the channel dope region includes a local channel dope region disposed in little or no overlap relationship with the first and second source/drain regions.

According to a fifth aspect of the invention, the semiconductor device of the first aspect is characterized in that the transistor characteristic adjusting region includes first and second pocket regions overlapping substantially the whole of the first and second source/drain regions and extending from the first and second source/drain regions to part of the channel region.

According to a sixth aspect of the invention, the semiconductor device of the fifth aspect is characterized in that the first and second pocket regions include first and second normal pocket regions extending also to the underside of the first and second source/drain regions.

According to a seventh aspect of the invention, the semiconductor device of the fifth aspect is characterized in that the first and second pocket regions include first and second shallow pocket regions having approximately the same forming depth as the first and second source/drain regions.

According to an eighth aspect of the invention, the semiconductor device of the first aspect is characterized in that the transistor characteristic adjusting region includes: a first partial transistor characteristic adjusting region disposed at a predetermined depth in the transistor forming region; and a second partial transistor characteristic adjusting region disposed in the transistor forming region so as to be deeper than the first partial transistor characteristic adjusting region.

According to a ninth aspect of the invention, the semiconductor device of the first aspect is characterized in that the transistor characteristic adjusting region includes: a first channel dope region overlapping the channel region in a plane view over substantially the entire surface of the channel region; a second channel dope region disposed at a region deeper than the first channel dope region so as to overlap the channel region in a plane view over substantially the entire surface of the channel region; and first and second pocket regions overlapping substantially the whole of the first and second source/drain regions and extending from the first and second source/drain regions to the channel region.

According to a tenth aspect of the invention, the semiconductor device of the first aspect is characterized in that the first and second source/drain regions have in their surfaces first and second high impurity concentration regions, respectively, having a higher impurity concentration than other regions, the first and second high impurity concentration regions being spaced a predetermined distance away from the channel region.

According to an eleventh aspect of the invention, the semiconductor device of the first aspect further comprises a capacitor provided with one electrode electrically connected to one of the first and second source/drain regions.

According to a twelfth aspect of the invention, a method of manufacturing a semiconductor device comprises the steps of: (a) providing a semiconductor substrate having a transistor forming region of a first conductivity type; (b) forming a gate insulating film and a gate electrode on a channel region in the transistor forming region; (c) selectively introducing impurity of a second conductivity type into the transistor forming region, to form first and second source/drain regions of the second conductivity type sandwiching the channel region and being adjacent to the channel region; and (d) introducing impurity of the first conductivity type into the transistor forming region to form a transistor characteristic adjusting region of the first conductivity type so as to at least overlap in part the channel region, wherein an insulating gate type transistor is defined by the first and second source/drain regions, the channel region, the gate insulating film, the gate electrode and the transistor characteristic adjusting region, and the first conductivity type impurity concentration of the transistor characteristic adjusting region and the second conductivity type impurity concentration of the first and second source/drain regions are set so as to satisfy the following conditions: $10^{18} \leq C1 \leq 10^{19}/cm^3$ ... (I); and $C2/10 \leq C1 \leq C2$ ... (II), where C1 is the maximum value of the first conductivity type impurity concentration of the transistor characteristic adjusting region except for a surface proximate region of the transistor forming region, and C2 is the maximum value of the second conductivity type impurity concentration of the first and second source/drain regions except for the surface proximate region.

According to a thirteenth aspect of the invention, the method of the twelfth aspect is characterized in that the step (d) includes the step of forming a channel dope region as the transistor characteristic adjusting region overlapping the channel region in a plane view over substantially the entire surface of the channel region, at a predetermined depth from the surface of the transistor forming region.

According to a fourteenth aspect of the invention, the method of the thirteenth aspect is characterized in that: the channel dope region includes a normal channel dope region formed over substantially the entire surface of the transistor forming region in a plane view; and the step (d) includes the step of introducing impurity of the first conductivity type into the entire surface of the transistor forming region.

According to a fifteenth aspect of the invention, the method of the thirteenth aspect is characterized in that: the channel dope region includes a local channel dope region formed in little or no overlap relationship with the first and second source/drain regions; and the step (d) includes the step of selectively introducing impurity of the first conductivity type into the channel region in the transistor forming region.

According to a sixteenth aspect of the invention, the method of the twelfth aspect is characterized in that: the transistor characteristic adjusting region includes first and second pocket regions overlapping substantially the whole of the first and second source/drain regions and extending from the first and second source/drain regions to the channel region; and the step (d) includes the step, after the step (b), of forming the first and second pocket regions by introducing impurity of the first conductivity type into the transistor forming region by using the gate electrode as a mask.

According to a seventeenth aspect of the invention, the method of the sixteenth aspect is characterized in that: the first and second pocket regions include first and second normal pocket regions extending also to the underside of the first and second source/drain regions; the step (c) includes a process of implanting ions of the second conductivity type at a first energy by using the gate electrode as a mask; and the step (d) includes a process of implanting ions of the first conductivity type at a second energy higher than the first energy by using the gate electrode as a mask.

According to an eighteenth aspect of the invention, the method of the sixteenth aspect is characterized in that: the first and second pocket regions include first and second shallow pocket regions having approximately the same forming depth as the first and second source/drain regions; and the process of introducing impurity of the first conductivity type in said step (d) includes a process of obliquely implanting impurity ions of the first conductivity type.

According to a nineteenth aspect of the invention, the method of the twelfth aspect is characterized in that: the transistor characteristic adjusting region includes a first partial transistor characteristic adjusting region formed at a predetermined depth in the transistor forming region and a second partial transistor characteristic adjusting region formed at a depth deeper than the first partial transistor characteristic adjusting region in the transistor forming region; the step (d) includes the steps of (d-1) implanting impurity ions of the first conductivity type to form the first partial transistor characteristic adjusting region, and (d-2) implanting impurity ions of the first conductivity type to form the second partial transistor characteristic adjusting region; and that ion implantation conditions of the steps (d-1) and (d-2) is set so that the second partial transistor characteristic adjusting region is deeper than the first partial transistor characteristic adjusting region.

According to a twentieth aspect of the invention, the method of the twelfth aspect is characterized in that: the transistor characteristic adjusting region includes a first channel dope region overlapping substantially the entire surface of the channel region in a plane view, a second channel dope region formed at a region deeper than the first channel dope region so as to overlap substantially the entire surface of the channel region in a plane view, and first and second pocket regions overlapping substantially the whole of the first and second source/drain regions and extending from the first and second source/drain regions to the channel region; and that the step (d) includes the steps of: (d-1) implanting impurity ions of the first conductivity type to form the first channel dope region; (d-2) implanting impurity ions of the first conductivity type to form the second channel dope region; and (d-3) implanting, after the step (b), impurity ions of the first conductivity type by using the gate electrode as a mask, to form the first and second pocket regions.

According to a twenty-first aspect of the invention, the method of the twelfth aspect is characterized in that: the first and second source/drain regions have in their surfaces first and second high impurity concentration regions, respectively, having a higher impurity concentration than other regions, each of first and second high impurity concentration regions being spaced a predetermined distance away from the channel region; that the step (c) includes the steps of: (c-1) implanting, after the step (b), impurity ions of the first conductivity type by using the gate electrode as a mask, to form the first and second source/drain regions of the first conductivity type; and (c-2) implanting, after the step (c-1), impurity ion of the first conductivity type by using the gate electrode as a mask, to form the first and second high impurity concentration regions in the surface of the first and second source/drain regions; and that ion implantation conditions of the step (c-2) is set so that the first and second high impurity concentration regions are spaced the predetermined distance away from the channel region.

According to a twenty-second aspect of the invention, the method of the twelfth aspect is characterized in that: the first and second source/drain regions have in their surfaces first and second high impurity concentration regions, respectively, having a higher impurity concentration than other regions, each of first and second high impurity concentration regions being spaced a predetermined distance away from the channel region, the method further comprising the step of: (e) forming a sidewall on both side surfaces of the gate electrode, wherein the step (c) includes the steps of: (c-1) implanting, after the step (b) and before the step (e), impurity ions of the first conductivity type by using the gate electrode as a mask, to form the first and second source/drain regions of the first conductivity type; and (c-2) implanting, after the step (e), impurity ions of the first conductivity type by using the gate electrode and the sidewall as a mask, to form the first and second high impurity concentration regions of the first conductivity type.

According to a twenty-third aspect of the invention, the method of the twelfth aspect is characterized in that: at least one of the first and second source/drain regions has in its surface a high impurity concentration region having a higher impurity concentration than other regions, the high impurity concentration region being spaced a predetermined distance away from the channel region, the method further comprising the step of: (f) forming, after the step (c), a mask layer on the entire surface, the mask layer having an opening above part of at least one of the first and second source/drain regions, wherein the step (c) includes the steps of: (c-1) implanting, after the step (b) and before the step (f), impurity ions of the first conductivity type by using the gate electrode as a mask, to form the source/drain regions; and (c-2) implanting, after the step (f), impurity ions of the first conductivity type from the opening of the mask layer, to form the high impurity concentration region in a region including the surface of the source/drain regions.

According to a twenty-fourth aspect of the invention, the method of the twenty-third aspect further comprises the steps of: (g) filling, after the step (c-1), the opening with an impurity diffusion source of the second conductivity type; and (h) diffusing a second impurity from the impurity diffusion source into the surface of the high impurity concentration region, to form an impurity diffusion region.

According to a twenty-fifth aspect of the invention, the method of the twelfth aspect further comprises the step of (i) electrically connecting one electrode to one of the first and second source/drain regions to form a capacitor.

The insulating gate type transistor of a semiconductor device in the first aspect satisfies the conditions (I) and (II), so that the depletion layer also extends into the first and second source/drain regions at the time of operation. This provides a good characteristic about assurance of resistance to punch-through and a reduction in leak current from the bottom of the first and second source/drain regions.

In the semiconductor device of the second aspect, the above-mentioned good characteristics can be obtained by forming, as a transistor characteristic adjusting region, a channel dope region overlapping mostly of the channel region having a strong relationship with the characteristic of the insulating gate type transistor.

In the semiconductor device of the third aspect, the formation of the normal channel dope region is relatively easy because it is formed over the entire surface of the transistor forming region.

In the semiconductor device of the fourth aspect, the formation of the local channel dope region provides a better characteristic about leak current reduction.

In the semiconductor device of the fifth aspect, an increase in threshold voltage can be suppressed effectively by forming the first and second pocket regions to be partially formed only in the channel region, as a transistor characteristic adjusting region.

In the semiconductor device of the sixth aspect, the normal pocket region is formed so as to extend to a lower part than the first and second source/drain regions. Thereby, the normal pocket region can easily extend to part of the channel region.

In the semiconductor device of the seventh aspect, the shallow pocket region has approximately the same forming depth as the first and second source/drain regions. This permits a further effect of reducing leak current from the bottom of the first and second source/drain regions.

In the semiconductor device of the eighth aspect, a better characteristic about assurance of resistance to punch-through and about reduction in leak current from the bottom of the first and second source/drain regions can be obtained by individually setting the impurity concentration of the first and second partial transistor characteristic adjusting regions.

In the semiconductor device of the ninth aspect, a better characteristic about threshold voltage control, assurance of resistance to punch-through and a reduction in leak current from the bottom of the first and second source/drain regions, can be obtained by individually setting the impurity concentration of the first and second channel dope regions and that of the first and second pocket regions.

In the semiconductor device of the tenth aspect, the presence of the first and second high impurity concentration regions allows for a reduction in the resistance value of the current path on the surface of the transistor forming region, without adversely affecting assurance of resistance to punch-through and leak current reduction.

In the semiconductor device of the eleventh aspect, it is able to provide a memory cell comprising an insulating gate type transistor having a good characteristic about assurance of resistance to punch-through and leak current reduction, and a capacitor for storage.

In the insulating gate type transistor obtained by the method of manufacturing a semiconductor device in the twelfth aspect, the conditions (I) and (II) are satisfied so that a depletion layer also extends into the first and second source/drain regions at the time of operation. It is therefore able to obtain a good characteristic about assurance of resistance to punch-through and about a reduction in leak current from the bottom of the first and second source/drain regions.

In the insulating gate type transistor obtained by the method of manufacturing a semiconductor device in the thirteenth aspect, the above-mentioned good characteristic can be obtained by forming, as a transistor characteristic adjusting region, the channel dope region of which flat region overlaps mostly of the channel region having a strong relationship with the characteristic of the insulating gate type transistor.

With the method of the fourteenth aspect, it is relatively easy to form the normal channel dope region by introducing the first impurity into the entire surface of the transistor forming region in the step (d).

In the insulating gate type transistor obtained by the method of the fifteenth aspect, a better characteristic about leak current reduction can be obtained by providing the local channel dope region.

In the insulating gate type transistor obtained by the method of the sixteenth aspect, an increase in threshold voltage can be suppressed effectively by forming the first and second pocket regions disposed only in part of the channel region, as a transistor characteristic adjusting region.

In the method of the seventeenth aspect, the first and second normal pocket regions extending to part of the channel region can be formed relatively with ease by the step (d) in which the first conductivity type ions are implanted at the second energy higher than the first energy by using the gate electrode as a mask.

In the method of the eighteenth aspect, the shallow pocket region of the insulating gate type transistor has approximately the same forming depth as the first and second source/drain regions. This permits a further effect of reducing leak current from the bottom of the first and second source/drain regions.

In the method of the nineteenth aspect, the insulating gate type transistor having a better characteristic about assurance of resistance to punch-through and about a reduction in leak current from the bottom of the first and second source/drain regions, can be obtained by the steps (d-1) and (d-2) of individually setting the impurity concentration of the first and second partial transistor characteristic adjusting regions.

In the method of the twentieth aspect, the insulating gate type transistor having a better characteristic about threshold voltage control, assurance of resistance to punch-through, and a reduction in leak current from the bottom of the first and second source/drain regions, can be obtained by the steps (d-1), (d-2) and (d-3) in which the impurity concentration of the first and second channel dope regions and that of the first and second pocket regions are set individually.

In the insulating gate type transistor of the twenty-first aspect, the presence of the first and second high impurity concentration regions allows for a reduction in the resistance value of the current path on the surface of the transistor forming region, without adversely affecting assurance of resistance to punch-through and leak current reduction.

With the method of the twenty-second aspect, the step (c-2) is performed by providing an offset corresponding to the thickness from the channel region to the sidewall. This permits a precise formation of the first and second high impurity concentration regions spaced a predetermined distance from the channel region, respectively.

With the method of the twenty-third aspect, the step (c-2) is performed by providing an offset corresponding to the distance from the channel region to the opening. This permits a precise formation of the high impurity concentration region spaced a predetermined distance from the channel region.

With the method of the twenty-fourth aspect, it is relatively easy to obtain the source/drain regions of triple diffusion structure by the step (h) in which the impurity diffusion region is formed by allowing the second impurity to diffuse from the impurity diffusion source into the surface of the high impurity concentration region.

The method of the twenty-fifth aspect can provide a memory cell comprising the insulating gate type transistor having a good characteristic about assurance of resistance to punch-through and leak current reduction, and a capacitor for storage.

It is an object of the present invention to overcome the aforementioned problems by providing a semiconductor device having a MOS transistor capable of obtaining a good characteristic particularly about assurance of resistance to punch-through and about leak current reduction, as well as a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a sectional view illustrating a sectional structure of a stack-type memory cell (Type 4) in the first preferred embodiment;

FIG. 13 is a plan view illustrating a planar structure of a capacitor in FIG. 12;

FIG. 15 is a sectional view illustrating a sectional structure of a stack-type memory cell (Type 5) in the first preferred embodiment;

FIG. 16 is a plan view illustrating a planar structure of a capacitor in FIG. 15;

FIG. 31 is a schematic diagram illustrating the state of a depletion layer of source/drain regions at a gate electrode edge proximate region in the second preferred embodiment;

FIG. 35 is an explanatory diagram illustrating the situation of boron affecting the threshold value of an NMOS transistor in the third preferred embodiment;

FIG. 38 is a schematic diagram illustrating the state of a depletion layer of source/drain regions at a gate electrode edge proximate region in the first preferred embodiment;

FIG. 39 is a schematic diagram illustrating the state of a depletion layer of source/drain regions at a gate electrode edge proximate region in the fourth preferred embodiment;

FIGS. 57 to 66 are sectional views illustrating fifth to fourteenth aspects of the fifth preferred embodiment, respectively;

FIG. 80 is another diagram for explaining the effect of the seventh preferred embodiment;

FIG. 81 is another circuit diagram for explaining the effect of the seventh preferred embodiment;

FIGS. 85 to 104 are sectional views illustrating first to twentieth aspects of the seventh preferred embodiment, respectively;

FIGS. 105 to 128 are sectional views illustrating first to twenty-fourth aspects of a memory cell structure according to an eighth preferred embodiment;

FIG. 129 is a sectional view illustrating a method of manufacturing a memory cell structure of the first preferred embodiment, according to a ninth preferred embodiment;

FIGS. 130 to 141 are sectional views illustrating a sequence of steps in the method of the ninth preferred embodiment;

FIGS. 143 to 145 are sectional views illustrating a sequence of steps in the method of the tenth preferred embodiment;

FIG. 146 is a sectional view illustrating a method of manufacturing a memory cell structure of the second preferred embodiment, according to an eleventh preferred embodiment;

FIGS. 147 to 155 are sectional views illustrating a sequence of steps in the method of the eleventh preferred embodiment;

FIG. 156 is a sectional view illustrating a method of manufacturing a memory cell structure of the third preferred embodiment, according to a twelfth preferred embodiment;

FIGS. 157 to 161 are sectional views illustrating a sequence of steps in the method of the twelfth preferred embodiment;

FIG. 169 is a sectional view illustrating a method of manufacturing a memory cell structure of the fifth preferred embodiment, according to a fifteenth preferred embodiment;

FIGS. 170 to 173 are sectional views illustrating a sequence of steps in the method of the fifteenth preferred embodiment;

FIG. 174 is a sectional view illustrating a method of manufacturing a memory cell structure of the sixth preferred embodiment, according to a sixteenth preferred embodiment;

FIGS. 175 to 178 are sectional views illustrating a sequence of steps in the method of the sixteenth preferred embodiment;

FIGS. 191 to 195 are sectional views illustrating a sequence of steps in the method of the nineteenth preferred embodiment;

FIG. 196 is a sectional view illustrating a method of manufacturing a memory cell structure of the eighth preferred embodiment, according to a twentieth preferred embodiment;

FIG. 211 is a sectional view illustrating a method of manufacturing a memory cell structure of the eighth preferred embodiment, according to a twenty-second preferred embodiment;

FIG. 212 is a sectional view illustrating the method of the twenty-second preferred embodiment;

FIG. 217 is a circuit diagram illustrating a memory cell construction of a conventional DRAM;

FIG. 218 is a plan view illustrating a planar structure of a stack-type memory cell (Type 1);

FIG. 235 is a plan view illustrating a planar structure of a stack-type memory cell (Type 8);

FIG. 236 is a sectional view taken along the line A8—A8 in FIG. 235;

FIGS. 237 and 238 are sectional views illustrating a sectional structure of trench-type memory cells (Type 3 and Type 4), respectively;

FIG. 239 is a plan view illustrating a planar structure of a stack-type memory cell (Type 9);

FIG. 240 is a sectional view taken along the line A9—A9 in FIG. 239;

FIG. 241 is a plan view illustrating a planar structure of a stack-type memory cell (Type 10);

FIG. 242 is a sectional view taken along the line A10—A10 in FIG. 241;

FIGS. 243 to 251 are sectional views illustrating a conventional method of manufacturing a stack-type memory cell;

FIGS. 252 and 253 are sectional views illustrating a transistor of LDD structure;

FIG. 254 is a sectional view illustrating a transistor that has an LDD structure employing a channel dope region;

FIG. 255 is a sectional view illustrating a transistor that has a DDD structure employing a channel dope region;

FIG. 256 is a sectional view illustrating a transistor that has an LDD structure employing a local channel dope region;

FIG. 257 is a sectional view illustrating a transistor that has a DDD structure employing a local channel dope region;

FIG. 258 is a sectional view illustrating a transistor that has an LDD structure employing a pocket structure;

FIG. 259 is a sectional view illustrating a transistor that has a DDD structure employing a pocket structure;

FIG. 260 is a sectional view illustrating a transistor that has an LDD structure employing a shallow pocket structure;

FIG. 261 is a sectional view illustrating a transistor that has a DDD structure employing a shallow pocket structure;

FIGS. 262 and 263 are sectional views illustrating transistors (Type 1 and Type 2), respectively, in which a source/drain region on the storage node side has a multi-layer structure; and FIGS. 264 to 268 are sectional views illustrating a sequence of steps in a method of manufacturing a transistor having the structure shown in FIG. 262.

DESCRIPTION OF THE PREFERRED EMBODIMENTS

Principle

As stated in the conventional techniques, the MOS transistor of an LDD structure or DD structure employing a shallow pocket region can provide a relatively good characteristic whereby no negative action occurs on all the factors: relaxation of gate edge field; suppression of threshold voltage rise; assurance of resistance to punch-through; and leak current reduction (relaxation of junction capacitance).

However, MOS transistors used for memory cell elements of DRAMs are further required to exhibit the best characteristic about assurance of resistance to punch-through and leak current reduction.

Figure 213:
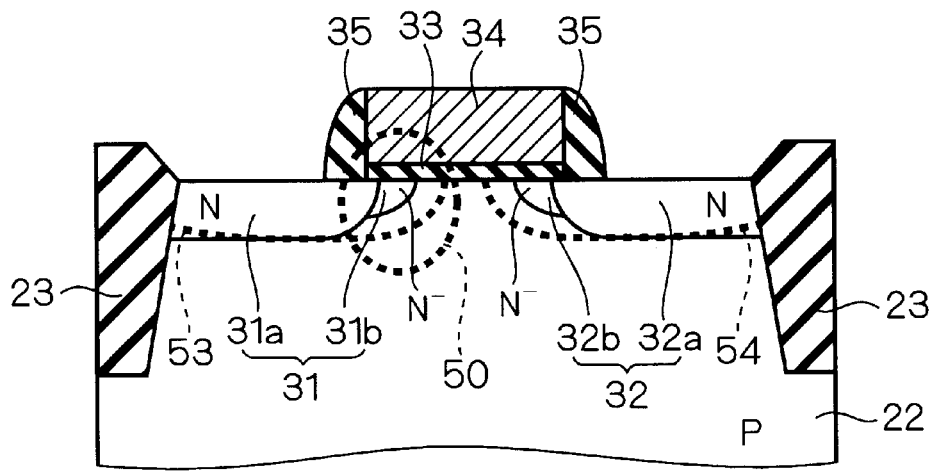
FIG. 213 is a diagram illustrating a transistor that has an LDD structure employing a shallow pocket.

Consider now the structure of FIG. 213 wherein a shallow pocket region is adopted for an LDD structure. In this structure, a depletion layer 61 of a source/drain end proximate region 50 is generated as shown in FIG. 214.

Figure 214:
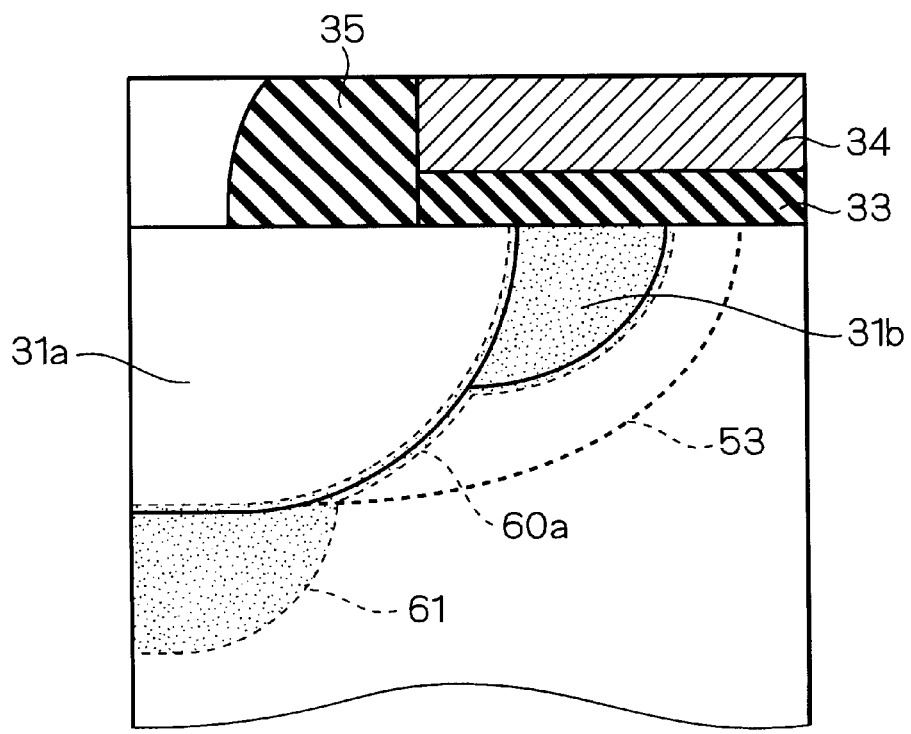
FIGS. 214 to 216 are diagrams for explaining a solution of a problem in a transistor that has an LDD structure employing a shallow pocket.

Referring to FIG. 214, at the interface between a source/drain primary region 31a and a shallow pocket region 53, the depletion layer 61 does not extend and becomes a thin region 60a. When an NMOS transistor operates, the thin region 60a becomes a region having a strong field. This region can suppress punch-through but suffers from the drawback of serving as a leak current source.

Figure 215:
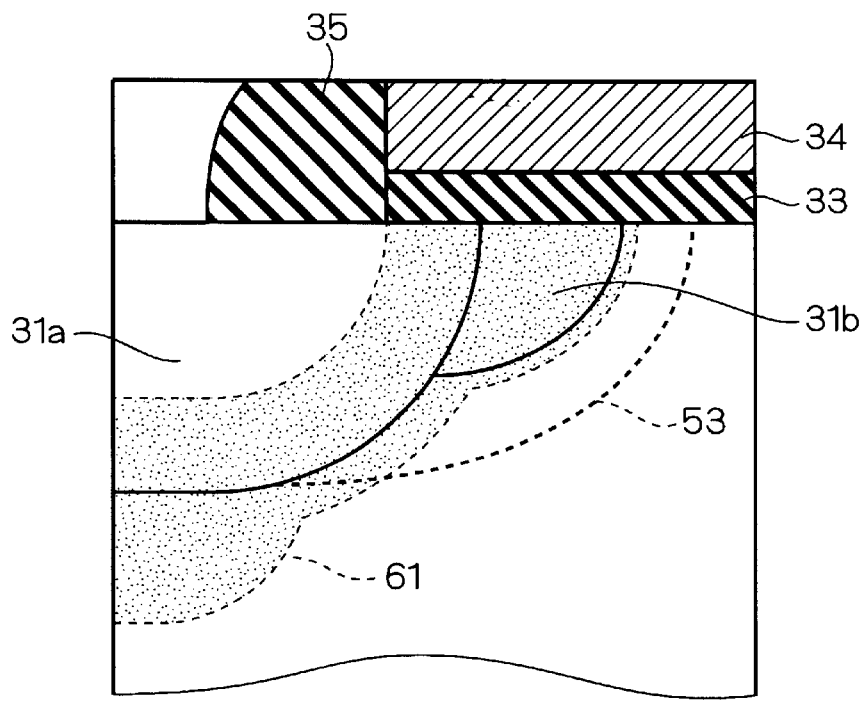
Figure 216:
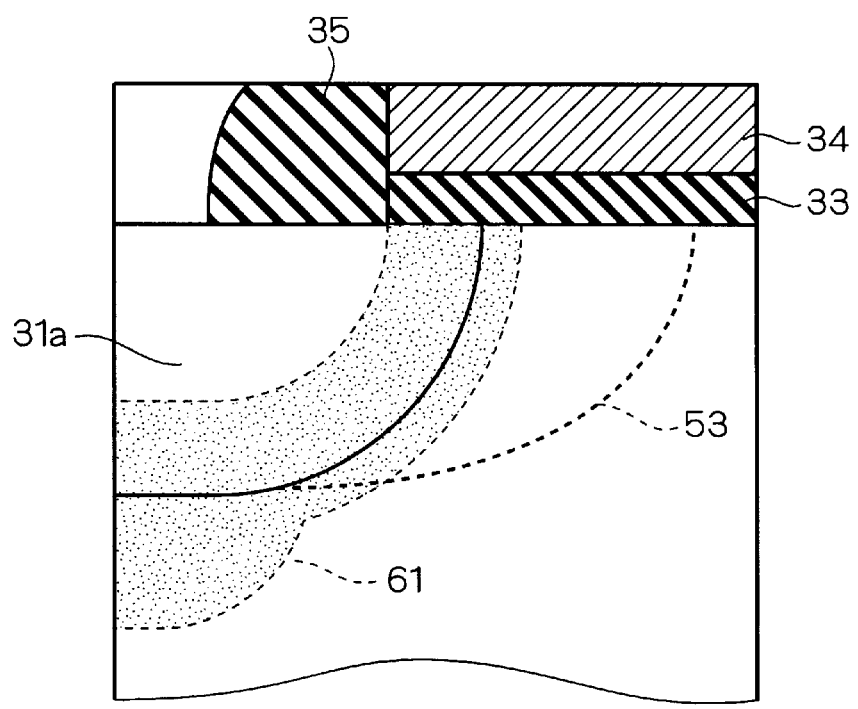
Figure 219:
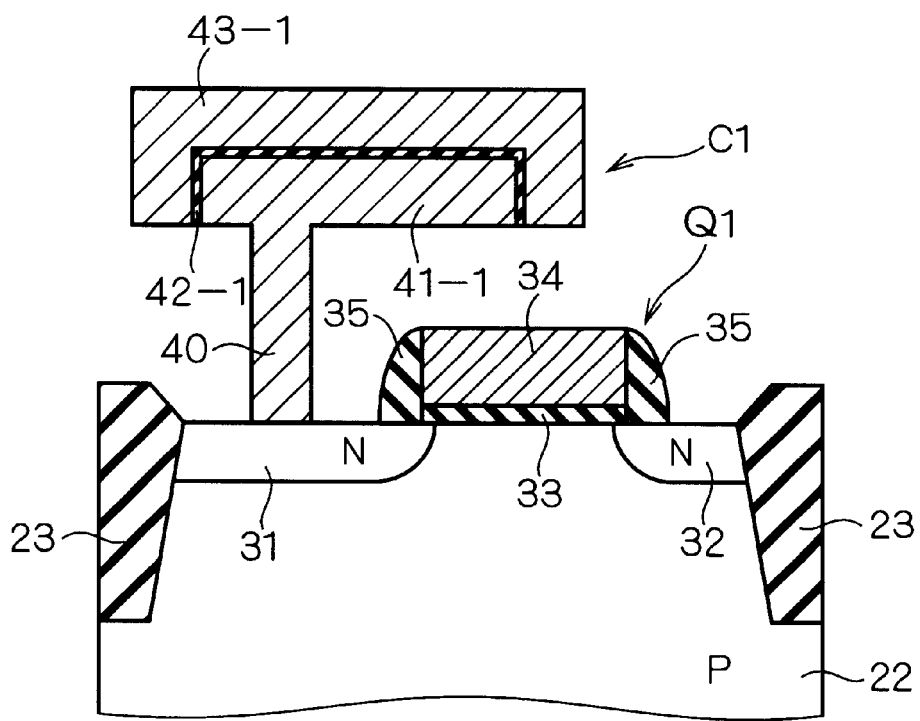
FIG. 219 is a sectional view taken along the line A1—A1 in FIG. 218.
Figure 220:
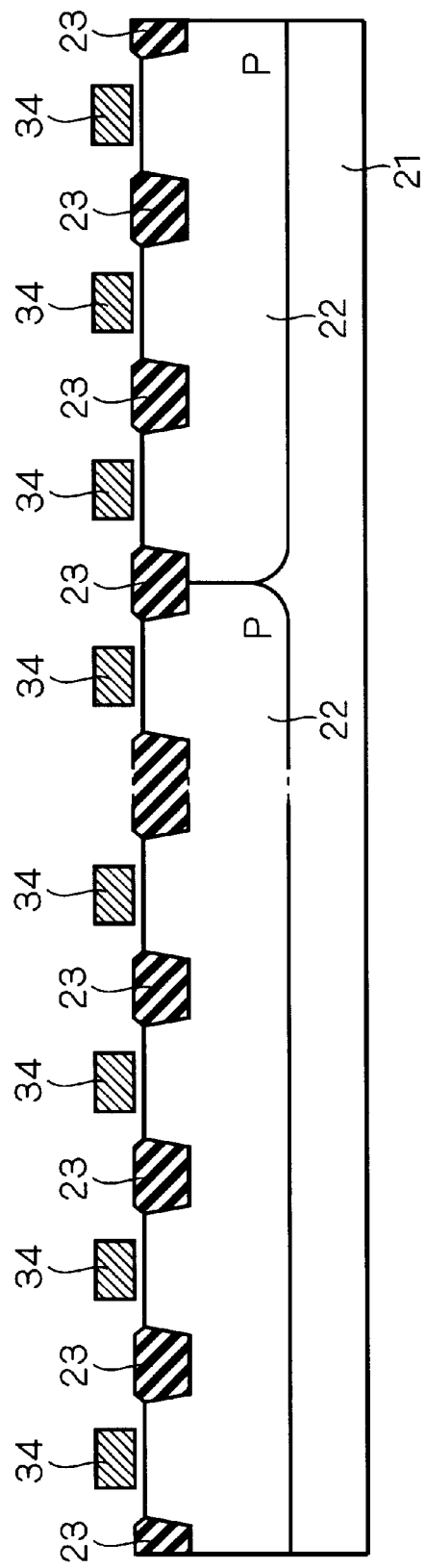
FIG. 220 is a schematic diagram of the outline of a well region.

As shown in FIG. 215, by arranging such that a depletion layer 61 extends into a source/drain primary region 31a, the thickness of the depletion layer 61 can be ensured to prevent an occurrence of a region having a strong field. Alternatively, it may be constructed such that no LDD region 31b is present as shown in FIG. 216.

Thus, a reduction in leak current can be optimized by determining the MOS transistor structure such that a depletion layer extends into a source/drain region.

First Preferred Embodiment

Figure 1:
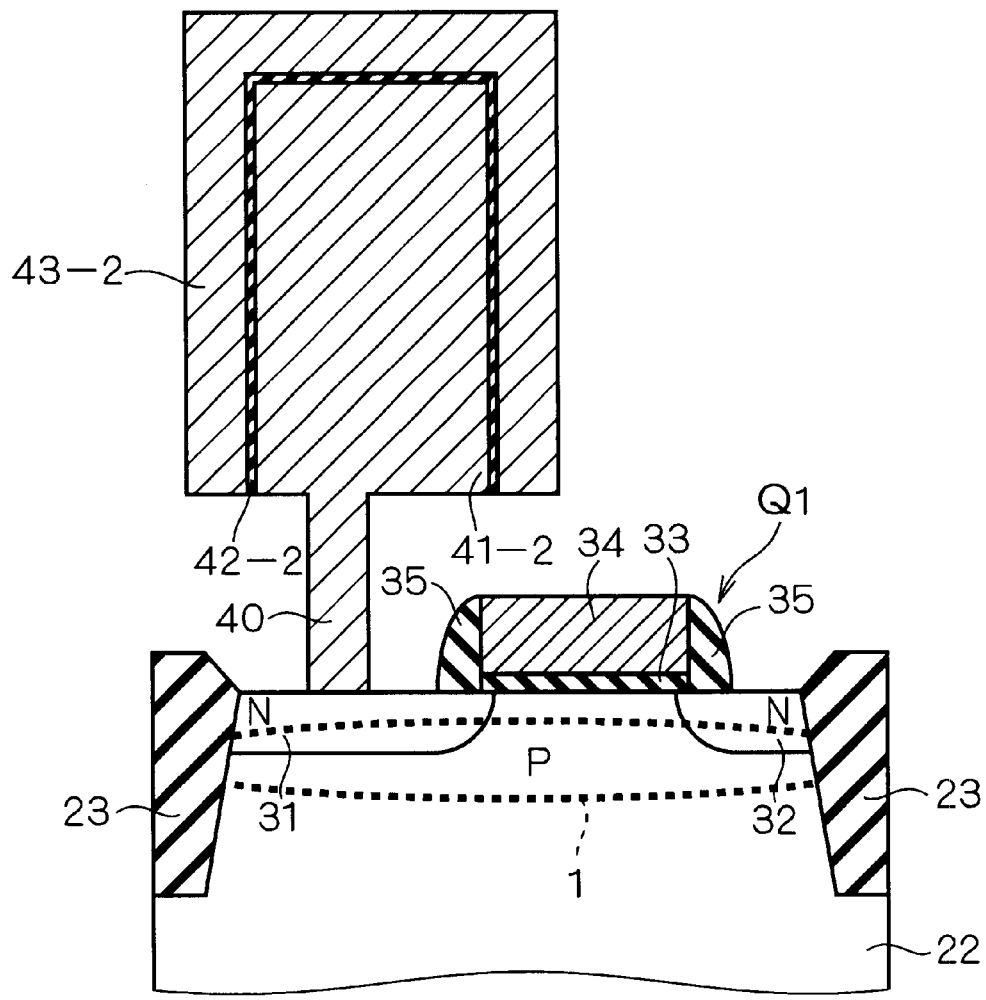
FIG. 1 is a sectional view illustrating a memory cell structure of a DRAM according to a first preferred embodiment of the present invention.

FIG. 1 is a sectional view illustrating a memory cell structure of a DRAM according to a first preferred embodiment. As shown in the figure, in addition to the usual MOS transistor structure, a P type (normal) channel dope region 1 is disposed at a predetermined depth over the entire surface of a P well region 22 including a channel region in a plane view. The channel dope region 1 functions as an NMOS transistor characteristic adjusting region, and is disposed so as to overlap the channel region in a plane view on the entire surface of the channel region, and also overlap an underlayer of a source/drain region 31.

Note that in the first preferred embodiment and the following second to sixth preferred embodiments, source/drain regions 31 and 32 may have an LDD region utilizing a sidewall 35, or may be simply formed by a single diffusion process.

Figure 221:
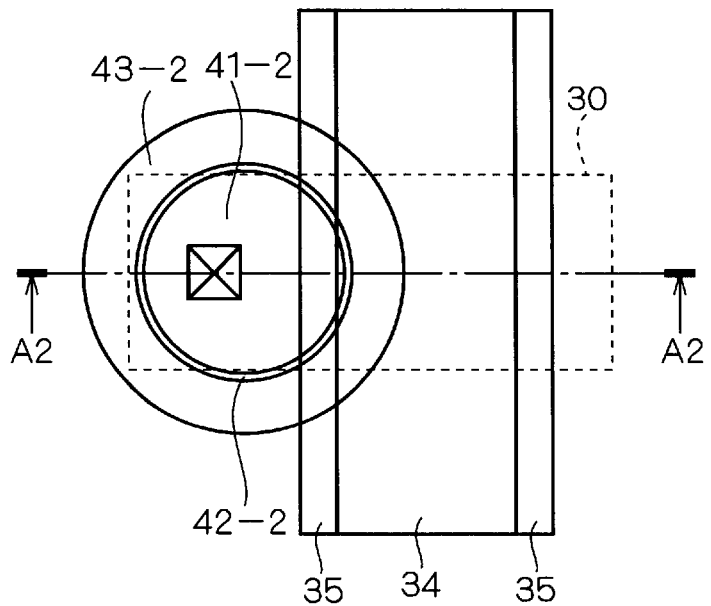
FIG. 221 is a plan view illustrating a planar structure of a stack-type memory cell (Type 2)
Figure 222:
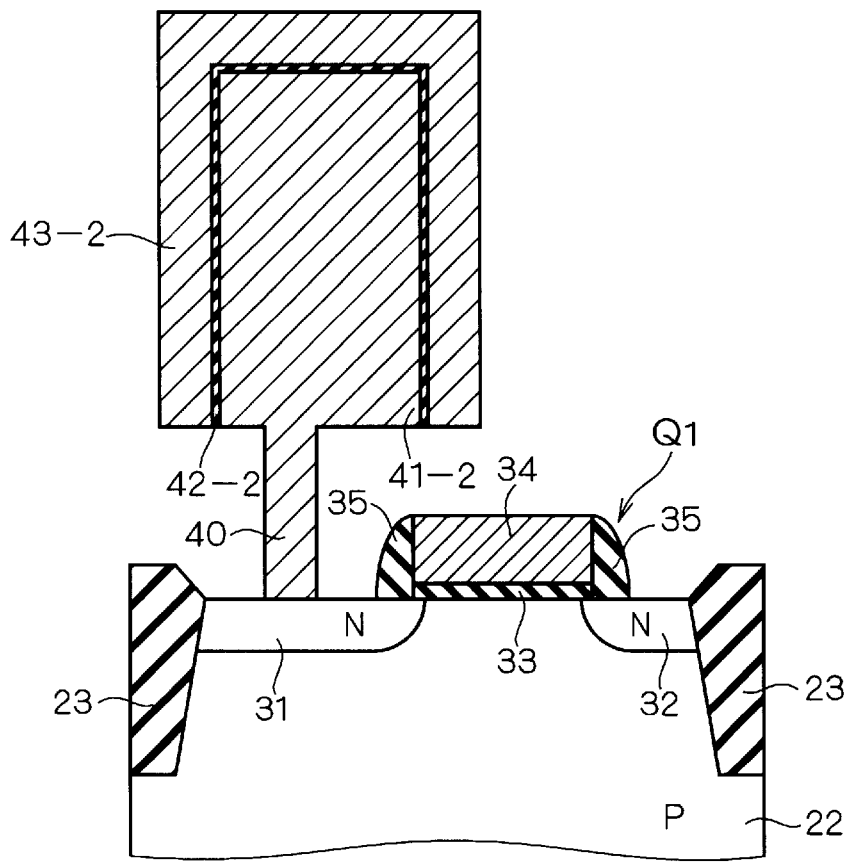
FIG. 222 is a sectional view taken along the line A2—A2 in FIG. 221.
Figure 223:
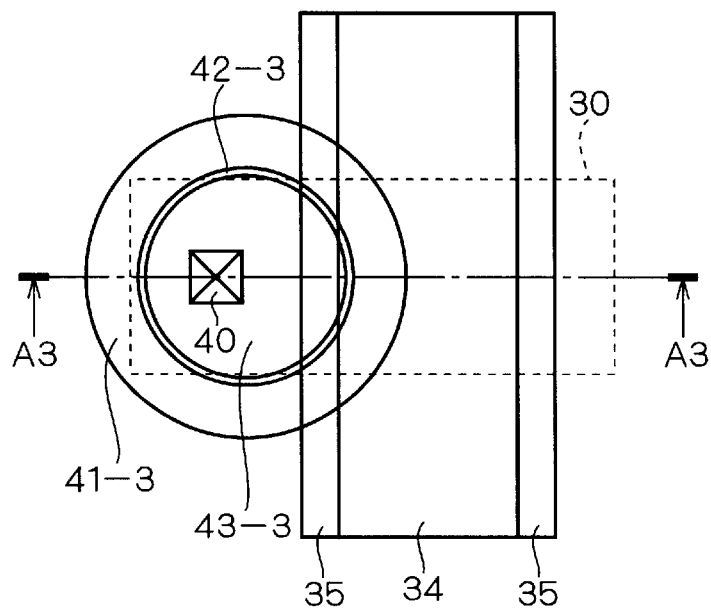
FIG. 223 is a plan view illustrating a planar structure of a stack-type memory cell (Type 3)
Figure 224:
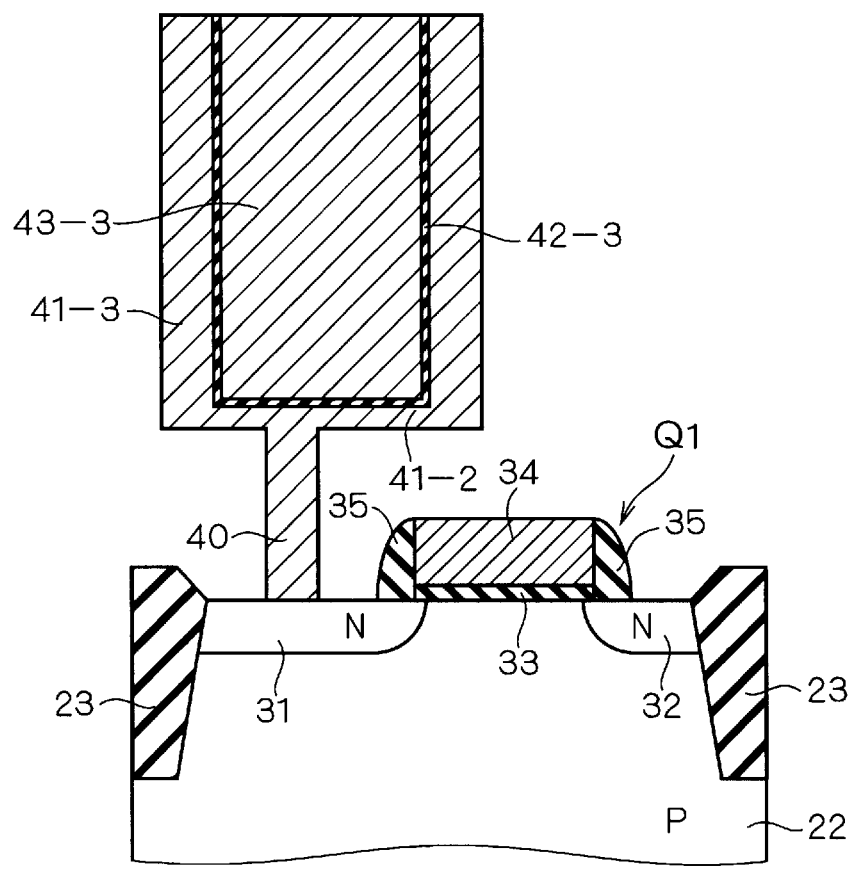
FIG. 224 is a sectional view taken along the line A3—A3 in FIG. 223.
Figure 225:
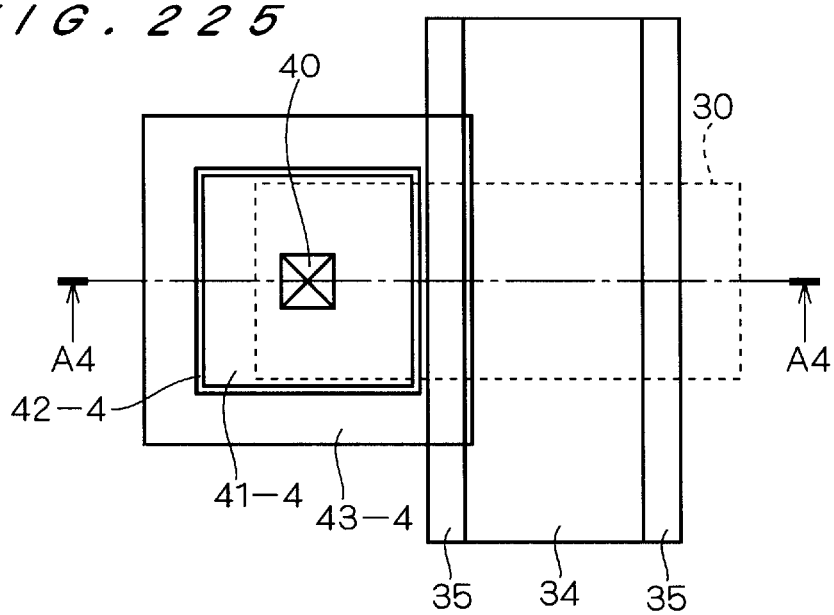
FIG. 225 is a plan view illustrating a planar structure of a stack-type memory cell (Type 4)
Figure 226:
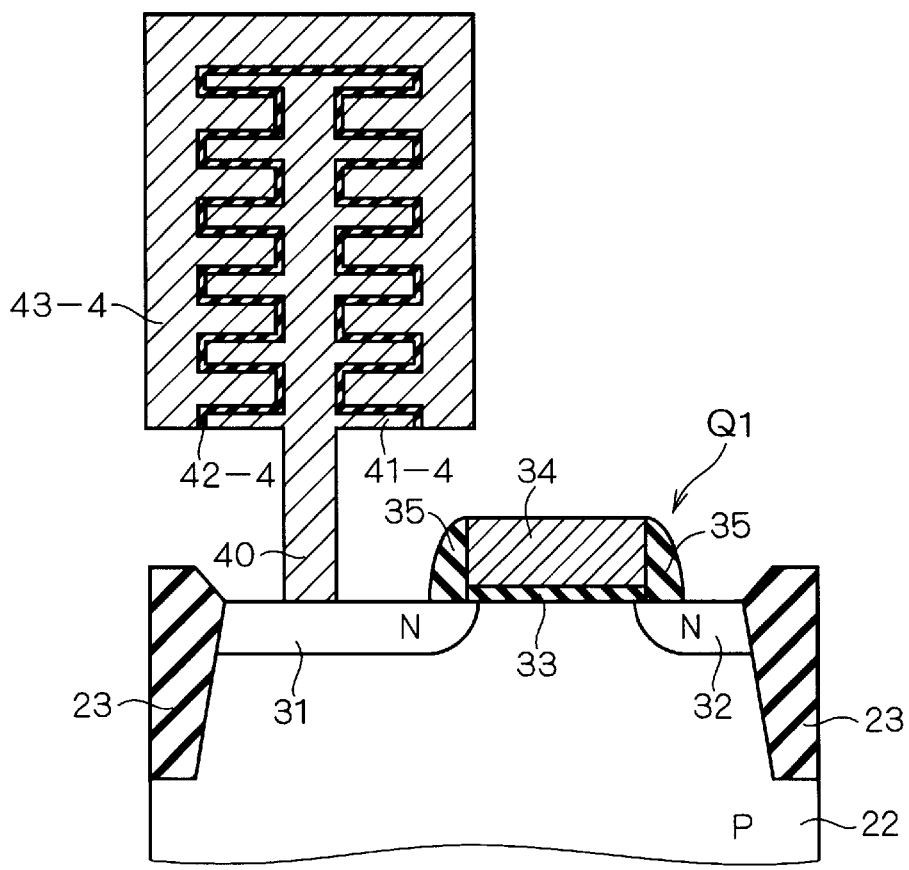
FIG. 226 is a sectional view taken along the line A4—A4 in FIG. 225.
Figure 227:
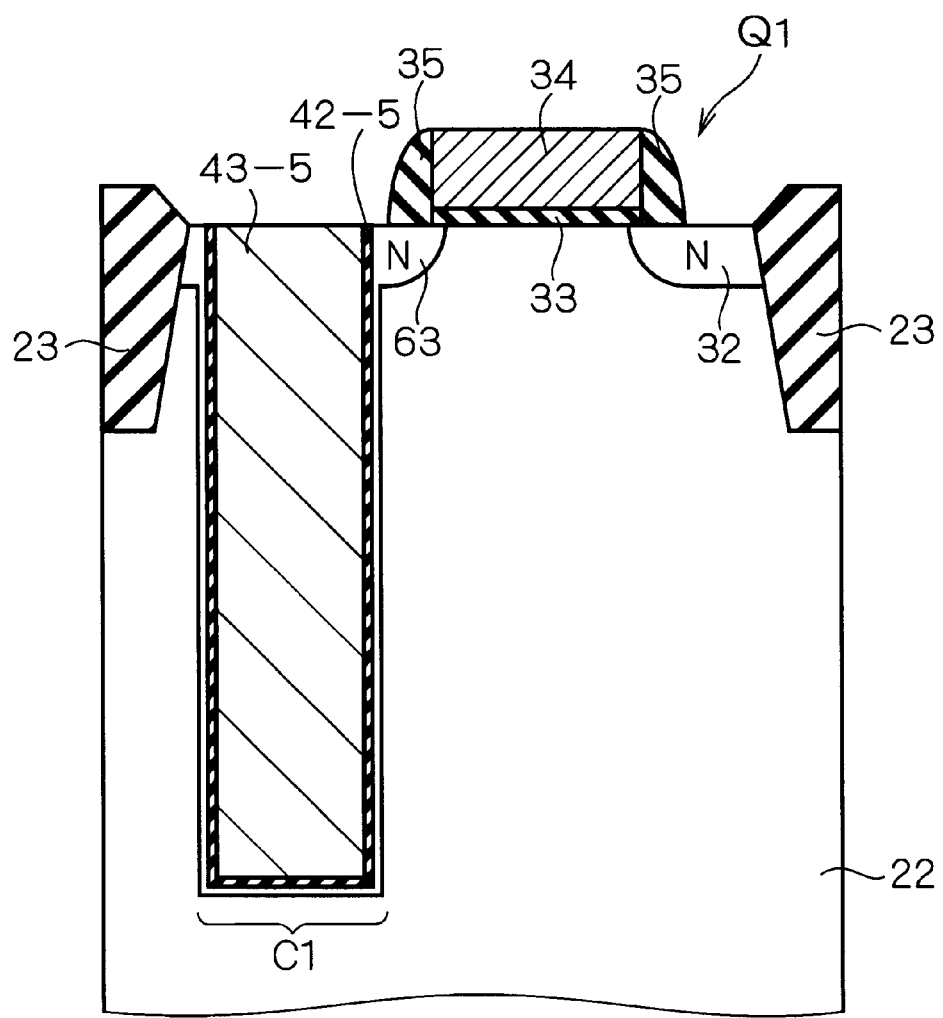
FIGS. 227 and 228 are sectional views illustrating a sectional structure of trench-type memory cells (Type 1 and Type 2), respectively.
Figure 228:
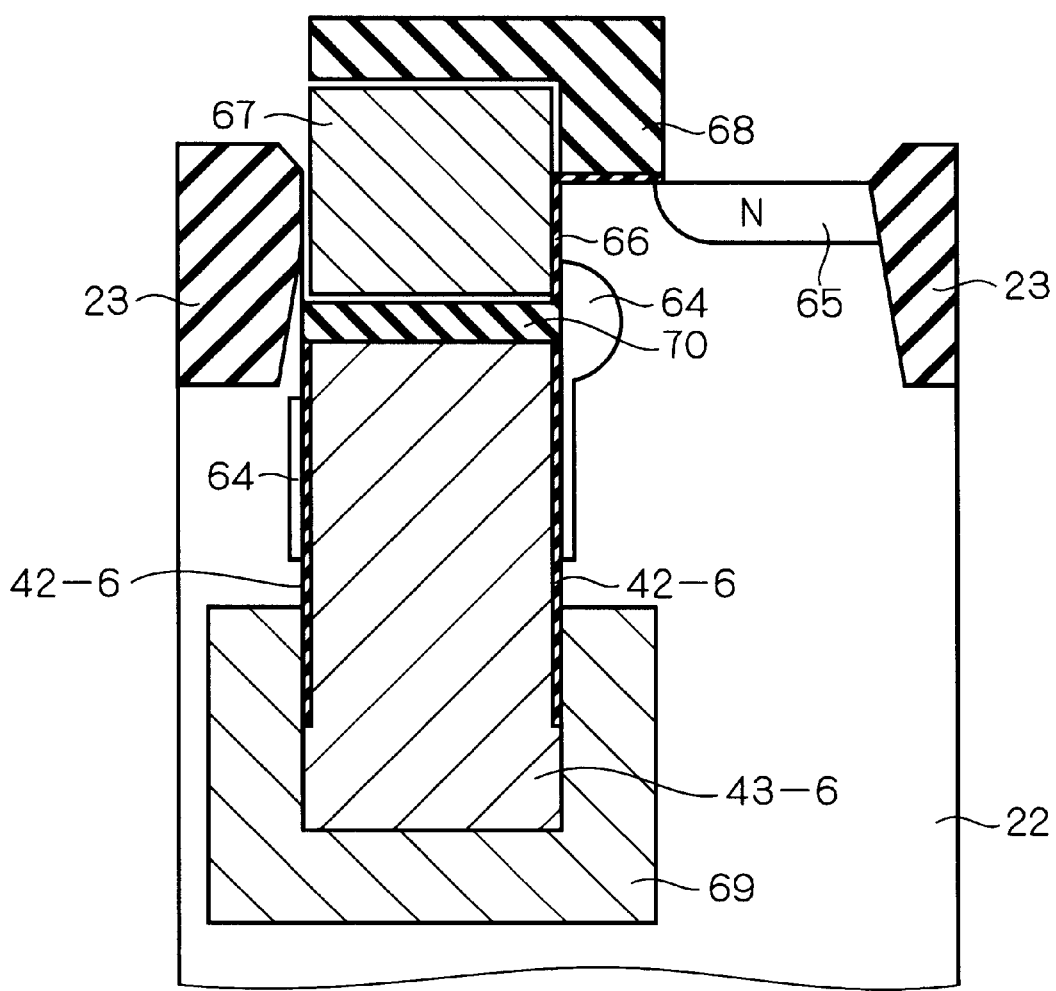
Figure 229:
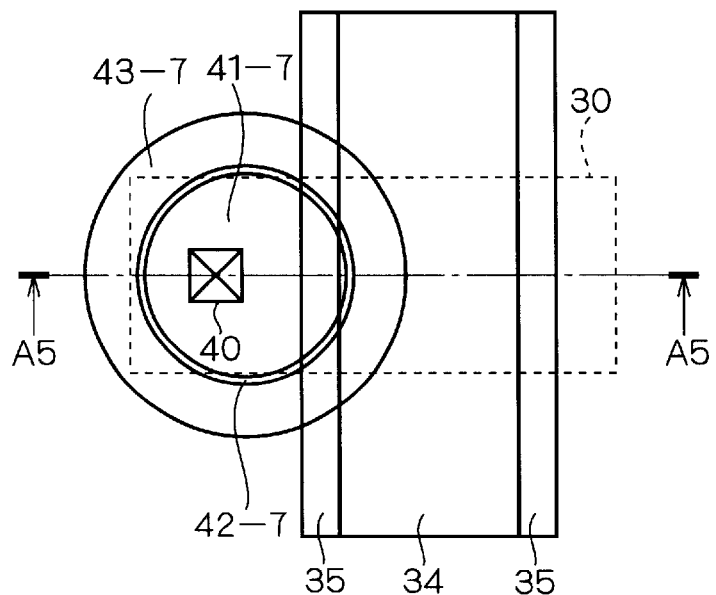
FIG. 229 is a plan view illustrating a planar structure of a stack-type memory cell (Type 5)
Figure 230:
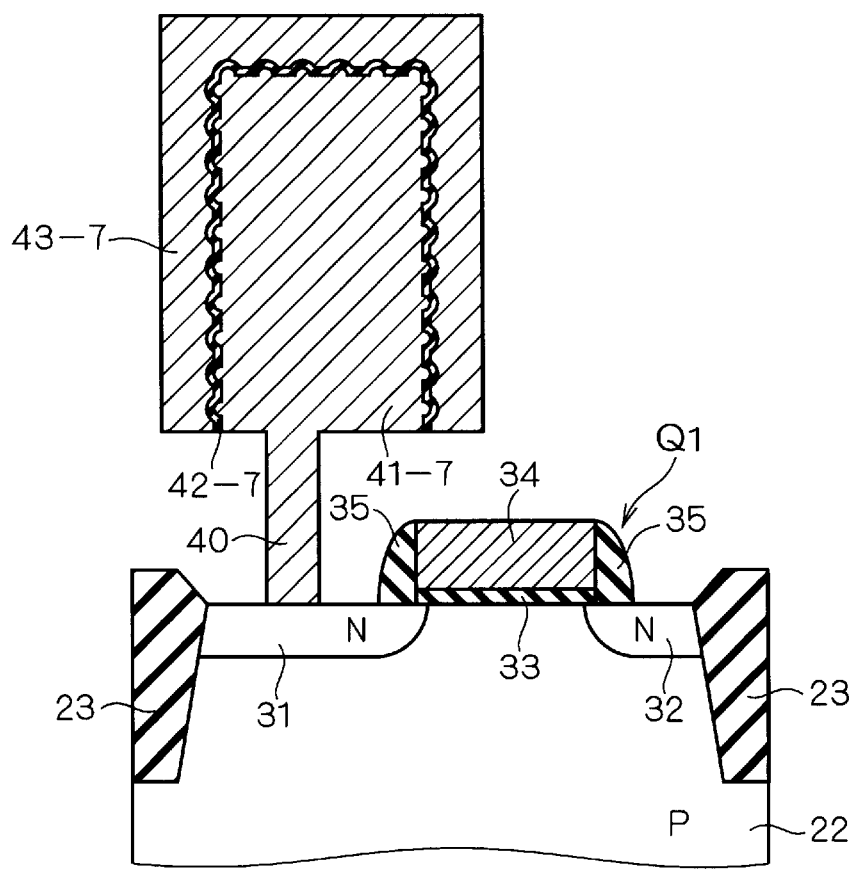
FIG. 230 is a sectional view taken along the line A5—A5 in FIG. 229.
Figure 231:
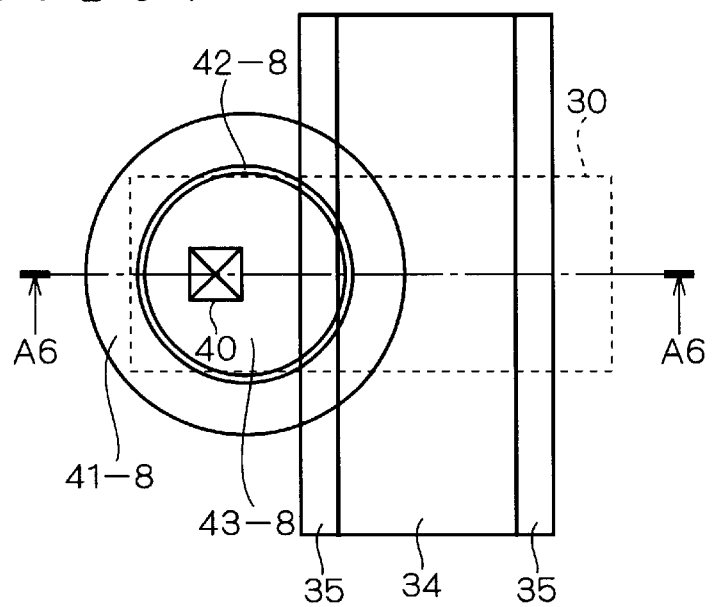
FIG. 231 is a plan view illustrating a planar structure of a stack-type memory cell (Type 6)
Figure 232:
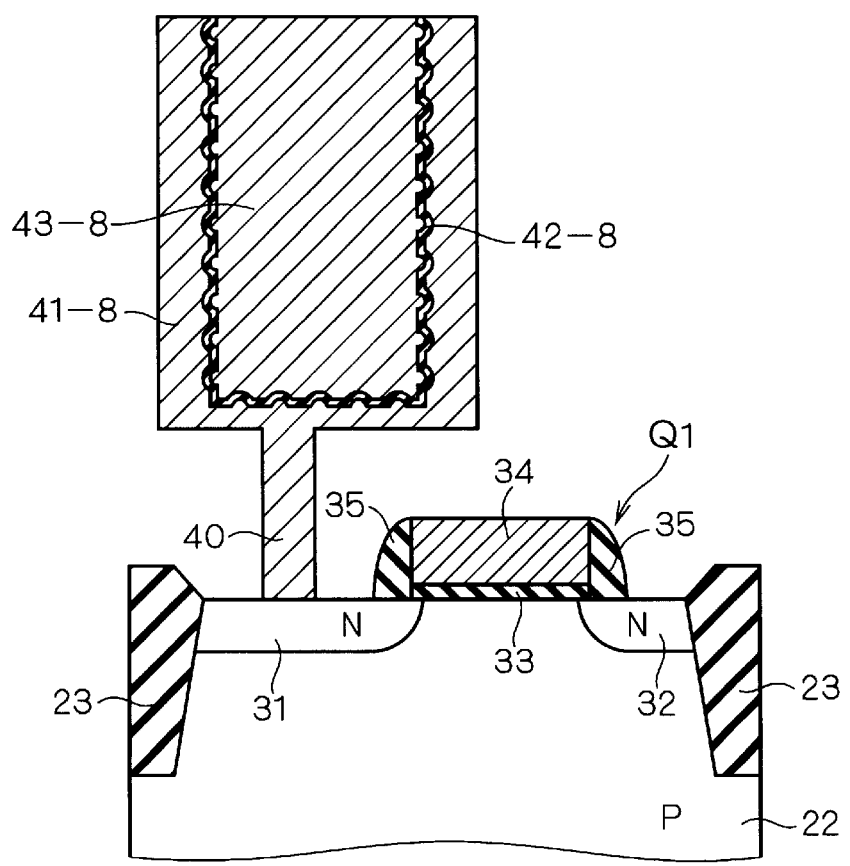
FIG. 232 is a sectional view taken along the line A6—A6 in FIG. 231.
Figure 233:
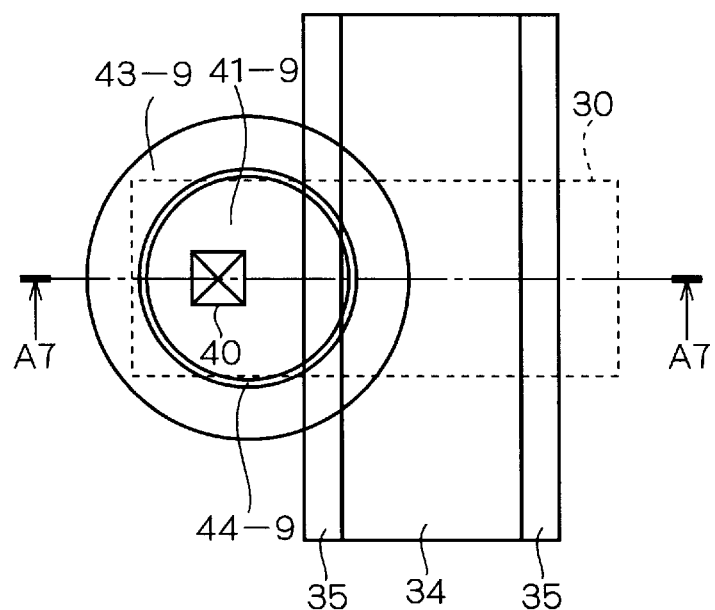
FIG. 233 is a plan view illustrating a planar structure of a stack-type memory cell (Type 7)
Figure 234:
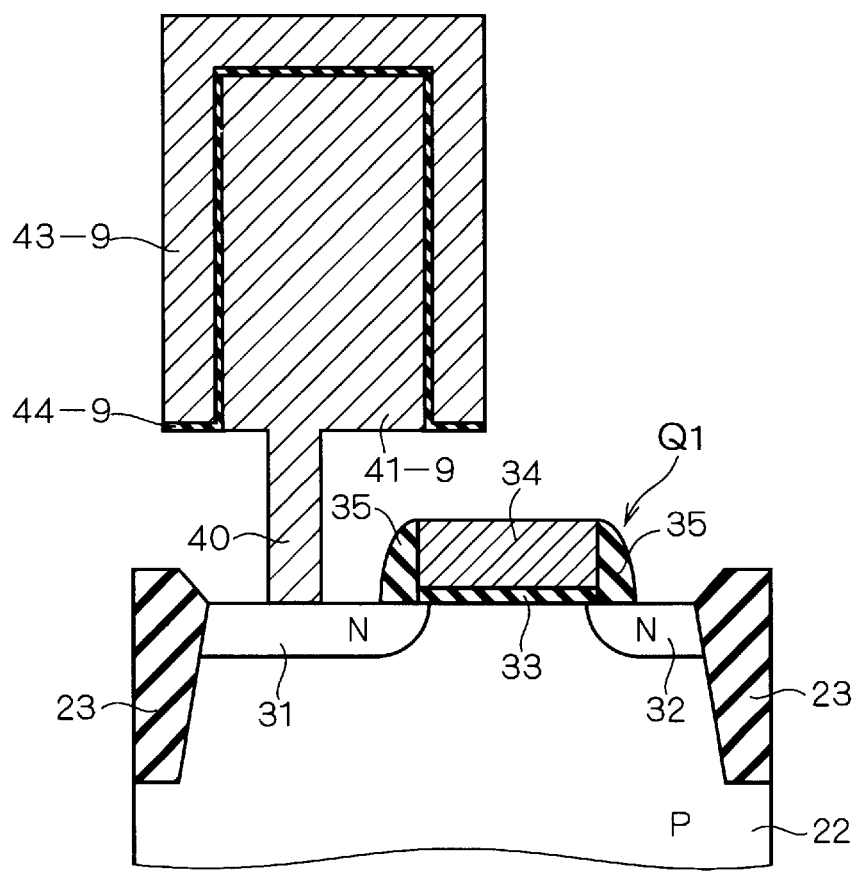
FIG. 234 is a sectional view taken along the line A7—A7 in FIG. 233.
Figure 245:
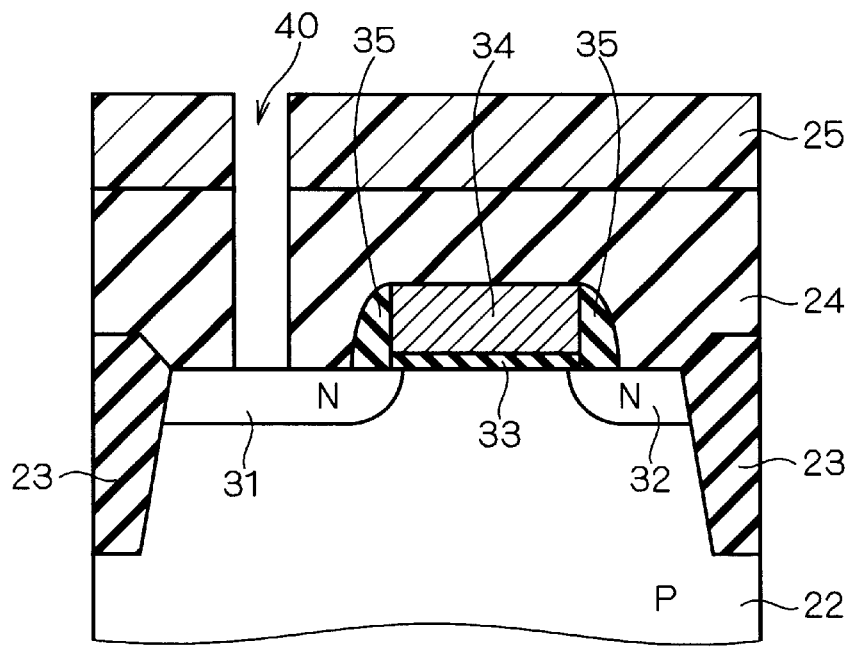
Figure 246:
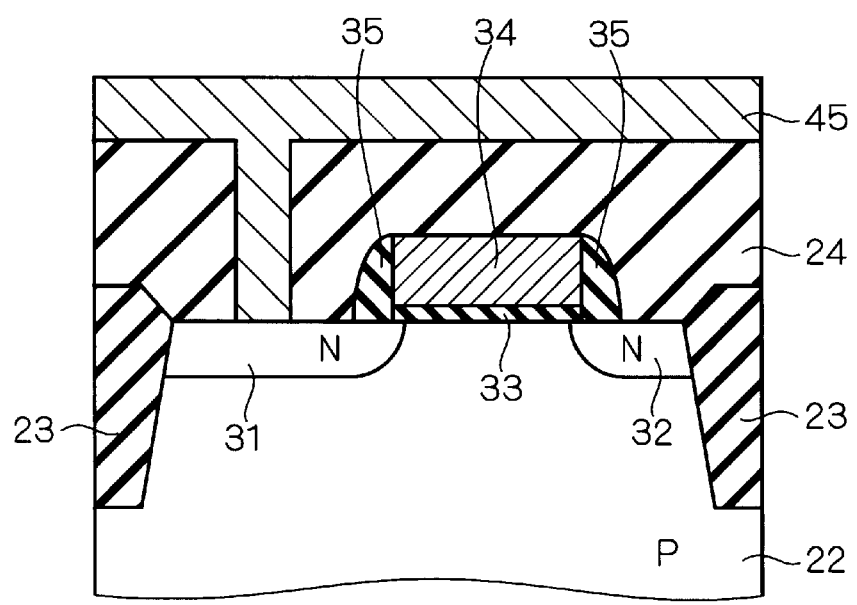
Figure 249:
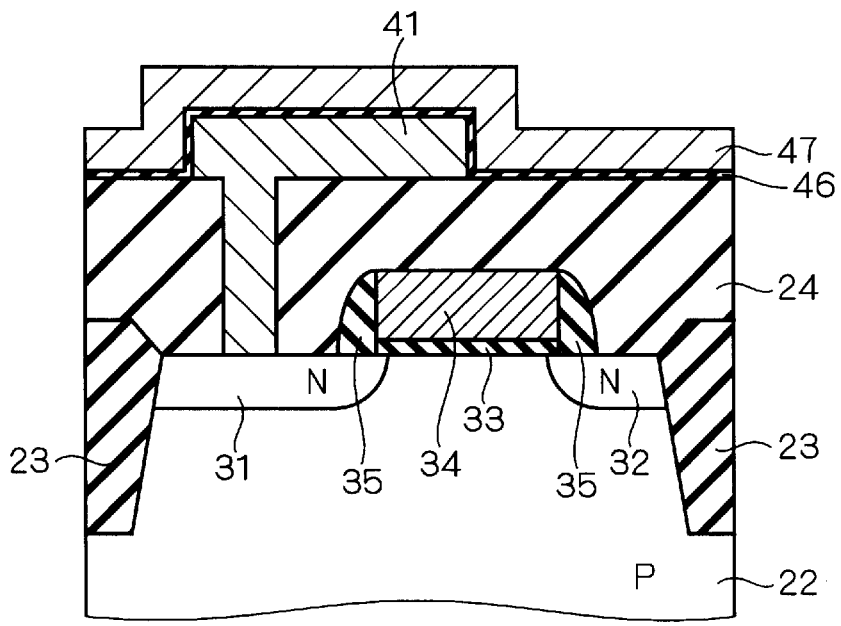
Figure 250:
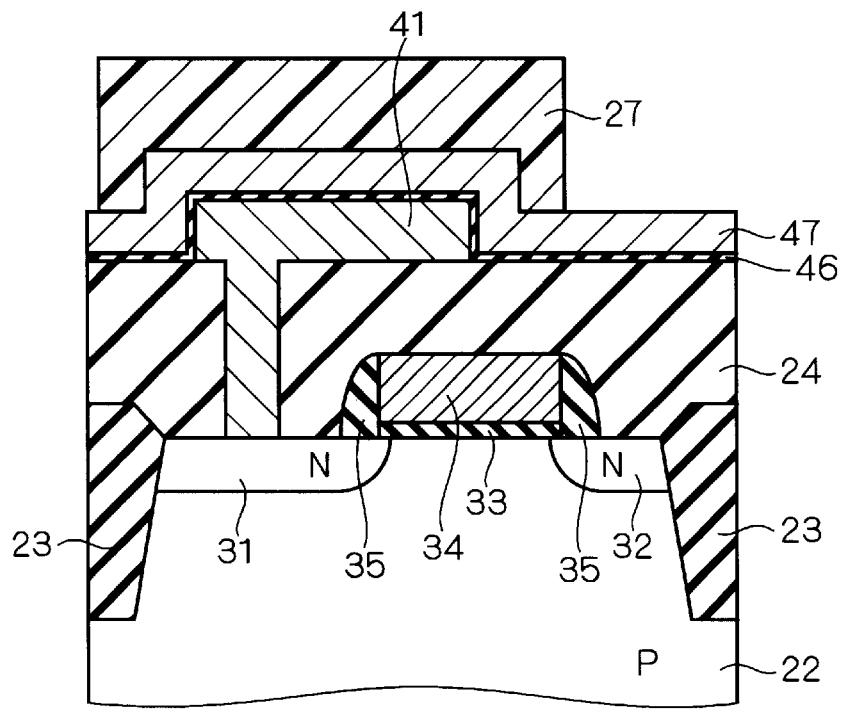
Figure 256:
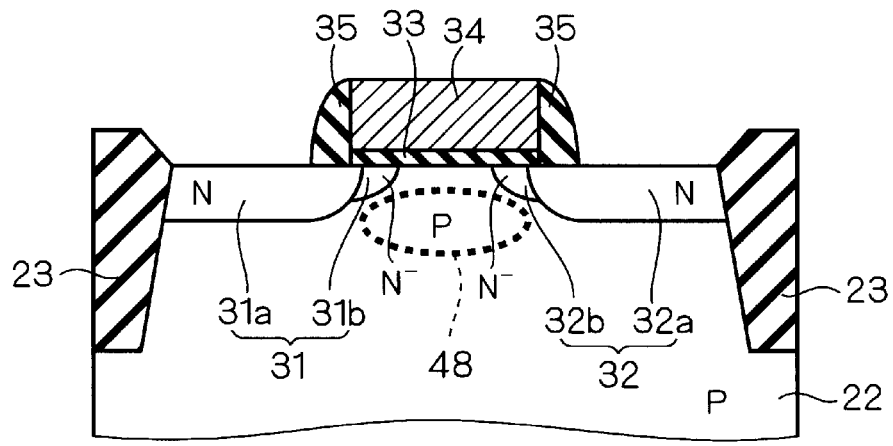
Figure 257:
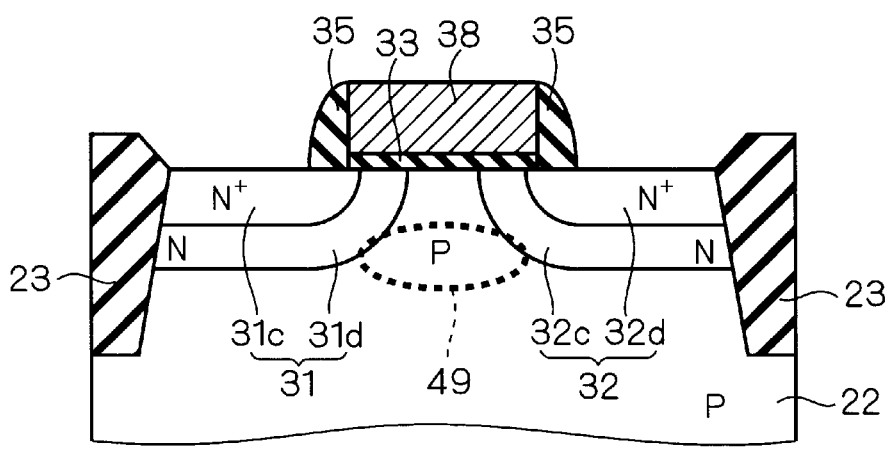
Figure 258:
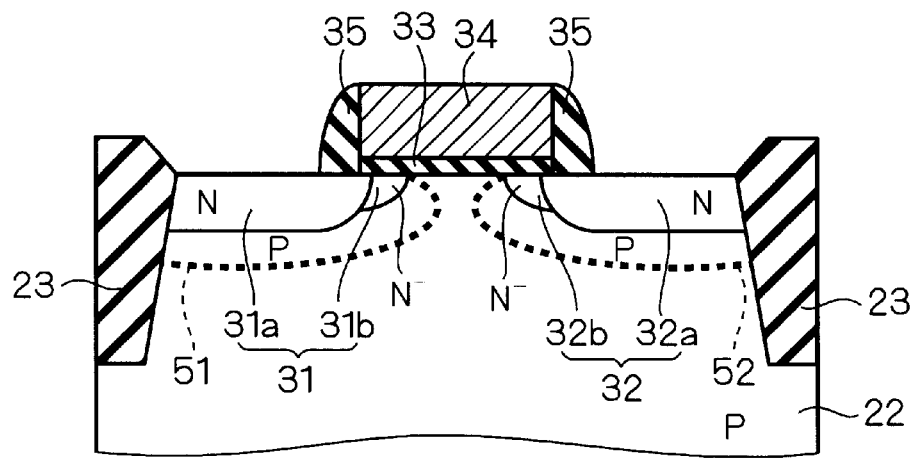
Figure 259:
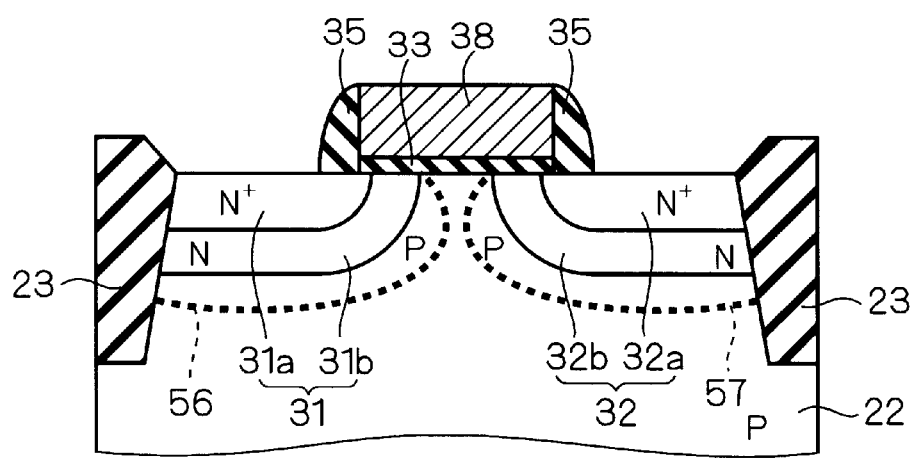
Figure 262:
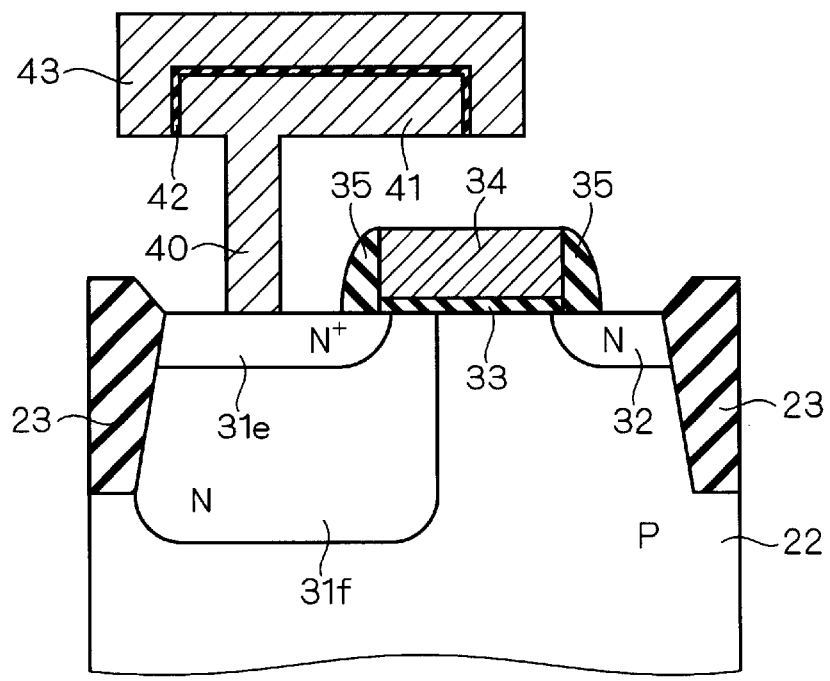
Figure 263:
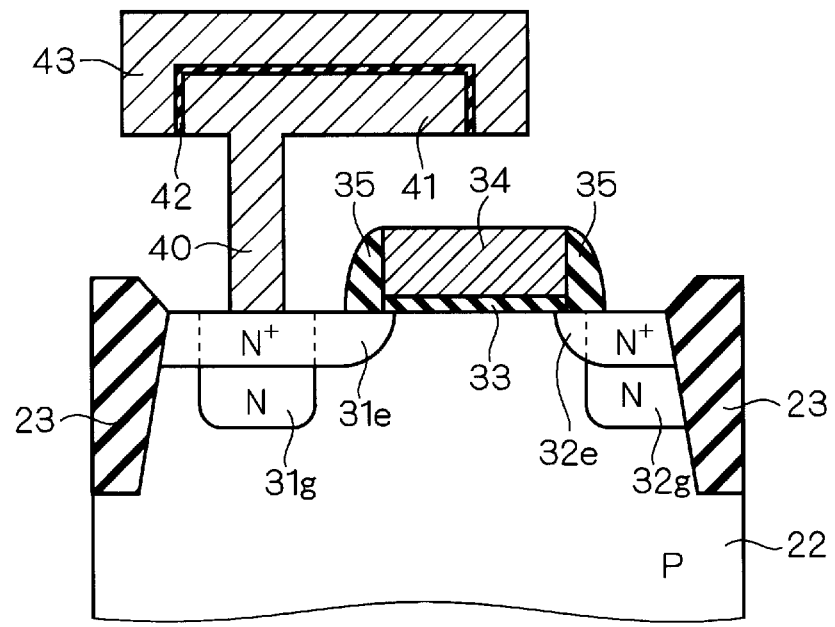
Figure 264:
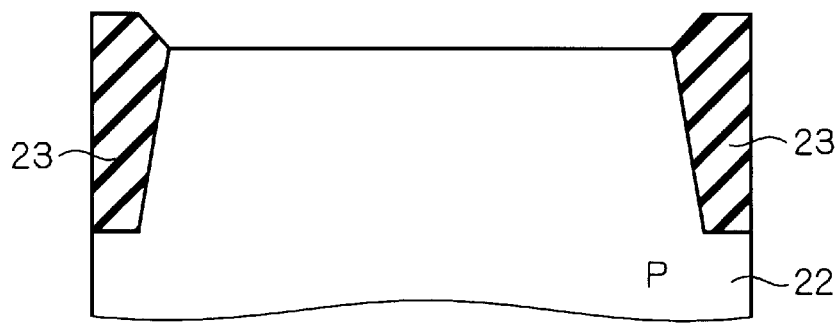
Figure 265:
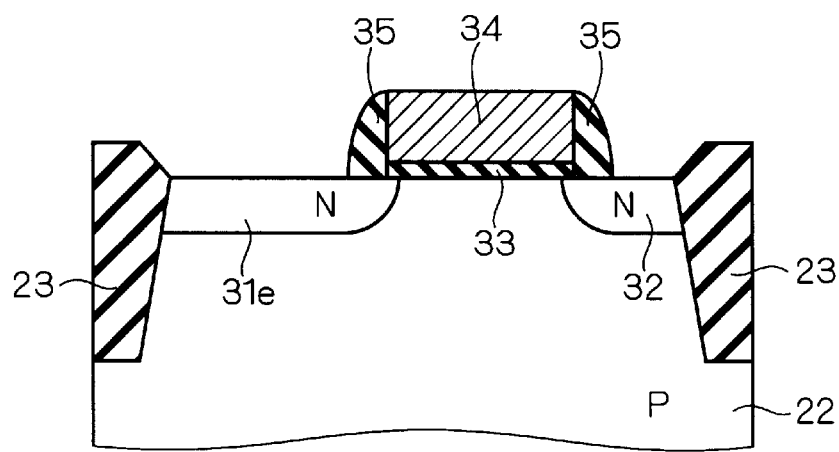
Figure 268:
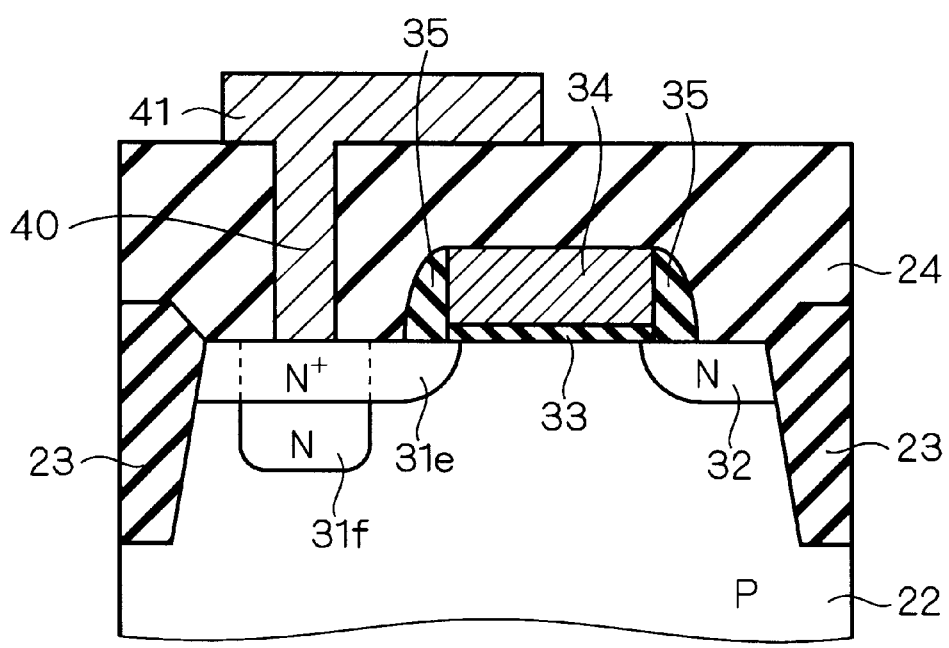

Otherwise, the construction of an NMOS transistor Q1 and the construction of a capacitor C1 are the same as that in the stack-type memory cell (Type 2) shown in FIGS. 221 and 222, and a description thereof is thus omitted.

Figure 2:
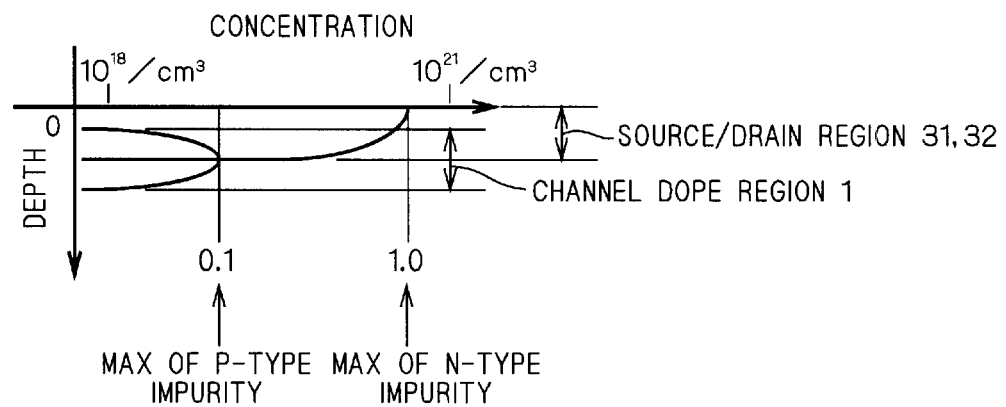
FIGS. 2 to 6 are graphs showing an impurity profile of an NMOS transistor of the first preferred embodiment.

FIG. 2 is a graph showing an impurity profile of the NMOS transistor Q1 in the first preferred embodiment. As shown in FIG. 2, it is set so that the maximum value of the P type impurity concentration (MAX of P) of the channel dope region 1 ranges from $1\times10^{18}$ to $1\times10^{19}$, and the maximum value of the N type impurity concentration (MAX of N) of the source/drain region 31 (32) is not less than 10% and not more than 100% (the case of just 10% is shown in FIG. 2).

It should be noted that the proximate region of the interface between silicon (the P well region 22 including the source/drain regions 31 and 32) and a silicon oxide film (a gate oxide film 33 and sidewall 35), that is, the surface proximate region of the P well region 22 is beyond the object. This is because the proximate region of the mentioned interface becomes a region where the impurity concentration elevates rapidly due to impurity collection onto defects. In FIG. 2, depth "0" denotes the interface between silicon and a silicon oxide film. This is true for impurity profiles to be described later.

Specifically, the maximum value MAX of P and the maximum value MAX of N satisfy the following conditions:

(I) $1\times10^{18} \leq$ MAX of P $\leq 1\times10^{19}$;

(II) MAX of N/10 $\leq$ MAX of P $\leq$ MAX of N; and (III) The proximate region of the interface between silicon and a silicon oxide film are beyond the object.

Figure 3:
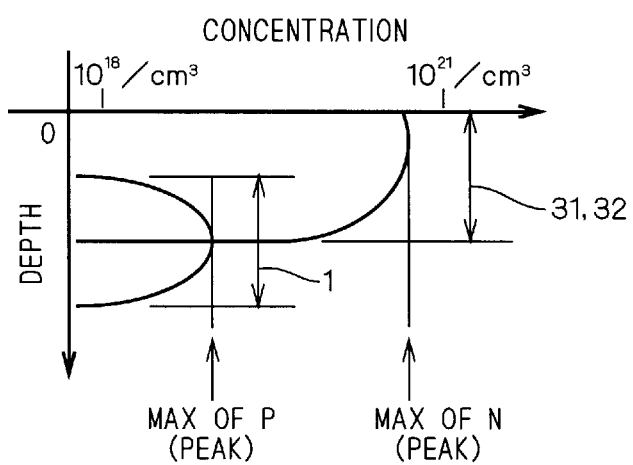
Figure 4:
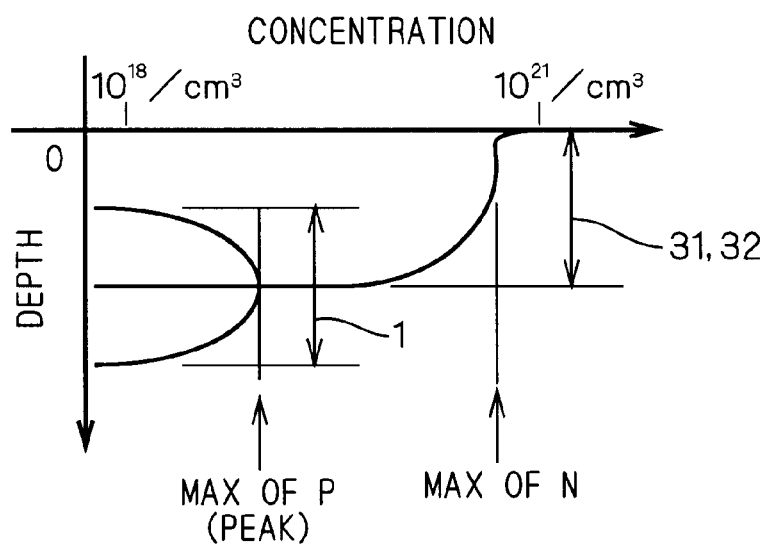

As used herein, the terms of the maximum value "MAX of P" and the maximum value "MAX of N" mean the maximum value in the region except for the interface proximate region. For instance, in the case of FIG. 3, the impurity concentration peak value of the source/drain region 31 (32) is the MAX of N, and that of the channel dope region 1 is the MAX of P. In the case of FIG. 4, the impurity maximum value in the source/drain region 31 except for the interface proximate region is the MAX of N, and the impurity concentration peak value of the channel dope region 1 is the MAX of P.

Figure 5:
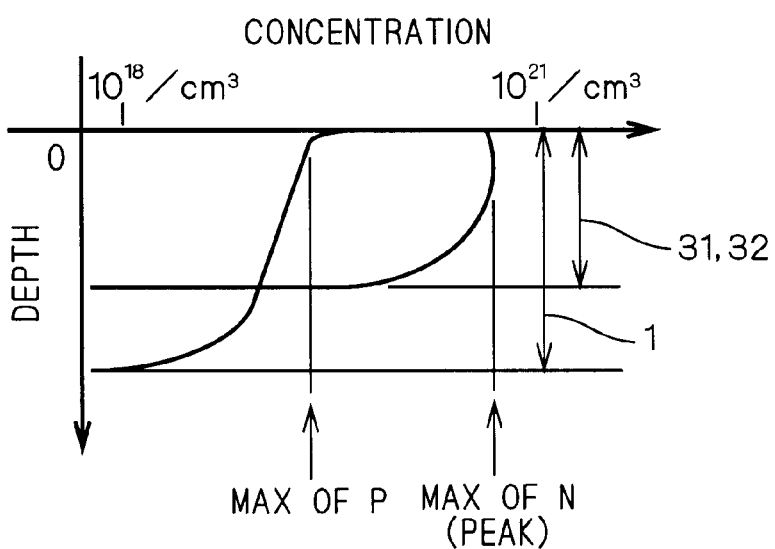
Figure 6:
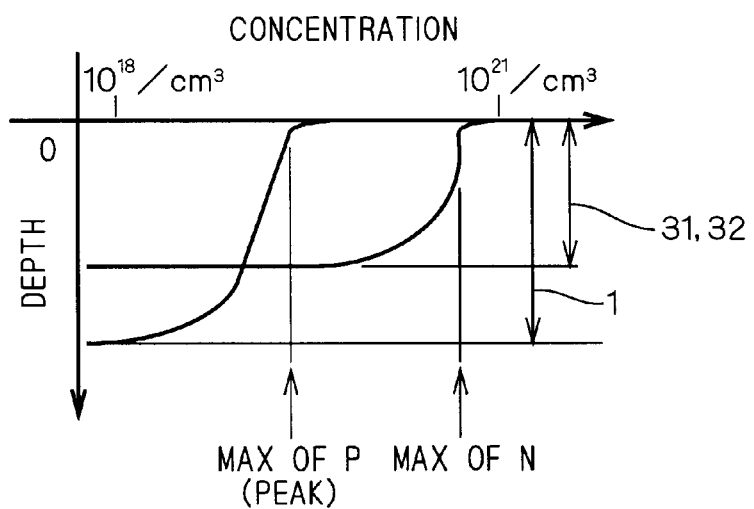

In the case of FIG. 5, the impurity maximum value in the channel dope region 1 except for the interface proximate region is the MAX of P, and the impurity concentration peak value of the source/drain region 31 is the MAX of N. In the case of FIG. 6, the impurity maximum value in the source/drain region 31 is the MAX of N, and that of the channel dope region 1 except for the interface proximate region is the MAX of P. The graphs of FIGS. 5 and 6 indicate an impurity profile when the channel dope region 1 is formed from the surface of the P well region 22 to a point deeper than the source/drain region 31.

Thus, the memory cell structure of the first preferred embodiment satisfies the mentioned conditions (I), (II) and (III), thereby a depletion layer can also extend into the source/drain region 31 (32) during the time the NMOS transistor Q1 operates.

It is therefore able to obtain the best characteristic about assurance of resistance to punch-through and leak current reduction (relaxation of junction capacitance).

Figure 7:
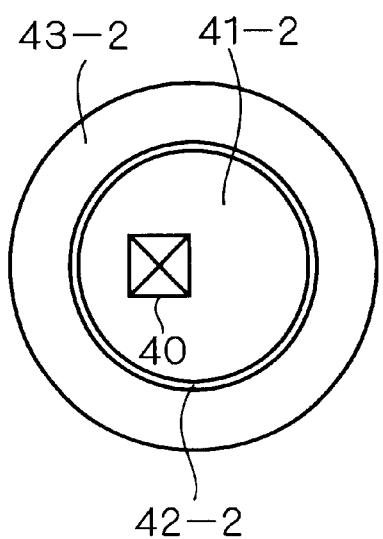
FIG. 7 is a plan view illustrating a planar structure of a capacitor in FIG. 1.

Although FIG. 1 illustrates the capacitor structure of the stack-type memory cell (Type 2), a variety of capacitor structures are applicable. The planar structure of the capacitor of the stack-type memory cell (Type 2) is as shown in FIG. 7.

Figure 8:
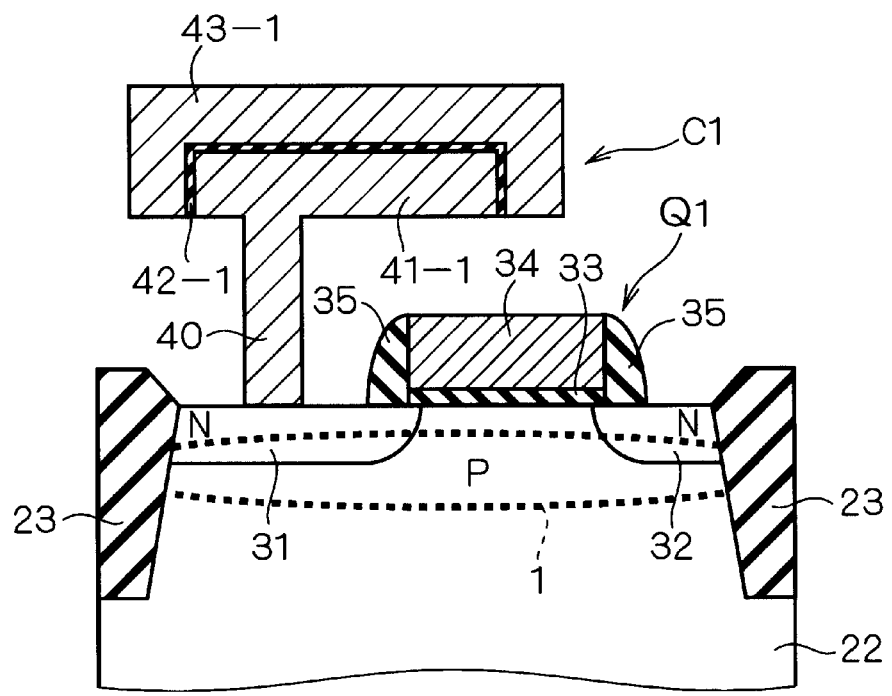
FIG. 8 is a sectional view illustrating a sectional structure of a stack-type memory cell (Type 1) in the first preferred embodiment.
Figure 9:
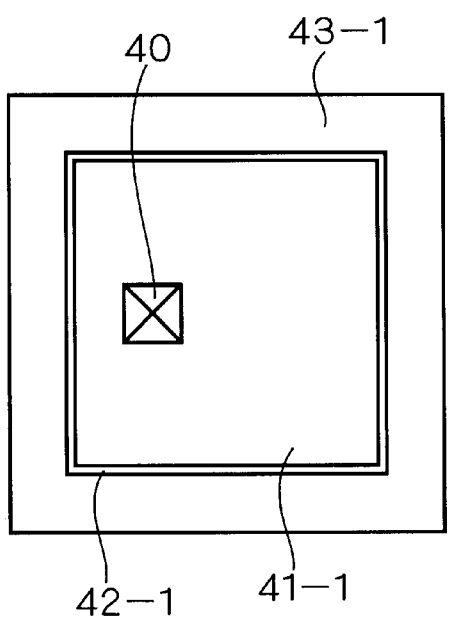
FIG. 9 is a plan view illustrating a planar structure of a capacitor in FIG. 8.
Figure 10:
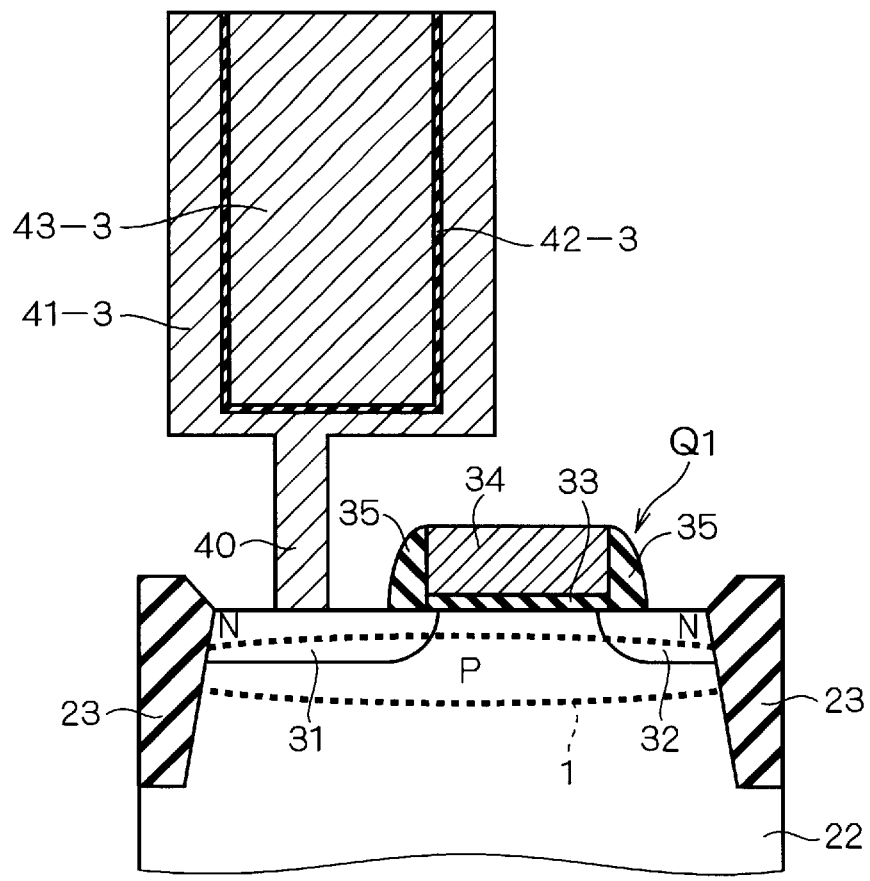
FIG. 10 is a sectional view illustrating a sectional structure of a stack-type memory cell (Type 3) in the first preferred embodiment.
Figure 11:
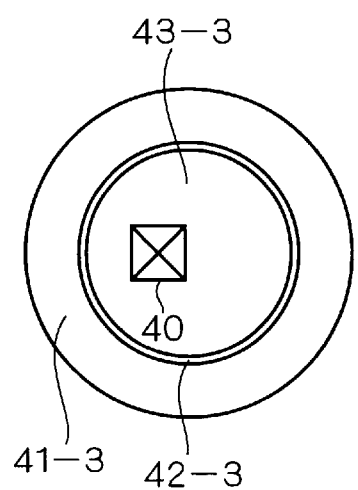
FIG. 11 is a plan view illustrating a planar structure of a capacitor in FIG. 10.
Figure 14:
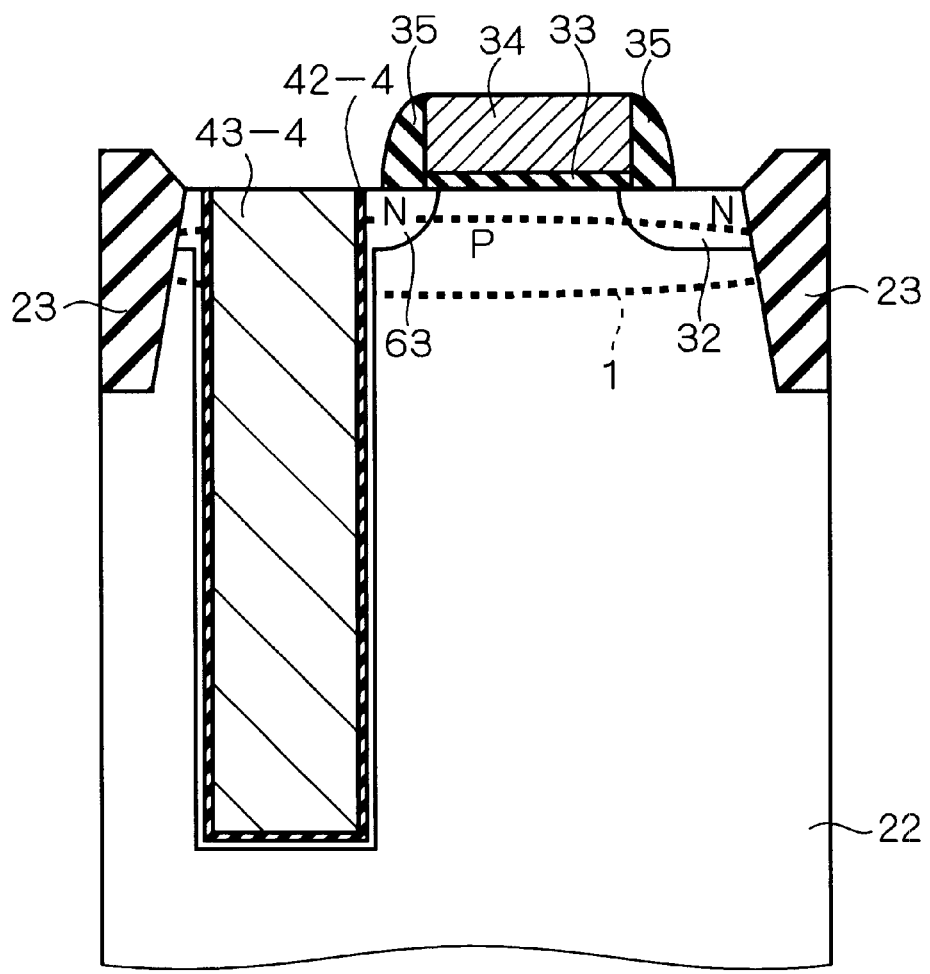
FIG. 14 is a sectional view illustrating a sectional structure of a trench-type memory cell (Type 1) in the first preferred embodiment.
Figure 17:
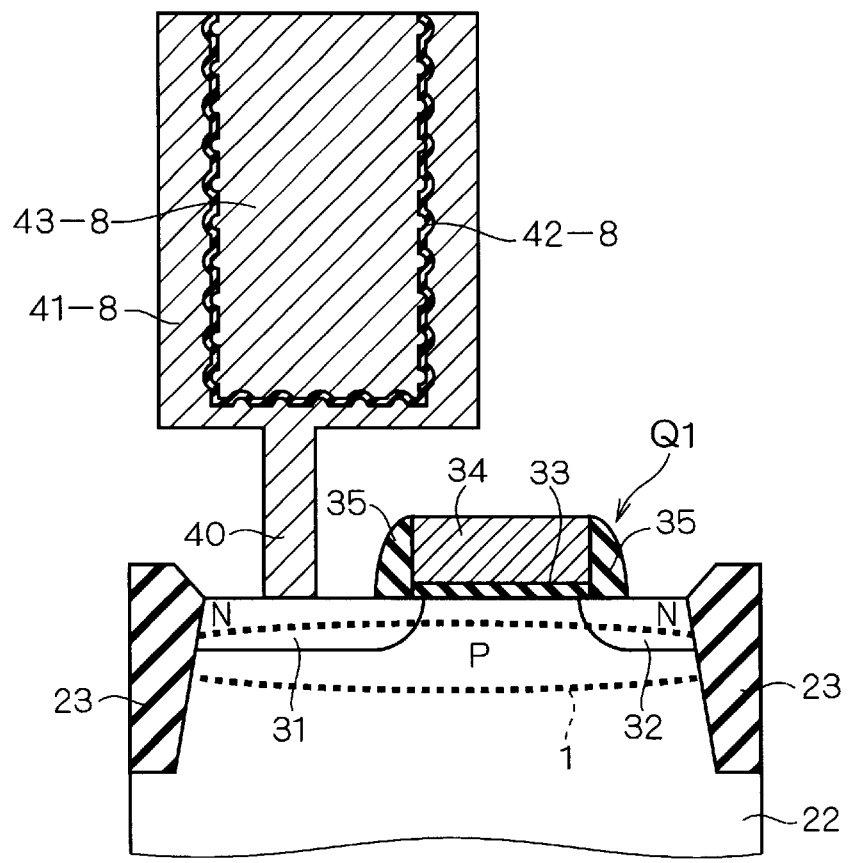
FIG. 17 is a sectional view illustrating a sectional structure of a stack-type memory cell (Type 6) in the first preferred embodiment.
Figure 18:
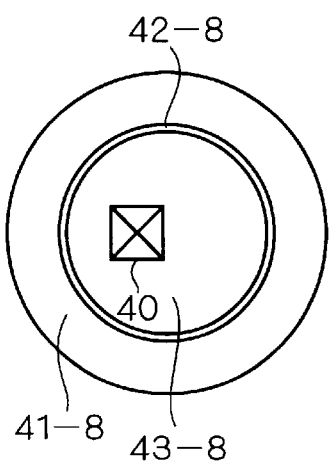
FIG. 18 is a plan view illustrating a planar structure of a capacitor in FIG. 17.
Figure 19:
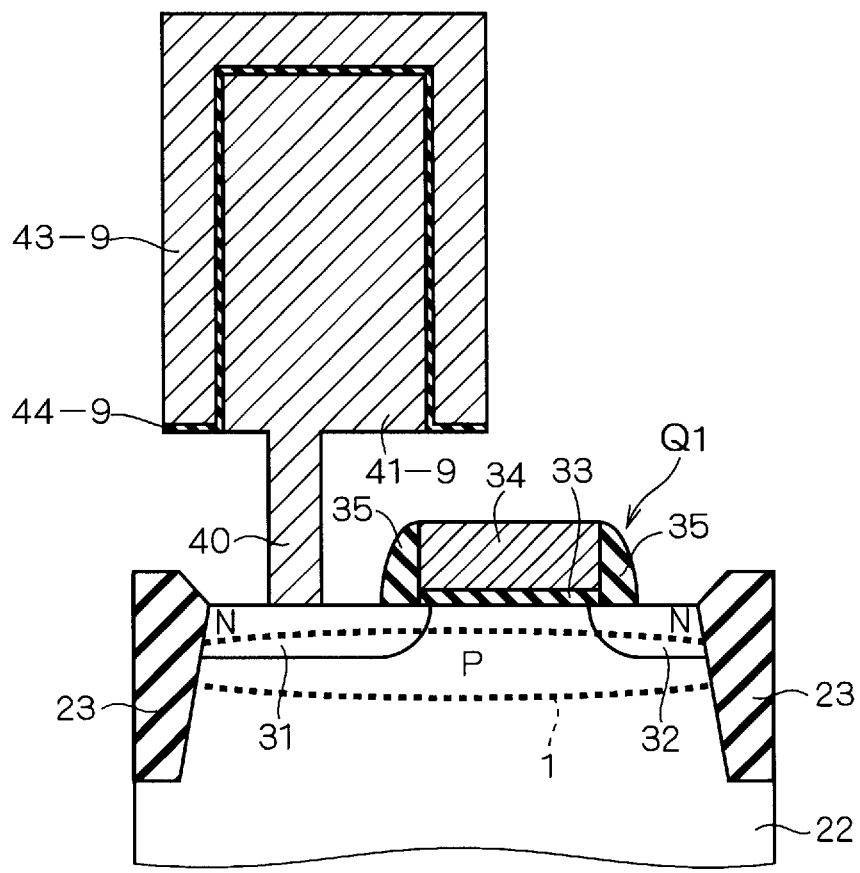
FIG. 19 is a sectional view illustrating a sectional structure of a stack-type memory cell (Type 7) in the first preferred embodiment.
Figure 20:
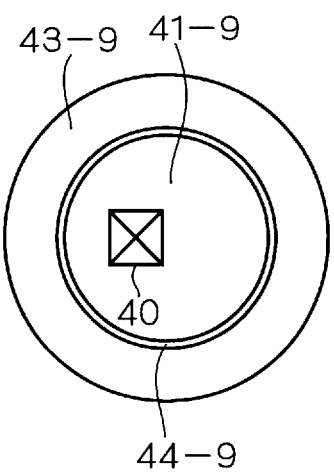
FIG. 20 is a plan view illustrating a planar structure of a capacitor in FIG. 19.
Figure 21:
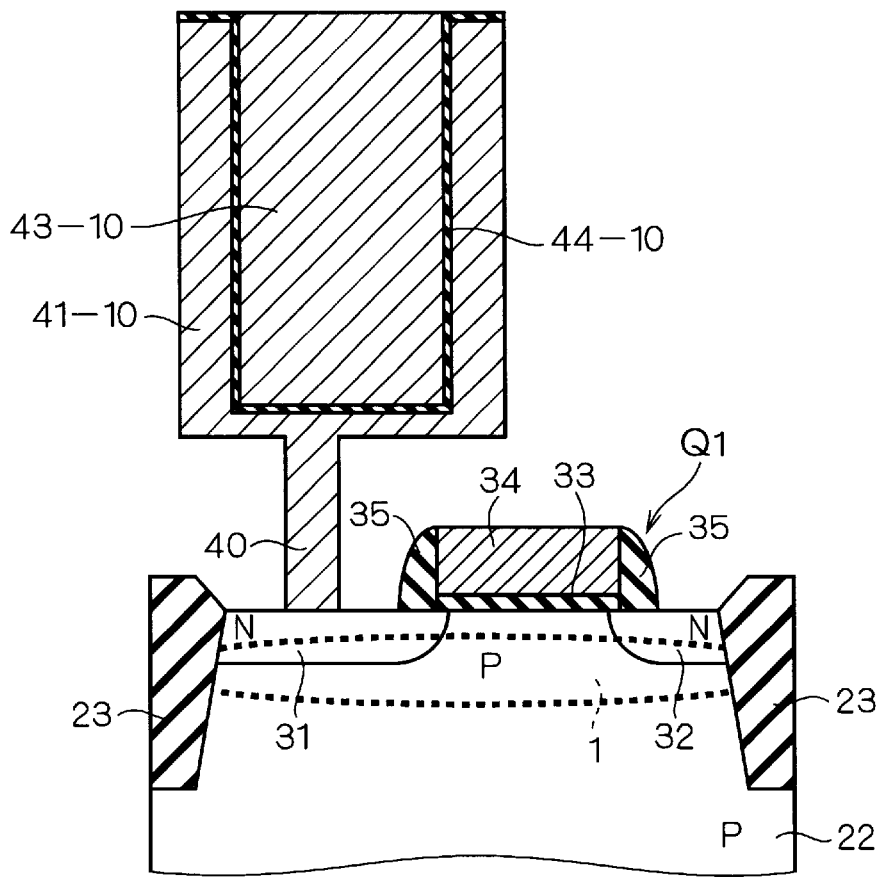
FIG. 21 is a sectional view illustrating a sectional structure of a stack-type memory cell (Type 8) in the first preferred embodiment.
Figure 22:
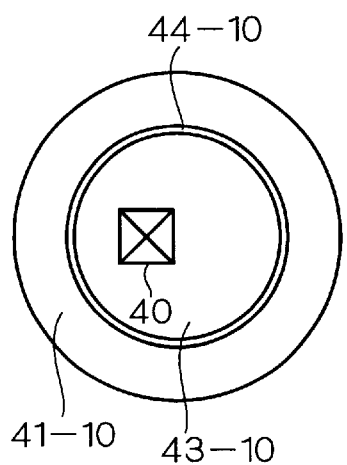
FIG. 22 is a plan view illustrating a planar structure of a capacitor in FIG. 21.
Figure 23:
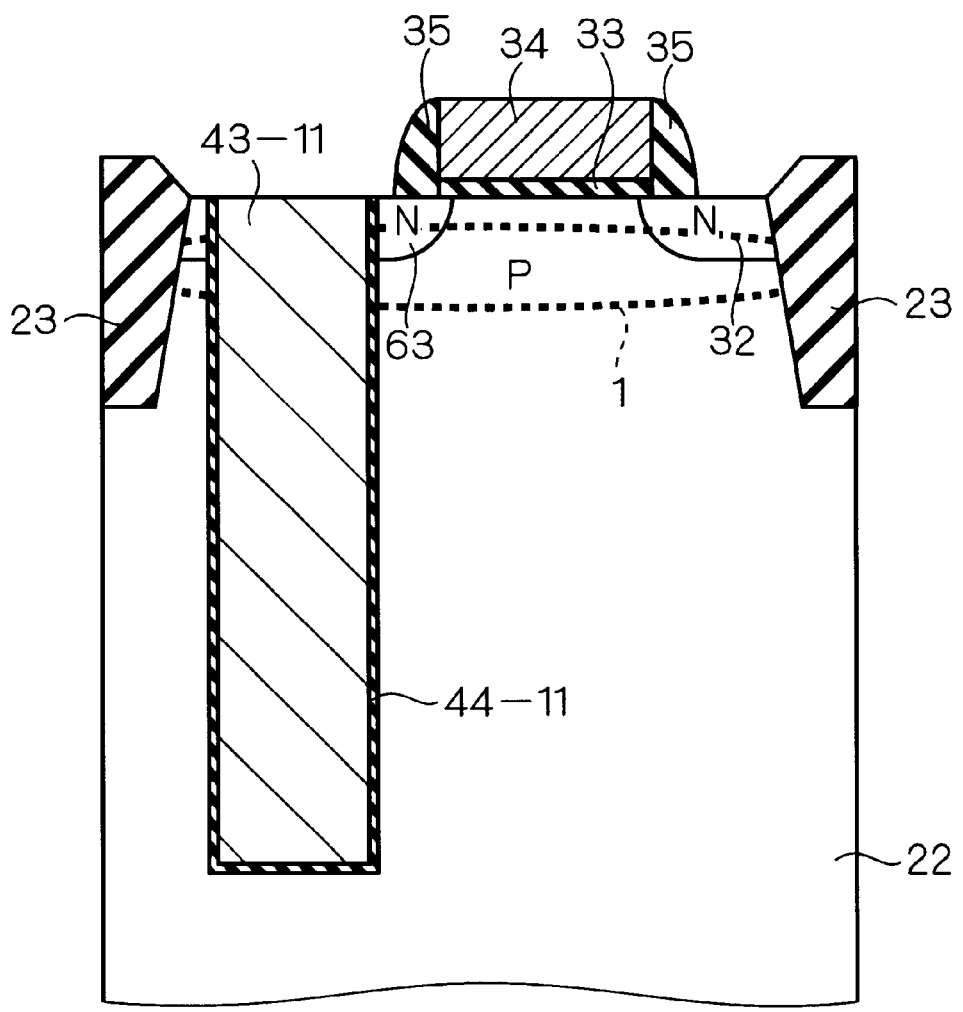
FIG. 23 is a sectional view illustrating a sectional structure of a trench-type memory cell (Type 2) in the first preferred embodiment.
Figure 24:
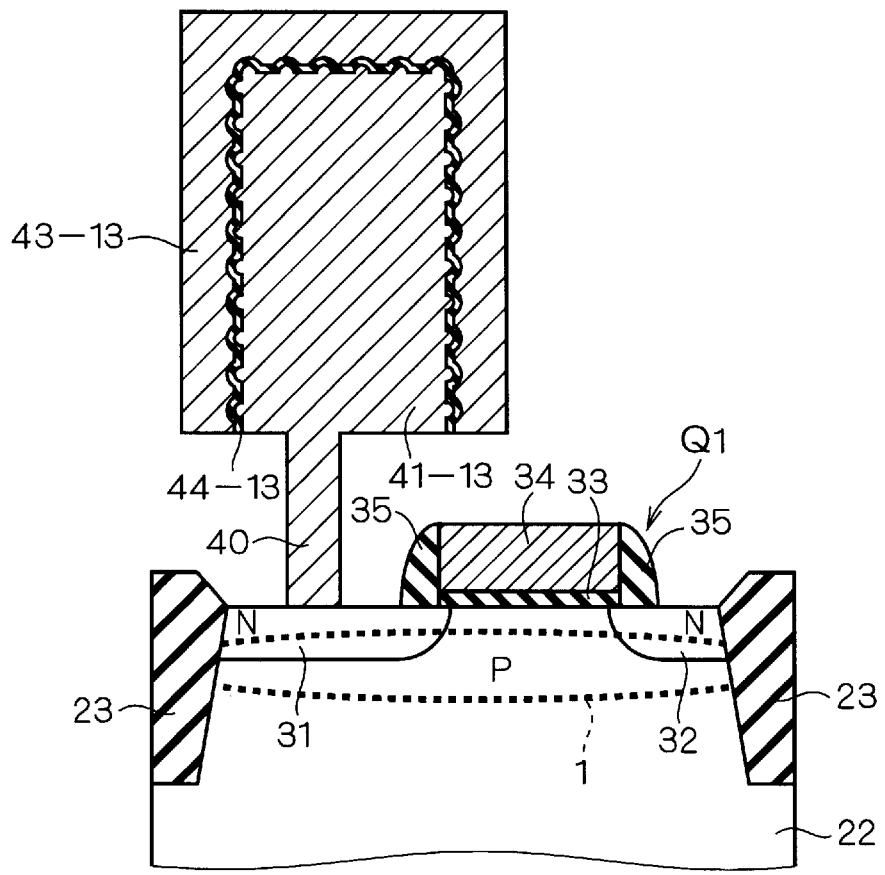
FIG. 24 is a sectional view illustrating a sectional structure of a stack-type memory cell (Type 9) in the first preferred embodiment.
Figure 25:
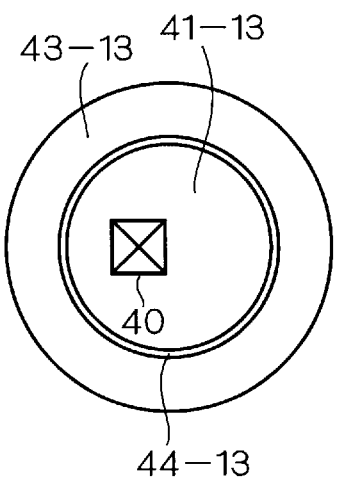
FIG. 25 is a plan view illustrating a planar structure of a capacitor in FIG. 24.
Figure 26:
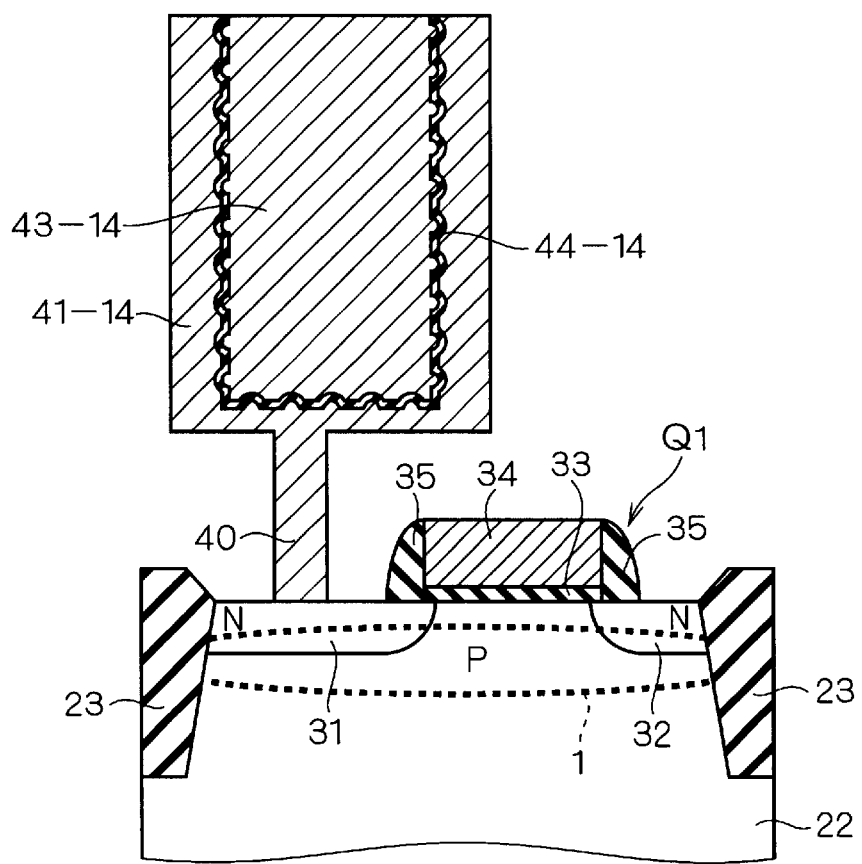
FIG. 26 is a sectional view illustrating a sectional structure of a stack-type memory cell (Type 10) in the first preferred embodiment.
Figure 27:
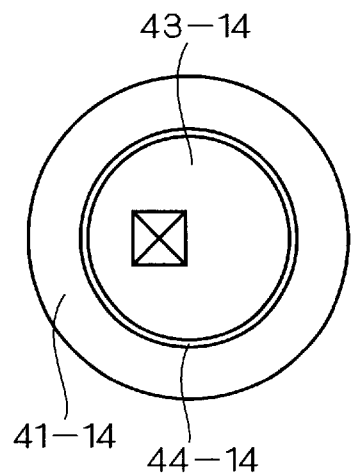
FIG. 27 is a plan view illustrating a planar structure of a capacitor in FIG. 26.

For instance, there can be considered the following capacitor structures: a stack-type memory cell (Type 1) shown in FIGS. 8 and 9; a stack-type memory cell (Type 3) in FIGS. 10 and 11; a stack-type memory cell (Type 4) in FIGS. 12 and 13; a trench-type memory cell (Type 1) in FIG. 14; a stack-type memory cell (Type 5) in FIGS. 15 and 16; a stack-type memory cell (Type 6) in FIGS. 17 and 18; a stack-type memory cell (Type 7) in FIGS. 19 and 20; a stack-type memory cell (Type 8) in FIGS. 21 and 22; a trench-type memory cell (Type 2) in FIG. 23; a stack-type memory cell (Type 9) in FIGS. 24 and 25; and a stack-type memory cell (Type 10) in FIGS. 26 and 27.

FIGS. 8, 10, 12, 14, 15, 17, 19, 21, 23, 24 and 26 are sectional views illustrating memory cell structures, respectively. FIGS. 9, 11, 13, 16, 18, 20, 22, 25 and 27 are plan views illustrating a planar structure of the capacitors shown in FIGS. 8, 10, 12, 15, 17, 19, 21, 24 and 26, respectively.

Second Preferred Embodiment

Figure 28:
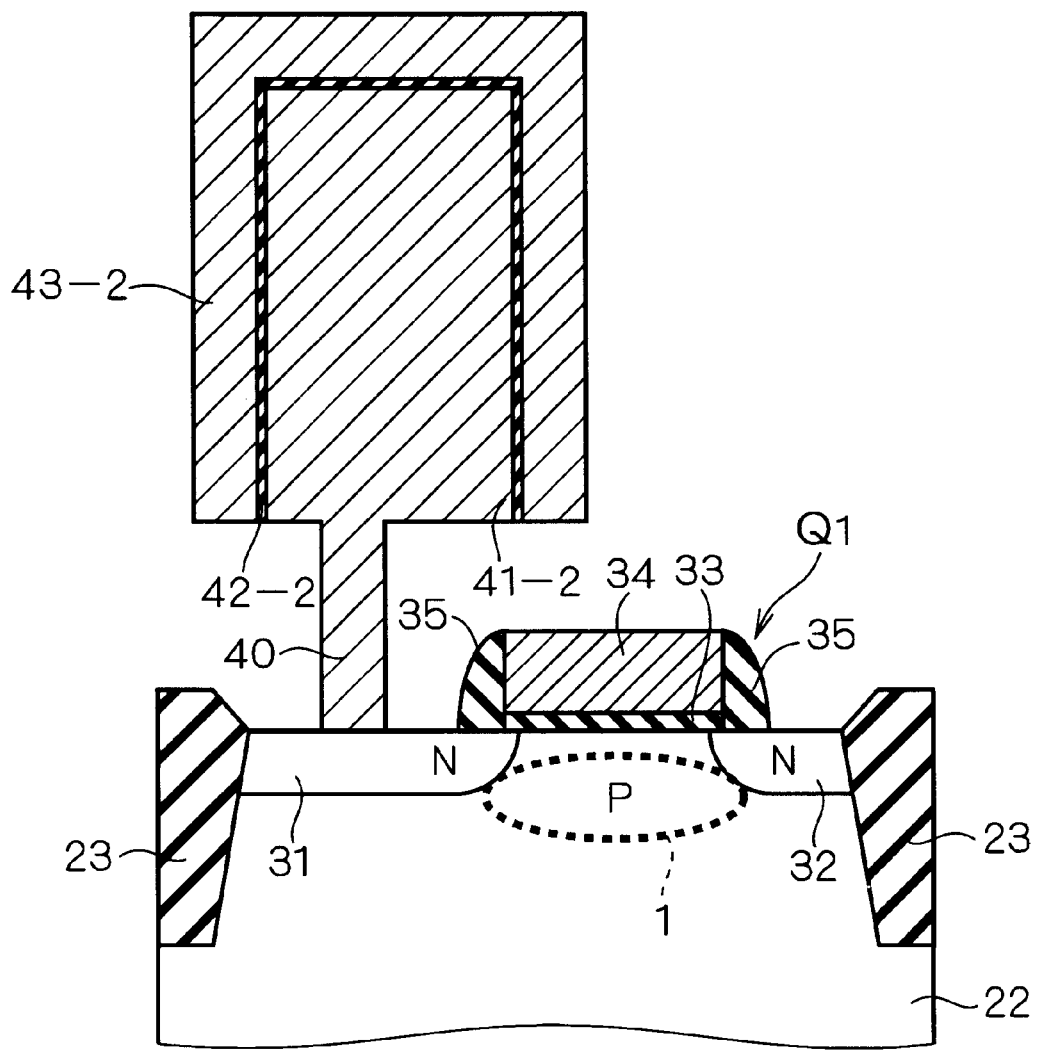
FIG. 28 is a sectional view illustrating a memory cell structure according to a second preferred embodiment.

FIG. 28 is a sectional view illustrating a memory cell structure of a DRAM according to a second preferred embodiment. As shown in FIG. 28, in addition to the usual MOS transistor structure, a local channel dope region 2 is disposed as an NMOS transistor characteristic adjusting region, under a gate electrode 34 of an NMOS transistor Q1 between source/drain regions 31 and 32. That is, the local channel dope region 2 is formed so that it overlaps substantially the entire surface of a channel region in a plane view, and that it has little or no overlap relationship with the source/drain regions 31 and 32.

Since the NMOS transistor Q1 and a capacitor C1 have the same structure as the stack-type memory cell (Type 2) shown in FIGS. 221 and 222, a description thereof is thus omitted.

Figure 29:
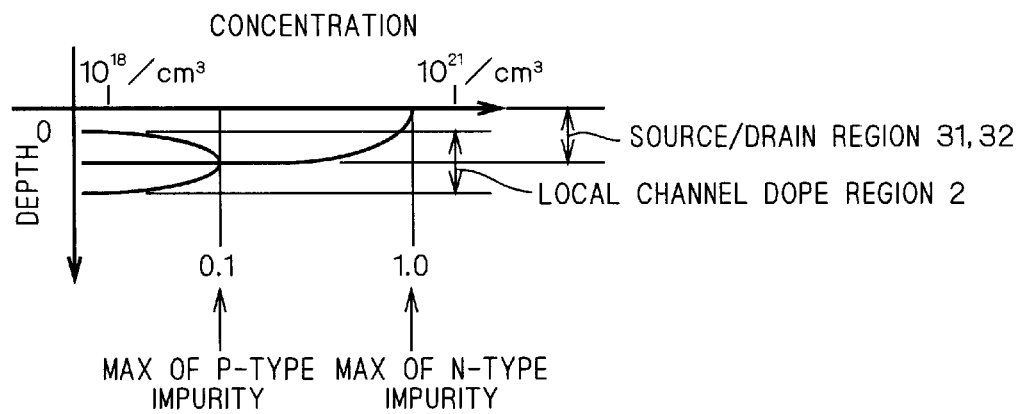
FIG. 29 is a graph showing an impurity profile of an NMOS transistor in the second preferred embodiment.

FIG. 29 is a graph showing an impurity profile of the NMOS transistor Q1 in the second preferred embodiment. As shown in FIG. 29, it is set so that the maximum value MAX of P of the P type impurity concentration of a local channel dope region 2 ranges from $1\times10^{18}$ to $1\times10^{19}$, and the maximum value MAX of P is not less than 10% and not more than 100% of the maximum value MAX of N of the N type impurity concentration of the source/drain region 31 (32) (the case of just 10% is shown in FIG. 29). Similarly to the first preferred embodiment, the proximate region of the interface between silicon and a silicon oxide film is beyond the object, and the maximum value MAX of P and the maximum value MAX of N indicate the maximum value in the region except for the interface proximate region.

Specifically, in the second preferred embodiment, the maximum value MAX of N of the N type impurity concentration of the source/drain region 31 (32) and the maximum value MAX of P of the P type impurity concentration of the local channel dope region 2 satisfy the conditions (I), (II) and (III) described in the first preferred embodiment.

Thus, similarly to the first preferred embodiment, the memory cell structure of the second preferred embodiment satisfies the mentioned conditions (I), (II) and (III), a depletion layer can also extend into the source/drain region 31 (32) during the time the NMOS transistor Q1 operates.

It is therefore able to obtain the best characteristic about assurance of resistance to punch-through and leak current reduction (relaxation of junction capacitance).

Figure 30:
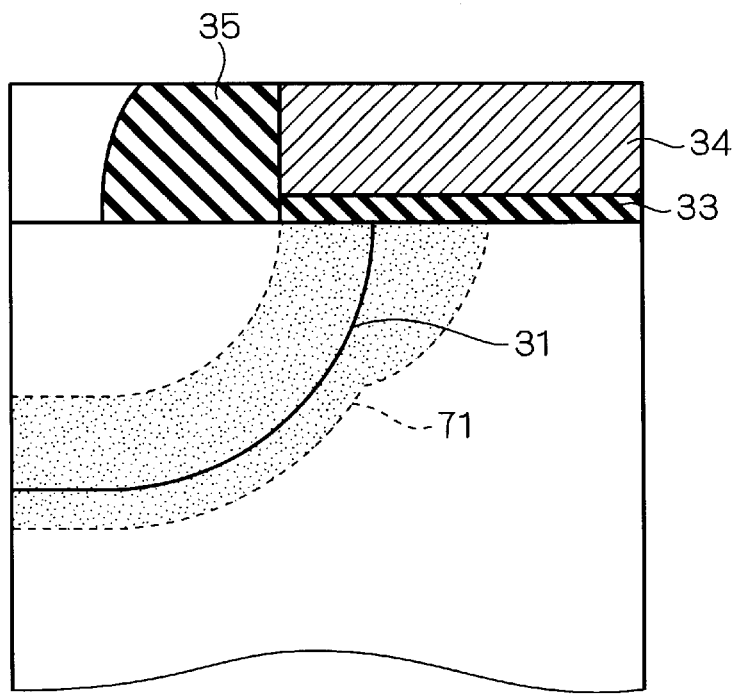
FIG. 30 is a schematic diagram illustrating the state of a depletion layer of source/drain regions at a gate electrode edge proximate region in the first preferred embodiment.

FIGS. 30 and 31 are diagrams illustrating extension of a depletion layer in the memory cell structure according to the first and second preferred embodiments, respectively. When compared the extension of a depletion layer 71 in FIG. 30 with that of a depletion layer 72 in FIG. 31, it is noticed that the depletion layer in the structure of the second preferred embodiment extends further below the source/drain region 31, than the structure of the first preferred embodiment. This provides a more effect of reducing leak current than the first preferred embodiment.

Although FIG. 28 illustrates the capacitor structure of the stack-type memory cell (Type 2), without limiting to this, a variety of capacitor structures, e.g., the capacitor structures shown in FIGS. 8 to 27, can be adopted as in the first preferred embodiment.

Third Preferred Embodiment

Figure 32:
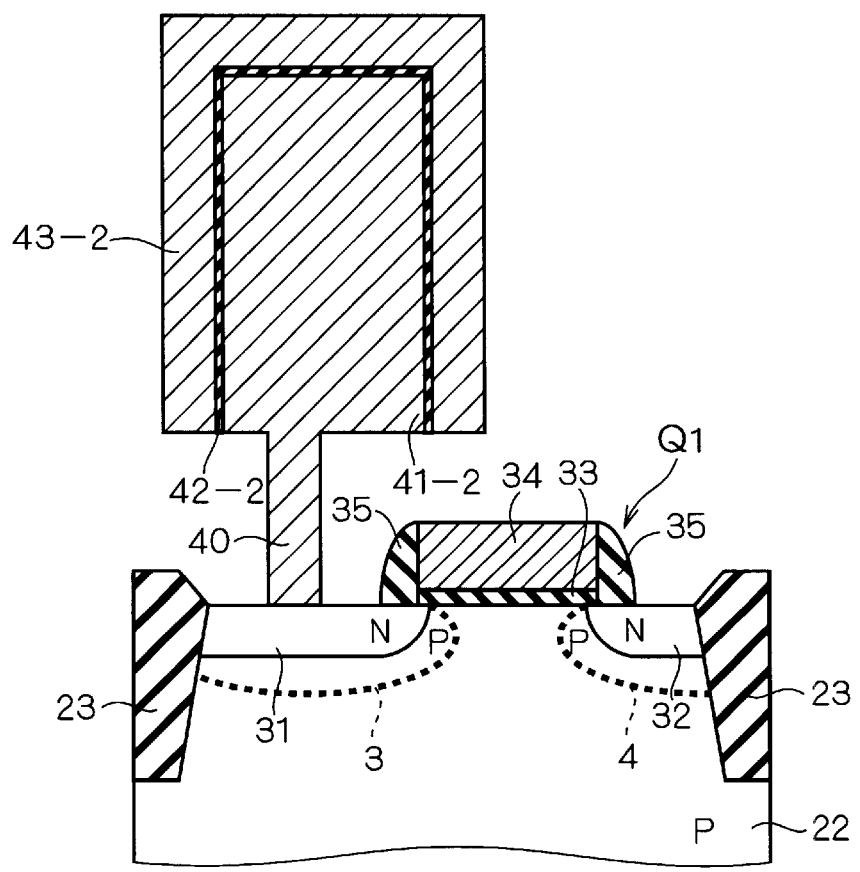
FIG. 32 is a sectional view illustrating a memory cell structure according to a third preferred embodiment.

FIG. 32 is a sectional view illustrating a memory cell structure of a DRAM according to a third preferred embodiment. As shown in FIG. 32, in addition to the usual MOS transistor structure, pocket regions 3 and 4 are disposed as an NMOS transistor characteristic adjusting region. The pocket regions 3 and 4 overlap substantially the entire of source/drain regions 31 and 32, and extend to part of a channel region underlying a gate oxide film 33 and also extend downwardly of the bottom of the source/drain regions 31 and 32.

Since the NMOS transistor Q1 and a capacitor C1 have the same structure as the stack-type memory cell (Type 2) as shown in FIGS. 221 and 222, a description thereof is thus omitted.

Figure 33:
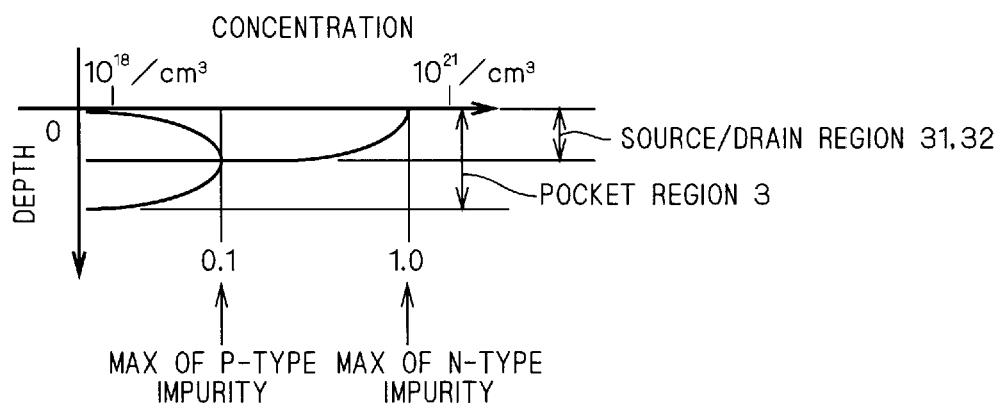
FIG. 33 is a graph showing an impurity profile of an NMOS transistor in the third preferred embodiment.

FIG. 33 is a graph showing an impurity profile of the NMOS transistor Q1 in the third preferred embodiment. As shown in FIG. 33, it is set so that the maximum value MAX of P of the P type impurity concentration of the pocket region 3 (4) ranges from $1\times10^{18}$ to $1\times10^{19}$, and the maximum value MAX of P is not less than 10% and not more than 100% of the maximum value MAX of N of the N type impurity concentration of the source/drain region 31 (32) (the case of just 10% is shown in FIG. 33). Similarly to the first preferred embodiment, the proximate region of the interface between silicon and a silicon oxide film is beyond the object, and the maximum value MAX of P and the maximum value MAX of N indicate the maximum value in the region except for the interface proximate region.

Specifically, in the third preferred embodiment, the maximum value MAX of N of the N type impurity concentration of the source/drain region 31 (32) and the maximum value MAX of P of the P type impurity concentration of the pocket region 3 (4) satisfy the conditions (I), (II) and (III) described in the first preferred embodiment.

Thus, similarly to the first preferred embodiment, the memory cell structure of the third preferred embodiment satisfies the mentioned conditions (I), (II) and (III), thereby a depletion layer can also extend into the source/drain region 31 (32) during the time the NMOS transistor Q1 operates.

It is therefore able to obtain the best characteristics about assurance of resistance to punch-through and leak current reduction (relaxation of junction capacitance).

Figure 34:
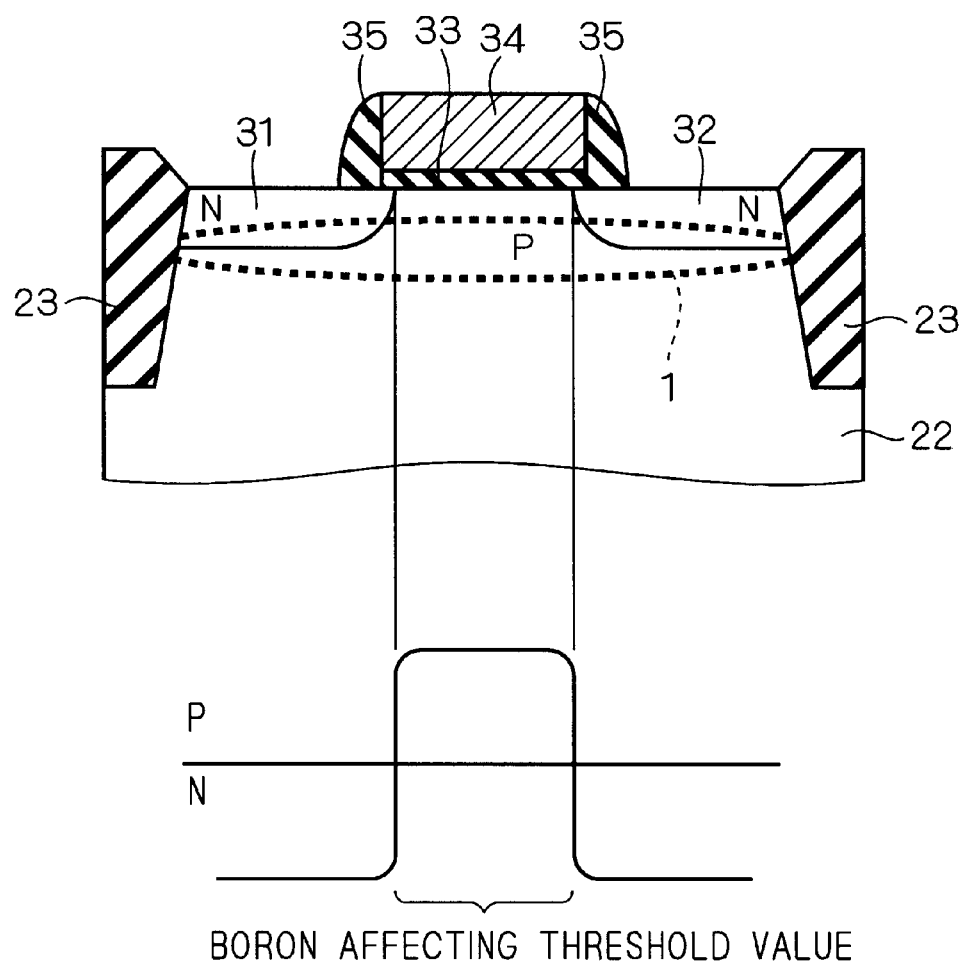
FIG. 34 is an explanatory diagram illustrating the situation of boron affecting the threshold value of an NMOS transistor in the first preferred embodiment.

FIGS. 34 and 35 are diagrams illustrating a state that boron (a P type impurity) affecting the threshold value is distributed on the surface of a P well region 22 in the memory cell structures of the first and third preferred embodiments, respectively. From a comparison between the P type impurity state in FIG. 34 and the P type impurity state in FIG. 35, it is noticed that in the structure of the third preferred embodiment the P type impurity concentration is held low in the middle of the channel region, and therefore, the threshold value of the NMOS transistor Q1 can be set low and exhibit the effect of suppressing an increase in threshold voltage, thereby increasing the amount of supply current.

Although FIG. 32 illustrates the capacitor structure of the stack-type memory cell (Type 2), without limiting to this, a variety of capacitor structures, e.g., the capacitor structures shown in FIGS. 8 to 27, can be adopted as in the first preferred embodiment.

Fourth Preferred Embodiment

Figure 36:
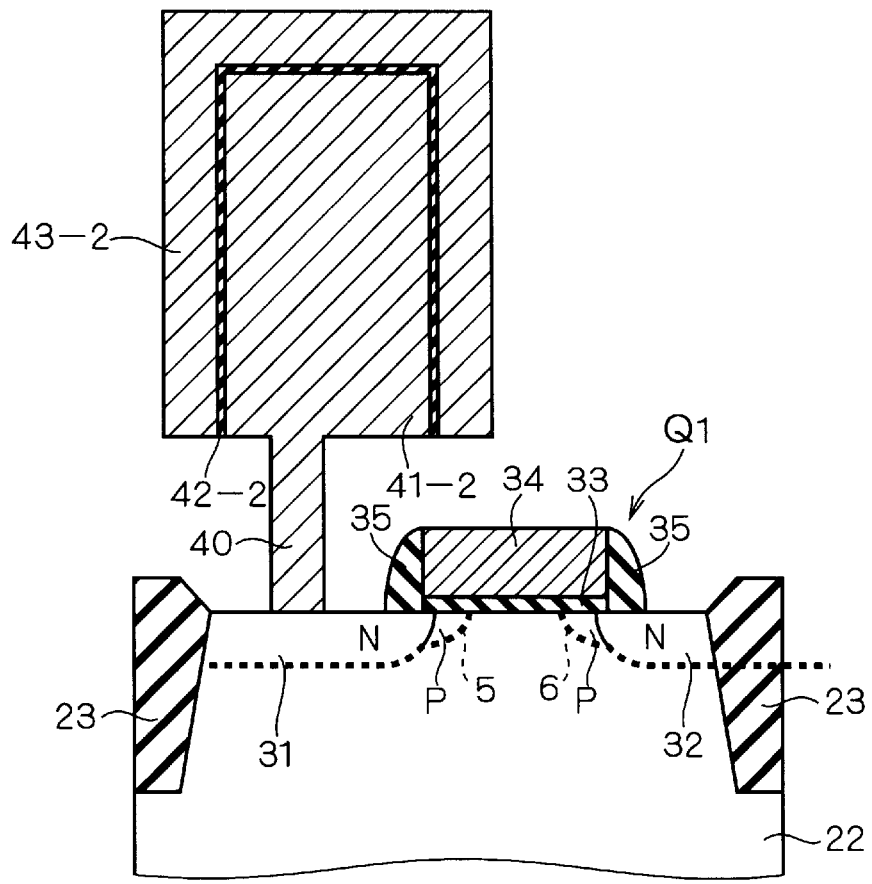
FIG. 36 is a sectional view illustrating a memory cell structure according to a fourth preferred embodiment.

FIG. 36 is a sectional view illustrating a memory cell structure of a DRAM according to a fourth preferred embodiment. As shown in FIG. 36, in addition to the usual MOS transistor structure, shallow pocket regions 5 and 6 are disposed as an NMOS transistor characteristic adjusting region. The shallow pocket regions 5 and 6 overlap substantially the whole of source/drain regions 31 and 32, and extend slightly to a channel region in a P well region 22, and have approximately the same forming depth as the source/drain regions 31 and 32.

Since the NMOS transistor Q1 and a capacitor C1 have the same structure as the stack-type memory cell (Type 2) as shown in FIGS. 221 and 222, a description thereof is thus omitted.

Figure 37:
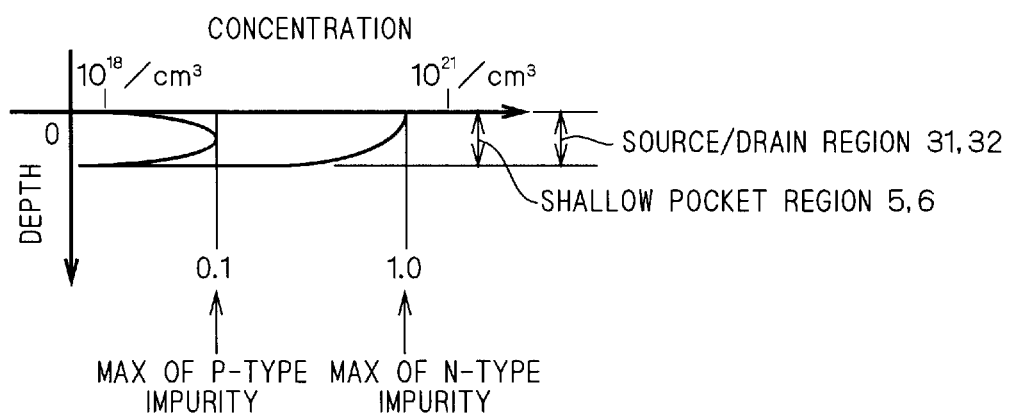
FIG. 37 is a graph showing an impurity profile of an NMOS transistor in the fourth preferred embodiment.

FIG. 37 is a graph showing an impurity profile of the NMOS transistor Q1 in the fourth preferred embodiment. As shown in FIG. 37, it is set so that the maximum value MAX of P of the P type impurity concentration of the shallow pocket region 5 (6) ranges from $1 \times 10^{18}$ to $1 \times 10^{19}$, and the maximum value MAX of P is not less than 10% and not more than 100% of the maximum value MAX of N of the N type impurity concentration of the source/drain region 31 (32) (the case of just 10% is shown in FIG. 37). Similarly to the first preferred embodiment, the proximate region of the interface between silicon and a silicon oxide film is beyond the object, and the maximum value MAX of P and the maximum value MAX of N indicate the maximum value in the region except for the interface proximate region.

Specifically, in the fourth preferred embodiment, the maximum value MAX of N of the N type impurity concentration of the source/drain region 31 (32) and the maximum value MAX of P of the P type impurity concentration of the shallow pocket region 5 (6) satisfy the conditions (I), (II) and (III) described in the first preferred embodiment.

Thus, similarly to the first preferred embodiment, the memory cell structure of the fourth preferred embodiment satisfies the mentioned conditions (I), (II) and (III), thereby a depletion layer can also extend into the source/drain region 31 (32) during the time the NMOS transistor Q1 operates.

It is therefore able to obtain the best characteristics about assurance of resistance to punch-through and leak current reduction (relaxation of junction capacitance).

In addition, like the third preferred embodiment, with the structure of the fourth preferred embodiment, the P type impurity concentration is held low in the middle of the channel region, and therefore, the threshold value of the NMOS transistor Q1 can be set low and exhibit the effect of suppressing an increase in threshold voltage, thereby increasing the amount of supply current.

FIGS. 38 and 39 are diagrams illustrating extension of a depletion layer in the memory cell structure of the first and fourth preferred embodiments, respectively. A comparison of the extension of a depletion layer 73 in FIG. 38 with that of a depletion layer 74 in FIG. 39, indicates that in the structure of the fourth preferred embodiment the depletion layer 74 extends further downwardly of the source/drain region 31 than the structure of the first preferred embodiment, thus leading to a more effect of reducing leak current than the first preferred embodiment.

Although FIG. 36 illustrates the capacitor structure of the stack-type memory cell (Type 2), without limiting to this, a variety of capacitor structures, e.g., the capacitor structures shown in FIGS. 8 to 27, can be adopted as in the first preferred embodiment.

Fifth Preferred Embodiment

Consideration

Figure 40:
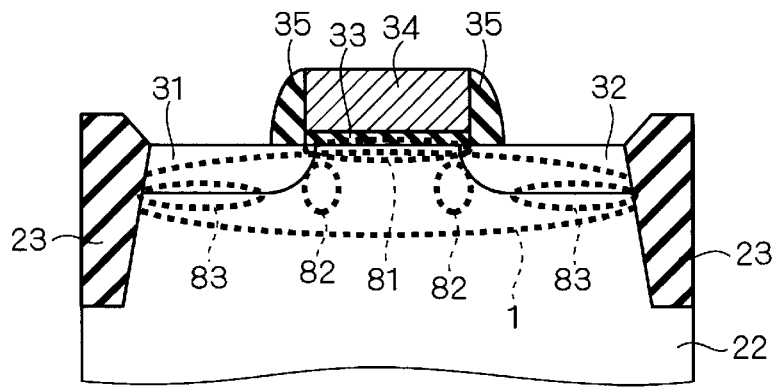
FIGS. 40 to 43 are explanatory diagrams illustrating the principle of a fifth preferred embodiment.

In an MOS transistor of the usual structure employing a channel dope region 1 shown in FIG. 40, it is considered that the P type impurity concentration of the following regions 81 to 83 substantially determine the electrical characteristic of the MOS transistor.

Specifically, it seems that the threshold value is determined by the impurity concentration of a threshold determining region 81 which is a channel region proximate region immediately below a gate oxide film 33, that the resistance to punch-through is determined by the impurity concentration of a punch-through determining region 82 which is an edge proximate region on the side surface of a source/drain region 31 (32), and that the amount of junction leak current is determined by the impurity concentration of a leak current determining region 83 underlying the source/drain region 31 (32).

Figure 41:
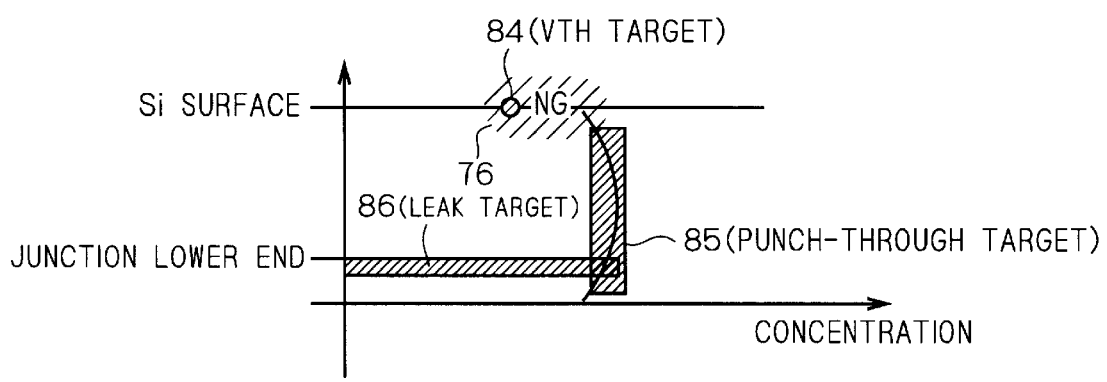
Figure 42:
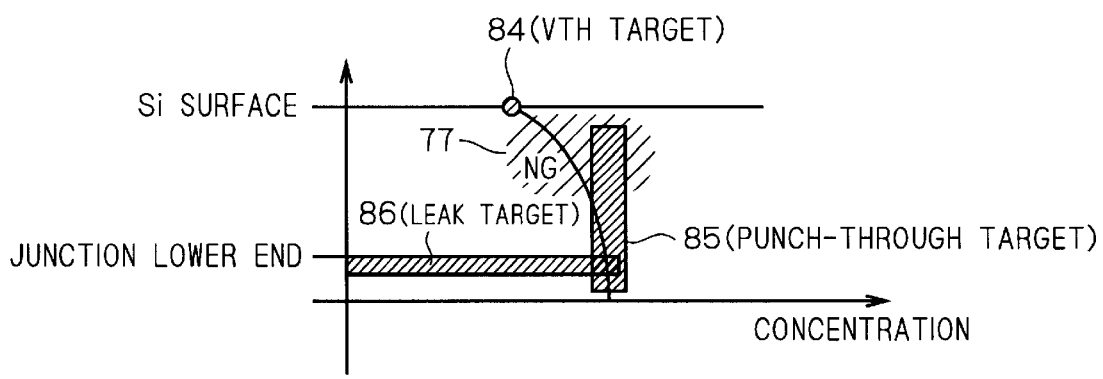

FIGS. 41 and 42 are graphs showing the relationship between the electrical characteristic of an NMOS transistor Q1 and the P type impurity concentration. In these graphs, when the impurity concentration is present in an optimum threshold zone 84, the threshold value of the NMOS transistor Q1 can be set at its optimum value. When the impurity concentration is present in an optimum punch-through zone 85 over substantially the entire area except for the vicinity of the surface of a P well region 22, assurance of resistance to punch-through and relaxation of edge field can be set to a good characteristic in well-balance. When the impurity concentration is present at an optimum leak current suppressing zone 86, suppression of leak current can be appropriately controlled. In these graphs, the term "Si surface" denotes the surface of the P well region 22, and the term "junction lower end" indicates the lowermost position of the source/drain region 31 (32).

In the case of FIG. 41, the impurity concentration is present in the optimum punch-through zone 85 and optimum leak current suppressing zone 86. This allows for a good characteristic about assurance of resistance to punch-through and leak current reduction, however, the impurity concentration departs considerably from the optimum threshold zone 84 and locates at an NG zone 76, thus failing to set to a good threshold voltage.

In the case of FIG. 42, the impurity concentration is present in the optimum threshold zone 84 and optimum leak current suppressing zone 86. Therefore, the setting of an optimum threshold voltage and the optimization of leak current reduction are attainable, however, the impurity concentration departs from the optimum punch-through zone 85 and locates at an NG zone 77, thus failing to obtain a good characteristic about assurance of resistance to punch-through.

Referring to FIGS. 41 and 42, with the structure of FIG. 40 in which the channel dope region 1 is formed by a single P type impurity implantation (and diffusion), it is possible to set an impurity concentration so as to locate at two zones selected from the optimum threshold zone 84, optimum punch-through zone 85 and optimum leak current suppressing zone 86. It is however very difficult to set an impurity concentration so as to locate at all the three zones.

Figure 43:
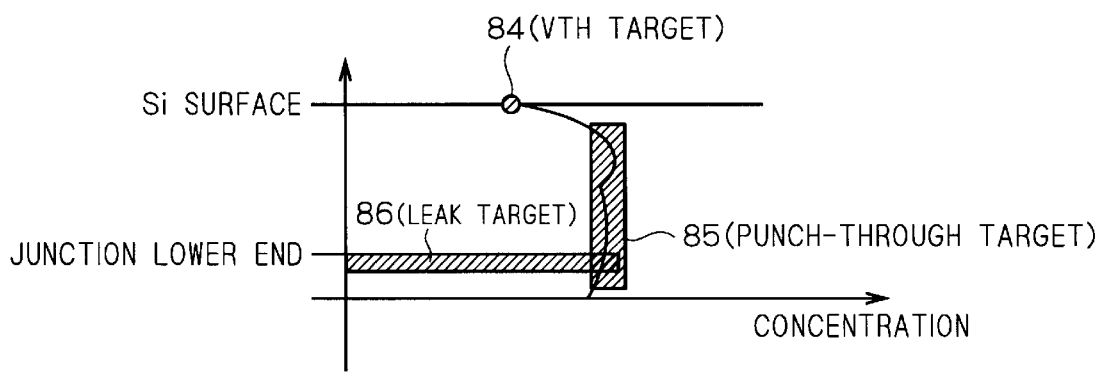

That is, in order to set an impurity concentration so as to locate at all the three zones of 84, 85 and 86, as shown in FIG. 43, it is necessary to perform a P type impurity implantation two times and to set an impurity distribution having two peaks.

Construction

Figure 44:
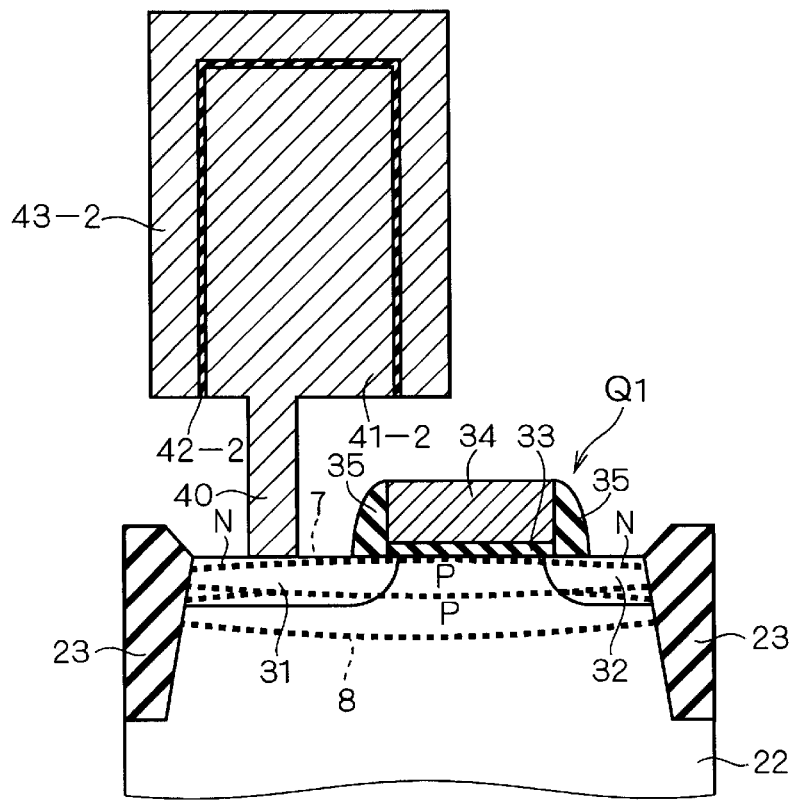
FIG. 44 is a sectional view illustrating a memory cell structure in the fifth preferred embodiment.

FIG. 44 is a sectional view illustrating a memory cell structure of a DRAM according to the fifth preferred embodiment. As shown in FIG. 44, in addition to the usual MOS transistor structure, a channel dope region 7 is disposed at a relatively shallow region having substantially the same depth as a source/drain region 31 (32), and a channel dope region 8 is disposed at a relatively deep region so as to extend from the bottom of the source/drain region 31 to a deeper position.

Since an NMOS transistor Q1 and a capacitor C1 have the same structure as the stack-type memory cell (Type 2) as shown in FIGS. 221 and 222, a description thereof is thus omitted.

Figure 45:
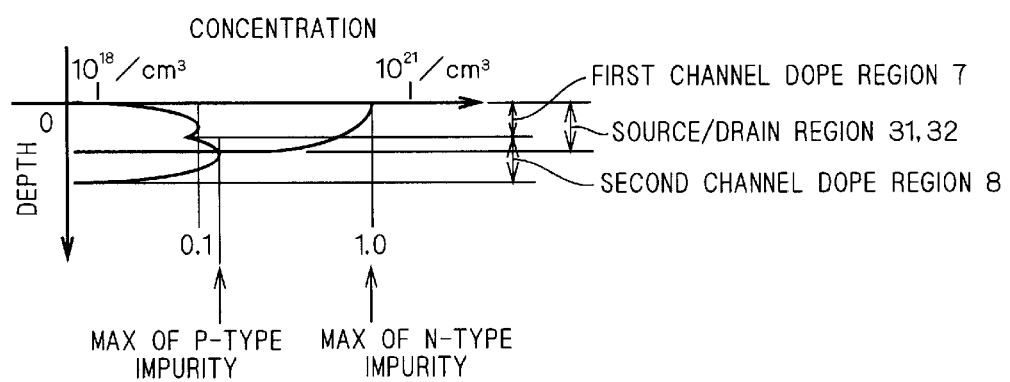
FIG. 45 is a graph showing an impurity profile of an NMOS transistor in the fifth preferred embodiment.

FIG. 45 is a graph showing an impurity profile of the NMOS transistor Q1 in the fifth preferred embodiment. As shown in FIG. 45, it is set so that the maximum value MAX of P of the P type impurity concentration in the channel dope regions 7 and 8 ranges from $1 \times 10^{18}$ to $1 \times 10^{19}$, and the maximum value MAX of P is not less than 10% and not more than 100% of the maximum value MAX of N of the N type impurity concentration of the source/drain region 31 (32) (the case of just 10% is shown in FIG. 45). Similarly to the first preferred embodiment, the proximate region of the interface between silicon and a silicon oxide film is beyond the object, and the maximum value MAX of P and the maximum value MAX of N indicate the maximum value in the region except for the interface proximate region.

Although FIG. 45 shows the case that the maximum value of the P type impurity concentration of the channel dope region 8 is higher than that of the channel dope region 7, it may be reversed.

That is, the maximum value MAX of N of the N type impurity concentration of the source/drain region 31 (32) and the maximum value MAX of P of the P type impurity concentration of the channel dope region 7 or 8 satisfy the conditions (I), (II) and (III) as described in the first preferred embodiment. As used herein, the maximum value MAX of P of the channel dope region 7 or 8 means the maximum value of the P type impurity concentration of at least one of the channel dope regions 7 and 8.

Thus, similarly to the first preferred embodiment, the memory cell structure of the fifth preferred embodiment satisfies the mentioned conditions (I), (II) and (III), thereby obtaining the best characteristic about assurance of resistant to punch-through and leak current reduction (relaxation of junction capacitance).

Further, as shown in FIG. 43, the fifth preferred embodiment can realize an impurity distribution that is present in all of the optimum threshold zone 84, optimum punch-through zone 85 and optimum leak current suppressing zone 86, by individually performing an ion implantation to form the channel dope regions 7 and 8, respectively. Therefore, all of threshold voltage, resistance to punch-through and leak current can be optimized in well-balance.

Combination with Channel Dope Region (First to Fourth Aspects)

It is the basis for the fifth preferred embodiment to form a P type impurity diffusion region at a relatively shallow region and a relatively deep region, respectively. A variety of aspects can be considered by combining, as a P type impurity diffusion region, a channel dope region, local channel dope region, pocket region, and shallow pocket region.

Firstly a description will be given of various structures employing a channel dope region as a P type impurity diffusion region to be formed at a relatively deep region.

Figure 46:
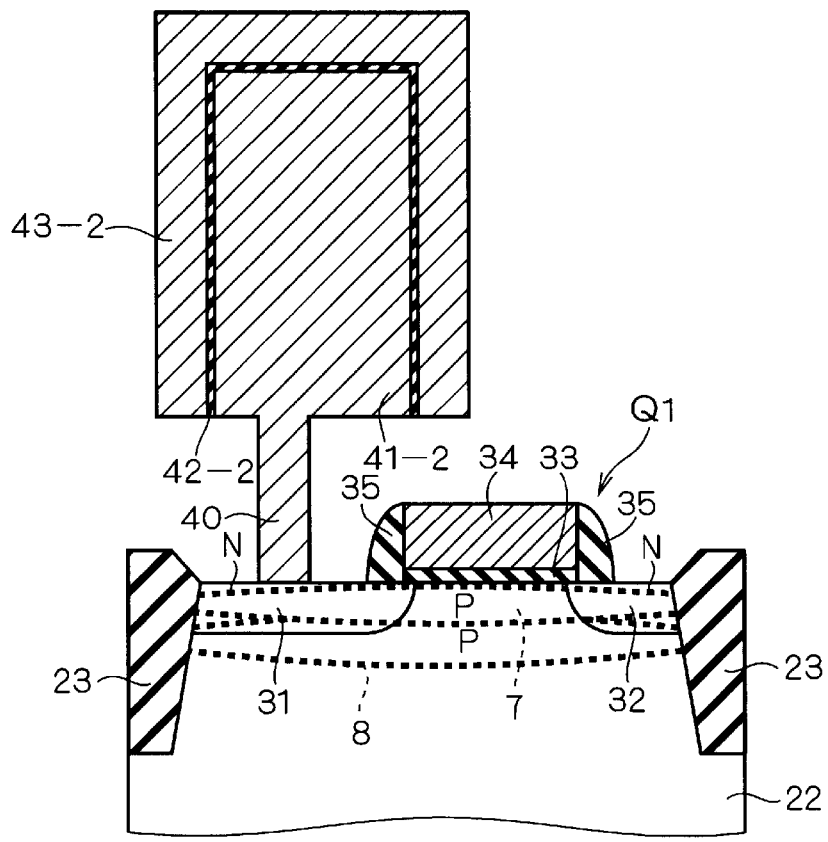
FIG. 46 is a sectional view illustrating a first aspect of the fifth preferred embodiment.

FIG. 46 is a sectional view illustrating a first aspect of the fifth preferred embodiment. In the structure of FIG. 46, a channel dope region 7 and a channel dope region 8 are employed as a P type impurity diffusion region formed at a relatively shallow region and at a relatively deep region, respectively.

Figure 47:
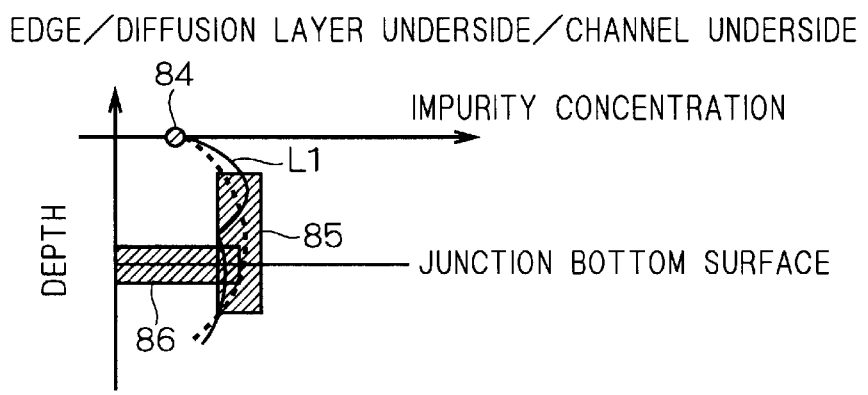
FIG. 47 is an explanatory diagram illustrating an impurity profile of the structure of FIG. 46.

FIG. 47 is a diagram illustrating a P type impurity distribution in the first aspect. In FIG. 47, a region where the bottom surface of source/drain regions 31 and 32 matches a flat surface position is hereinafter sometimes referred to as a "diffusion layer underside" in the specification and drawings. A region where an edge proximate region of a gate electrode 34 matches a flat surface position is hereinafter sometimes referred to as "edge" in the specification and drawings. A region where a channel center proximate region matches a flat surface position is hereinafter sometimes referred to as a "channel underside" in the specification and drawings. The first aspect has an impurity distribution L1 locating at optimum zones 84, 85 and 86 (represented by thick solid line) with respect to all the foregoing regions, thereby obtaining a good characteristic about all of threshold voltage, assurance of resistance to punch-through, and leak current. In FIG. 47, a broken line indicates an impurity distribution obtained by a single diffusion processing.

In the fifth preferred embodiment, it is desirable from the viewpoint of relaxation of gate edge field that the concentration of a punch-through determining region 82 is set low in such a range that assurance of resistance to punch-through is obtained appropriately.

With the first aspect of combining the channel dope regions 7 and 8, the effect of reducing edge leak (relaxation of gate edge field) and the effect of bottom leak (reduction in leak current) can be expected as compared to the case of performing one diffusion processing.

Figure 48:
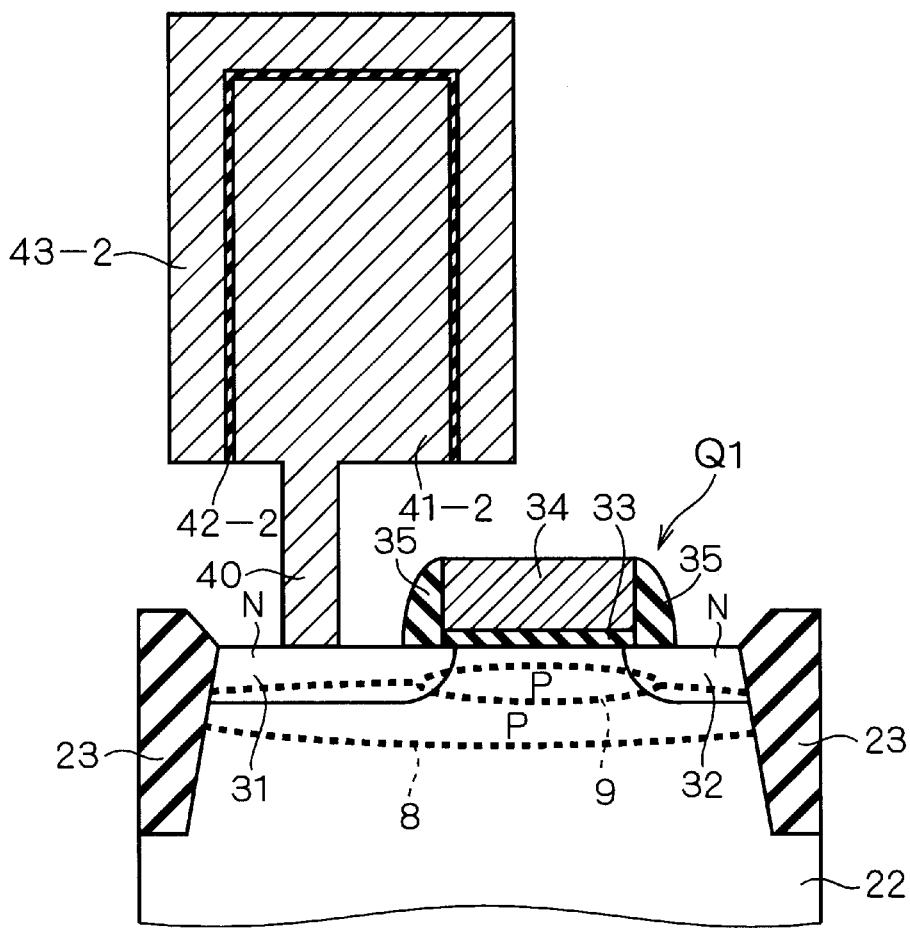
FIG. 48 is a sectional view illustrating a second aspect of the fifth preferred embodiment.

FIG. 48 is a sectional view illustrating a second aspect of the fifth preferred embodiment. The structure of FIG. 48 employs a local channel region 9 as a P type impurity diffusion region formed at a relatively shallow region and employs a channel dope region 8 as a P type impurity diffusion region formed at a relatively deep region.

Figure 49:
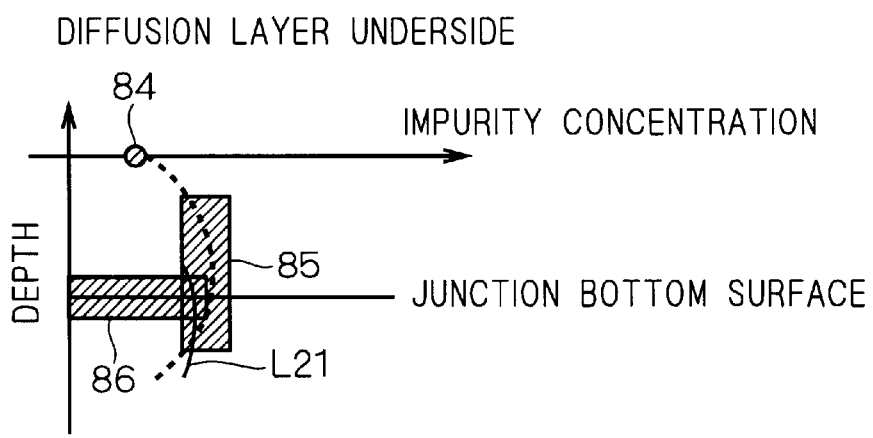
FIGS. 49 and 50 are explanatory diagrams illustrating an impurity profile of the structure of FIG. 48.
Figure 50:
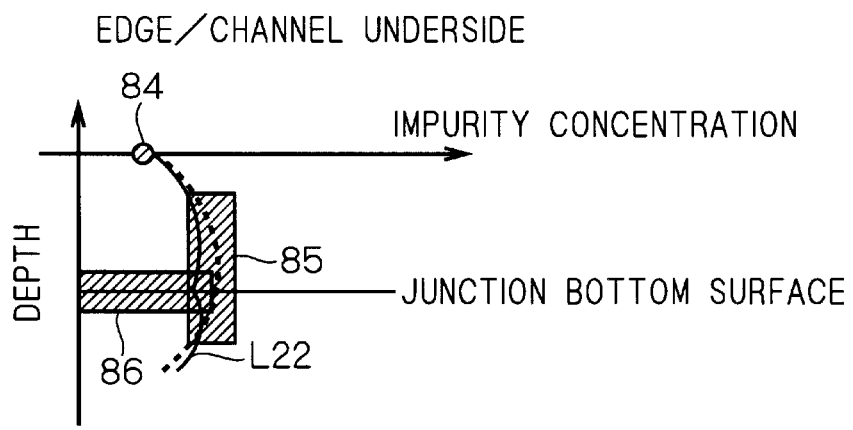

FIG. 49 is a diagram illustrating a P type impurity distribution at the edge and the channel underside in the second aspect. FIG. 50 is a diagram illustrating a P type impurity distribution at the diffusion layer underside in the second aspect. FIGS. 49 and 50 illustrate impurity distributions L21 and L22, each of which is present in an optimum threshold zone 84 in respect of the edge and the channel underside, an optimum punch-through zone 85 in respect of the edge, and an optimum leak current suppressing zone 86 in respect of the diffusion layer underside. It is therefore able to obtain a good characteristic about all of threshold voltage, assurance of resistance to punch-through and leak current.

With the structure of the second aspect of combining the local channel region 9 and channel dope region 8, the effect of reducing edge leak and the effect of reducing bottom leak can be expected as compared to the case of performing one diffusion process.

Figure 51:
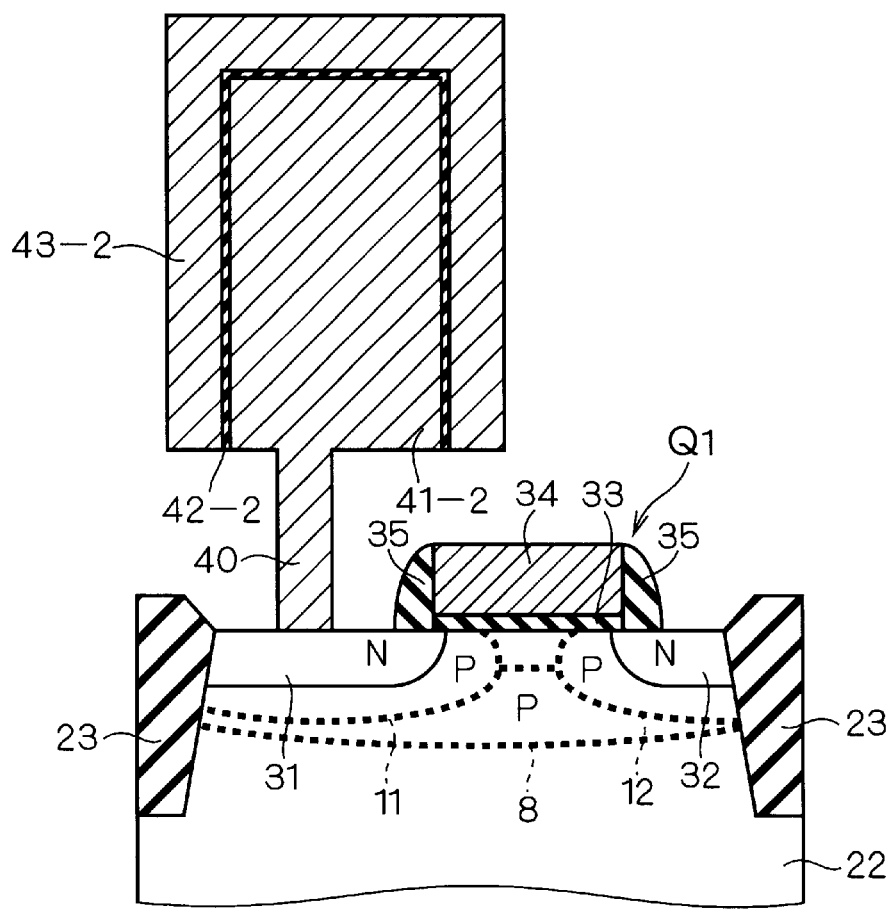
FIG. 51 is a sectional view illustrating a third aspect of the fifth preferred embodiment.

FIG. 51 is a sectional view illustrating a third aspect of the fifth preferred embodiment. The structure of FIG. 51 employs pocket regions 11 and 12 as a P type impurity diffusion region formed at a relatively shallow region, and employs a channel dope region 8 as a P type impurity diffusion region formed at a relatively deep region.

Figure 52:
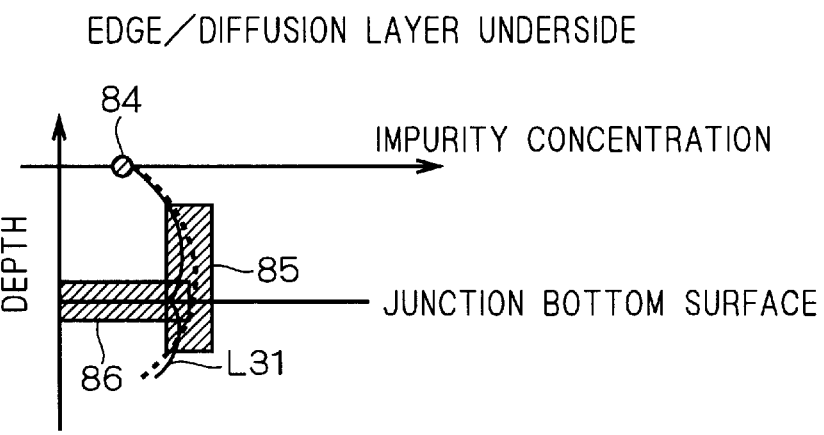
FIGS. 52 and 53 are explanatory diagrams illustrating an impurity profile of the structure of FIG. 51.
Figure 53:
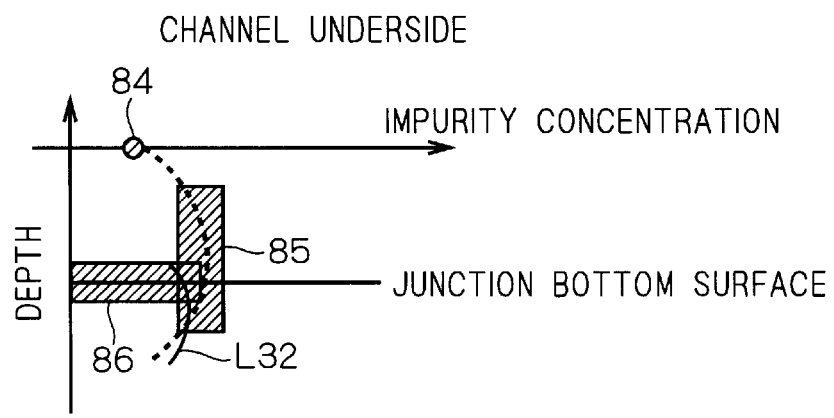

FIG. 52 is a diagram illustrating a P type impurity distribution at the edge and the diffusion layer underside in the third aspect. FIG. 53 is a diagram illustrating a P type impurity distribution at the channel underside in the third aspect. FIGS. 52 and 53 illustrate impurity distributions L31 and L32, each of which is present in optimum threshold zone 84 in respect of the edge, an optimum punch-through zone 85 in respect of the edge, and an optimum leak current suppressing zone 86 in respect of the diffusion layer underside. It is therefore able to obtain a good characteristic about all of threshold voltage, assurance of resistance to punch-through, and leak current.

With the third aspect of combining the pocket regions 11, 12 and the channel dope region 8, the effect of reducing edge leak and bottom leak can be expected as compared to the case of performing one diffusion process.

Figure 54:
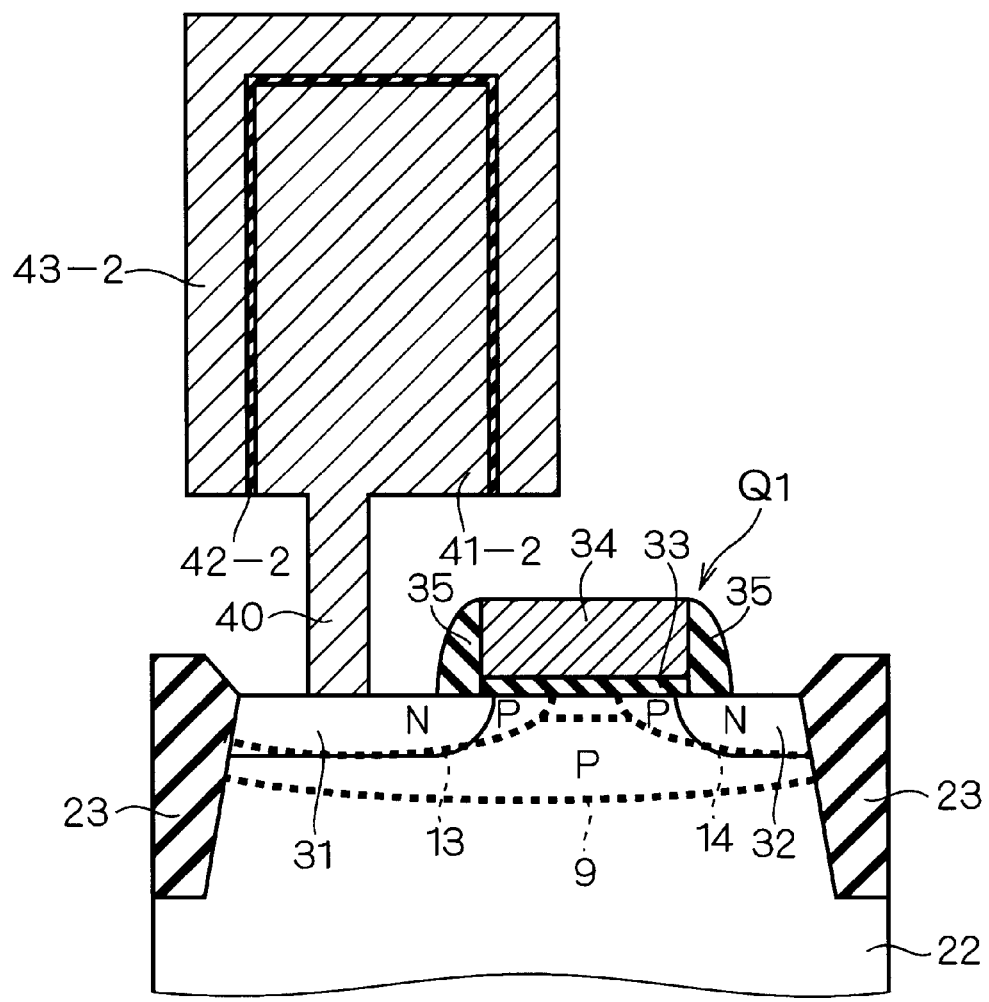
FIG. 54 is a sectional view illustrating a fourth aspect of the fifth preferred embodiment.

FIG. 54 is a sectional view illustrating a fourth aspect of the fifth preferred embodiment. The structure of FIG. 54 employs shallow pocket regions 13 and 4 as a P type impurity diffusion region formed at a relatively shallow region, and employs a channel dope region 8 as a P type impurity diffusion region formed at a relatively deep region.

Figure 55:
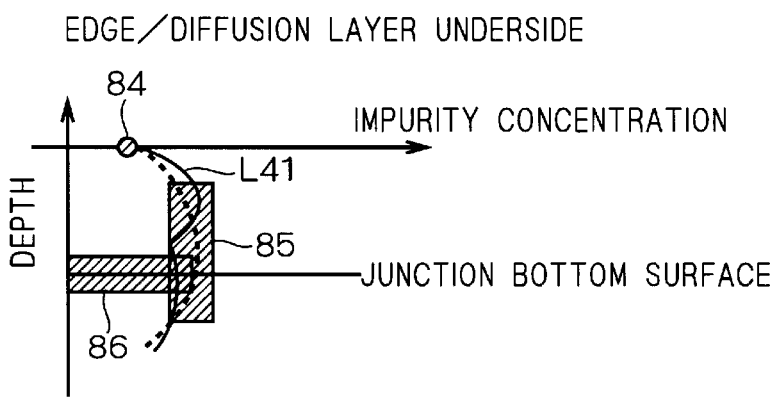
FIGS. 55 and 56 are explanatory diagrams illustrating an impurity profile of the structure of FIG. 54.
Figure 56:
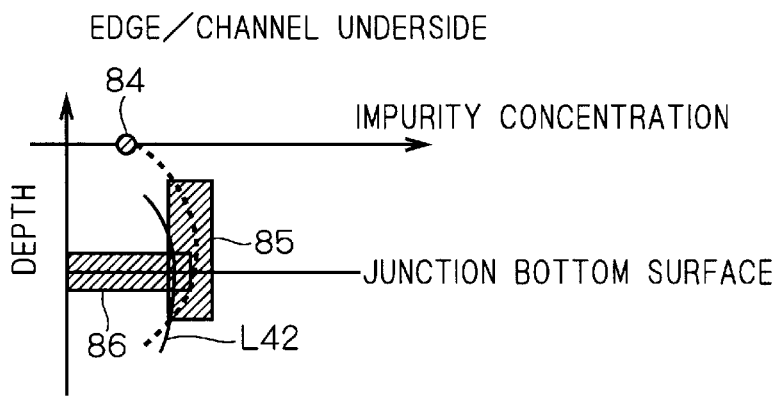

FIG. 55 is a diagram illustrating a P type impurity distribution at the edge and the diffusion layer underside in the fourth aspect. FIG. 56 is a diagram illustrating a P type impurity distribution at the channel underside in the fourth aspect. As shown in these figures, the fourth aspect has impurity distributions L41 and L42 in which an optimum threshold zone 84 is present in respect of the edge, an optimum punch-through zone 85 is present in respect of the edge, and an optimum leak current suppressing zone 86 is present in respect of the diffusion layer underside. It is therefore able to obtain a good characteristic about all of threshold voltage, assurance of resistance to punch-through, and leak current.

With the fourth aspect of combining the shallow pocket regions 13, 14 and the channel dope region 8, the effect of reducing bottom leak can be expected as compared to the case of performing one diffusion process.

Combination with Local Channel Dope Region (Fifth to Eighth Aspects)

Description will now be given of various structures employing a local channel dope region as a P type impurity diffusion region to be formed at a relatively deep region.

Figure 57:
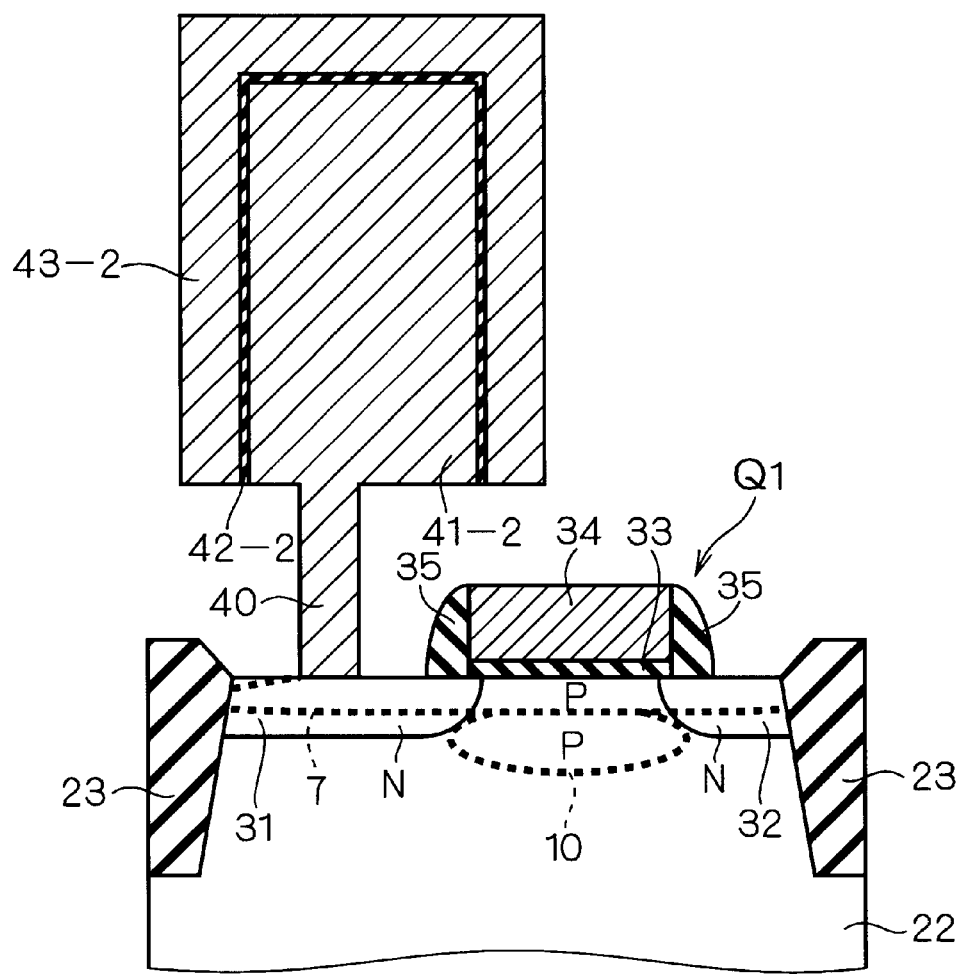

FIG. 57 is a sectional view illustrating a fifth aspect of the fifth preferred embodiment. The structure of FIG. 57 employs a channel dope region 7 as a P type impurity diffusion region formed at a relatively shallow region, and employs a local channel dope region 10 as a P type impurity diffusion region formed at a relatively deep region.

Figure 58:
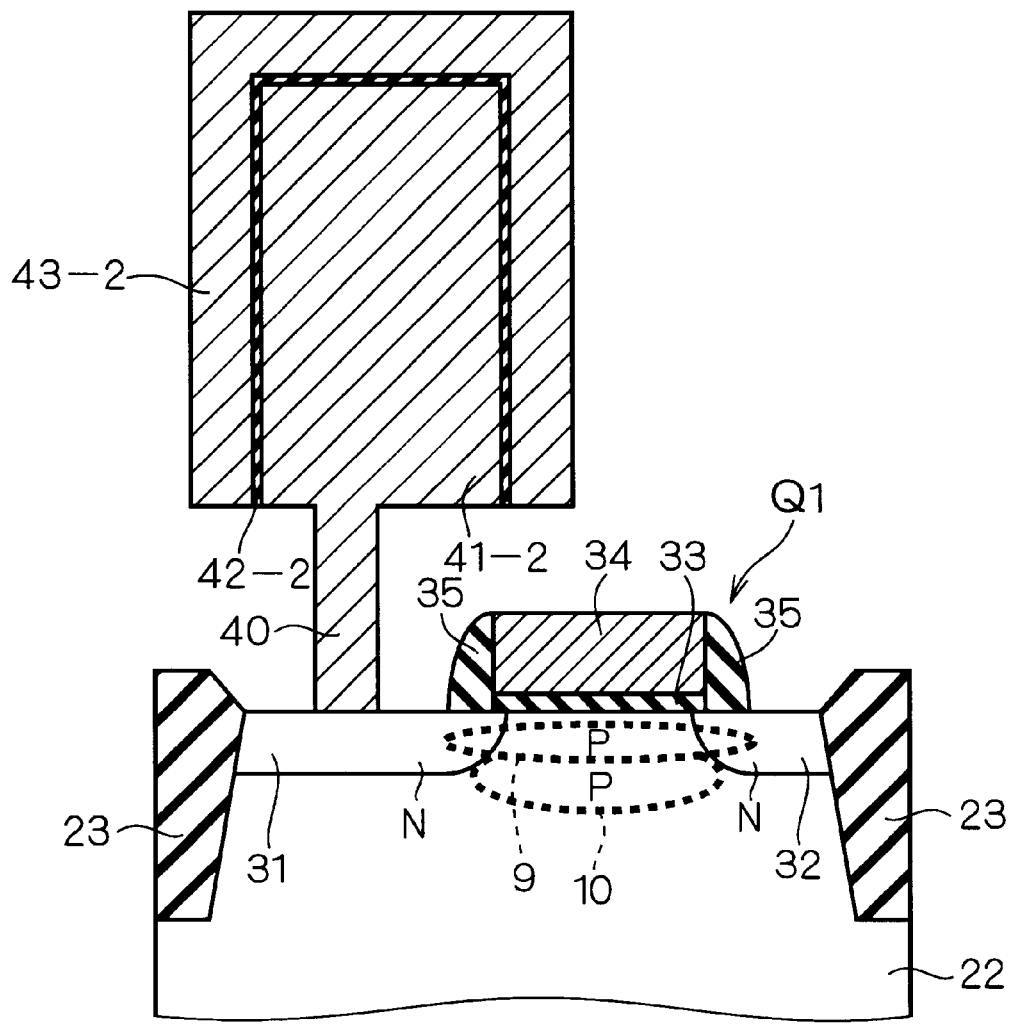

FIG. 58 is a sectional view illustrating a sixth aspect of the fifth preferred embodiment. The structure of FIG. 58 employs a local channel region 9 as a P type impurity diffusion region formed at a relatively shallow region, and employs a local channel dope region 10 as a P type impurity diffusion region formed at a relatively deep region.

FIG. 59 is a sectional view illustrating a seventh aspect of the fifth preferred embodiment. The structure of FIG. 59 employs pocket regions 11 and 12 as a P type impurity diffusion region formed at a relatively shallow region, and employs a local channel dope region 10 as a P type impurity diffusion region formed at a relatively deep region.

Figure 60:
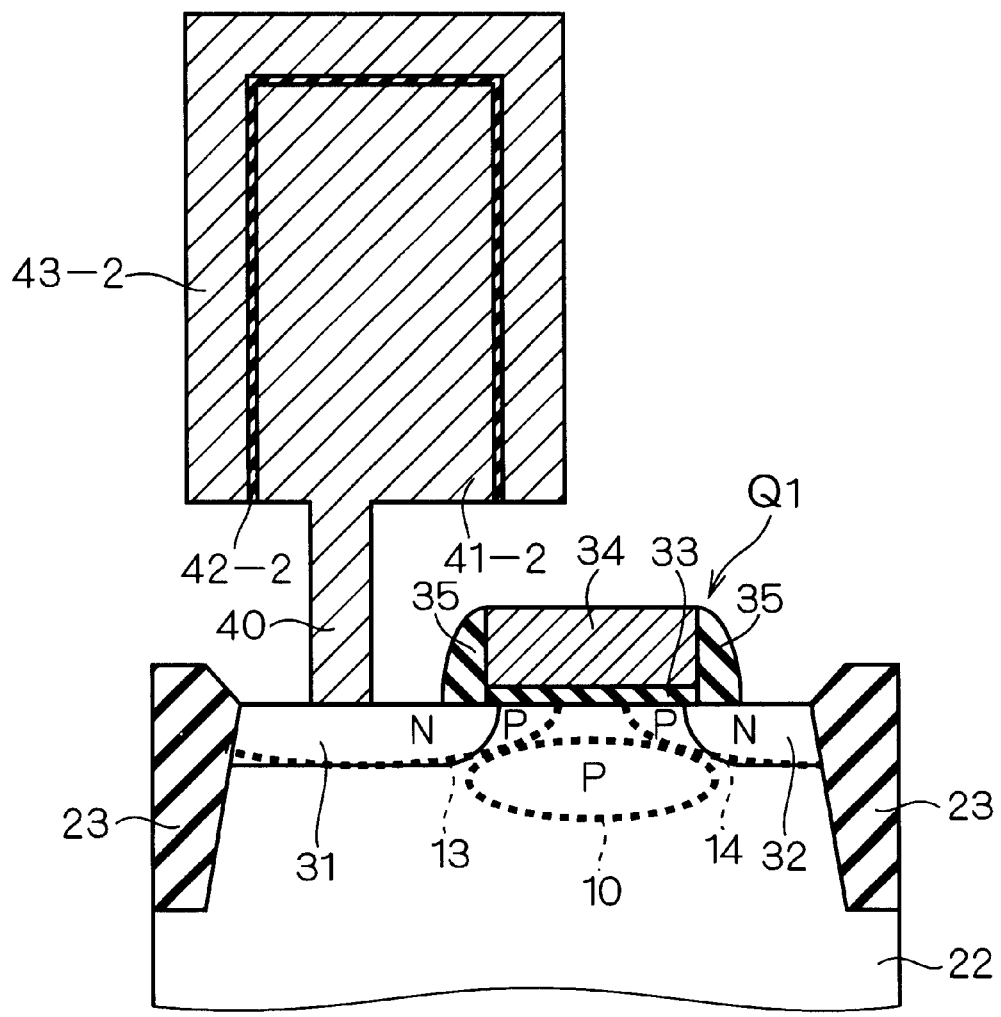

FIG. 60 is a sectional view illustrating an eighth aspect of the fifth preferred embodiment. The structure of FIG. 60 employs shallow pocket regions 13 and 14 as a P type impurity diffusion region formed at a relatively shallow region, and employs a local channel dope region 10 as a P type impurity diffusion region formed at a relatively deep region.

The fifth to eighth aspects can also provide a good characteristic about all of threshold voltage, assurance of resistance to punch-through and leak current, by virtue of the impurity distributions locating at the optimum zones 84, 85 and 86.

In addition, the fifth to eighth aspects have such an inherent characteristic that the effect of suppressing bottom leak is far advanced than the first to fourth aspects.

Combination with Pocket Region (Ninth to Twelfth Aspects)

Description will now be given of various structures employing a pocket region as a P type impurity diffusion region to be formed at a relatively deep region.

Figure 61:
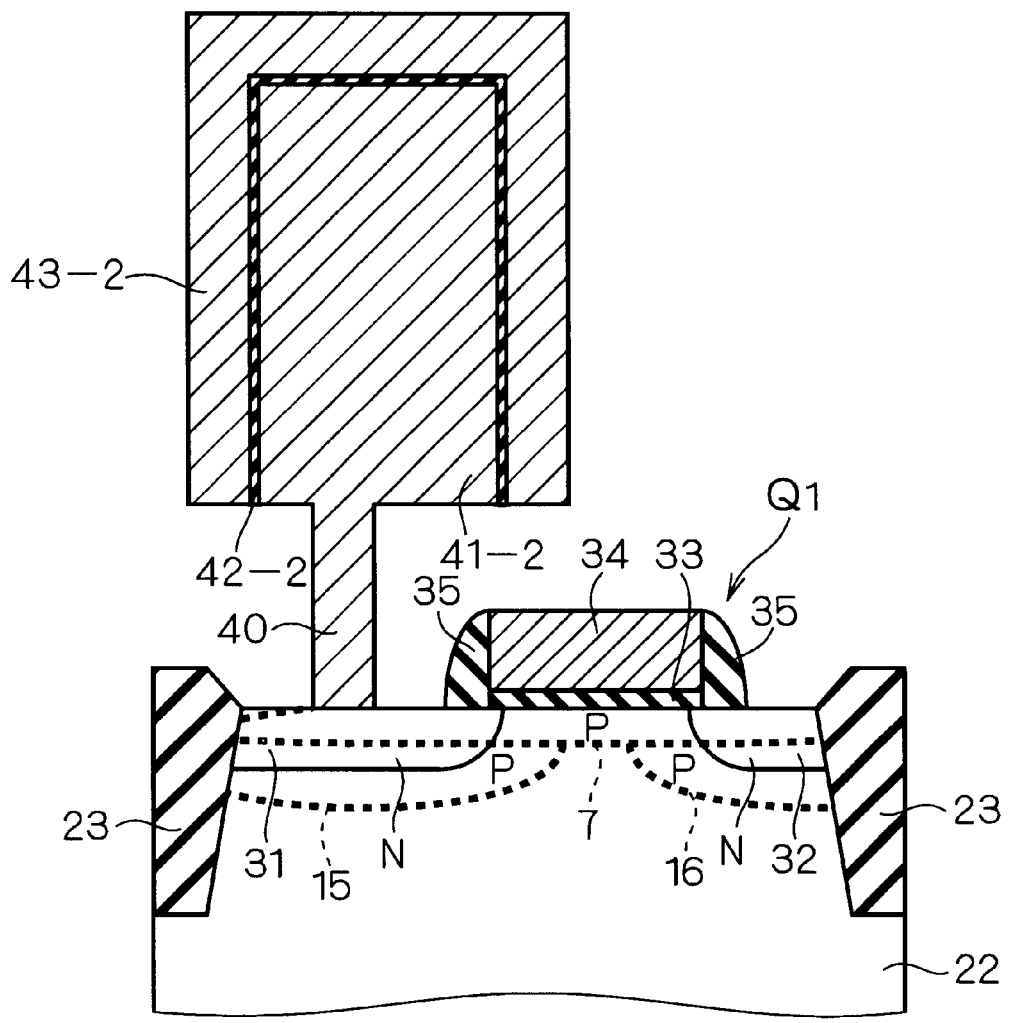

FIG. 61 is a sectional view illustrating a ninth aspect of the fifth preferred embodiment. The structure of FIG. 61 employs a channel dope region 7 as a P type impurity diffusion region formed at a relatively shallow region, and employs pocket regions 15 and 16 as a P type impurity diffusion region formed at a relatively deep region.

Figure 62:
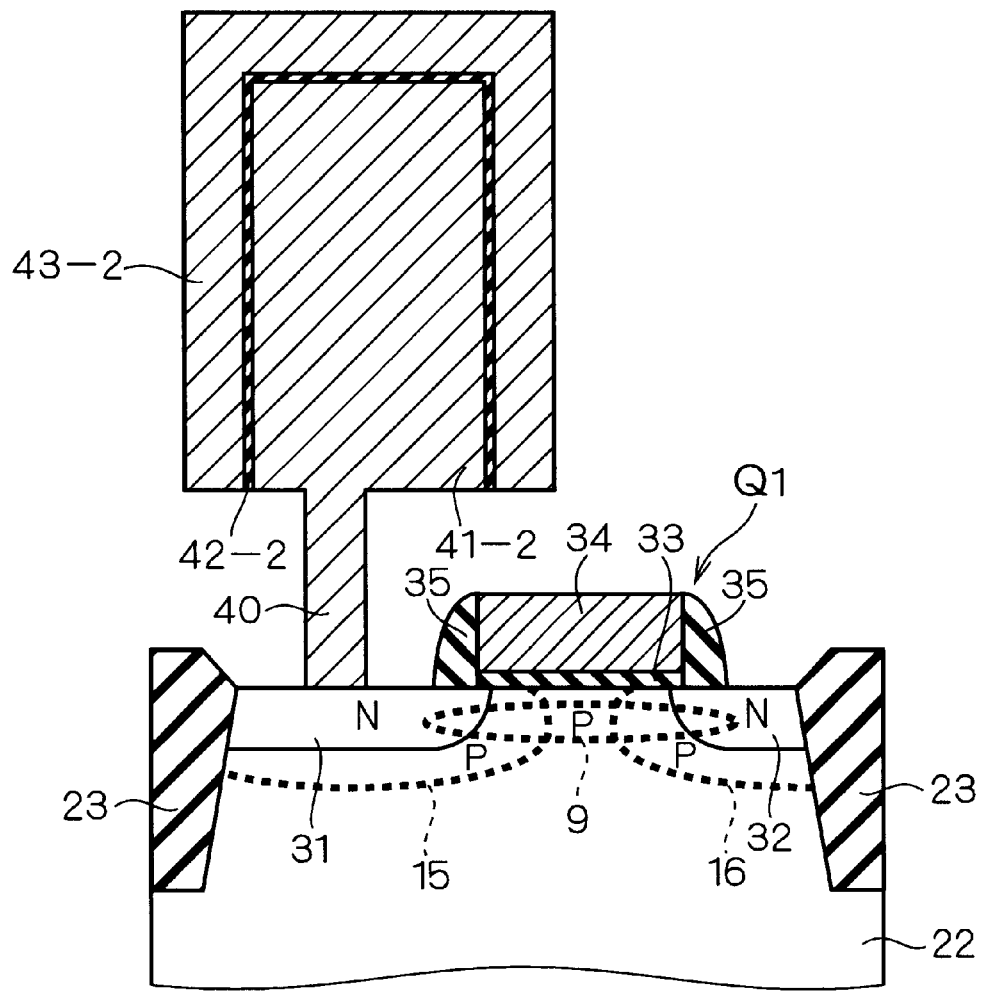

FIG. 62 is a sectional view illustrating a tenth aspect of the fifth preferred embodiment. The structure of FIG. 62 employs a local channel region 9 as a P type impurity diffusion region formed at a relatively shallow region, and employs pocket regions 15 and 16 as a P type impurity diffusion region formed at a relatively deep region.

Figure 63:
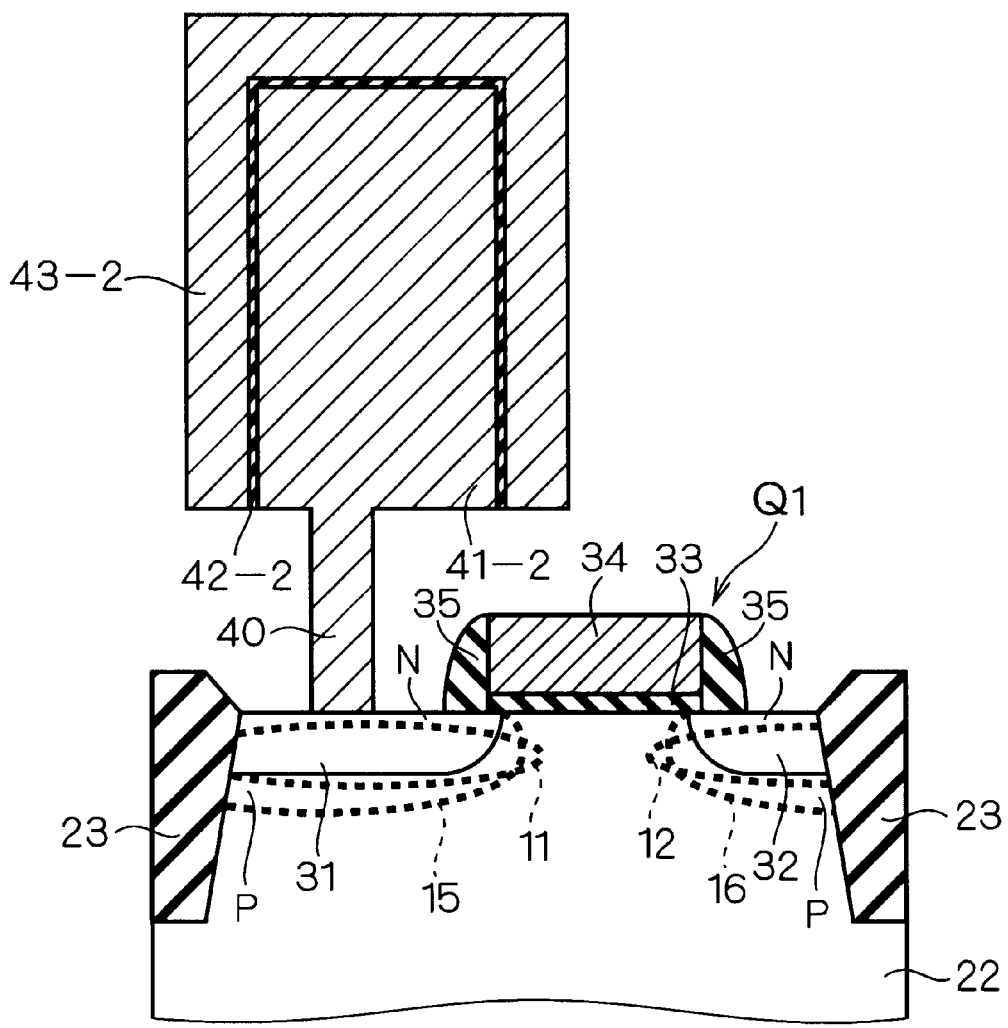

FIG. 63 is a sectional view illustrating an eleventh aspect of the fifth preferred embodiment. The structure of FIG. 63 employs pocket regions 11 and 12 as a P type impurity diffusion region formed at a relatively shallow region, and employs pocket regions 15 and 16 as a P type impurity diffusion region formed at a relatively deep region.

Figure 64:
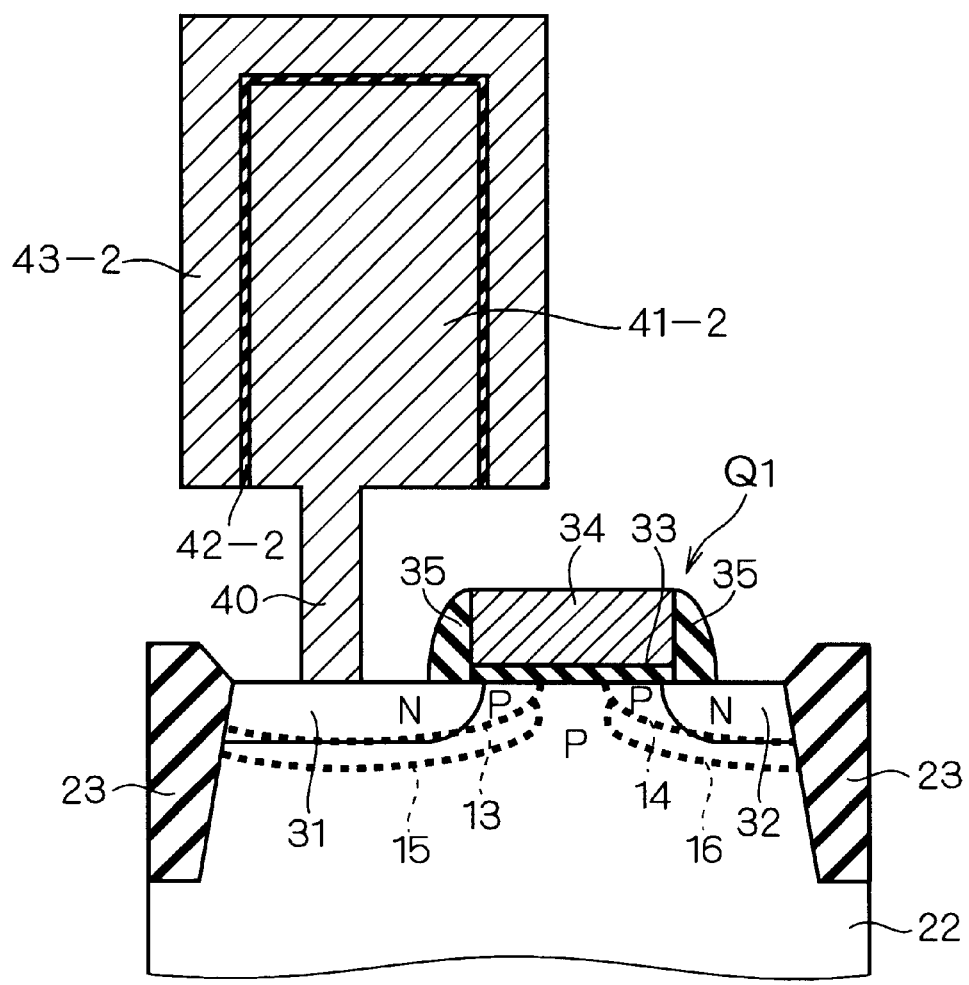

FIG. 64 is a sectional view illustrating a twelfth aspect of the fifth preferred embodiment. The structure of FIG. 64 employs shallow pocket regions 13 and 14 as a P type impurity diffusion region formed at a relatively shallow region, and employs pocket regions 15 and 16 as a P type impurity diffusion region formed at a relatively deep region.

The ninth to twelfth aspects can also provide a good characteristic about all of threshold voltage, assurance of resistance to punch-through and leak current, by virtue of the impurity distributions locating at the optimum zones 84, 85 and 86.

In addition, the ninth to twelfth aspects have such an inherent characteristic that threshold controllability is far advanced than the first to fourth aspects. This is noticeable particularly in the eleventh and twelfth aspects.

Combination with Shallow Pocket Region (Thirteenth and Fourteenth Aspects)

Figure 65:
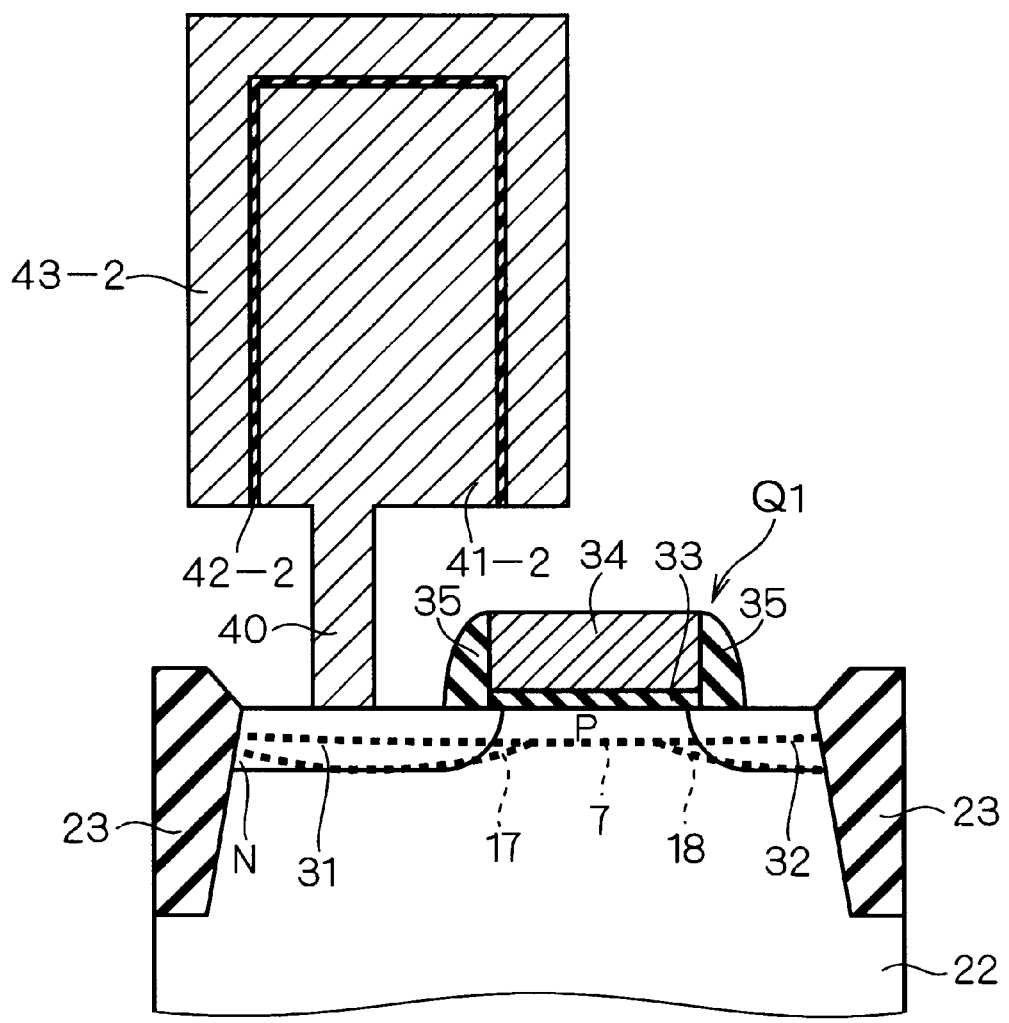

FIG. 65 is a sectional view illustrating a thirteenth aspect of the fifth preferred embodiment. The structure of FIG. 65 employs a channel dope region 7 as a P type impurity diffusion region formed at a relatively shallow region, and employs shallow pocket regions 17 and 18 as a P type impurity diffusion region formed at a relatively deep region.

FIG. 66 is a sectional view illustrating a fourteenth aspect of the fifth preferred embodiment. The structure of FIG. 66 employs a local channel region 9 as a P type impurity diffusion region formed at a relatively shallow region, and employs shallow pocket regions 17 and 18 as a P type impurity diffusion region formed at a relatively deep region.

The thirteenth and fourteenth aspects can also provide a good characteristic about all of threshold voltage, assurance of resistance to punch-through and leak current, by virtue of the impurity distributions locating at the optimum zones 84, 85 and 86.

In addition, the thirteenth and fourteenth aspects have such an inherent characteristic that threshold controllability is far advanced than the first and second aspects.

In the first to fourteenth aspects of the fifth preferred embodiment, although the capacitor structure of the stack-type memory cell (Type 2) is shown in FIG. 44 etc., without limiting to this, a variety of capacity structures, e.g., the capacitor structure shown in FIGS. 8 to 27, can be adopted as in the first preferred embodiment.

Sixth Preferred Embodiment

Figure 67:
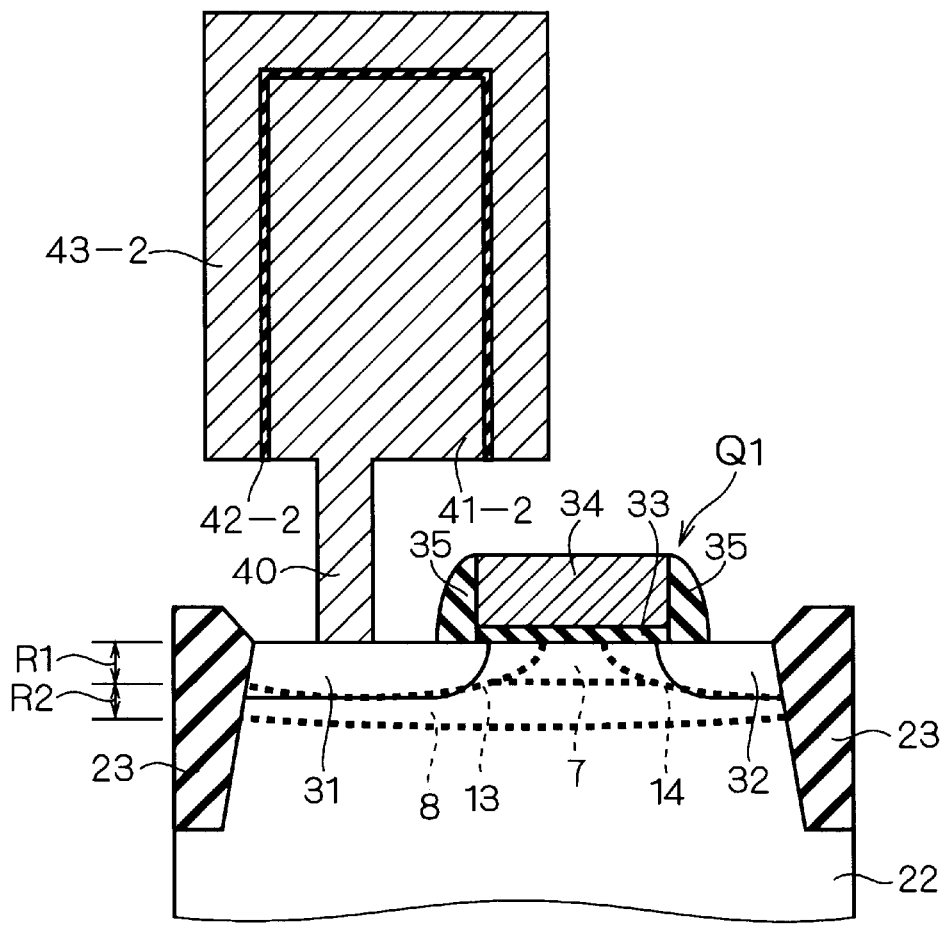
FIG. 67 is a sectional view illustrating a first aspect of a memory cell structure according to a sixth preferred embodiment.

FIG. 67 is a sectional view illustrating a memory cell structure of a DRAM according to a sixth preferred embodiment. As shown in FIG. 67, in addition to the usual MOS transistor structure, a channel dope region 7 is disposed at a relatively shallow region having substantially the same depth as a source/drain region 31 (32), and a channel dope region 8 is disposed at a relatively deep region extending from the bottom of the source/drain region 31 (32) to a deeper position, and shallow pocket regions 13 and 14 are disposed.

Since an NMOS transistor Q1 and a capacitor C1 have the same structure as the stack-type memory cell (Type 2) as shown in FIGS. 221 and 222, a description thereof is thus omitted.

Figure 68:
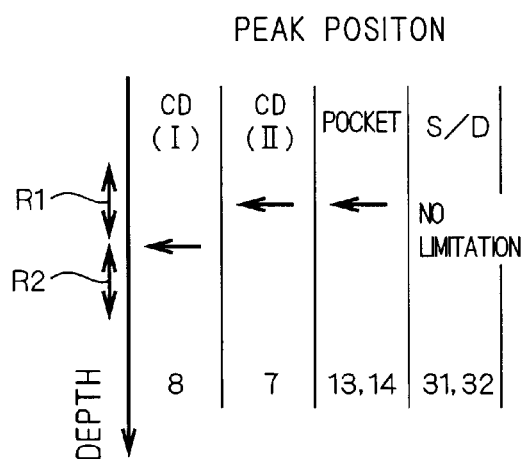
FIG. 68 is an explanatory diagram illustrating the impurity peak state of an NMOS transistor of the first aspect in the sixth preferred embodiment.

FIG. 68 is a graph showing an impurity profile of the NMOS transistor Q1 according to a first aspect of the sixth preferred embodiment. As shown in FIG. 68, the peak value (maximum value) of the impurity concentration in the channel dope region 7 (CD (II)) and in the shallow pocket regions 13 and 14 (pocket) is present in the vicinity of the middle of region R1, and the peak value of the channel dope region 8 (CD (I)) is present near the middle of region R2. Note that no limitation is imposed on the peak value of the source/drain regions 31 and 32 (S/D).

It is set so that the maximum value MAX of P of the P type impurity concentration in the channel dope regions 7 and 8 and in the shallow pocket regions 13 and 14 ranges from $1 \times 10^{18}$ to $1 \times 10^{19}$, and the maximum value MAX of P is not less than 10% and not more than 100% of the maximum value MAX of N of the N type impurity concentration of the source/drain region 31 (32). Similarly to the first preferred embodiment, the proximate region of the interface between silicon and a silicon oxide film is beyond the object, and the maximum value MAX of P and the maximum value MAX of N indicate the maximum value in the region except for the interface proximate region.

Specifically, in the sixth preferred embodiment, the maximum value MAX of N of the N type impurity concentration of the source/drain region 31 (32) and the maximum value MAX of P of the P type impurity concentration in the channel dope regions 7 and 8 and in the shallow pocket regions 13 and 14 satisfy the conditions (I), (II) and (III) described in the first preferred embodiment. As used herein, the maximum value MAX of P in the channel dope regions 7 and 8 and in the shallow pocket regions 13 and 14 indicates the maximum value of the P type impurity concentration in at least one region among these regions 7, 8, 13 and 14.

Thus, similarly to the first preferred embodiment, the memory cell structure of the first aspect in the sixth preferred embodiment satisfies the mentioned conditions (I), (II) and (III), thereby obtaining the best characteristic about assurance of resistance to punch-through and leak current reduction (relaxation of junction capacitance).

Further, the characteristics about control of threshold voltage, assurance of resistance to punch-through and suppression of leak current can be set under well-controlled conditions in order to realize their respective desired characteristics, by individually setting distributions of three P type impurity concentrations of the channel dope region 7, the channel dope region 8 and the shallow pocket regions 13 and 14.

Figure 69:
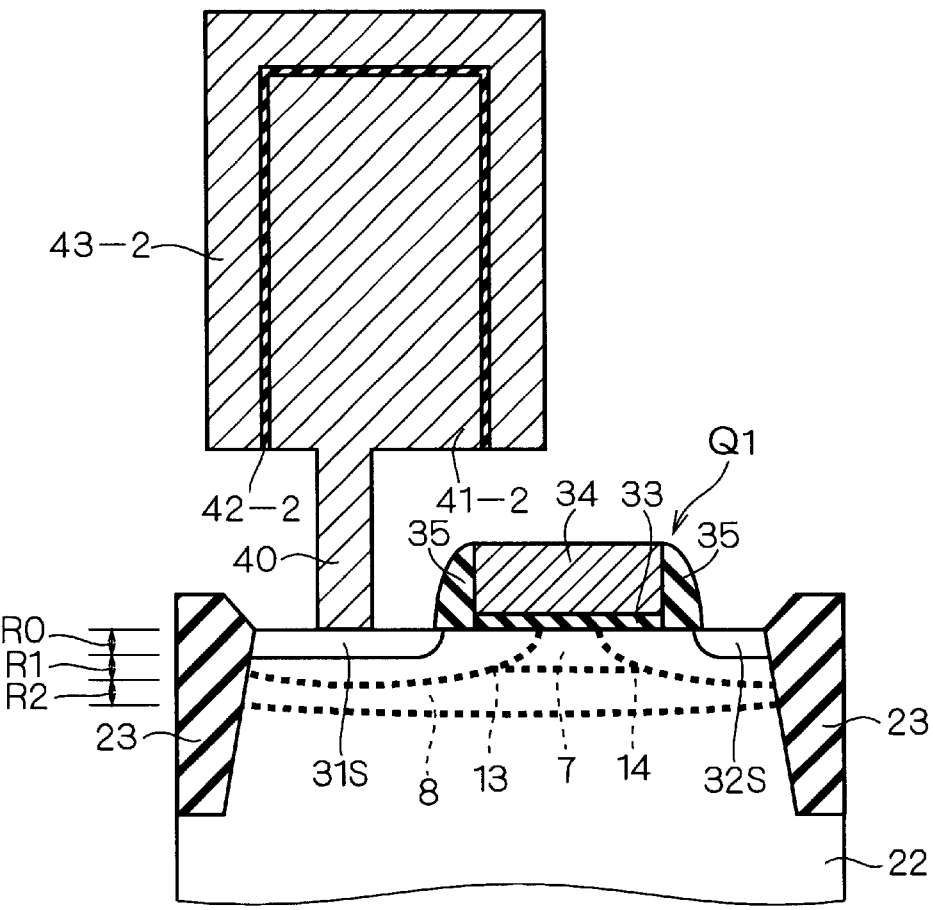
FIG. 69 is a sectional view illustrating a second aspect of the memory cell structure in the sixth preferred embodiment.

FIG. 69 is a sectional view illustrating a second aspect of the memory cell structure of a DRAM in the sixth preferred embodiment. As shown in FIG. 69, instead of the source/drain regions 31 and 32, source/drain regions 31S and 32S are disposed so as to be shallower than the regions 31 and 32. Otherwise, the construction is identical with that of the first aspect shown in FIG. 67.

Figure 70:
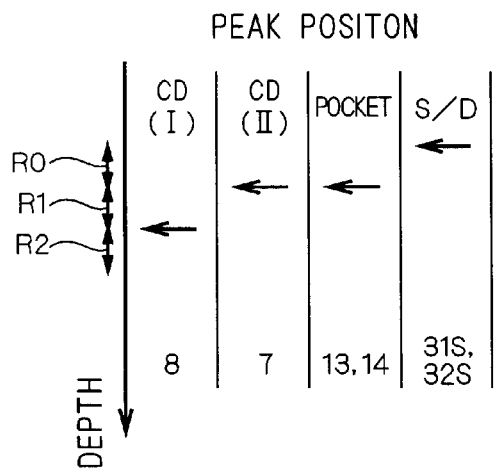
FIG. 70 is an explanatory diagram illustrating the impurity peak state of an NMOS transistor of the second aspect in the sixth preferred embodiment.

FIG. 70 is a graph showing the peak position of an impurity profile of the NMOS transistor Q1 according to a second aspect of the sixth preferred embodiment. As shown in FIG. 70, the peak value of the impurity concentration in source/drain regions 31S and 32S is present near the middle of region R0, and the peak value (maximum value) of the impurity concentration in a channel dope region 7 and that of shallow pocket regions 13 and 14 are present near the middle of region R1, and the peak value of the channel dope region 8 is present near the middle of region R2.

It is set so that the maximum value MAX of N of the N type impurity concentration in the source/drain region 31S (32S) and the maximum value MAX of P of the P type impurity concentration in the channel dope regions 7, 8 and in shallow pocket regions 13, 14 are both in the range of $1 \times 10^{18}$ to $1 \times 10^{21}$, and the maximum value MAX of P is set to not less than 10% of the maximum value MAX of N.

Thus, similarly to the first preferred embodiment, the memory cell structure of the second aspect in the sixth preferred embodiment satisfies the mentioned conditions (I), (II) and (III), thereby obtaining the best characteristic about assurance of resistance to punch-through and leak current reduction (relaxation of junction capacitance).

Further, the characteristics about control of threshold voltage, assurance of resistance to punch-through and suppression of leak current can be set individually in order to realize their respective desired characteristics, by virtue of the channel dope region 7, the channel dope region 8, and the shallow pocket regions 13 and 14.

Seventh Preferred Embodiment

Setting of Offset

Figure 71:
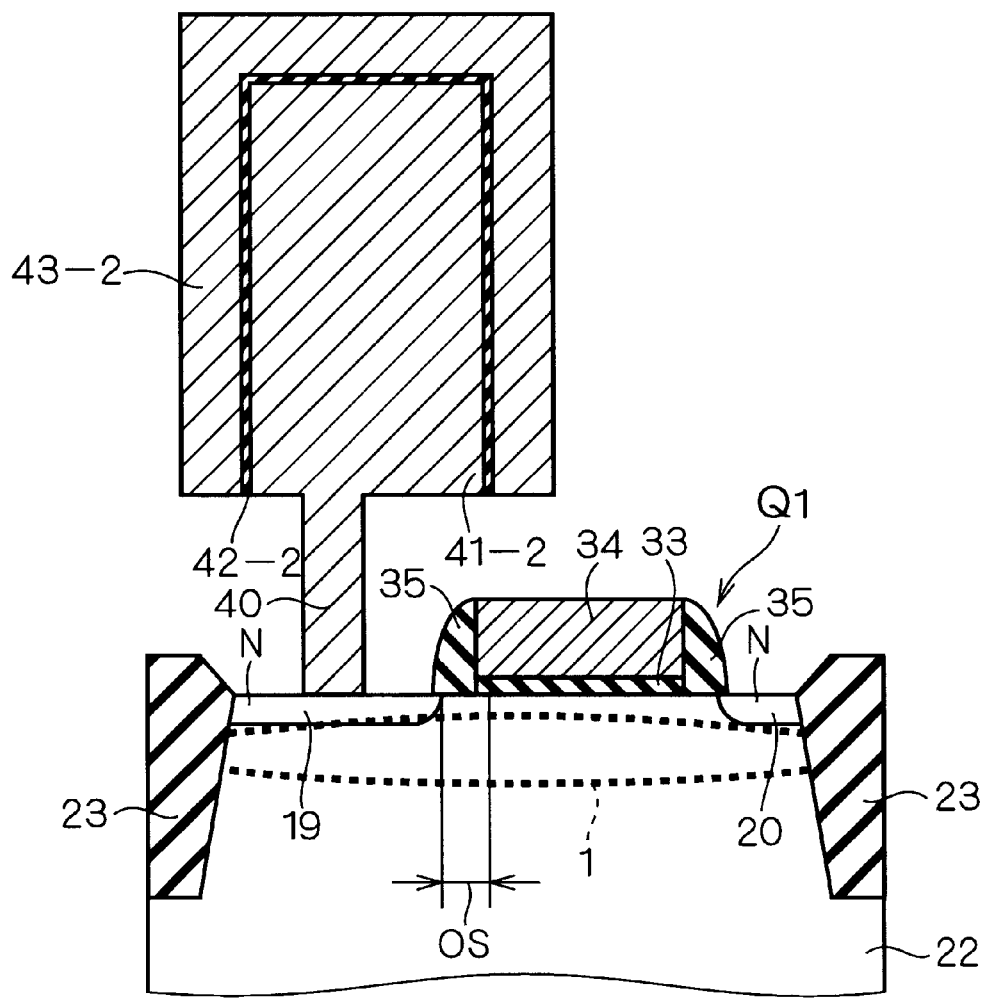
FIG. 71 is a sectional view illustrating a structure to explain the principle according to a seventh preferred embodiment.

FIG. 71 is a sectional view illustrating a memory cell structure of a DRAM in which source/drain regions are disposed with an offset. Referring to FIG. 71, as in the first preferred embodiment, a P type channel dope region 1 is disposed and, instead of the source/drain regions 31 and 32, source/drain regions 19 and 20 are disposed by providing an offset from the edge of a gate electrode 34. Otherwise, the construction and impurity concentration are identical with those in the first preferred embodiment shown in FIG. 1.

The characteristic of assurance of resistance to punch-through is noticeably improved by forming the source/drain regions 19 and 20 with an offset OS from the edge of the gate electrode 34, as shown in FIG. 71.

Figure 72:
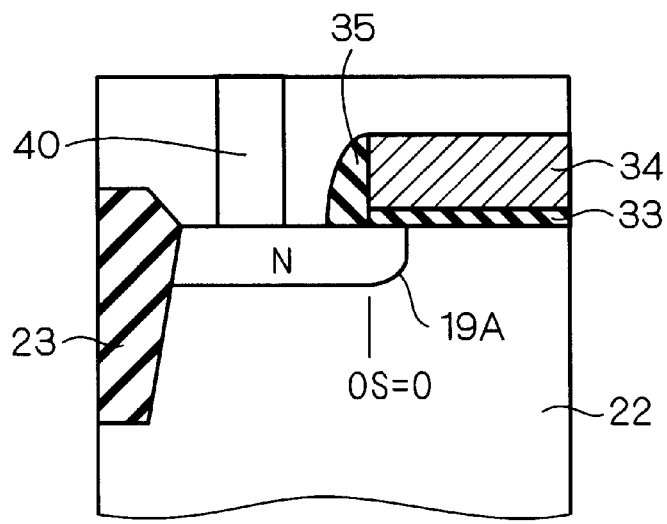
FIGS. 72 to 75 are explanatory diagrams illustrating the offset state of a contact region in the seventh preferred embodiment.

Referring to FIG. 72, after forming the gate electrode 34 and before forming a sidewall 35, an N type impurity ion implantation is performed when an offset OS is "0", thereby to form a source/drain region 19A.

Figure 73:
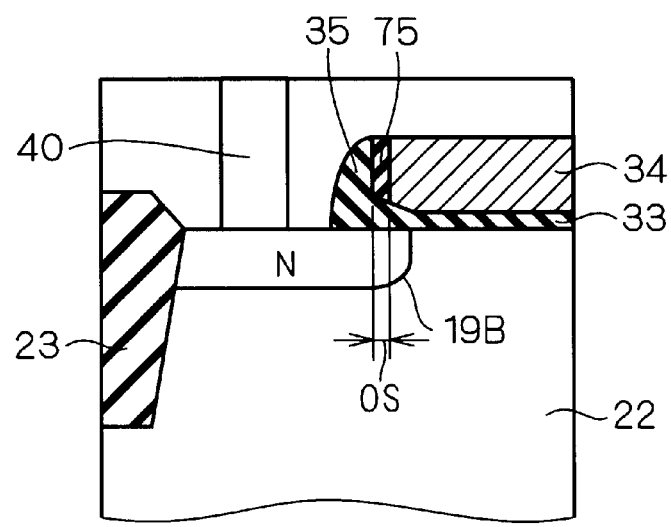

Referring to FIG. 73, before forming a sidewall 35, a smile oxide film 75 is formed on the side surface of a gate electrode 34, and an N type impurity ion implantation is performed by providing an offset OS corresponding to the thickness of the smile oxide film 75, thereby to form a source/drain region 19B.

Figure 74:
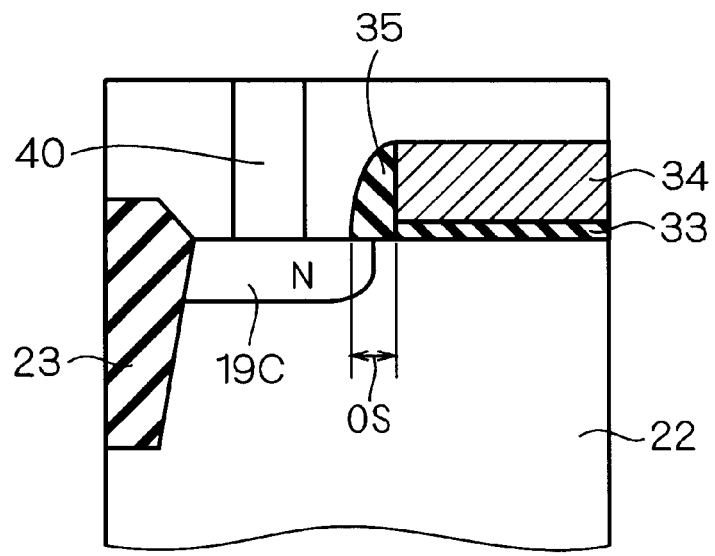

Referring to FIG. 74, after forming a sidewall 35, an N type impurity ion implantation is performed by providing an offset OS corresponding to the thickness of the sidewall 35, thereby to form a source/drain region 19C.

Figure 75:
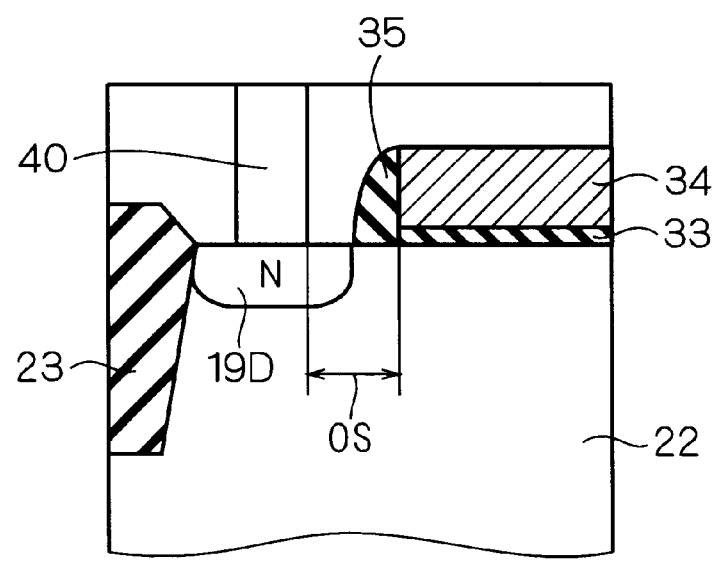

Referring to FIG. 75, after forming a contact hole 40, an N type impurity ion implantation is performed by providing an offset OS corresponding to the distance from the edge of a gate electrode 34 to the contact hole 40, thereby to form a source/drain region 19D.

As described above, source/drain regions can be formed by providing a variety of offset OS.

Construction

Figure 76:
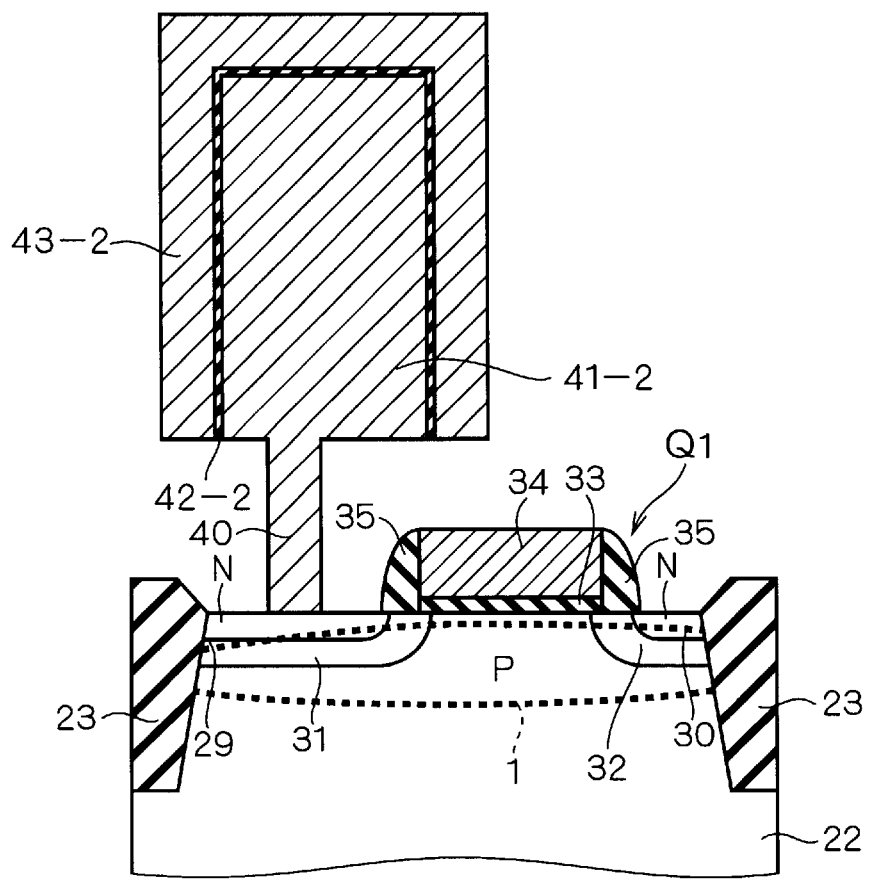
FIG. 76 is a sectional view illustrating a memory cell structure in the seventh preferred embodiment.

FIG. 76 is a sectional view illustrating a memory cell structure of a DRAM according to the seventh preferred embodiment. As shown in FIG. 76, a source/drain region 31 (32) is formed by dual diffusion, and contact regions 29 and 30 are respectively disposed on the surface of the source/drain regions 31 and 32 except for the underside of a sidewall 35. Therefore, it is set so that the contact regions 29 and 30 have an impurity concentration higher than other area of the source/drain regions 31 and 32. A P type channel dope region 1 is disposed so as to overlap in part the source/drain regions 31 and 32. Otherwise, the construction and impurity concentration are identical with those in the first preferred embodiment shown in FIG. 1.

Figure 77:
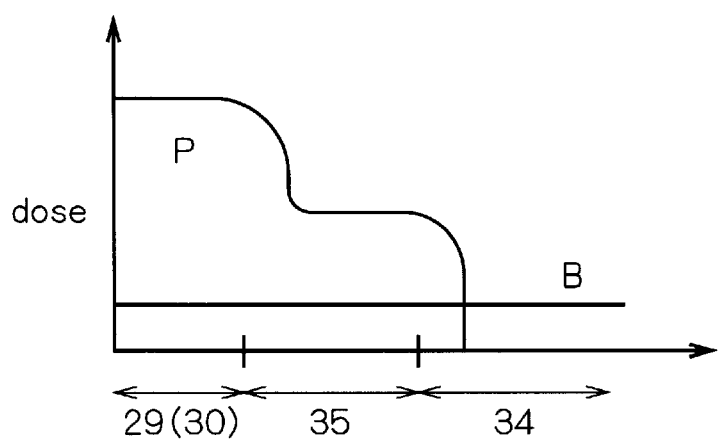
FIG. 77 is a graph showing an impurity profile of source/drain regions in the seventh preferred embodiment.

FIG. 77 is a graph showing an impurity profile of a source/drain region 31 in the seventh preferred embodiment. As shown in FIG. 77, the impurity concentration of phosphorus is gradually reduced from a contact region 29 (30) to the source/drain region 31 underlying the sidewall 35. Thereby, as compared to the case of forming the source/drain region 31 by one diffusion process, an increase of the parasitic resistance in the source/drain region 31 can be more suppressed while assurance of resistance to punch-through and leak current reduction are held appropriately. This permits flow of more current.

Figure 78:
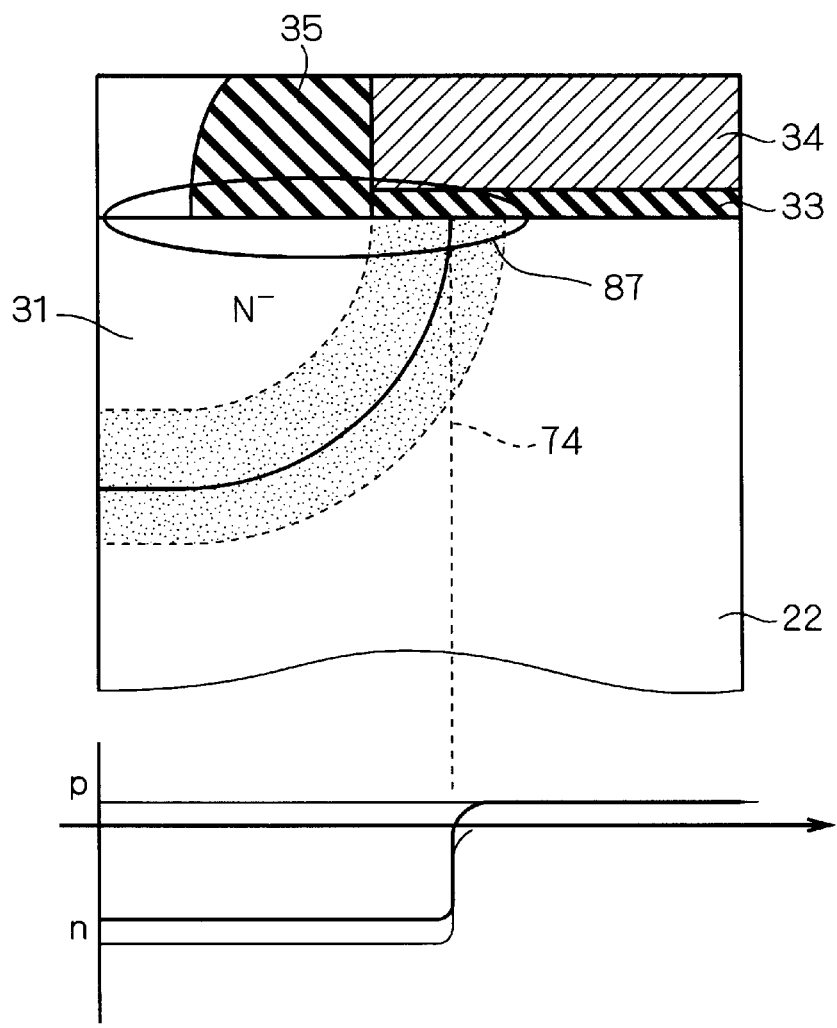
FIG. 78 is a diagram for explaining the effect of the seventh preferred embodiment.
Figure 79:
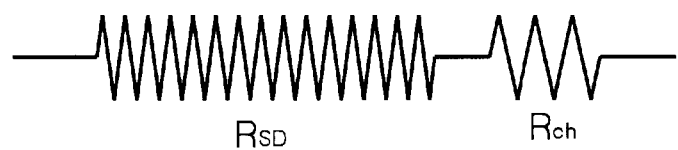
FIG. 79 is a circuit diagram for explaining the effect of the seventh preferred embodiment.

FIG. 78 is a diagram illustrating a state of an edge proximate region of a gate electrode 34 when a source/drain region 31 is made by one diffusion process. As shown in FIG. 78, a depletion layer 74 extends to the inside and outside of the source/drain region 31, and a current passing zone 87 on the surface of the source/drain region 31 becomes a region having a high resistance (i.e., its impurity concentration is low). This results in that a channel resistance $R_{ch}$ is connected in series to a relatively large parasitic resistance $R_{SD}$ of the source/drain region 31, as shown in FIG. 79.

FIG. 80 is a diagram illustrating a state of an edge proximate region of a gate electrode 34 when a source/drain region 31 is made by two diffusion processes as in the seventh preferred embodiment. As shown in FIG. 80, a depletion layer 75 extends to the inside and outside of the source/drain region 31, and most of a current passing zone 88 on the surface of the source/drain region 31 becomes a contact region 29 having a relatively low resistance (i.e., its impurity concentration is high). Therefore, a channel resistance $R_{ch}$ is connected in series to a relatively small parasitic resistance $R_{SD}$ of the source/drain region 31, as shown in FIG. 81.

Thus, in the memory cell structure of the seventh preferred embodiment, an increase of the parasitic resistance in the source/drain region 31 can be suppressed because the source/drain region 31 is formed by dual diffusion. This permits flow of more current.

As to the longitudinal impurity profile in the vicinity of a PN junction between the source/drain regions 31 and 32, there is no difference between the construction of FIG. 78 and that of FIG. 80, thus obtaining approximately the same effect of reducing leak current.

Figure 82:
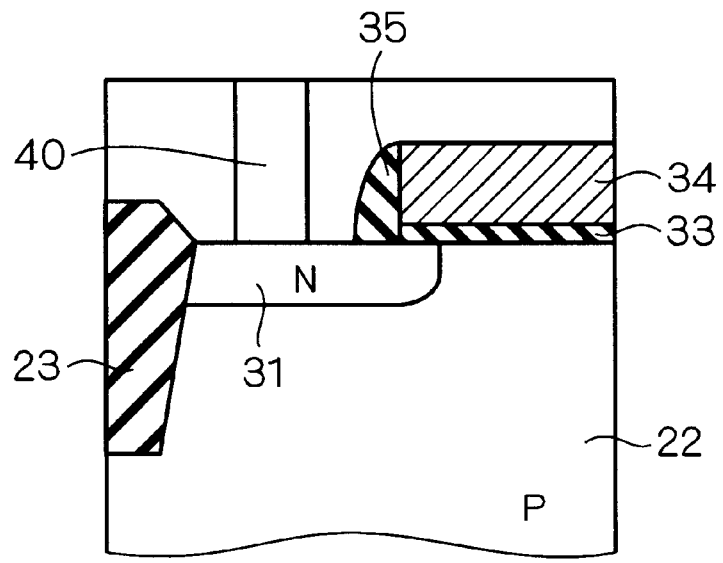
FIG. 82 is an explanatory diagram illustrating a method of forming a contact region (Method 1) in the seventh preferred embodiment.
Figure 83:
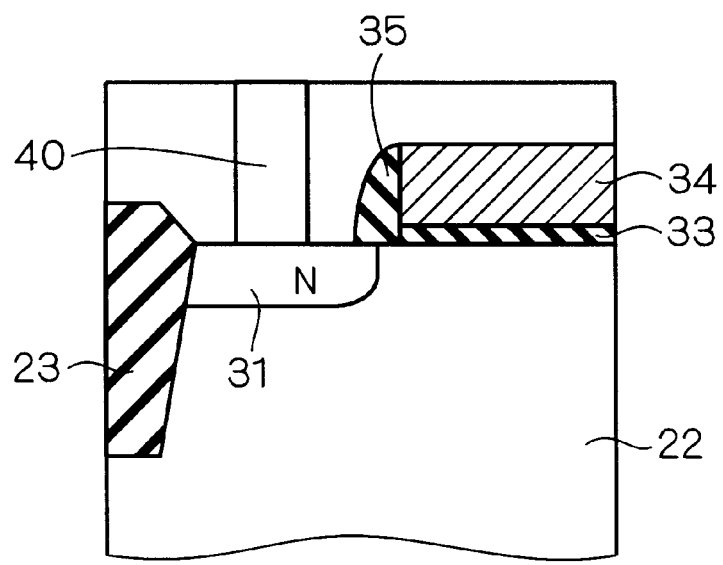
FIG. 83 is an explanatory diagram illustrating a method of forming a contact region (Method 2) in the seventh preferred embodiment.
Figure 84:
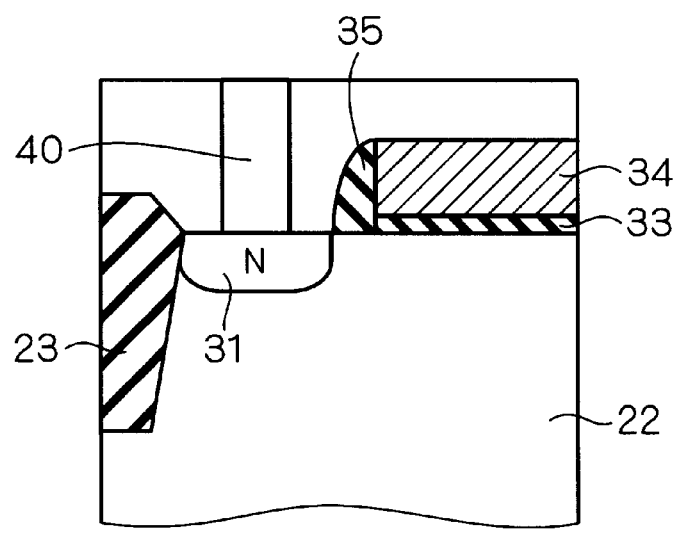
FIG. 84 is an explanatory diagram illustrating a method of forming a contact region (Method 3) in the seventh preferred embodiment.

FIGS. 82 to 84 are diagrams illustrating the steps of ion implantation for forming a source/drain region 31.

Referring to FIG. 82, after forming a gate electrode 34 and before forming a sidewall 35, an ion implantation (and diffusion process) is performed to form a source/drain region 31. This step is hereinafter referred to as "gate SD" for the sake of convenience.

Referring to FIG. 83, after forming a sidewall 35 and before forming a contact hole 40, an ion implantation is performed to form a source/drain region 31. This step is hereinafter referred to as "SWSD" for the sake of convenience.

Referring to FIG. 84, after forming a contact hole 40, an ion implantation is performed to form a source/drain region 31. This step is hereinafter referred to as "contact SD" for the sake of convenience.

The formation of a source/drain region by means of dual diffusion can be performed by combining two of the mentioned three diffusion processes of "gate SD", "SWSD" and "contact SD", alternatively, by performing the same process (e.g., gate SD) two times.

First to Twentieth Aspects

FIG. 85 is a sectional view illustrating a first aspect of the seventh preferred embodiment. The first aspect shows the case of forming a source/drain region 31A (32A) by using "gate SD" in two diffusion processes.

As shown in FIG. 85, a contact region 29A (30A) extending to the underside of the edge proximate region of a gate electrode 34 is formed in the surface of a source/drain region 31A (32A) extending to the underside of the edge proximate region of the gate electrode 34. The forming width of a sidewall 35A is set to TA.

Figure 86:
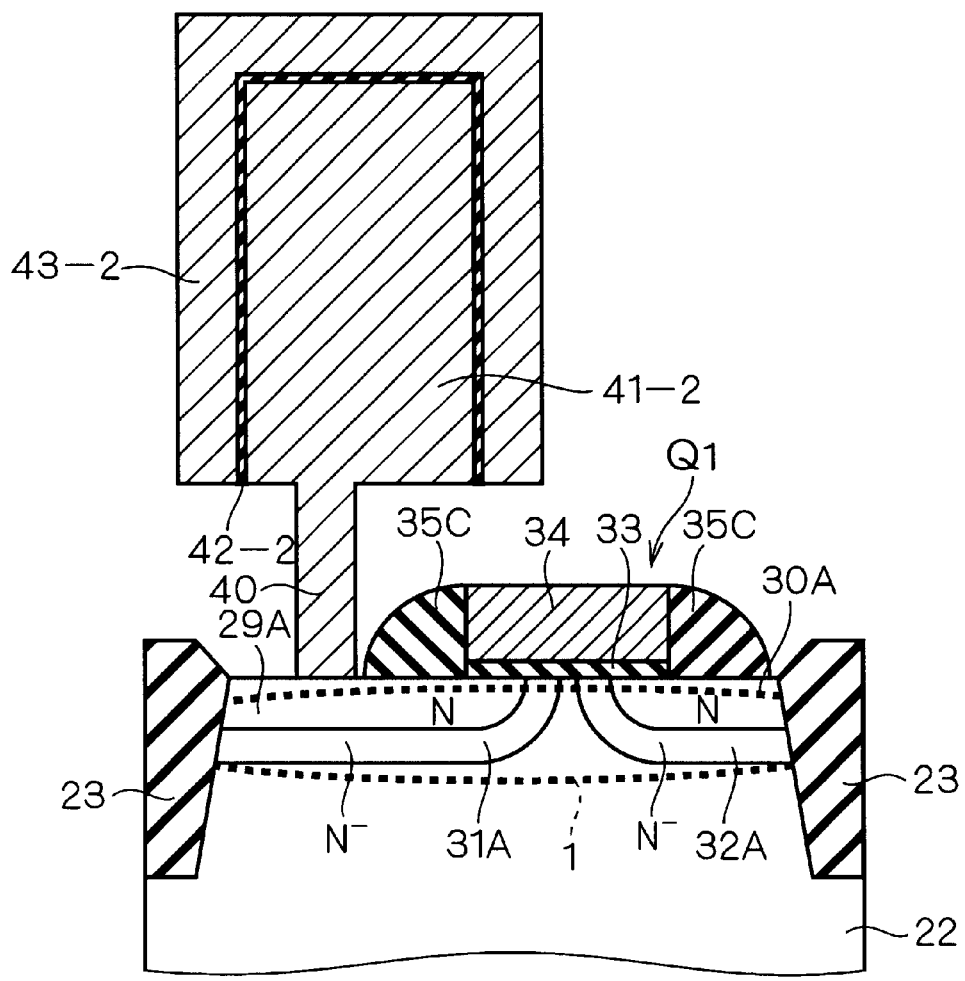

FIG. 86 is a sectional view illustrating a second aspect of the seventh preferred embodiment. The second aspect shows the case of forming a source/drain region 31A (32A) by using "gate SD" in two diffusion processes.

As shown in FIG. 86, a contact region 29A (30A) extending to the underside of the edge proximate region of a gate electrode 34 is formed in the surface of a source/drain region 31A (32A) extending to the underside of the edge proximate region of the gate electrode 34. The forming width of a sidewall 35C is set to TC (>TA).

The structure of the first or second aspect can reduce the parasitic resistance of source/drain regions.

Figure 87:
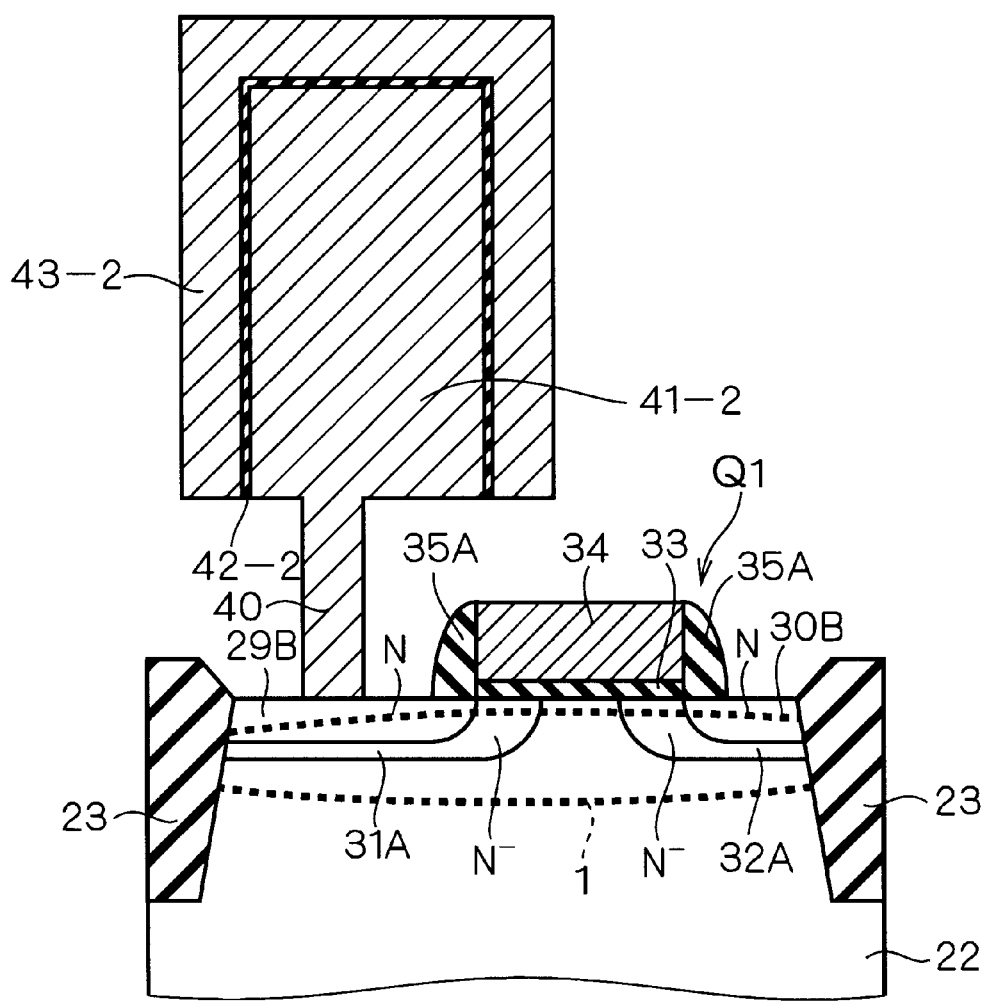

FIG. 87 is a sectional view illustrating a third aspect of the seventh preferred embodiment. The third aspect shows the case of forming a source/drain region 31A (32A) by using "gate SD" and "SWSD" in two diffusion processes.

As shown in FIG. 87, a contact region 29B (30B) extending to the underside of a sidewall 35A is formed in the surface of a source/drain region 31A (32A) extending to the underside of the edge proximate region of a gate electrode 34. The forming width of the sidewall 35A is set to TA.

Figure 88:
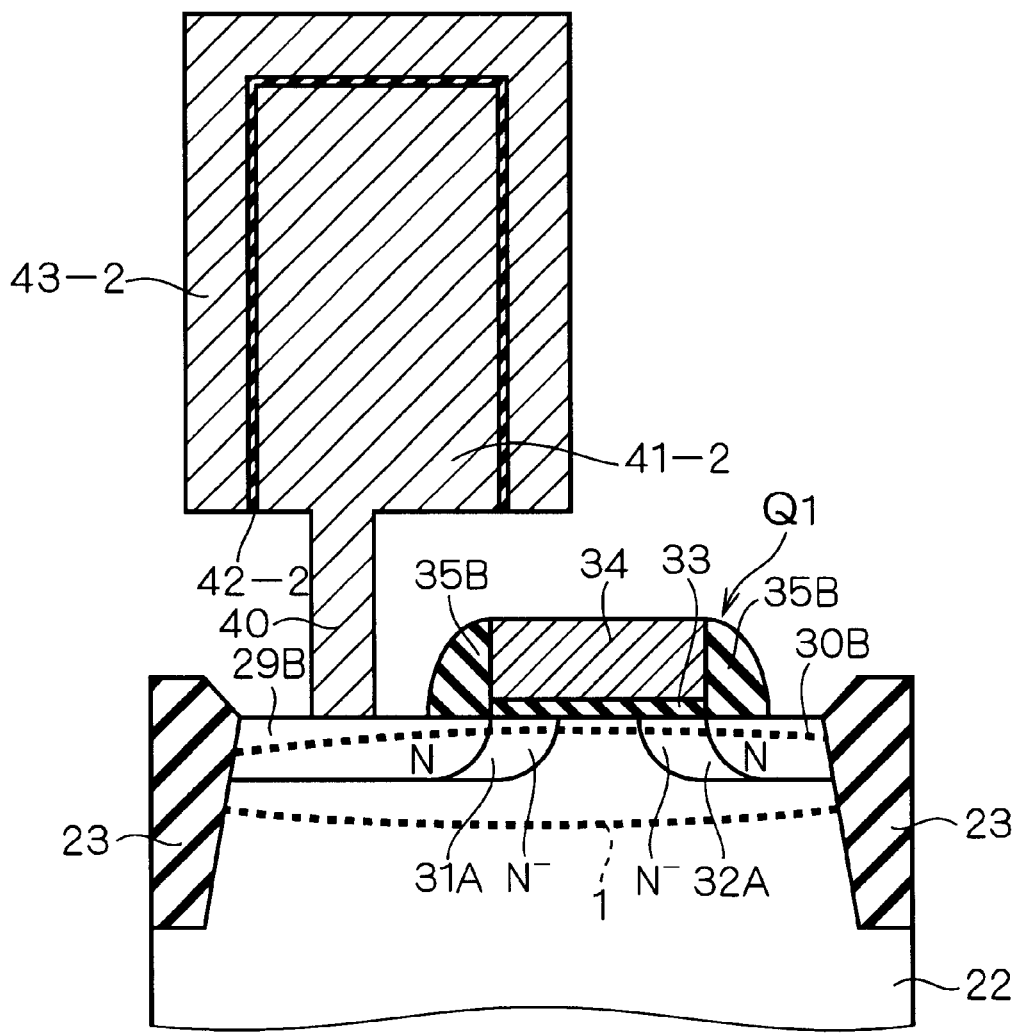

FIG. 88 is a sectional view illustrating a fourth aspect of the seventh preferred embodiment. The fourth aspect shows the case of forming a source/drain region 31A (32A) by using "gate SD" and "SWSD" in two diffusion processes.

Figure 89:
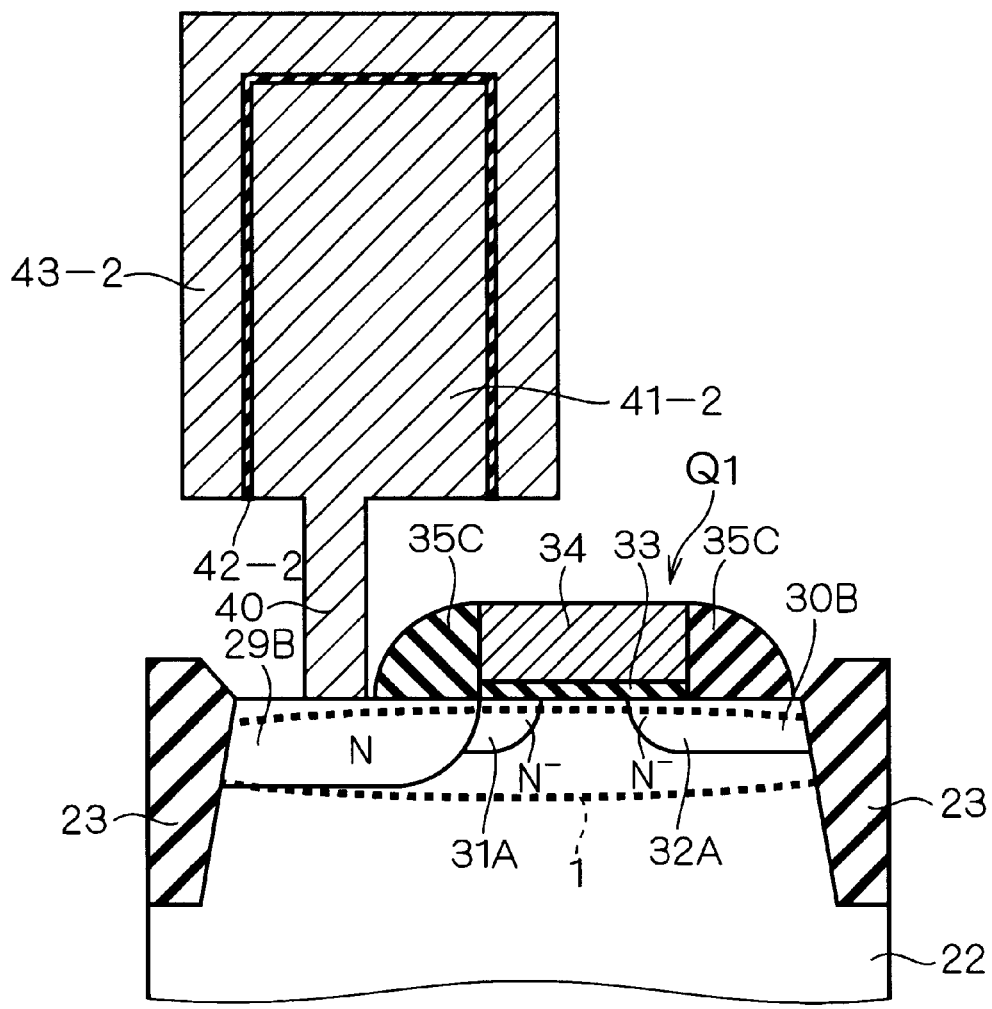

As shown in FIG. 88, a contact region 29B (30B) extending to the underside of a sidewall 35B and having approximately the same forming depth as a source/drain region 31A (32A) is formed in the surface of the source/drain region 31A (32A) extending to the underside of the edge proximate region of a gate electrode 34. The forming width of the FIG. 89 is a sectional view illustrating a fifth aspect of the seventh preferred embodiment. The fifth aspect shows the case of forming a source/drain region 31A (32A) by using "gate SD" and "SWSD" in two diffusion processes.

As shown in FIG. 89, a contact region 29B (30B) extending to the underside of a sidewall 35C and having a forming depth deeper than the source/drain region 31A (32A) is formed in the surface of the source/drain region 31A (32A) extending to the underside of the edge proximate region of a gate electrode 34. The forming width of the sidewall 35C is set to TC (>TB).

The structure of the third, fourth or fifth aspect can reduce the parasitic resistance of source/drain regions, and also can improve assurance of resistance to punch-through because a lateral distance between the source/drain region 31A and contact region 29B is made wider than that of the first or second aspect.

Figure 90:
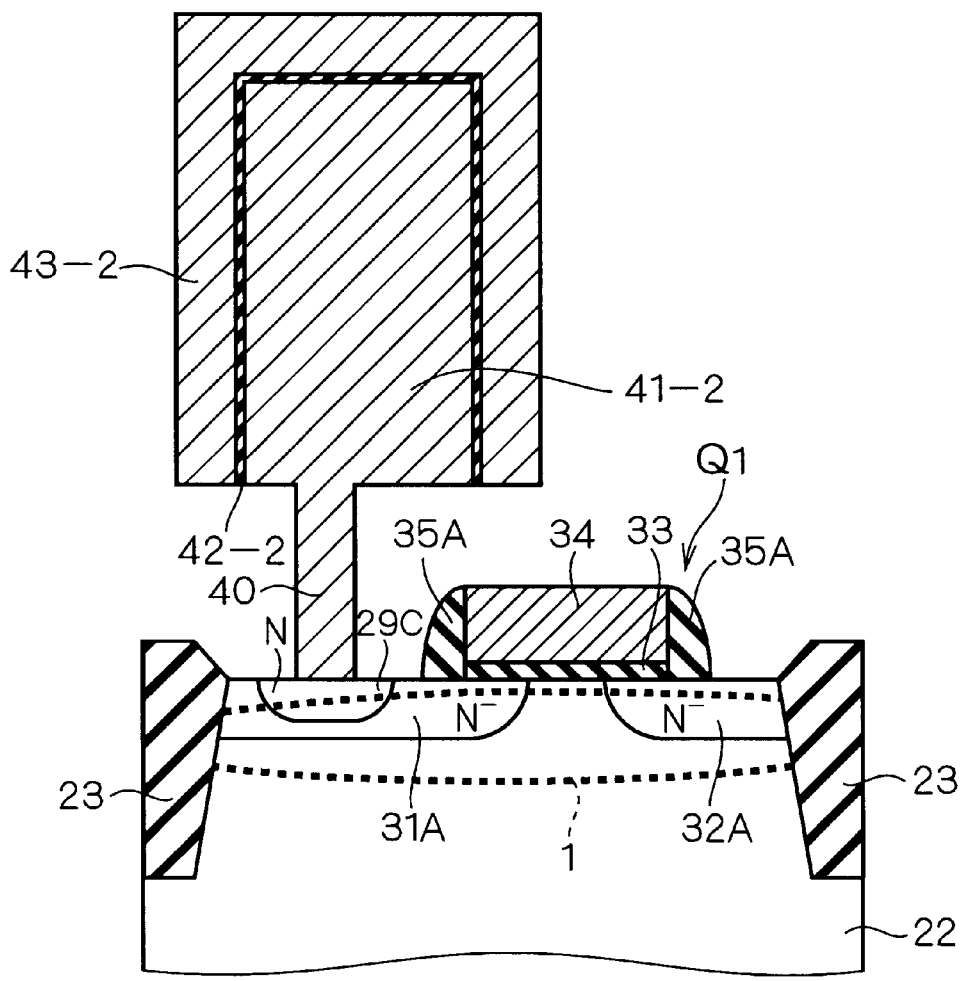

FIG. 90 is a sectional view illustrating a sixth aspect of the seventh preferred embodiment. The sixth aspect shows the case of forming a source/drain region 31A (32A) by using "gate SD" and "contact SD" in two diffusion processes.

As shown in FIG. 90, a contact region 29C is formed around a region where the surface of a source/drain region 31A (32A) extending to the underside of the edge proximate region of a gate electrode 34 is in contact with a contact hole 40 disposed in the source/drain region 31A (32A). The forming width of a sidewall 35A is set to TA.

Figure 91:
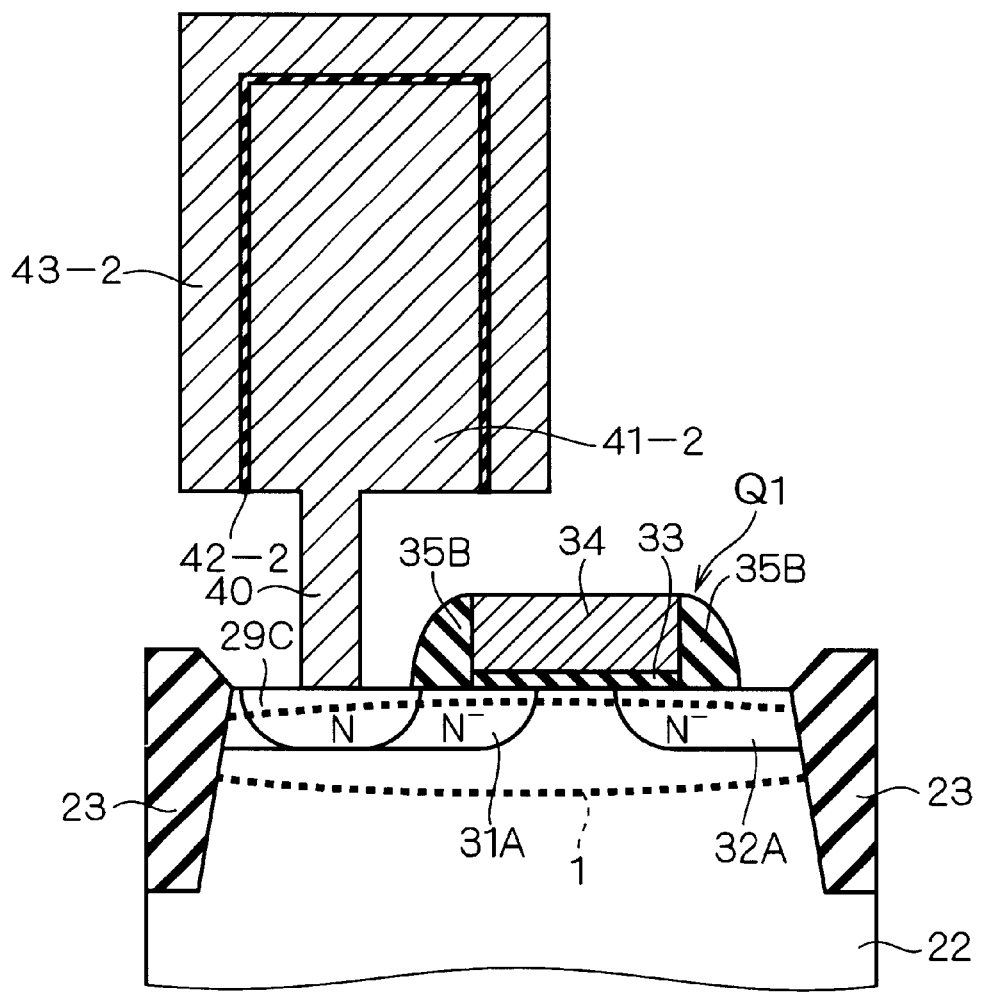

FIG. 91 is a sectional view illustrating a seventh aspect of the seventh preferred embodiment. The seventh aspect shows the case of forming a source/drain region 31A (32A) by using "gate SD" and "contact SD" in two diffusion processes.

As shown in FIG. 91, a contact region 29C is formed around a region where the surface of the source/drain region 31A (32A) extending to the underside of the edge proximate region of a gate electrode 34 is in contact with a contact hole 40 disposed in the source/drain region 31A (32A). The contact region 29C has approximately the same forming depth as the source/drain region 31A (32A). The forming width of a sidewall 35B is set to TB (>TA).

Figure 92:
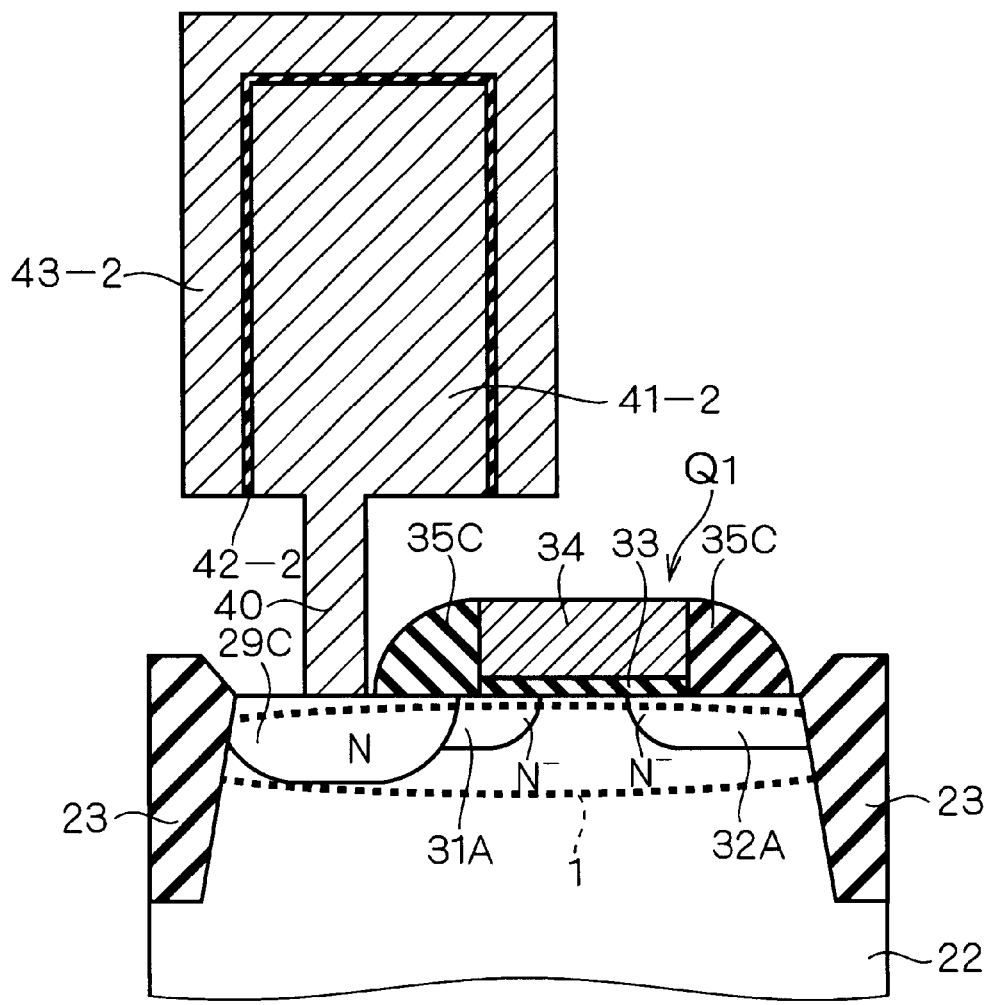

FIG. 92 is a sectional view illustrating an eighth aspect of the seventh preferred embodiment. The eighth aspect shows the case of forming a source/drain region 31A (32A) by using "gate SD" and "contact SD" in two diffusion processes.

As shown in FIG. 92, a contact region 29C (30C) is formed around a region where the source/drain region 31A (32A) extending to the underside of the edge proximate region of a gate electrode 34 is electrically connected to a contact hole 40 disposed in the source/drain region 31A (32A). The contact region 29C (30C) has a forming depth deeper than the source/drain region 31A (32A). The forming width of a sidewall 35C is set to TC (>TB).

Figure 93:
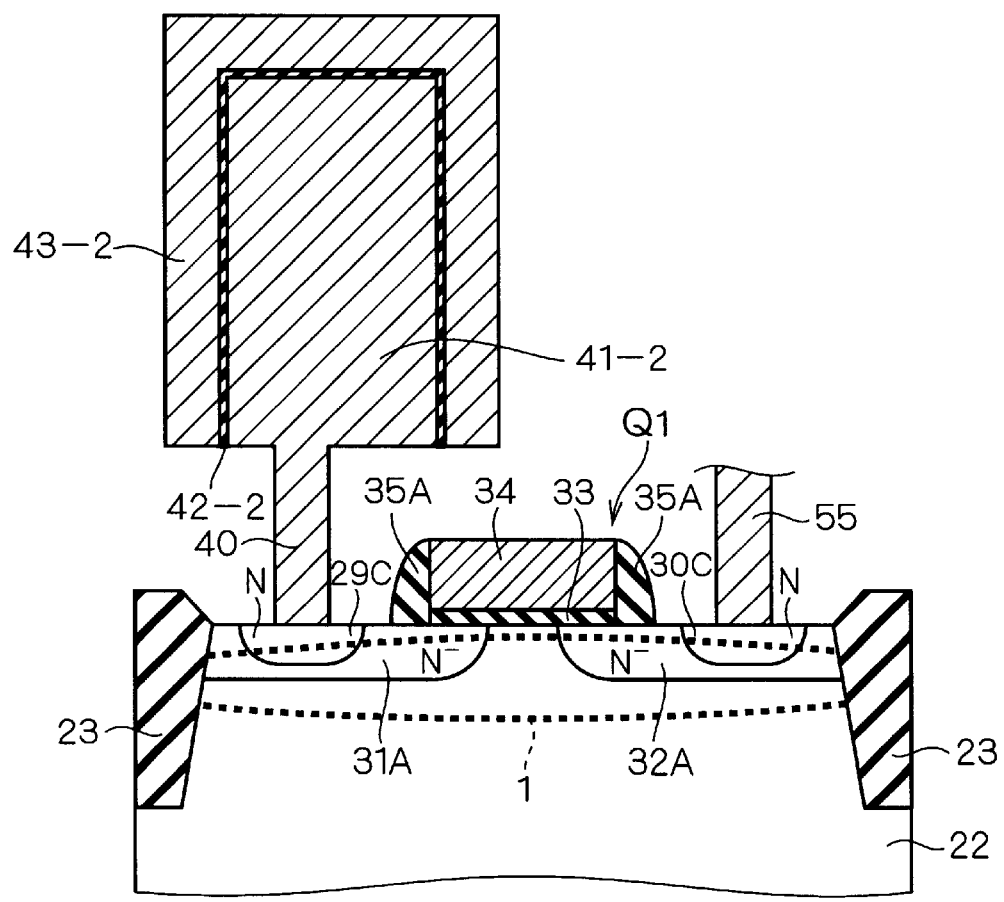

FIG. 93 is a sectional view illustrating a ninth aspect of the seventh preferred embodiment. The ninth aspect shows the case of forming a source/drain region 31A (32A) by using "gate SD" and "contact SD" in two diffusion processes.

As shown in FIG. 93, a contact region 29C (30C) is formed around a region where the surface of the source/drain region 31A (32A) extending to the underside of the edge proximate region of a gate electrode 34 is electrically connected to a contact hole 40 disposed in the source/drain region 31A (32A). The forming width of a sidewall 35A is set to TA. Note that another contact hole 55 is disposed on the contact region 30C.

Figure 94:
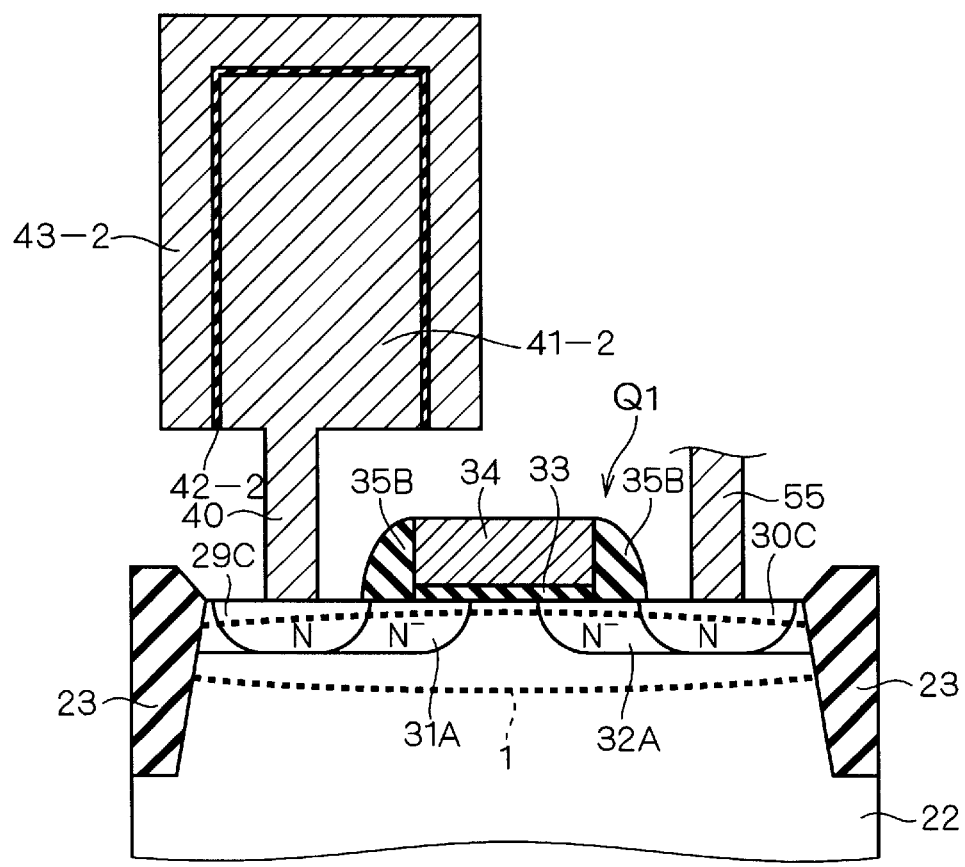

FIG. 94 is a sectional view illustrating a tenth aspect of the seventh preferred embodiment. The tenth aspect shows the case of forming a source/drain region 31A (32A) by using "gate SD" and "contact SD" in two diffusion processes.

As shown in FIG. 94, a contact region 29C (30C) is formed around a region where the source/drain region 31A (32A) extending to the underside of the edge proximate region of a gate electrode 34 is electrically connected to a contact hole 40 disposed in the source/drain region 31A (32A). The contact region 29C (30C) has a forming depth deeper than the source/drain region 31A (32A). The forming width of a sidewall 35B is set to TB (>TA). Note that another contact hole 55 is disposed on the contact region 30C.

Figure 95:
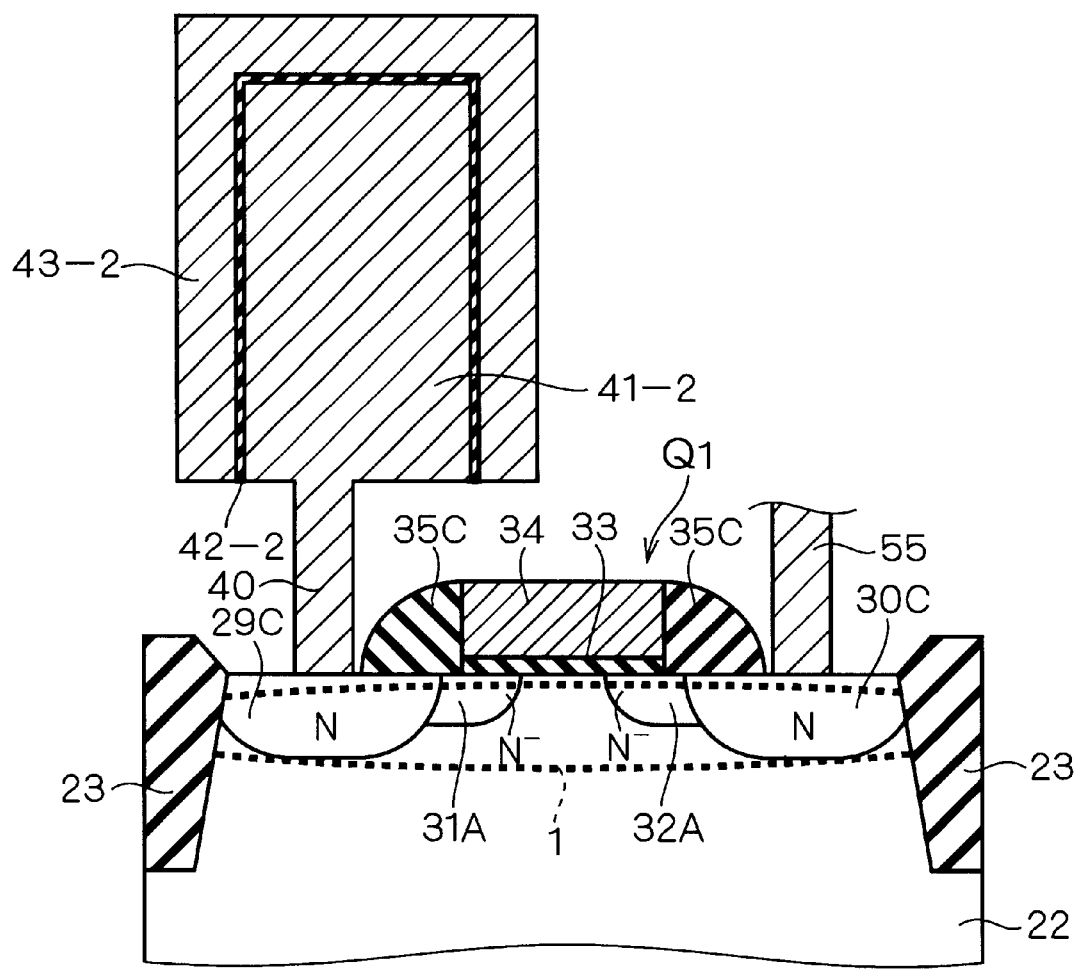

FIG. 95 is a sectional view illustrating an eleventh aspect of the seventh preferred embodiment. The eleventh aspect shows the case of forming a source/drain region 31A (32A) by using "gate SD" and "contact SD" in two diffusion processes.

As shown in FIG. 95, a contact region 29C (30C) is formed around a region where the source/drain region 31A (32A) extending to the underside of the edge proximate region of a gate electrode 34 is electrically connected to a contact hole 40 disposed in the source/drain region 31A (32A). The contact region 29C (30C) has a forming depth deeper than the source/drain region 31A (32A). The forming width of a sidewall 35C is set to TC (>TB). Note that another contact hole 55 is disposed on the contact region 30C.

Every structure of the sixth to eleventh aspects can reduce the parasitic resistance of source/drain regions and also can improve assurance of resistance to punch through because a lateral distance between the source/drain region 31A and contact region 29C is made wider than that of the third, fourth or fifth aspect.

Figure 96:
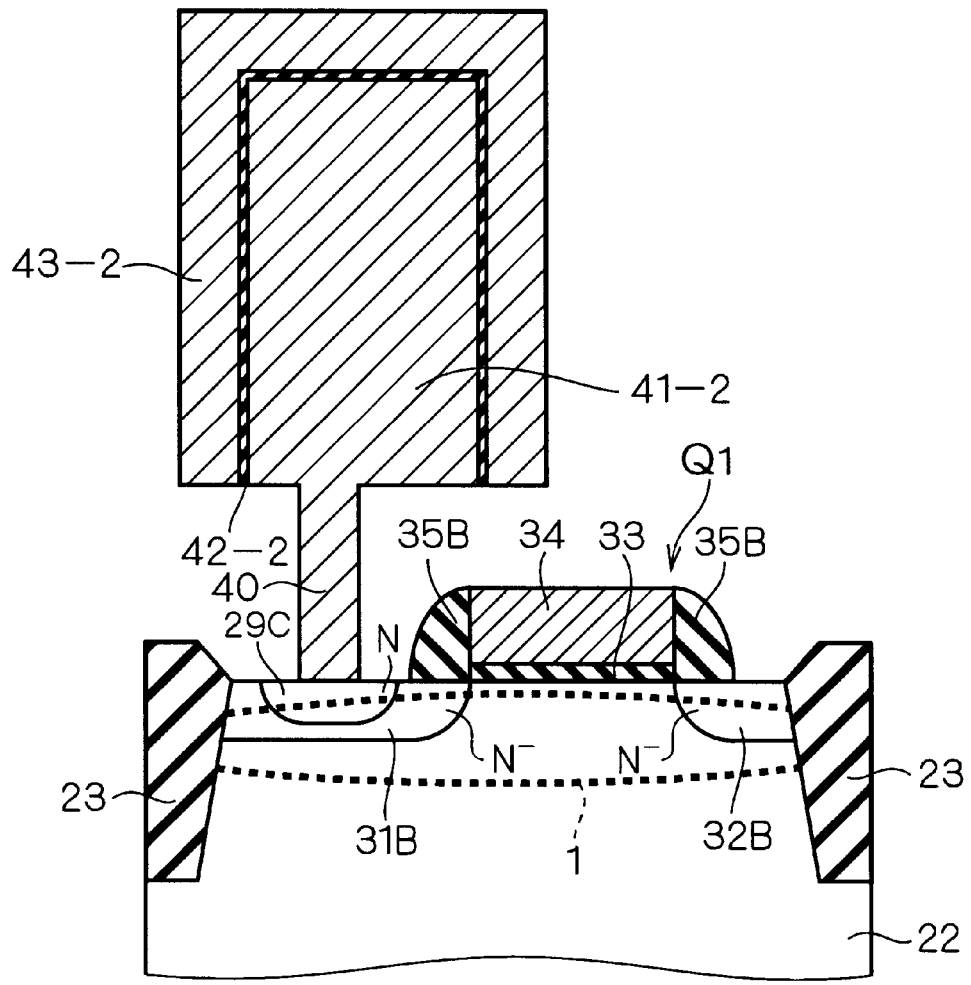

FIG. 96 is a sectional view illustrating a twelfth aspect of the seventh preferred embodiment. The twelfth aspect shows the case of forming a source/drain region 31B (32B) by using "SWSD" and "contact SD" in two diffusion processes.

As shown in FIG. 96, a contact region 29C is formed around a region where the source/drain region 31B (32B) extending to the underside of a sidewall 35B is electrically connected to a contact hole 40 disposed in the source/drain region 31B (32B).

When the source/drain region 31B (32B) is formed by performing a thermal diffusion process after ion implantation, the source/drain region 31B may be formed at a forming depth of not less than d/r wherein r is the ratio of a diffusion process in the channel direction of the source/drain region 31B, and d is the amount of offset due to the sidewall 35B.

Figure 97:
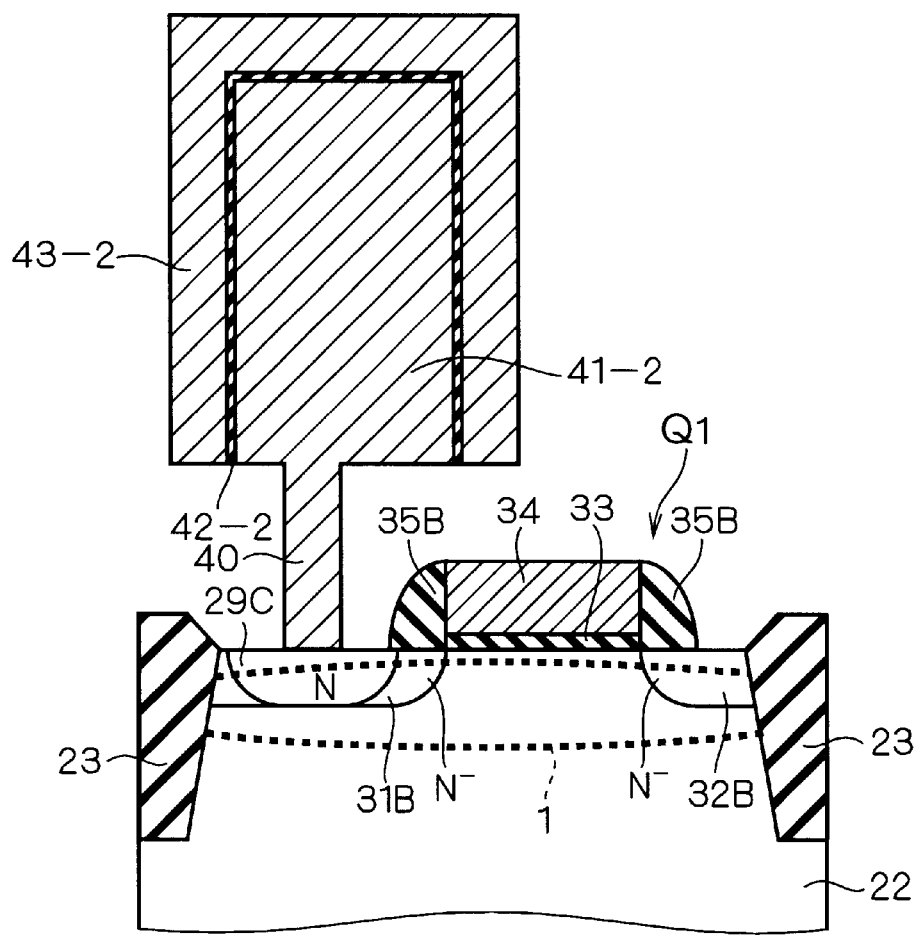

FIG. 97 is a sectional view illustrating a thirteenth aspect of the seventh preferred embodiment. The thirteenth aspect shows the case of forming a source/drain region 31B (32B) by using "SWSD" and "contact SD" in two diffusion processes.

As shown in FIG. 97, a contact region 29C is formed around a region where the source/drain region 31B (32B) extending to the underside of the edge proximate region of a gate electrode 34 is electrically connected to a contact hole 40 disposed in the source/drain region 31B (32B). The contact region 29C (30C) has approximately the same forming depth as the source/drain region 31B (32B).

Figure 98:
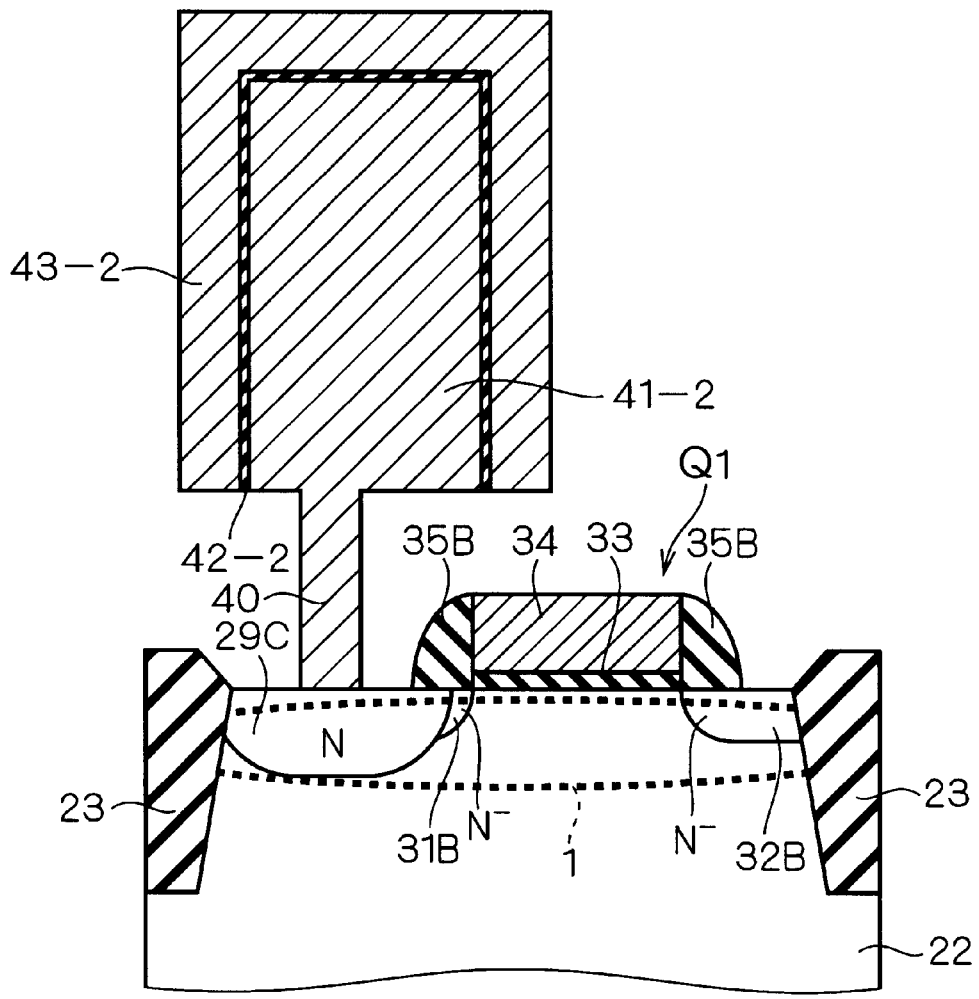

FIG. 98 is a sectional view illustrating a fourteenth aspect of the seventh preferred embodiment. The fourteenth aspect shows the case of forming a source/drain region 31B (32B) by using "SWSD" and "contact SD" in two diffusion processes.

As shown in FIG. 98, a contact region 29C (30C) is formed around a region where the surface of the source/drain region 31B (32B) extending to the underside of a sidewall 35B is electrically connected to a contact hole 40 disposed in the source/drain region 31B (32B). The contact region 29C (30C) has a forming depth deeper than the source/drain region 31B (32B).

Figure 99:
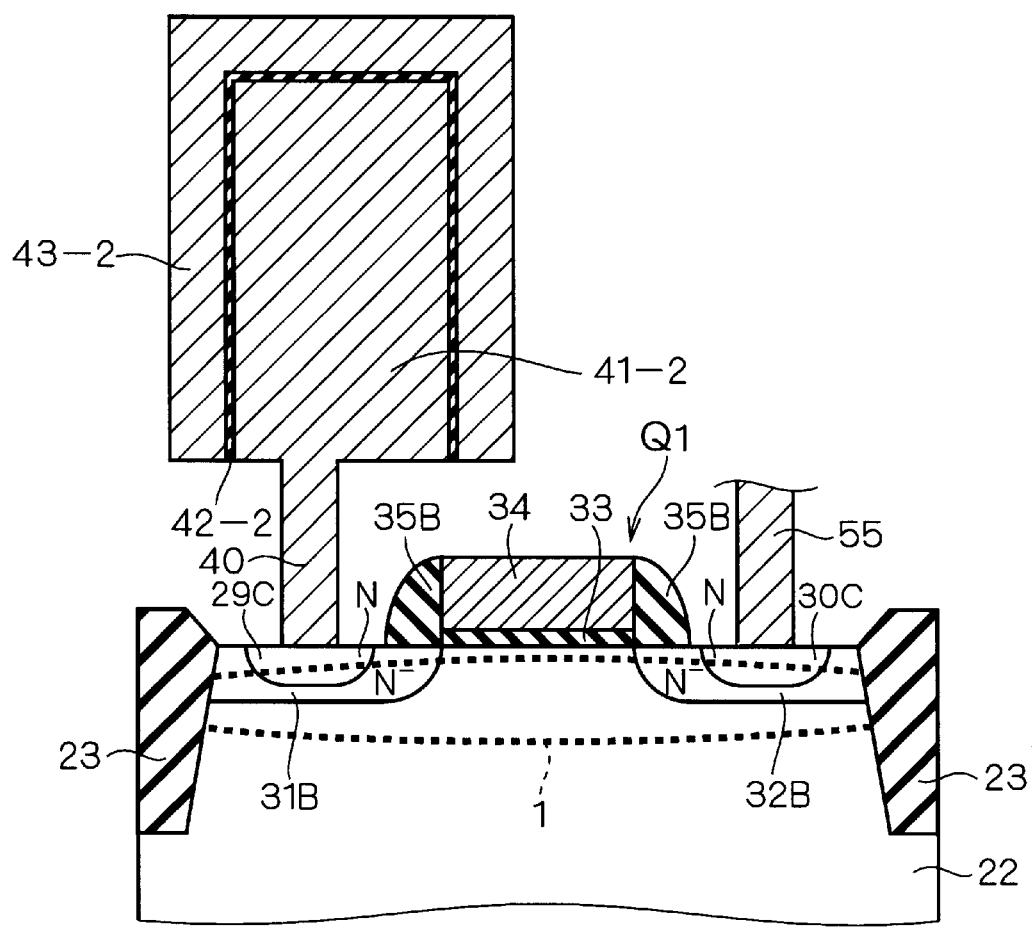

FIG. 99 is a sectional view illustrating a fifteenth aspect of the seventh preferred embodiment. The fifteenth aspect shows the case of forming a source/drain region 31B (32B) by using "SWSD" and "contact SD" in two diffusion processes.

As shown in FIG. 99, a contact region 29C (30C) is formed around a region where the surface of the source/drain region 31B (32B) extending to the underside of a sidewall 35B is electrically connected to a contact hole 40 disposed in the source/drain region 31B (32B). Note that another contact hole 55 is disposed on the contact region 30C.

Figure 100:
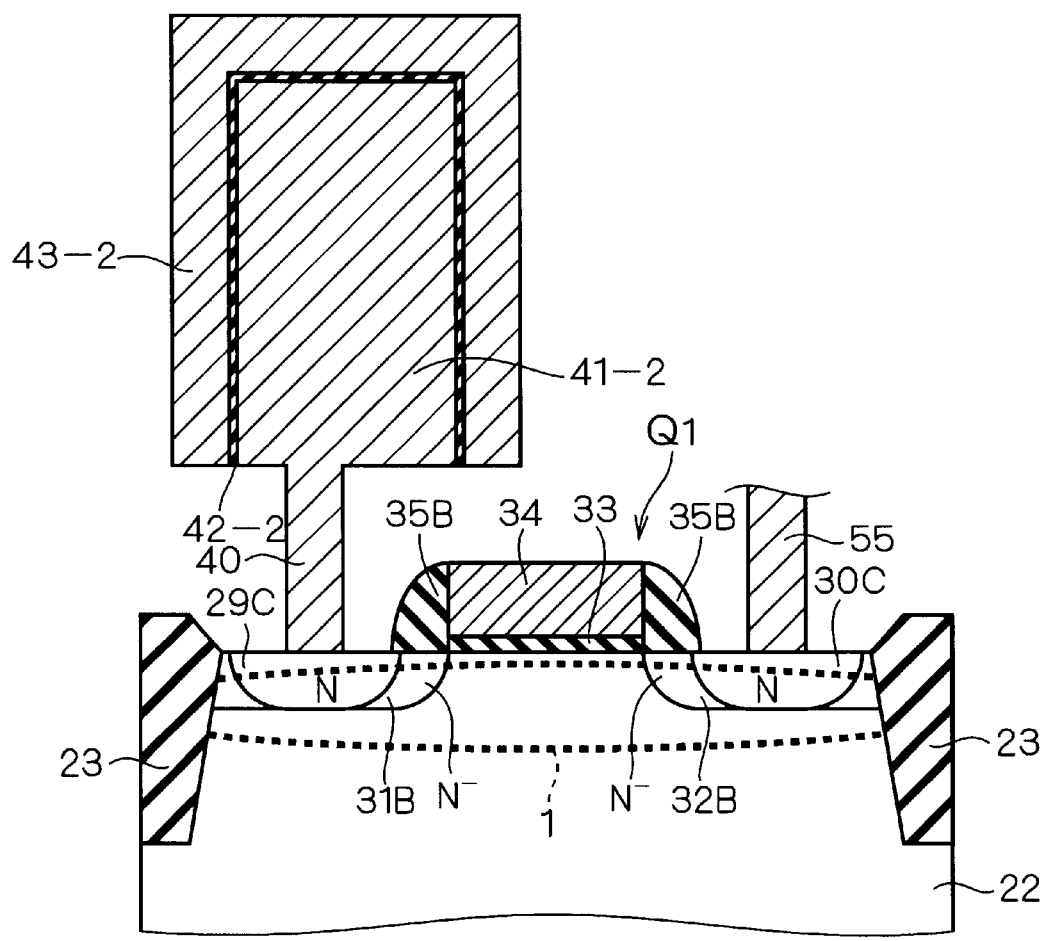

FIG. 100 is a sectional view illustrating a sixteenth aspect of the seventh preferred embodiment. The sixteenth aspect shows the case of forming a source/drain region 31B (32B) by using "SWSD" and "contact SD" in two diffusion processes.

As shown in FIG. 100, a contact region 29C (30C) is formed around a region where the surface of the source/drain region 31B (32B) extending to the underside of a sidewall 35B is electrically connected to a contact hole 40 disposed in the source/drain region 31B (32B). The contact region 29C (30C) has approximately the same forming depth as the source/drain region 31B. Note that another contact hole 55 is disposed on the contact region 30C.

Figure 101:
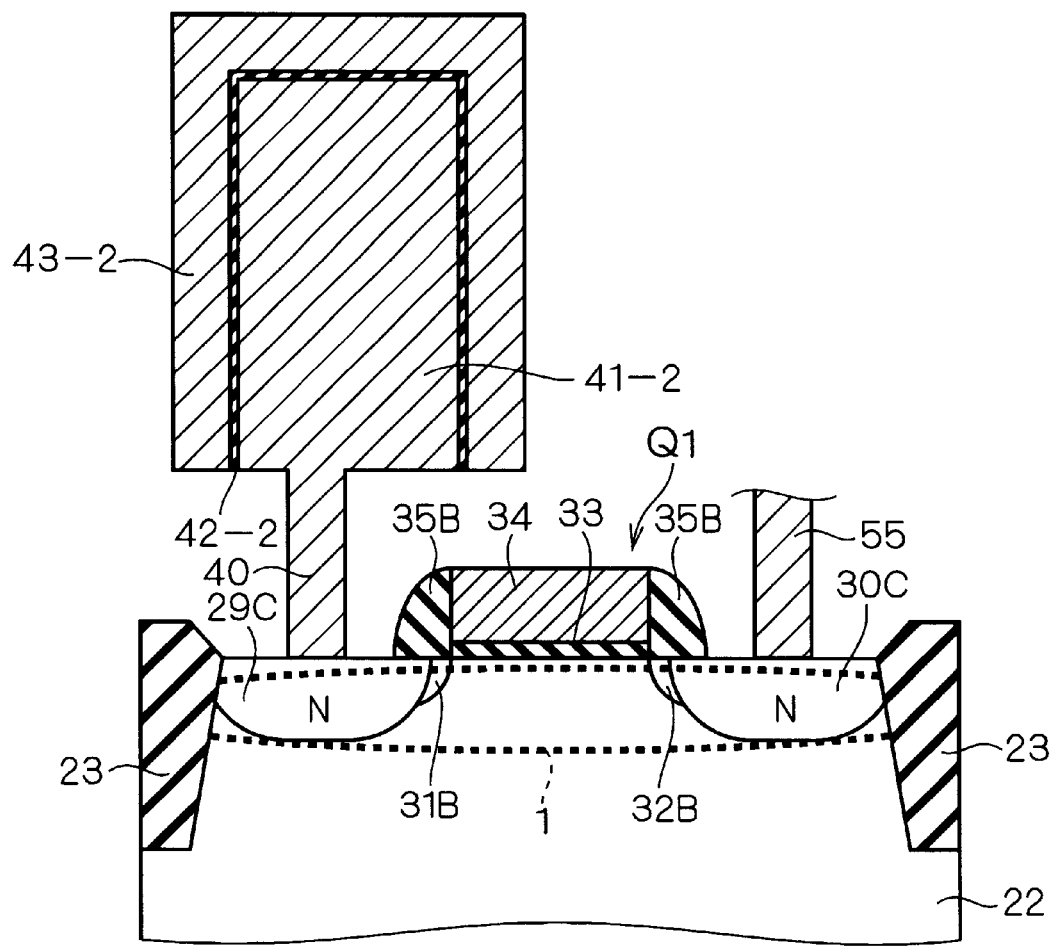

FIG. 101 is a sectional view illustrating a seventeenth aspect of the seventh preferred embodiment. The seventeenth aspect shows the case of forming a source/drain region 31B (32B) by using "SWSD" and "contact SD" in two diffusion processes.

As shown in FIG. 101, a contact region 29C (30C) is formed around a region where the surface of the source/drain region 31B (32B) extending to the underside of a sidewall 35B is electrically connected to a contact hole 40 disposed in the source/drain region 31B (32B). The contact region 29C (30C) has a forming depth deeper than the source/drain region 31B (32B). Note that another contact hole 55 is disposed on the contact region 30C.

Every structure of the twelfth to seventeenth aspects can reduce the parasitic resistance of source/drain regions and also can further improve the characteristic about assurance of resistance to punch-through because the distance between the source/drain regions 31B and 32B is made wider than that of any of the seventh to eleventh aspects.

Figure 102:
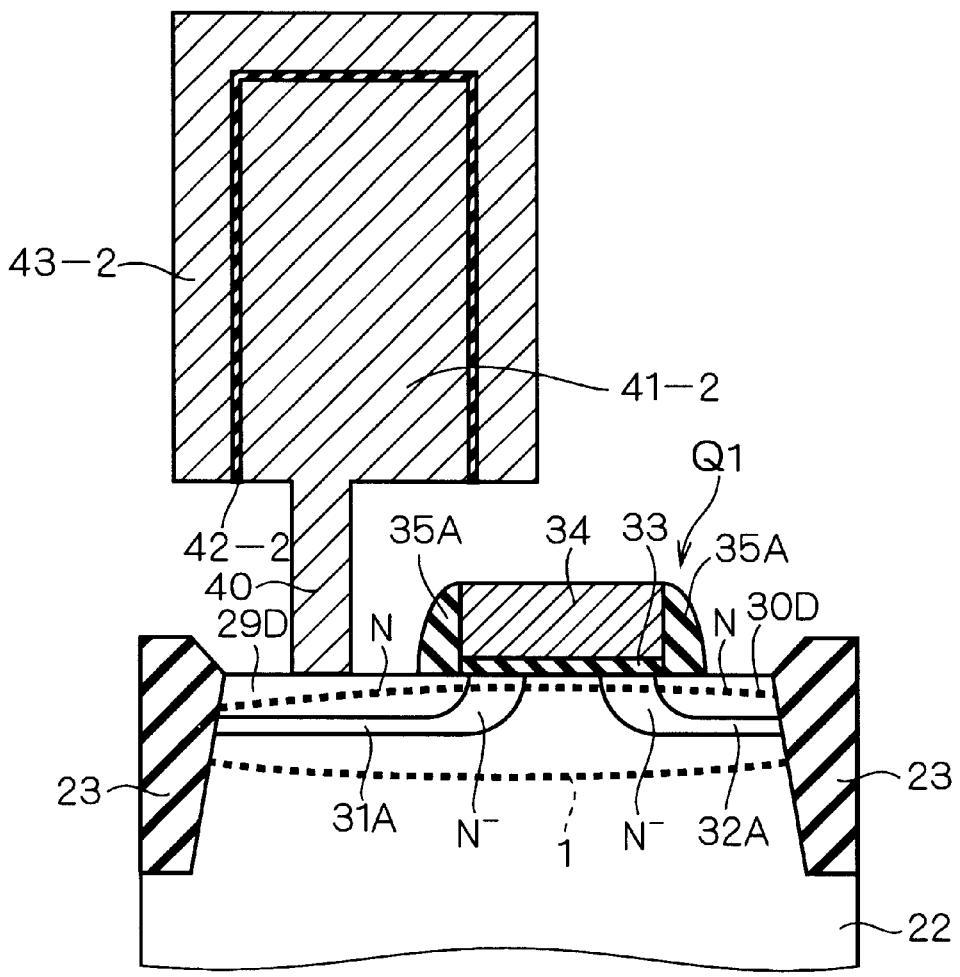

FIG. 102 is a sectional view illustrating an eighteenth aspect of the seventh preferred embodiment. The eighteenth aspect shows the case of forming a source/drain region 31A (32A) by using "gate SD" and "SWSD" in two diffusion processes. The ion implantation performed in the process of "SWSD" is an oblique ion implantation.

As shown in FIG. 102, a contact region 29D (30D) extending to the underside of a slight portion of the edge proximate region of a gate electrode 34 is formed in the surface of the source/drain region 31A (32A) extending to the underside of the edge proximate region of the gate electrode 34.

The eighteenth aspect can provide resistance to punch-though similarly to the first and second aspects, as well as the third to fifth aspects, because the extension of a contact region 29D into the channel direction is shorter than a contact region 29A and is longer than a contact region 29B.

Figure 103:
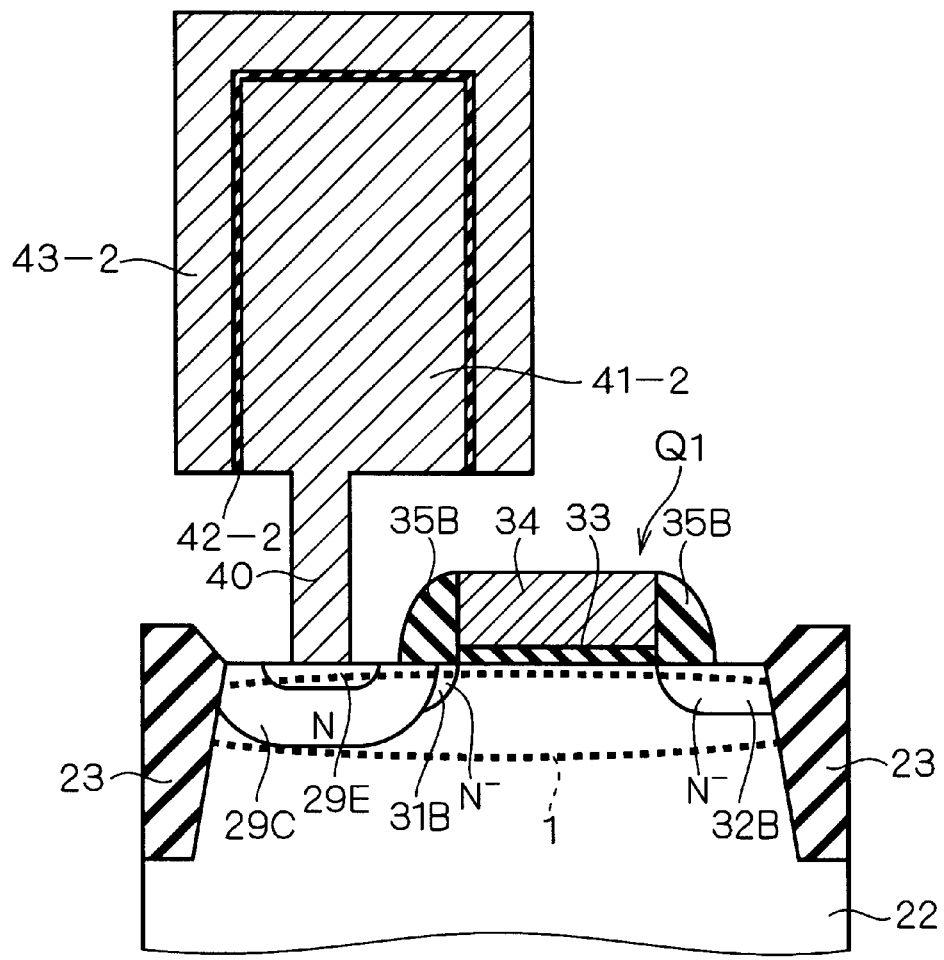

FIG. 103 is a sectional view illustrating a nineteenth aspect of the seventh preferred embodiment. The nineteenth aspect shows the case that a source/drain region 31B (32B) is formed by three diffusion processes in which "SWSD", "contact SD", and a storage node electrode 41-2, are respectively used as a diffusion source.

As shown in FIG. 103, a contact region 29C (30C) is formed around a region where the surface of the source/drain region 31B (32B) extending to the underside of a sidewall 35B is electrically connected to a contact hole 40 disposed in the source/drain region 31B (32B). The contact region 29C (30C) has a forming depth deeper than the source/drain region 31B (32B). A contact region 29E is formed around a region where the surface of the contact region 29C is electrically connected to the contact hole 40.

Figure 104:
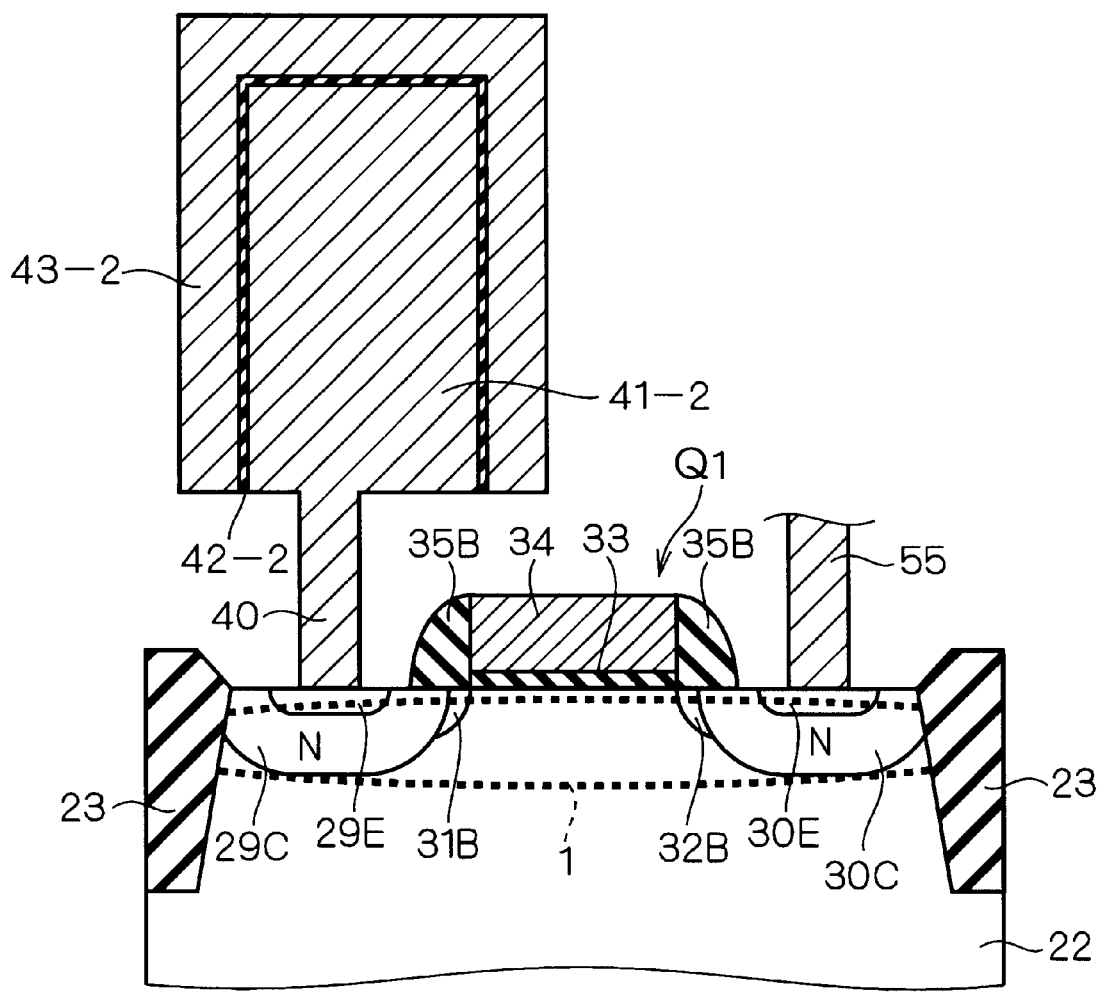

FIG. 104 is a sectional view illustrating a twentieth aspect of the seventh preferred embodiment. The twentieth aspect shows the case that a source/drain region 31B (32B) is formed by three diffusion processes employing "SWSD", "contact SD", and the diffusion material formed at a storage node electrode 41-2 and a contact hole 55.

As shown in FIG. 104, a contact region 29C (30C) is formed around a region where the surface of the source/drain region 31B (32B) extending to the underside of a sidewall 35B is electrically connected to a contact hole 40 disposed in the source/drain region 31B (32B). The contact region 29C (30C) has a forming depth deeper than the source/drain region 31B (32B). A contact region 29E is formed around a region where the contact region 29C (30C) is electrically connected to the contact hole 40. Another contact hole 55 is disposed on the contact region 30C.

When the source/drain region 31 is formed by triple diffusion, as in the nineteenth or twentieth aspect, it is able to reduce parasitic resistance by the contact region 29E, while relaxation of gate edge field is attained by the contact region 29C.

Eighth Preferred Embodiment

FIGS. 105 to 110 are sectional views illustrating first to sixth aspects of a memory cell structure of a DRAM according to an eighth preferred embodiment. The first to sixth aspects show the cases that a source/drain region obtained by dual diffusion of the seventh preferred embodiment is used in a structure employing a channel dope region 1.

Figure 105:
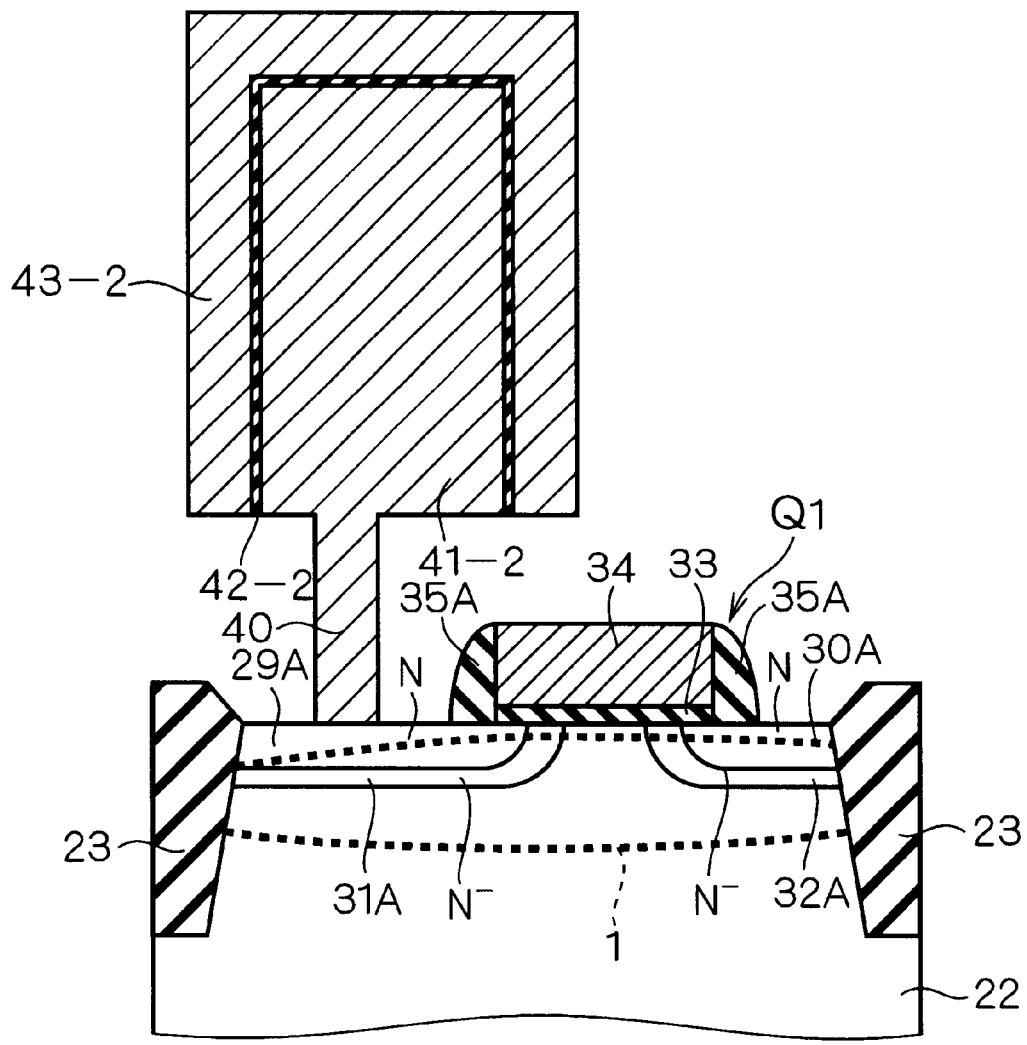
Figure 106:
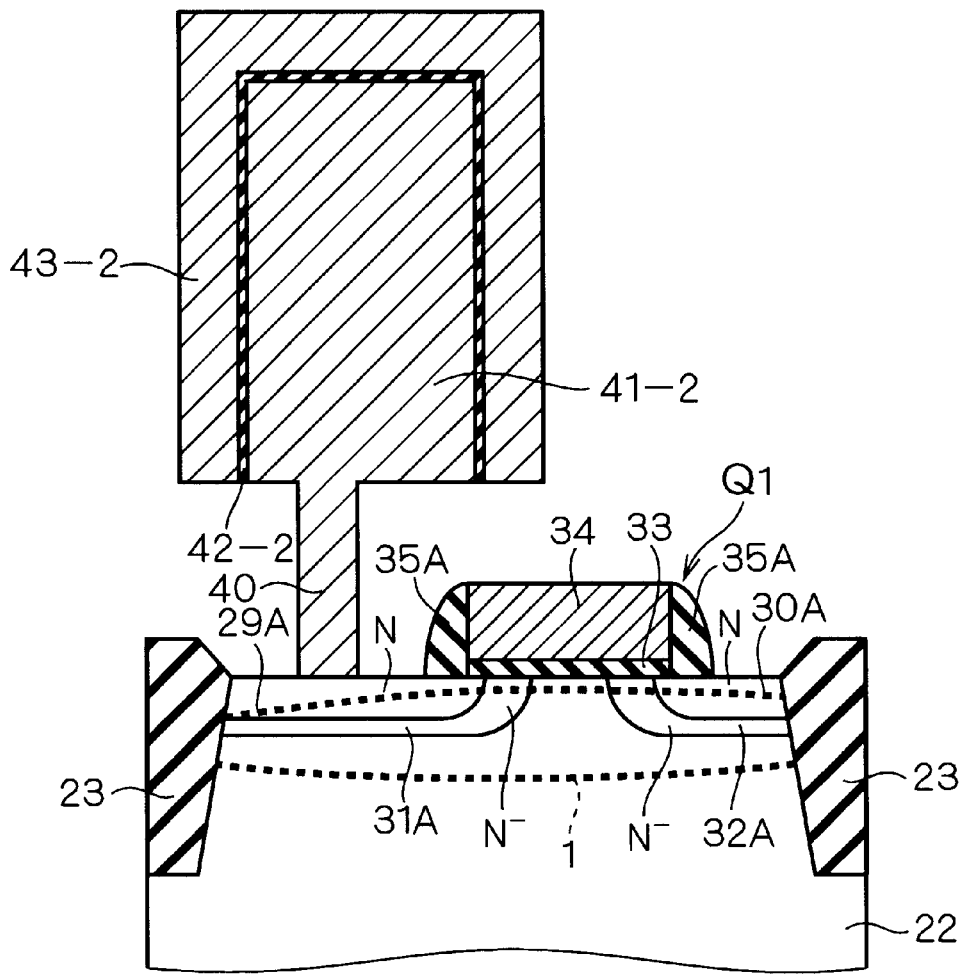
Figure 107:
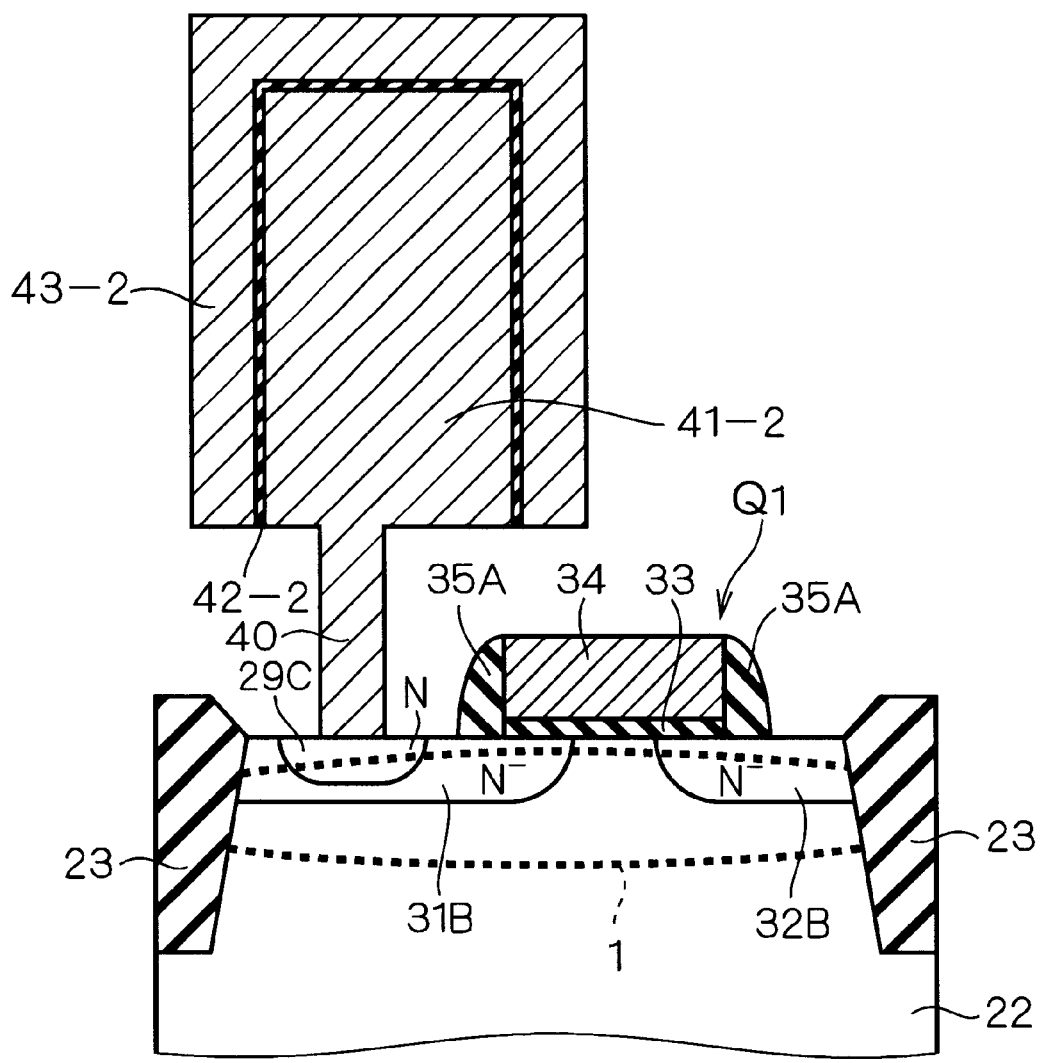
Figure 108:
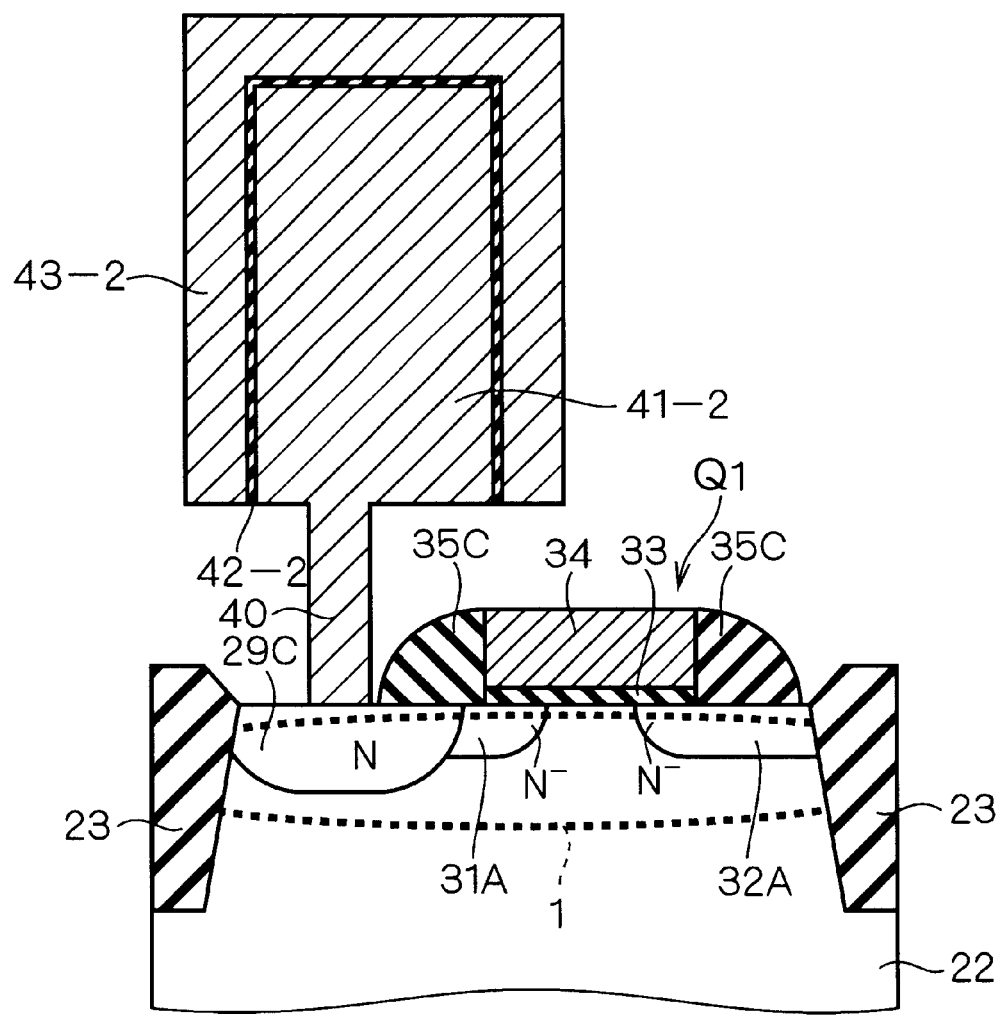
Figure 109:
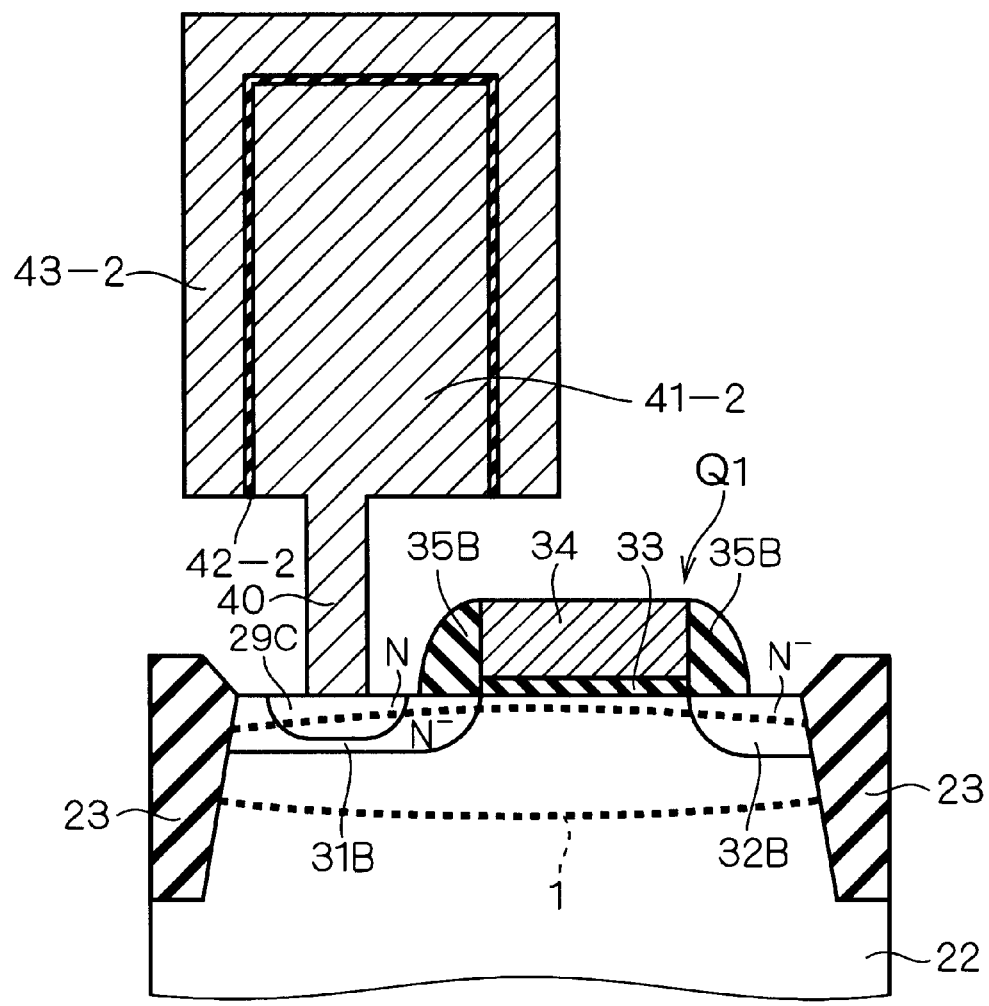

Specifically, FIG. 105 shows a structure obtained by using "gate SD" in two diffusion processes (corresponding to the first aspect of the seventh preferred embodiment as shown in FIG. 85). FIG. 106 shows a structure obtained by using "gate SD" and "SWSD" in two diffusion processes (corresponding to the third aspect of the seventh preferred embodiment as shown in FIG. 87). FIG. 107 shows a structure obtained by using "gate SD" and "contact SD" in two diffusion processes and by forming shallowly a contact region 29C (corresponding to the sixth aspect of the seventh preferred embodiment as shown in FIG. 90). FIG. 108 shows a structure obtained by using "gate SD" and "contact SD" in two diffusion processes and by forming deeply a contact region 29C (corresponding to the eighth aspect of the seventh preferred embodiment as shown in FIG. 92). FIG. 109 shows a structure obtained by using "SWSD" and "contact SD" in two diffusion processes and by forming shallowly a contact region 29C (corresponding to the twelfth aspect of the seventh preferred embodiment as shown in FIG. 96). FIG. 110 shows a structure obtained by using "SWSD" and "contact SD" in two diffusion processes and by forming deeply a contact region 29C (corresponding to the fourteenth aspect of the seventh preferred embodiment as shown in FIG. 98).

FIGS. 111 to 116 are sectional views illustrating seventh to twelfth aspects of a memory cell structure of a DRAM according to the eighth preferred embodiment. The seventh to twelfth aspects show the cases that a source/drain region obtained by dual diffusion of the seventh preferred embodiment is used in a structure employing pocket regions 3 and 4.

Figure 112:
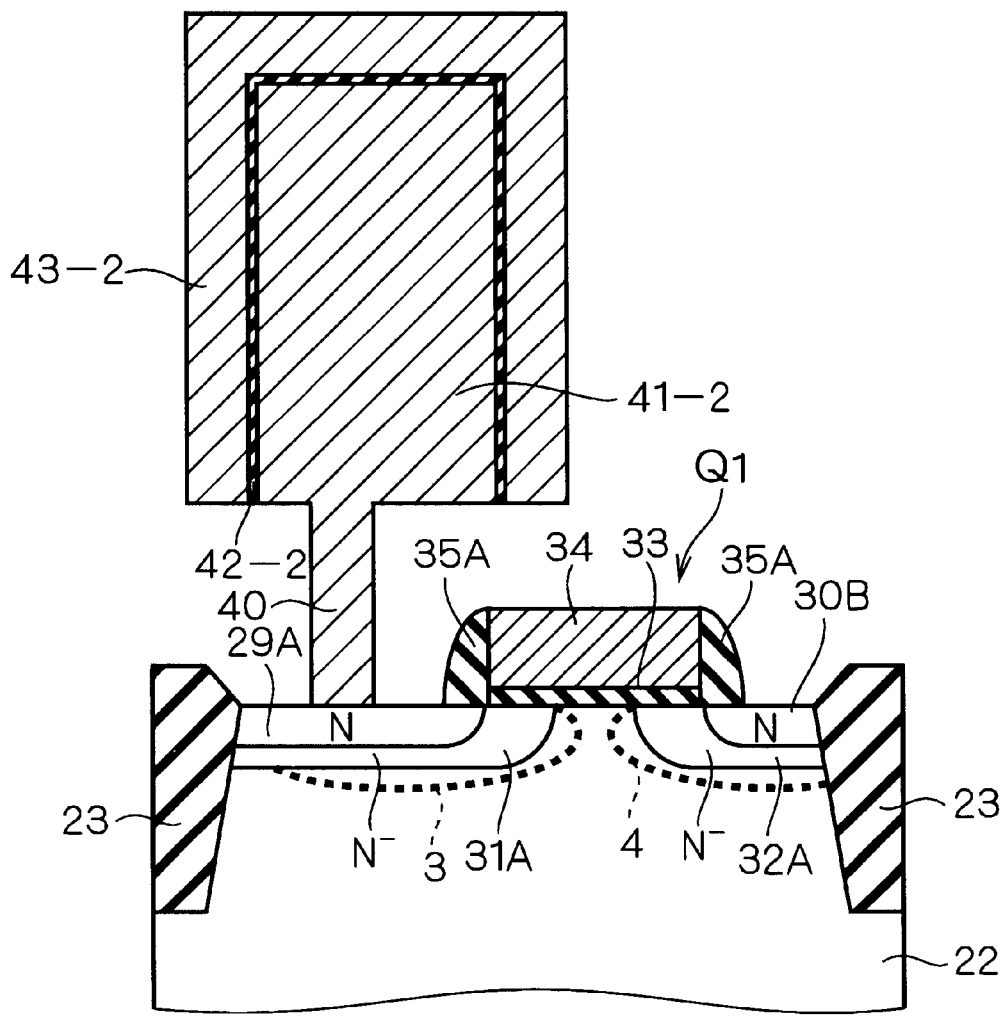
Figure 113:
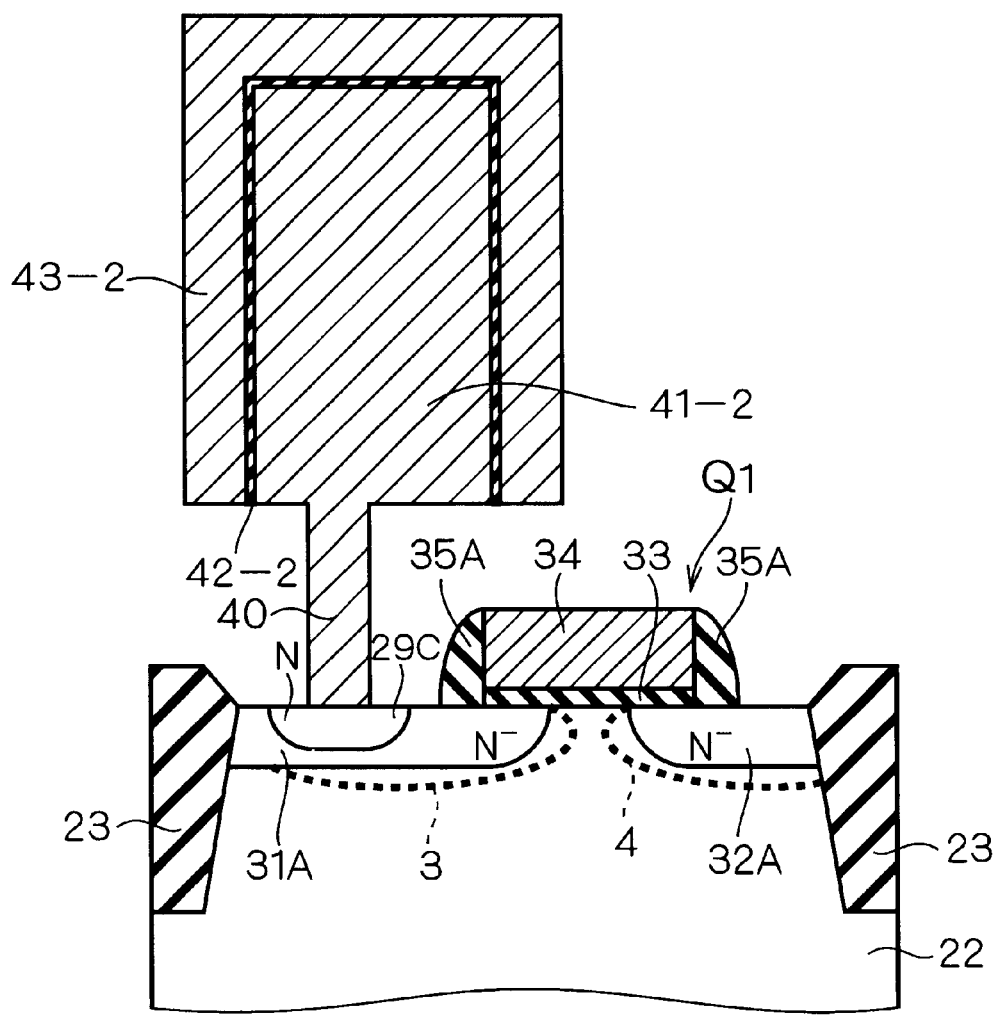
Figure 115:
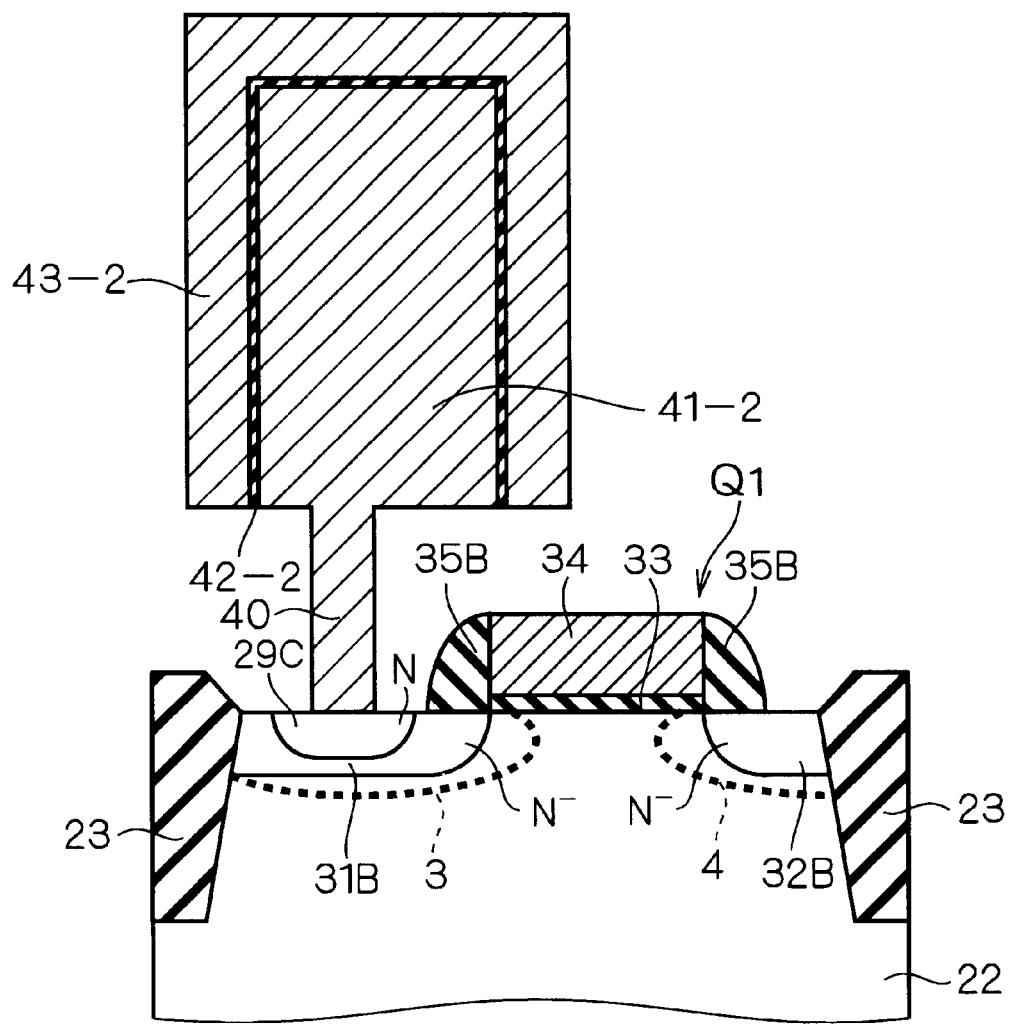

Specifically, FIG. 111 shows a structure obtained by using "gate SD" in two diffusion processes (corresponding to the first aspect of the seventh preferred embodiment as shown in FIG. 85). FIG. 112 shows a structure obtained by using "gate SD" and "SWSD" in two diffusion processes (corresponding to the third aspect of the seventh preferred embodiment as shown in FIG. 87). FIG. 113 shows a structure obtained by using "gate SD" and "contact SD" in two diffusion processes and forming shallowly a contact region 29C (corresponding to the sixth aspect of the seventh preferred embodiment as shown in FIG. 90). FIG. 114 shows a structure obtained by using "gate SD" and "contact SD" in two diffusion processes and by forming deeply a contact region 29C (This structure corresponds to the eighth aspect of the seventh preferred embodiment as shown in FIG. 92, except for the use of a sidewall 35A.). FIG. 115 shows a structure obtained by using "SWSD" and "contact SD" in two diffusion processes and by forming shallowly a contact region 29C (corresponding to the twelfth aspect of the seventh preferred embodiment as shown in FIG. 96). FIG. 116 shows a structure obtained by using "SWSD" and "contact SD" in two diffusion processes and by forming deeply a contact region 29C (corresponding to the fourteenth aspect of the seventh preferred embodiment as shown in FIG. 98).

FIGS. 117 to 122 are sectional views illustrating thirteenth to eighteenth aspects of a memory cell structure of a DRAM according to the eighth preferred embodiment. The thirteenth to eighteenth aspects show the cases that a source/drain region obtained by dual diffusion of the seventh preferred embodiment is used in a structure in combination of a channel dope region 8 formed at a deep region and shallow pocket regions 13 and 14 formed at a shallow region.

Figure 120:
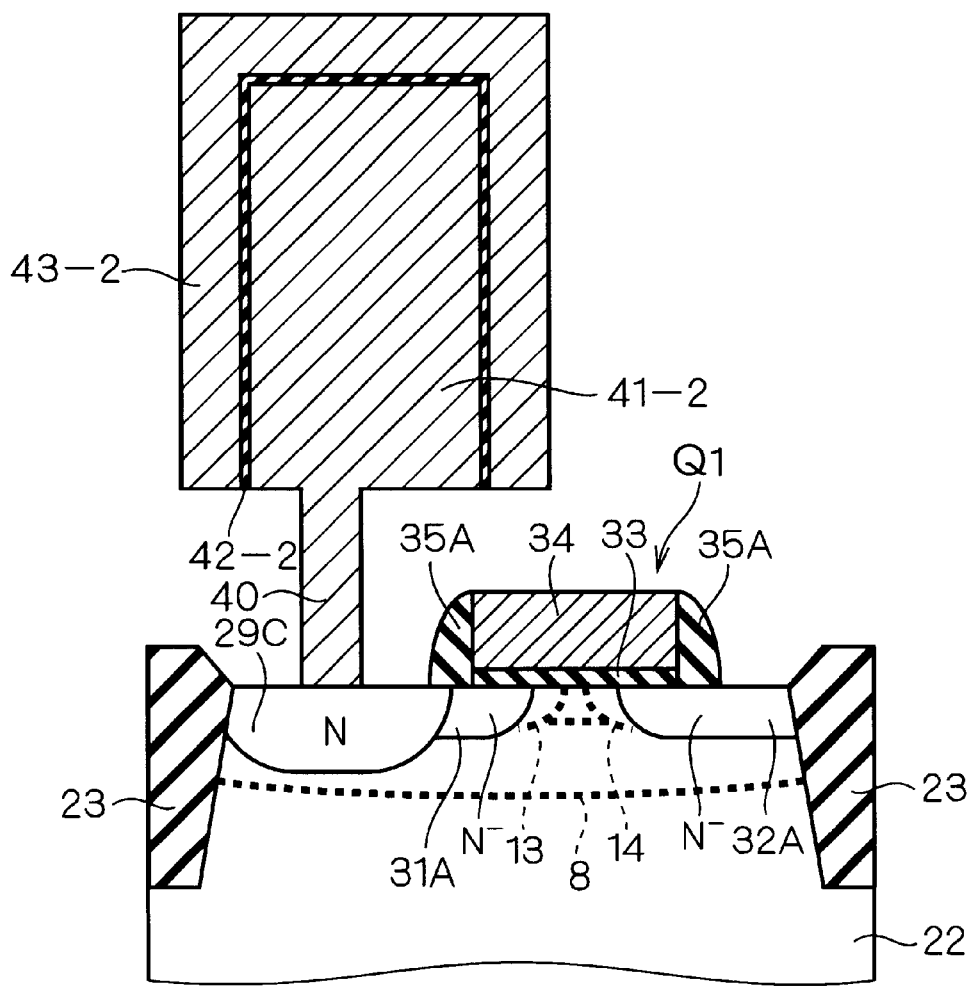
Figure 121:
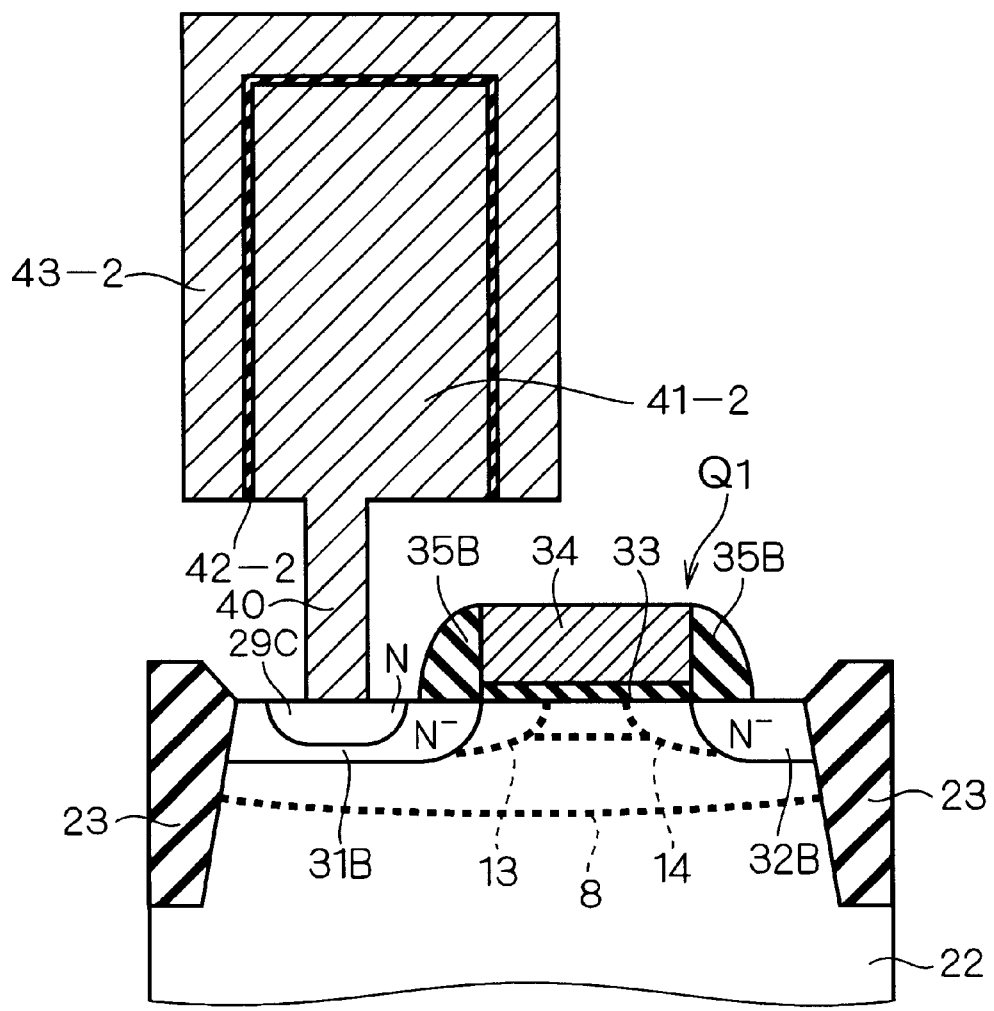
Figure 122:
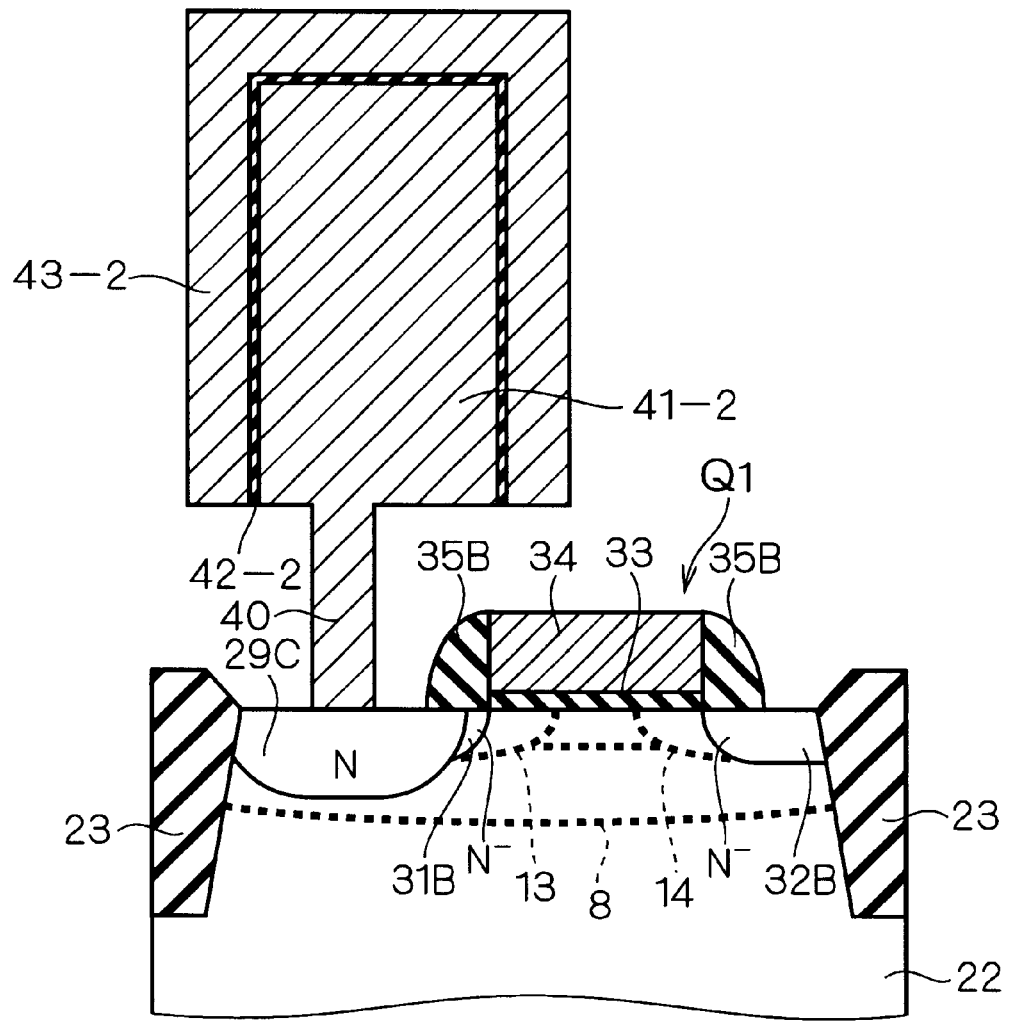

Specifically, FIG. 117 shows a structure obtained by using "gate SD" in two diffusion processes (corresponding to the first aspect of the seventh preferred embodiment as shown in FIG. 85). FIG. 118 shows a structure obtained by using "gate SD" and "SWSD" in two diffusion processes (corresponding to the third aspect of the seventh preferred embodiment as shown in FIG. 87). FIG. 119 shows a structure obtained by using "gate SD" and "contact SD" in two diffusion processes and by forming shallowly a contact region 29C (corresponding to the sixth aspect of the seventh preferred embodiment as shown in FIG. 90). FIG. 120 shows a structure obtained by using "gate SD" and "contact SD" in two diffusion processes and by forming deeply a contact region 29C (This structure corresponds to the eighth aspect of the seventh preferred embodiment as shown in FIG. 92, except for the use of a sidewall 35A.). FIG. 121 shows a structure obtained by using "SWSD" and "contact SD" in two diffusion processes and by forming shallowly a contact region 29C (corresponding to the twelfth aspect of the seventh preferred embodiment as shown in FIG. 96). FIG. 122 shows a structure obtained by using "SWSD" and "contact SD" in two diffusion processes and by forming deeply a contact region 29C (corresponding to the fourteenth aspect of the seventh preferred embodiment as shown in FIG. 98).

FIGS. 123 to 128 are sectional views illustrating nineteenth to twenty-fourth aspects of a memory cell structure of a DRAM according to the eighth preferred embodiment. The nineteenth to twenty-fourth aspects show the cases that a source/drain region obtained by dual diffusion of the seventh preferred embodiment is used in a structure in combination of a channel dope region 8 formed at a deep region and a channel dope region 7 and shallow pocket regions 13 and 14 formed at a shallow region.

Figure 123:
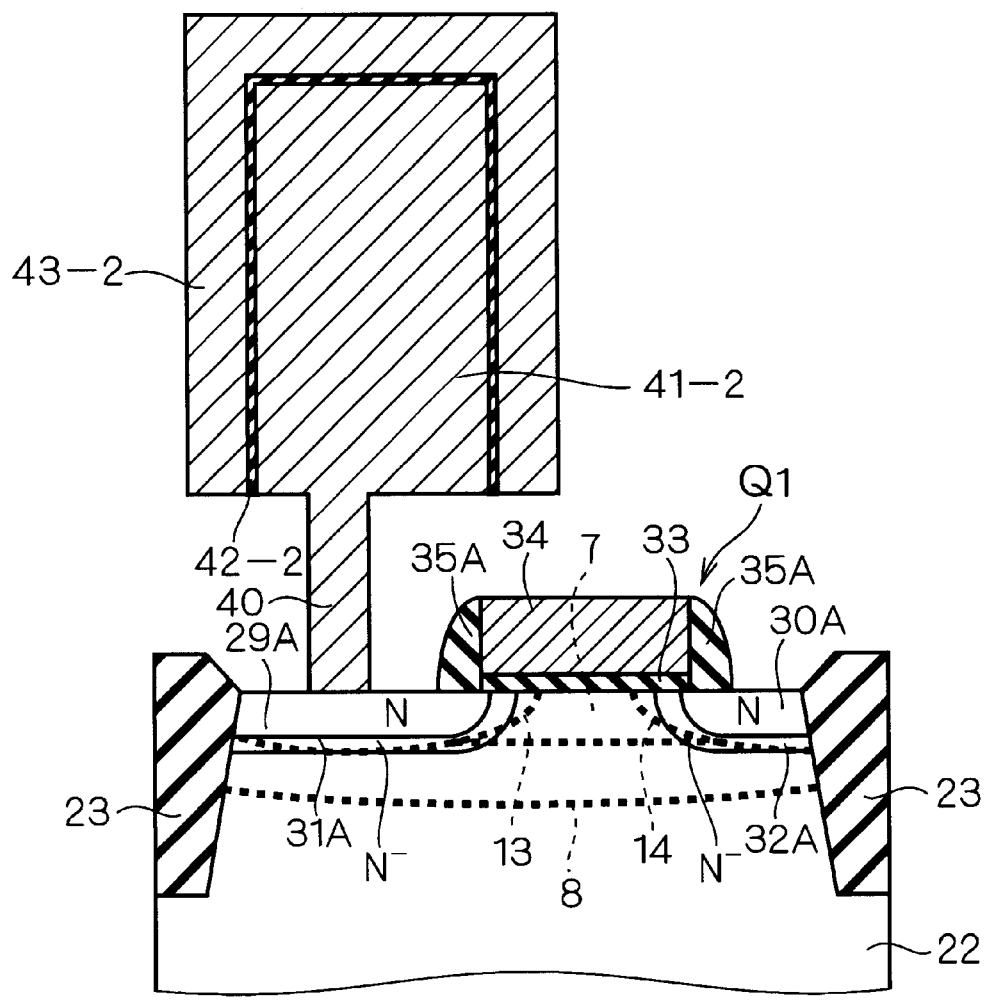
Figure 124:
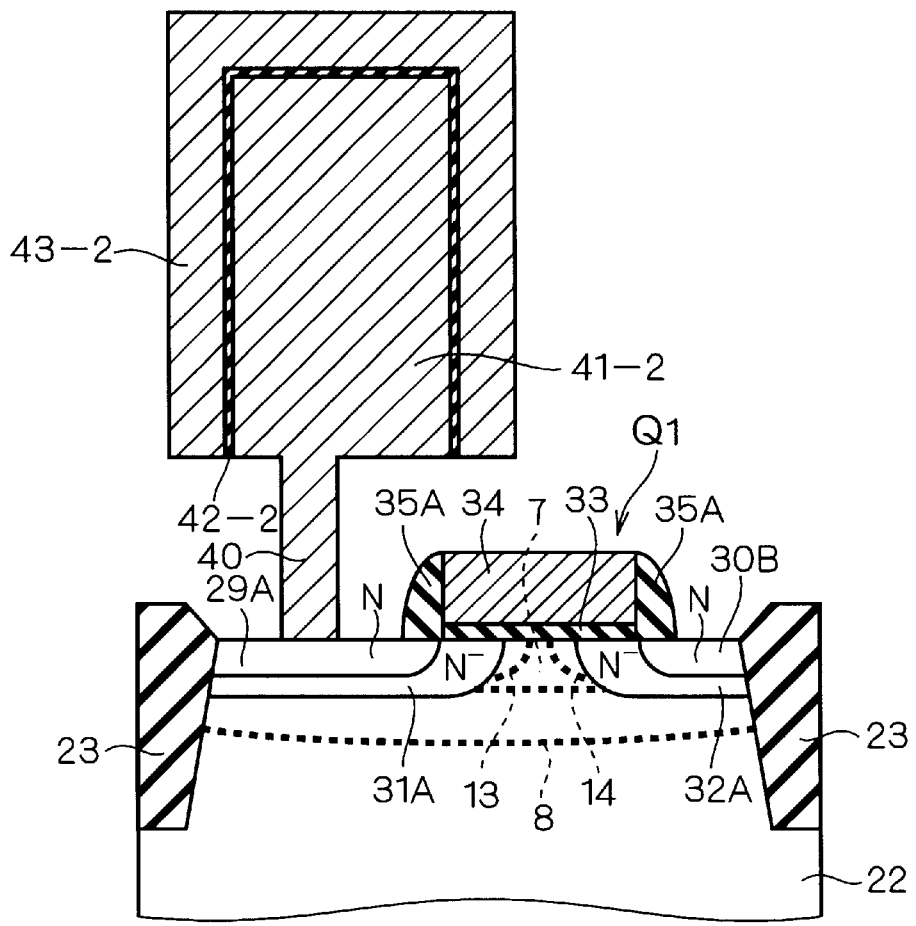
Figure 125:
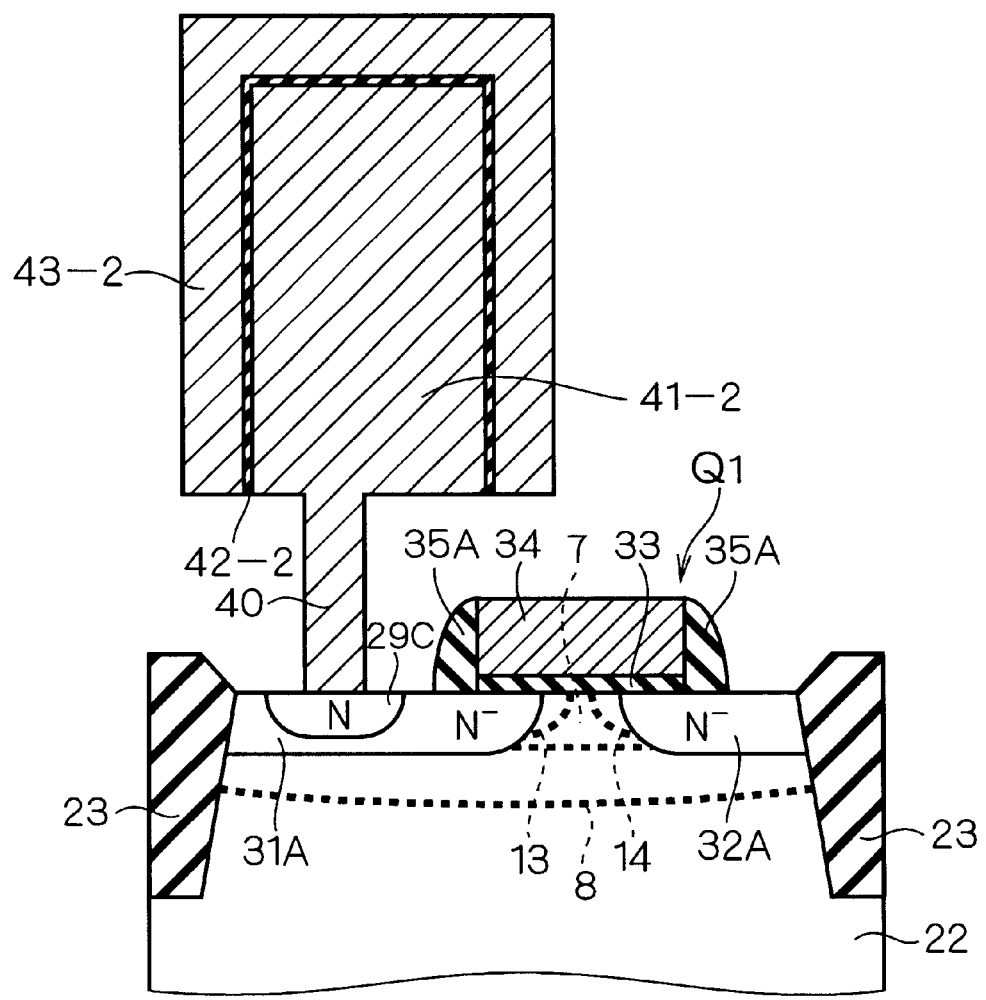
Figure 126:
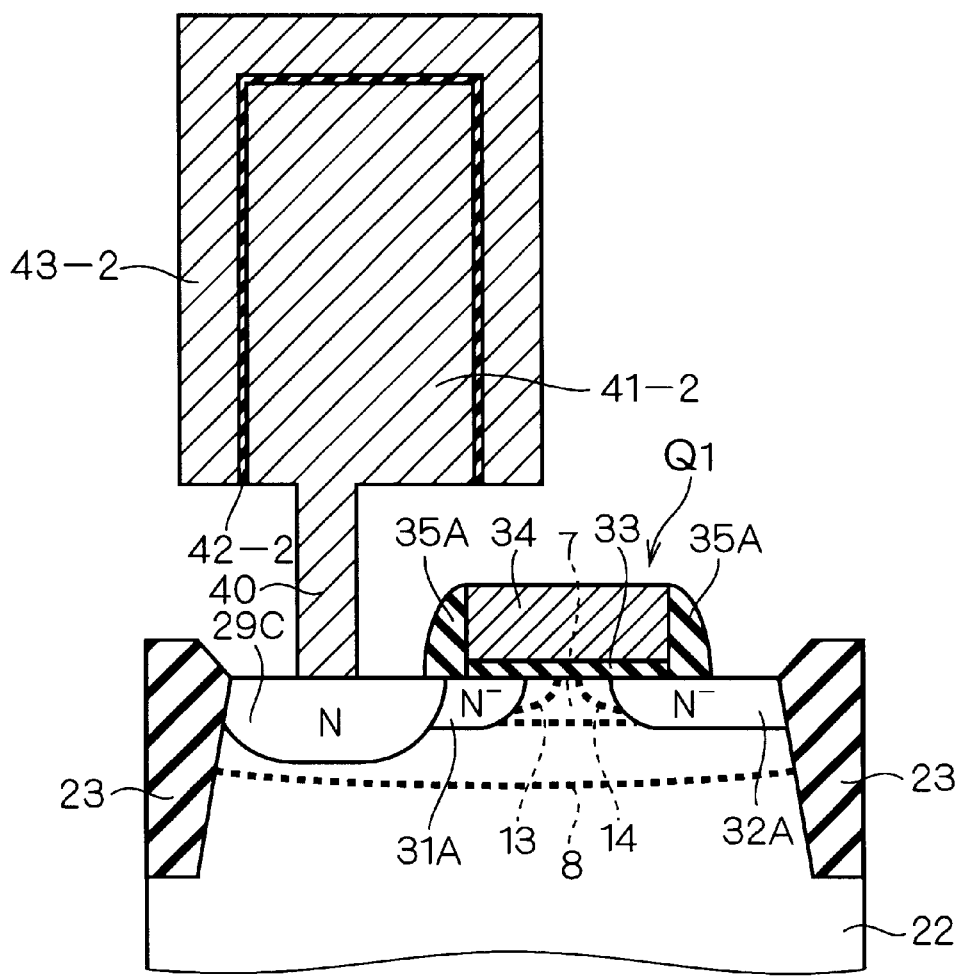
Figure 127:
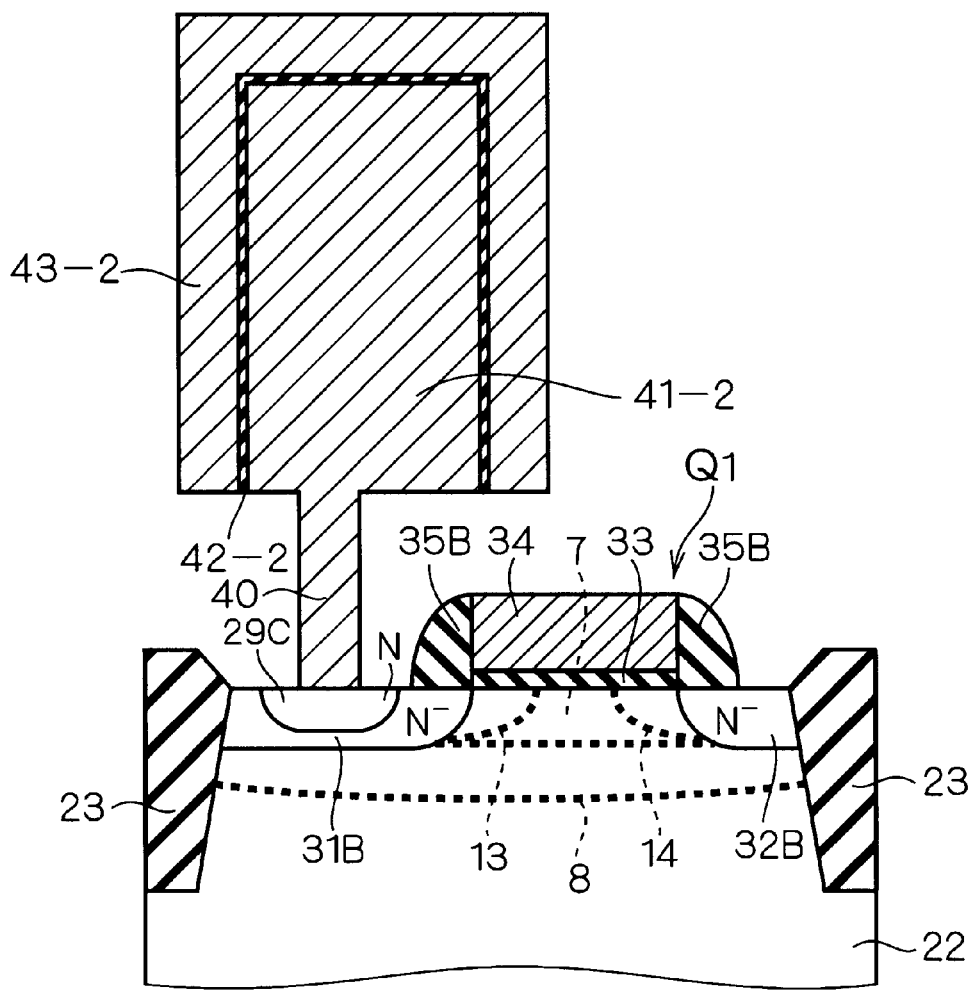
Figure 128:
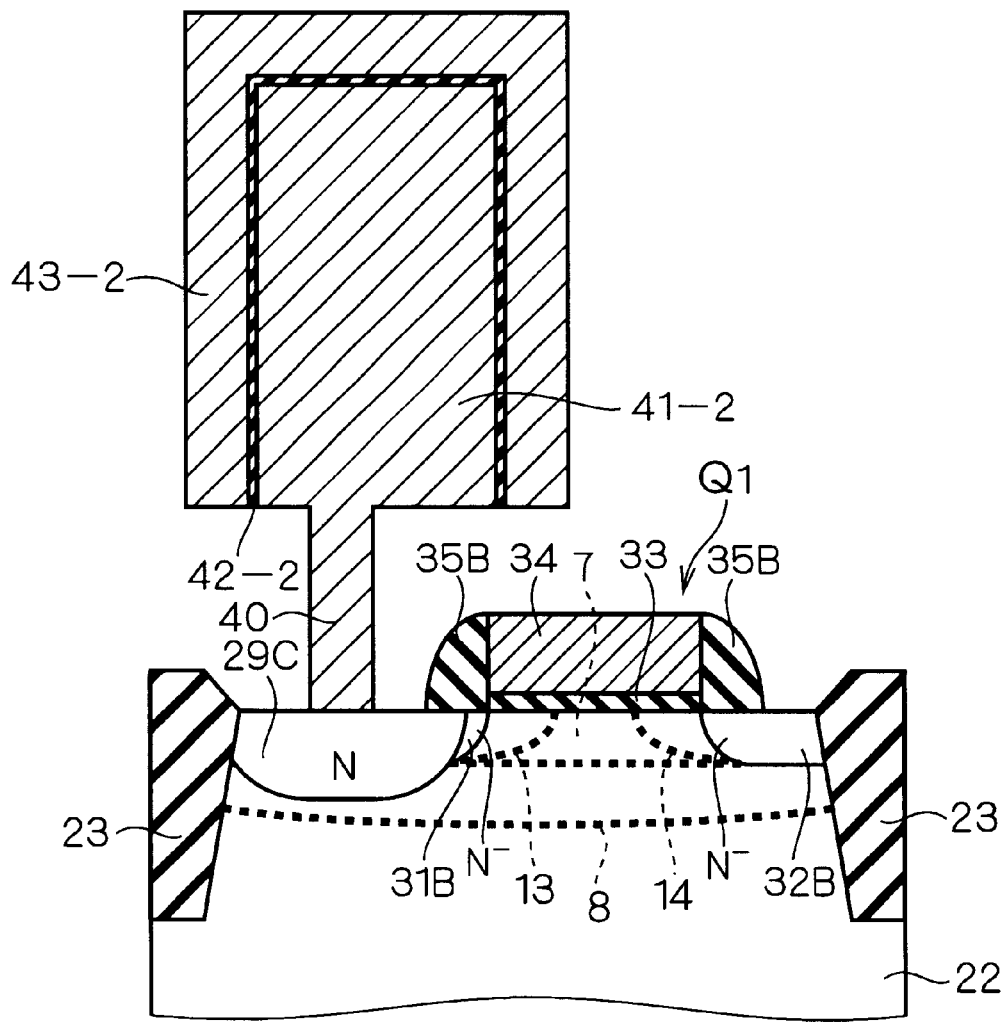

Specifically, FIG. 123 shows a structure obtained by using "gate SD" in two diffusion processes (corresponding to the first aspect of the seventh preferred embodiment as shown in FIG. 85). FIG. 124 shows a structure obtained by using "gate SD" and "SWSD" in two diffusion processes (corresponding to the third aspect of the seventh preferred embodiment as shown in FIG. 87). FIG. 125 shows a structure obtained by using "gate SD" and "contact SD" in two diffusion processes and by forming shallowly a contact region 29C (corresponding to the sixth aspect of the seventh preferred embodiment as shown in FIG. 90). FIG. 126 shows a structure obtained by using "gate SD" and "contact SD" in two diffusion processes and by forming deeply a contact region 29C (This structure corresponds to the eighth aspect of the seventh preferred embodiment as shown in FIG. 92, except for the use of a sidewall 35A.). FIG. 127 shows a structure obtained by using "SWSD" and "contact SD" in two diffusion processes and by forming shallowly a contact region 29C (corresponding to the twelfth aspect of the seventh preferred embodiment as shown in FIG. 96). FIG. 128 shows a structure obtained by using "SWSD" and "contact SD" in two diffusion processes and by forming deeply a contact region 29C (corresponding to the fourteenth aspect of the seventh preferred embodiment as shown in FIG. 98).

As described above, the eighth preferred embodiment provides various memory cell structures obtained by using the (local) channel dope region or the (shallow) pocket region, or a combination of these, as shown in the first to sixth preferred embodiments, together with a structure having the source/drain region by dual diffusion as shown in the seventh preferred embodiment. It is, of course, possible to consider other combinations, in addition to the foregoing first to twenty-fourth aspects.

Ninth Preferred Embodiment

FIGS. 129 to 141 are sectional views illustrating a sequence of steps in a method of manufacturing a memory cell element of a DRAM according to a ninth preferred embodiment. The ninth preferred embodiment relates to a method of manufacturing a memory cell element described in the first preferred embodiment. The method of the ninth preferred embodiment will be described hereinafter by referring to these drawings.

Referring to FIG. 129, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Referring to FIG. 130, boron ions 91 are implanted (due to diffusion) at an energy of 300 keV and a dose of $1 \times 10^{13}/cm^2$, thereby to form a P well region 22 that is an NMOS transistor forming region. Subsequently, boron ions are implanted at an energy of 120 keV and a dose of $5 \times 10^{12}/cm^2$, and then at an energy of 30 keV and a dose of $3 \times 10^{12}/cm^2$, thereby to form a channel cut region (not shown) and a channel dope region 1.

Since the channel dope region 1 is formed over the entire surface of the P well region 22, its formation is relatively easy.

Figure 131:
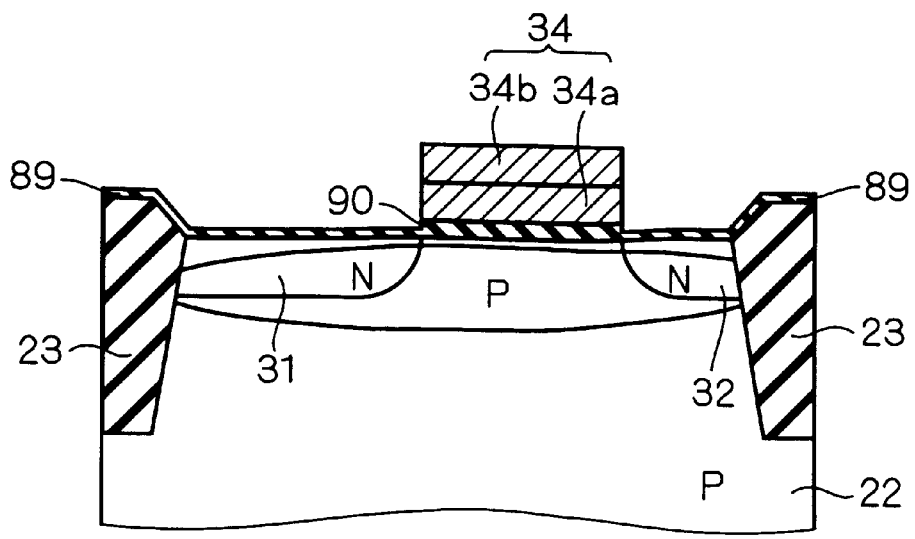

Referring to FIG. 131, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90.

Figure 132:
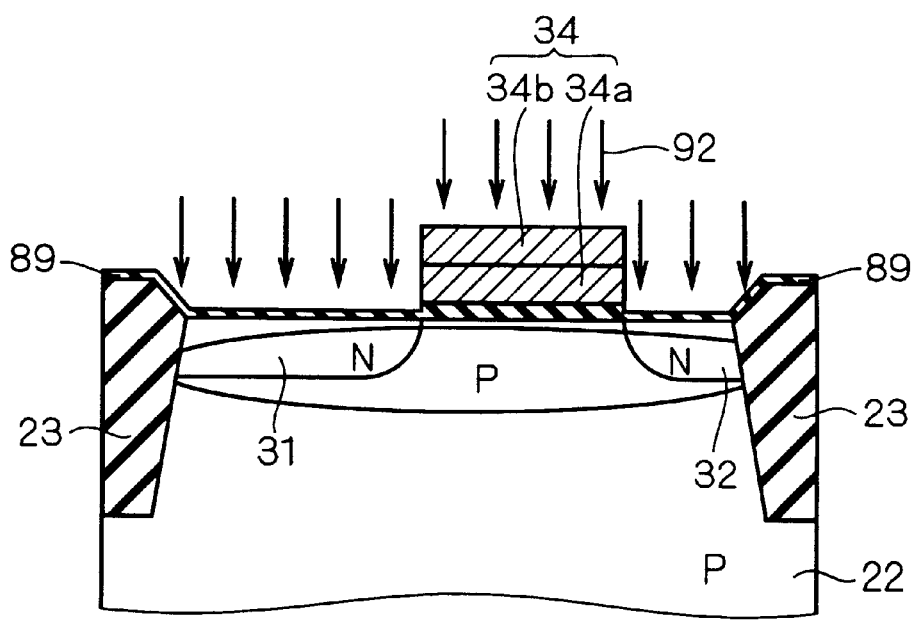

Referring to FIG. 132, by using the gate electrode 34 as a mask, phosphorus ions 92 are implanted at an energy of 30 keV and a dose of $1\times10^{13}/cm^2$, thereby to form source/drain regions 31 and 32.

Specifically, the impurity concentration of boron ions in the channel dope region 1 is set so as to be 30% of the impurity concentration of phosphorus ions for forming the source/drain regions 31 and 32. The impurity concentration is approximately $10^5$ to $10^6$ times the dose.

Therefore, the channel dope region 1 and source/drain region 31 (32) can satisfy the conditions (I), (II) and (III) described in the first preferred embodiment.

Referring to FIG. 133, a sidewall 35 composed such as of TEOS having a thickness of 5 to 15 nm is formed on the side surface of the gate electrode 34.

This results in an NMOS transistor Q1 comprising the source/drain regions 31, 32, gate oxide film 33, gate electrode 34 and sidewall 35.

Referring to FIG. 134, an interlayer insulating film 24 is deposited on the entire surface, and a patterned resist 25 is then formed on the interlayer insulating film 24. By using the resist 25 as a mask, the interlayer insulating film 24 is selectively etched away to obtain a contact hole 40 extending through the interlayer insulating film 24 and having a diameter of 0.2 μm.

Referring to FIG. 135, the resist 25 is then removed, and a (doped) polysilicon layer 45 is deposited in a thickness of 500 nm on the entire surface, as shown in FIG. 136.

Figure 137:
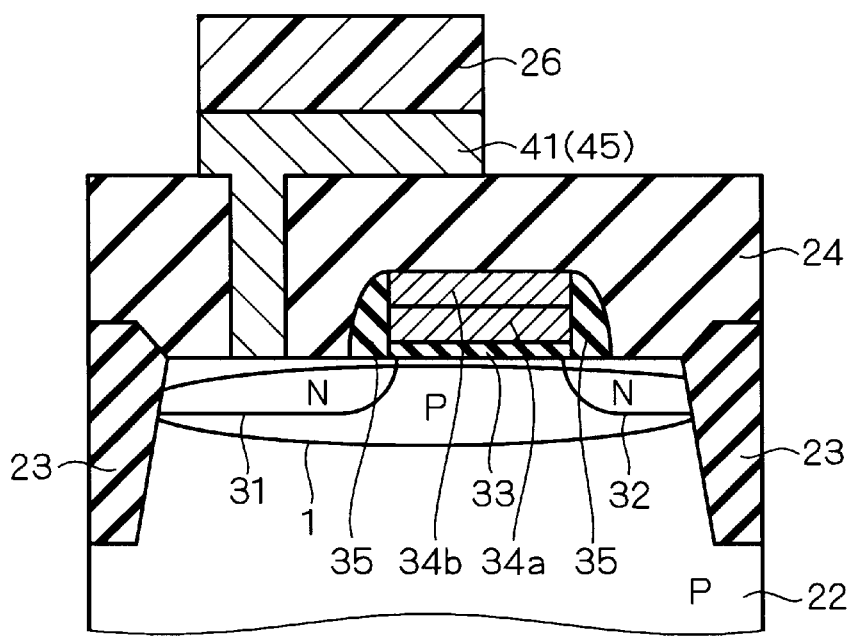
Figure 138:
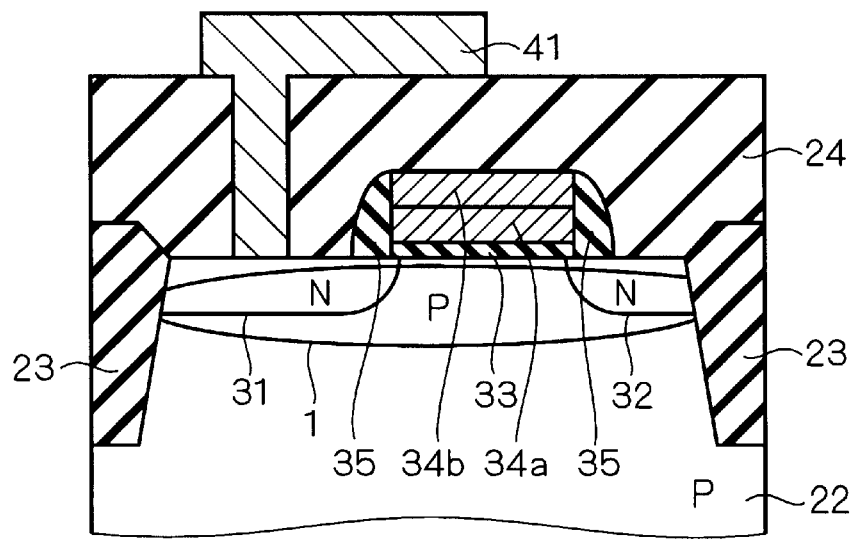

Referring to FIG. 137, by using a patterned resist 26 as a mask, the polysilicon layer 45 is etched away to obtain a storage node electrode 41. The resist 26 is then removed as shown in FIG. 138.

Referring to FIG. 139, an insulating film 46 and a polysilicon layer 47 are subsequently formed on the entire surface. Examples of the insulating film 46 are: one having a dual structure consisting of $SiO_2$ having a thickness of 7.5 nm and $Si_3N_4$ having a thickness of 7.5 nm; $TaO_5$ having a thickness of 15 nm; and BST having a thickness of 15 nm. The polysilicon layer 47 is formed in a thickness of 200 nm.

Referring to FIG. 140, a patterned resist 27 is formed on the polysilicon layer 47.

Figure 141:
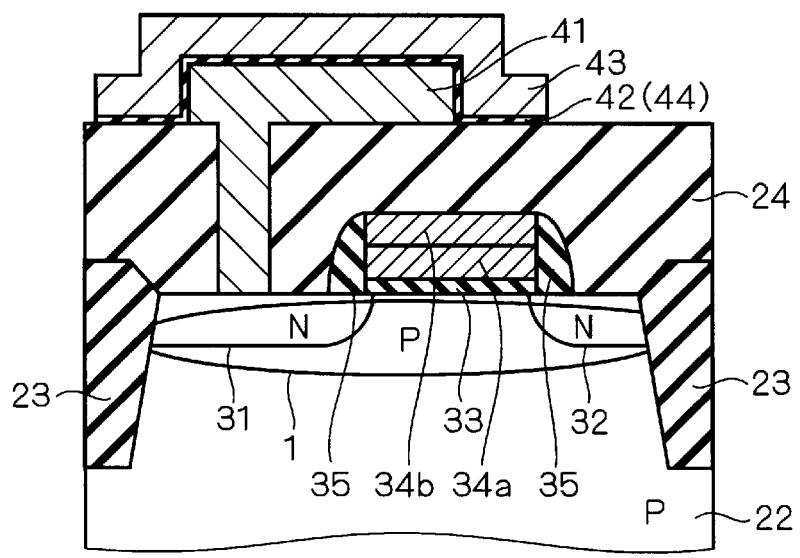

Referring to FIG. 141, by using the resist 27 as a mask, the insulating film 46 and polysilicon layer 47 are selectively removed to obtain an insulating film 42 and cell plate electrode 43. The resist 27 is then removed to complete the memory cell element of the first preferred embodiment having the memory capacitors (41 to 43).

Tenth Preferred Embodiment

FIGS. 142 to 145 are sectional views illustrating a sequence of steps in a method of manufacturing a memory cell element of a DRAM according to a tenth preferred embodiment. The tenth preferred embodiment relates to a method of manufacturing a memory cell element described in the second preferred embodiment. The method of the tenth preferred embodiment will be described hereinafter by referring to these drawings.

Figure 142:
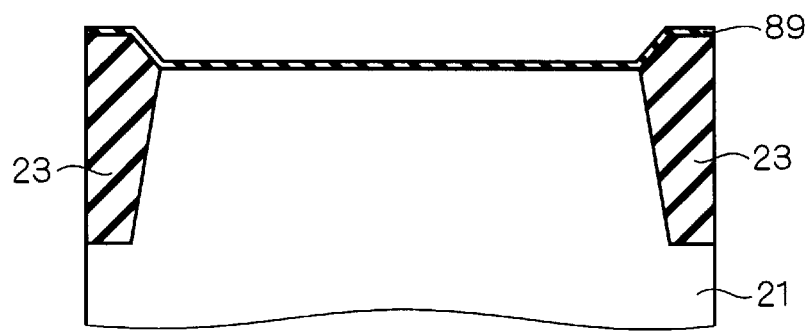
FIG. 142 is a sectional view illustrating a method of manufacturing a memory cell structure of the second preferred embodiment, according to a tenth preferred embodiment.

Referring to FIG. 142, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Subsequently, boron ions are implanted at an energy of 300 keV and a dose of $1\times10^{13}/cm^2$, thereby to form a P well region 22 that is an NMOS transistor forming region. Then, boron ions are implanted at an energy of 120 keV and a dose of $5\times10^{12}/cm^2$, thereby to form a channel cut region (not shown).

Referring to FIG. 143, a resist 92 having an opening 80 is formed, and boron ions 93 are then implanted from the opening 80 at an energy of 30 keV and a dose of $5\times10^{12}/cm^2$, thereby to form a local channel dope region 2 under the opening 80.

Referring to FIG. 144, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90.

Subsequently, the same manufacturing steps as in the ninth preferred embodiment shown in FIGS. 132 to 141 are performed to complete the memory cell element of the second preferred embodiment shown in FIG. 145.

Eleventh Preferred Embodiment

FIGS. 146 to 155 are sectional views illustrating a sequence of steps in a method of manufacturing a memory cell element of a DRAM according to an eleventh preferred embodiment. The eleventh preferred embodiment relates to a method of manufacturing a memory cell element described in the second preferred embodiment. The method of the eleventh preferred embodiment will be described hereinafter by referring to these drawings.

Referring to FIG. 146, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface. Subsequently, boron ions are implanted at an energy of 300 keV and a dose of $1\times10^{13}/cm^2$, thereby to form a P well region 22 that is an NMOS transistor forming region. Then, boron ions are implanted at an energy of 120 keV and a dose of $5\times10^{12}/cm^2$, thereby to form a channel cut region (not shown).

Figure 147:
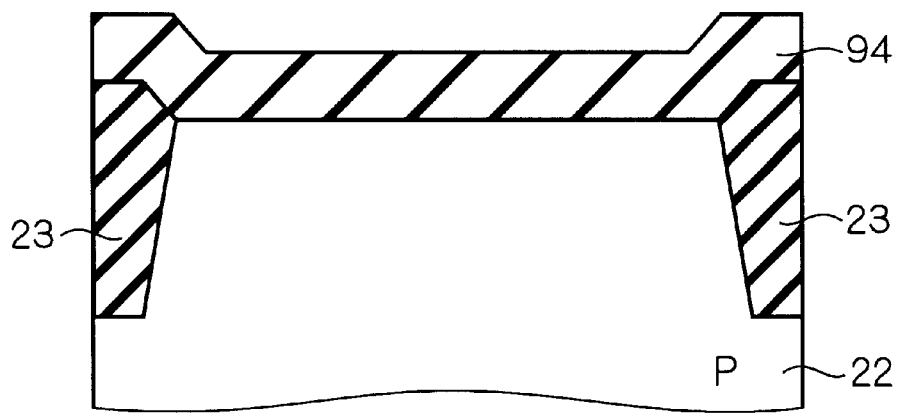

Referring to FIG. 147, a nitride film 94 composed such as of a silicon nitride film ($Si_3N_4$) is formed in a thickness of 200 nm on the entire surface.

Figure 148:
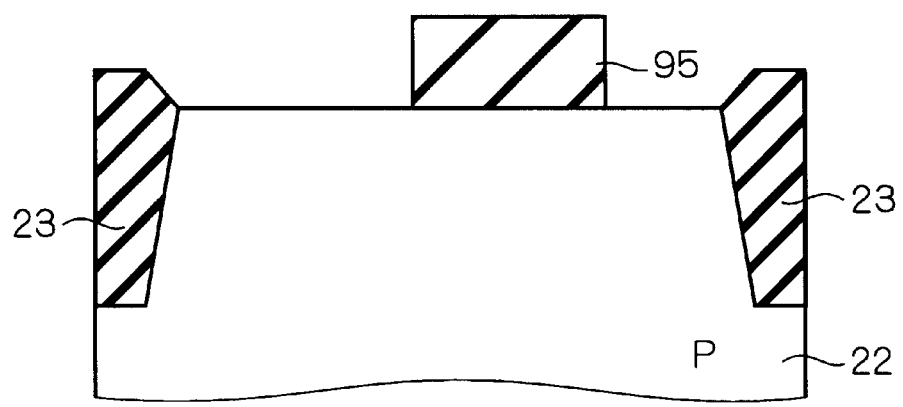

Referring to FIG. 148, by using a patterned resist (not shown) as a mask, the nitride film 94 is selectively etched away to form a dummy gate electrode 95 at a region where a gate electrode should be formed. The resist is then removed.

Referring to FIG. 149, by using the dummy gate electrode 95 as a mask, phosphorus ions 96 are implanted at an energy of 30 keV and a dose of $1\times10^{13}/cm^2$, thereby to form source/drain regions 31 and 32.

Referring to FIG. 150, a TEOS layer 97 is formed on the entire surface, followed by CMP process. This results in a flat structure made up of the dummy gate electrode 95 and TEOS layer 97.

Referring to FIG. 151, the dummy gate electrode 95 is then removed to provide an opening 79 in the TEOS layer 97.

Referring to FIG. 152, boron ions 98 are implanted from the opening 79 at an energy of 30 keV and a dose of $3\times10^{12}/cm^2$, thereby to form a local channel dope region 2 between the source/drain regions 31 and 32.

Specifically, the impurity concentration of boron ions in the local channel dope region 2 is set so as to be 50% of the impurity concentration of phosphorus ions for forming the source/drain regions 31 and 32. The impurity concentration is approximately $10^6$ times the dose.

Therefore, the local channel dope region 2 and source/drain region 31 (32) can satisfy the conditions (I), (II) and (III) described in the first preferred embodiment.

Figure 153:
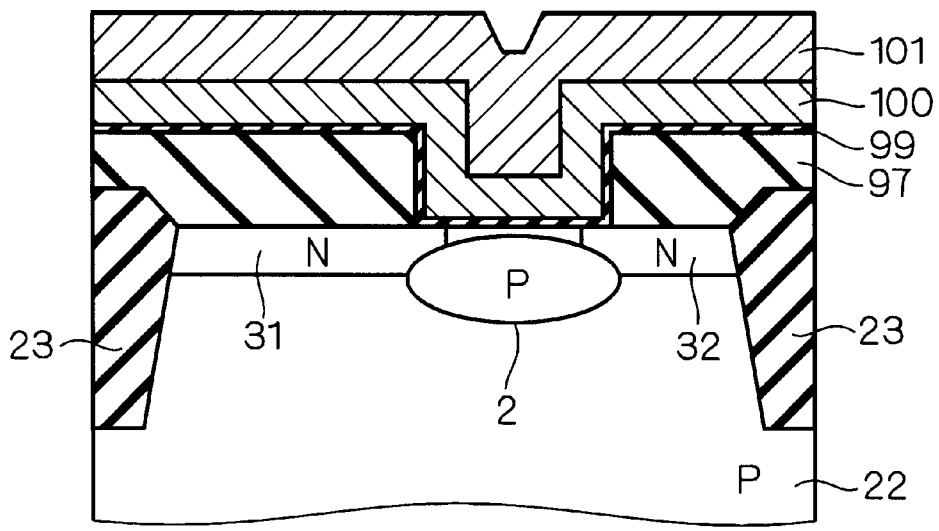

Referring to FIG. 153, an oxide film 99 composed such as of a silicon oxide film, a polysilicon layer 100 and a tungsten layer 101 are formed subsequently on the entire surface.

Figure 154:
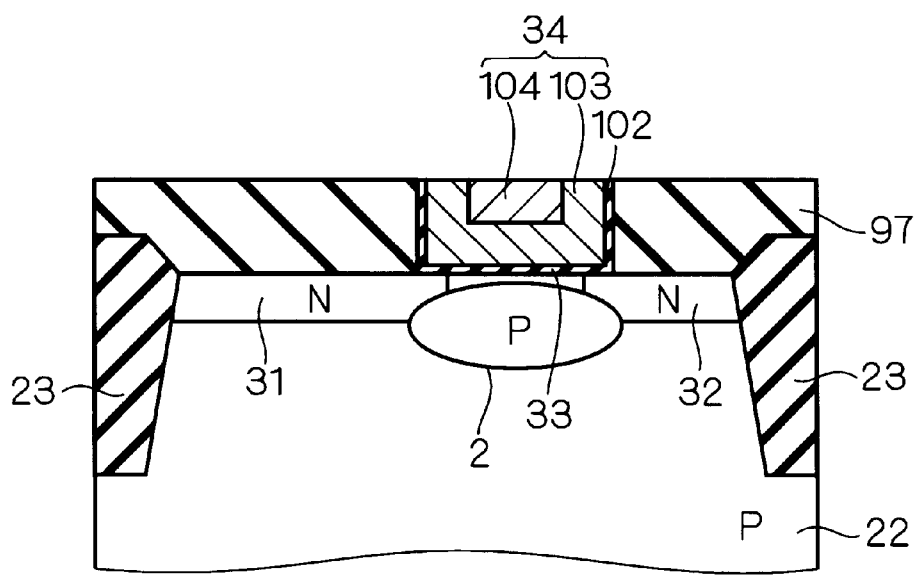

Referring to FIG. 154, the oxide film 99, polysilicon layer 100 and tungsten layer 101 are subjected to CMP processing, in order to attain such a planarization that the oxide film 99, polysilicon layer 100 and tungsten layer 101 are left only within the opening 79. As a result, a gate electrode 34 composed of a polysilicon part 103 and a tungsten part 104 is formed from the remaining polysilicon layer 100 and tungsten layer 101, and a gate oxide film 102 is formed from the remaining oxide film 99.

Subsequently, the same manufacturing steps as in the ninth preferred embodiment shown in FIGS. 134 to 141 are performed to complete the memory cell element of the second preferred embodiment shown in FIG. 155.

Twelfth Preferred Embodiment

FIGS. 156 to 161 are sectional views illustrating a sequence of steps in a method of manufacturing a memory cell element of a DRAM according to a twelfth preferred embodiment. The twelfth preferred embodiment relates to a method of manufacturing a memory cell element described in the third preferred embodiment. The method of the twelfth preferred embodiment will be described hereinafter by referring to these drawings.

Referring to FIG. 156, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface. Subsequently, boron ions are implanted at an energy of 300 keV and a dose of $1\times10^{13}/cm^2$, thereby to form a P well region 22 that is an NMOS transistor forming region. Then, boron ions are implanted at an energy of 120 keV and a dose of $5\times10^{12}/cm^2$, thereby to form a channel cut region (not shown).

Figure 157:
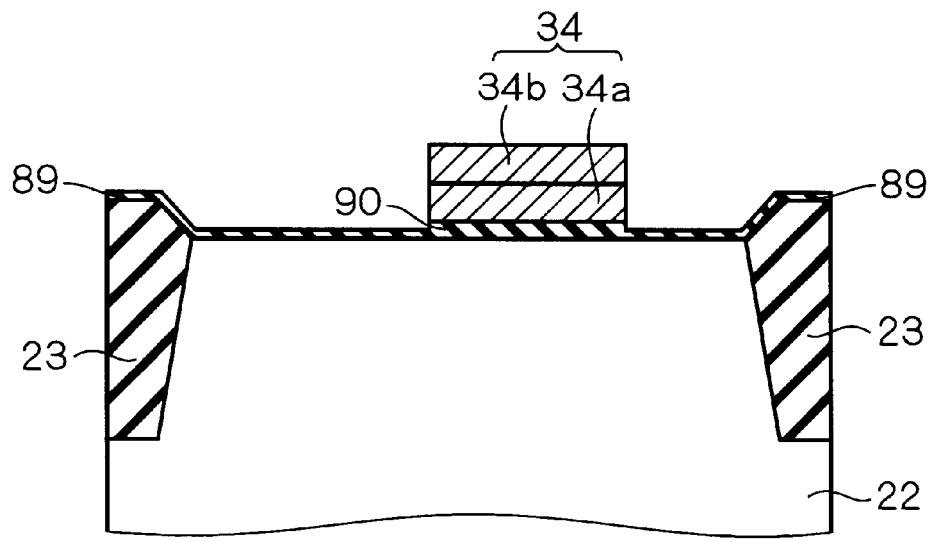

Referring to FIG. 157, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90.

Figure 158:
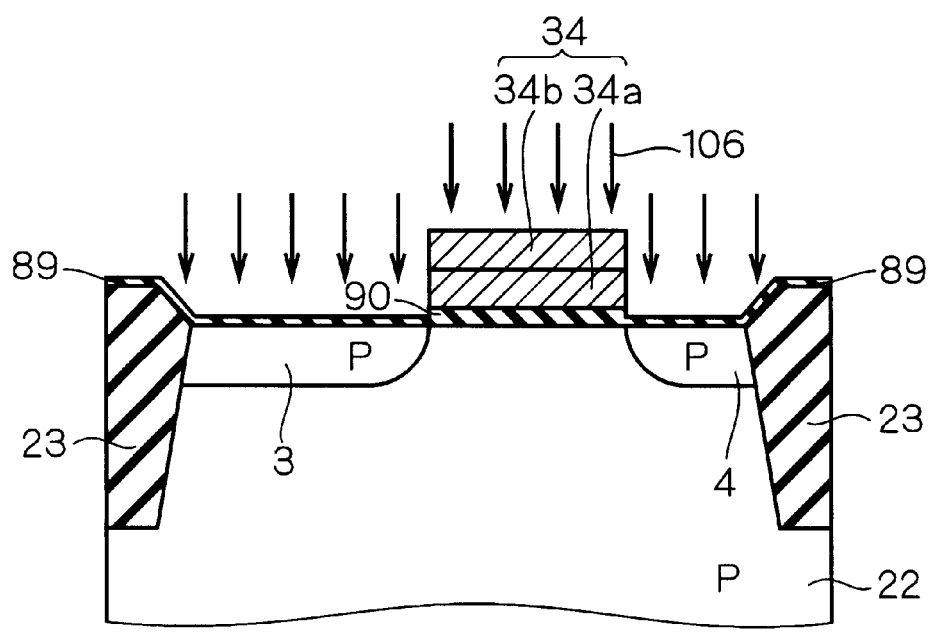

Referring to FIG. 158, by using the gate electrode 34 as a mask, boron ions 106 are implanted at an angle of 7° and at an energy of 50 keV and a dose of $3\times10^{12}/cm^2$, thereby to form pocket regions 3 and 4.

Referring to FIG. 159, by using the gate electrode 34 as a mask, phosphorus ions 107 are implanted at an energy of 30 keV and a dose of $1\times10^{13}/cm^2$, thereby to form source/drain regions 31 and 32.

Specifically, the impurity concentration of boron ions in the pocket regions 3 and 4 is set so as to be 30% of the impurity concentration of phosphorus ions for forming the source/drain regions 31 and 32. The impurity concentration is approximately $10^6$ times the dose.

Therefore, the pocket regions 3 (4) and source/drain region 31 (32) can satisfy the conditions (I), (II) and (III) described in the first preferred embodiment.

The pocket regions 3 and 4 are formed so as to be deeper than the source/drain regions 31 and 32. Therefore, by increasing the energy than that in forming the source/drain regions 31 and 32, it is relatively easy to form the pocket regions 3 and 4 so as to extend from the source/drain regions 31 to the channel region.

Referring to FIG. 160, a sidewall 35 composed such as of a TEOS having a thickness of 5 to 15 nm is formed on the side surface of the gate electrode 34.

Figure 161:
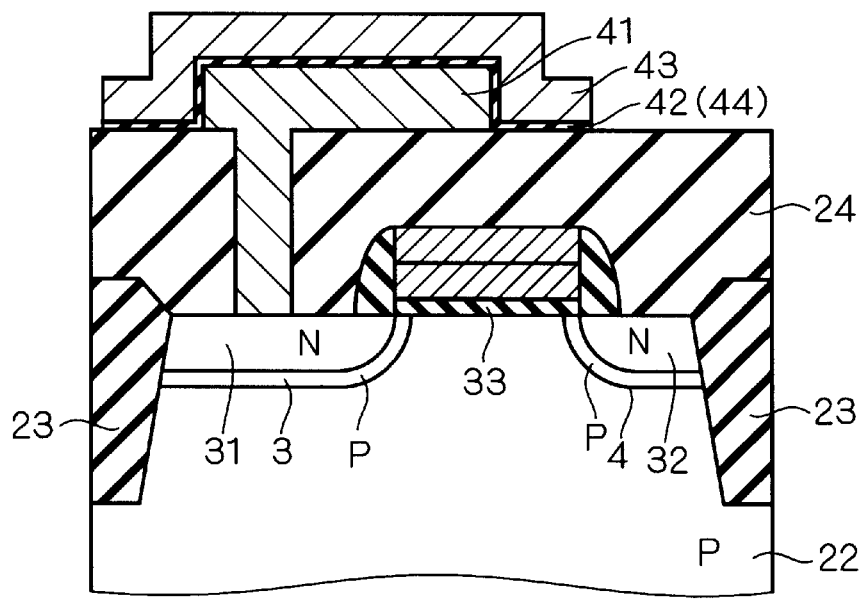

Subsequently, the same manufacturing steps as in the ninth preferred embodiment shown in FIGS. 132 to 141 are performed to complete the memory cell element of the third preferred embodiment, as shown in FIG. 161.

Thirteenth Preferred Embodiment

Figure 162:
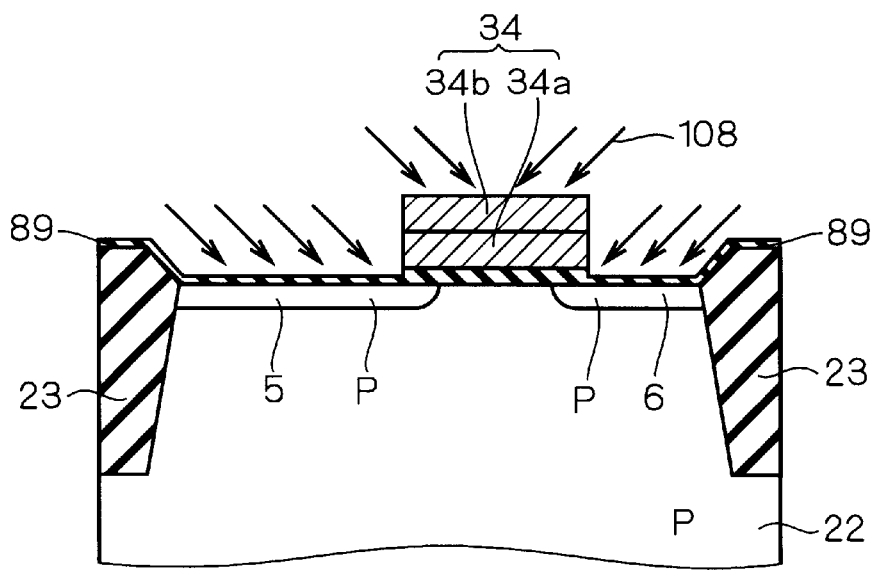
FIG. 162 is a sectional view illustrating a method of manufacturing a memory cell structure of the fourth preferred embodiment, according to a thirteenth preferred embodiment.
Figure 163:
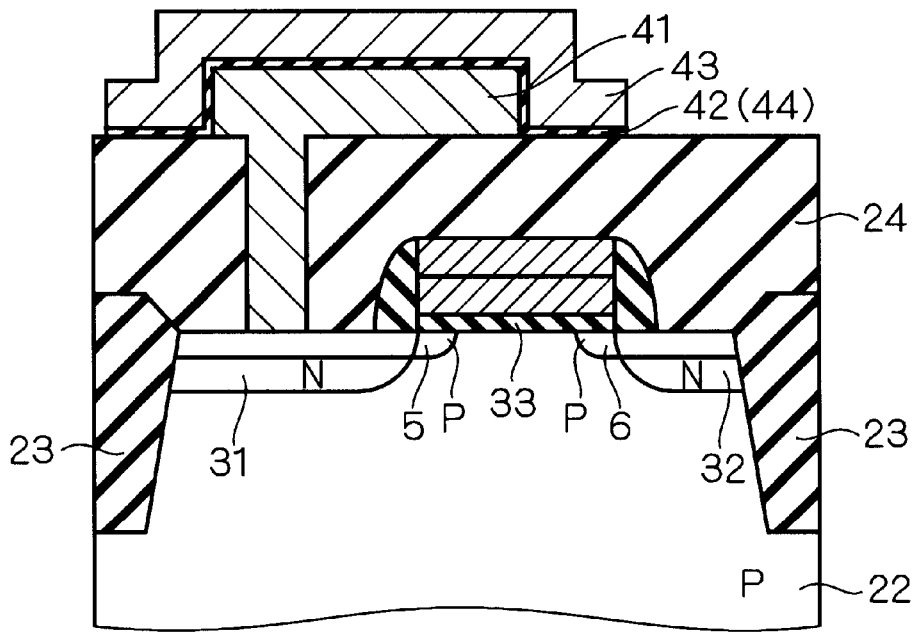
FIG. 163 is a sectional view illustrating the method of the thirteenth preferred embodiment.

FIGS. 162 and 163 are sectional views illustrating a sequence of steps in a method of manufacturing a memory cell element of a DRAM according to a thirteenth preferred embodiment. The thirteenth preferred embodiment relates to a method of manufacturing a memory cell element described in the fourth preferred embodiment. The method of the thirteenth preferred embodiment will be described hereinafter by referring to these drawings.

Firstly, the same steps as in the twelfth preferred embodiment as shown in FIGS. 156 and 157 are performed. Then, as shown in FIG. 162, by using a gate electrode 34 as a mask, an oblique implantation of boron ions 108 is performed at an energy of 50 keV and a dose of $3\times10^{12}/cm^2$, thereby to form shallow pocket regions 5 and 6.

Subsequently, the same steps as in the twelfth preferred embodiment as shown in FIGS. 159 and 160, and the same steps as in the ninth preferred embodiment as shown in FIGS. 132 to 141, are performed to complete the memory cell element of the fourth preferred embodiment, as shown in FIG. 163.

Fourteenth Preferred Embodiment

FIGS. 164 to 168 are sectional views illustrating a sequence of steps in a method of manufacturing a memory cell element of a DRAM according to a fourteenth preferred embodiment. The fourteenth preferred embodiment relates to a method of manufacturing a memory cell element described in the fifth preferred embodiment (i.e., the first aspect shown in FIG. 46). The method of the fourteenth preferred embodiment will be described hereinafter by referring to these drawings.

Figure 164:
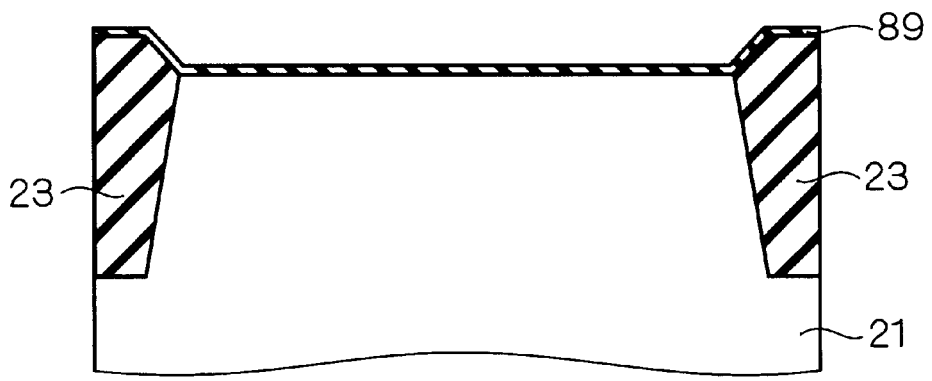
FIG. 164 is a sectional view illustrating a method of manufacturing a memory cell structure of the fifth preferred embodiment, according to a fourteenth preferred embodiment.

Referring to FIG. 164, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Figure 165:
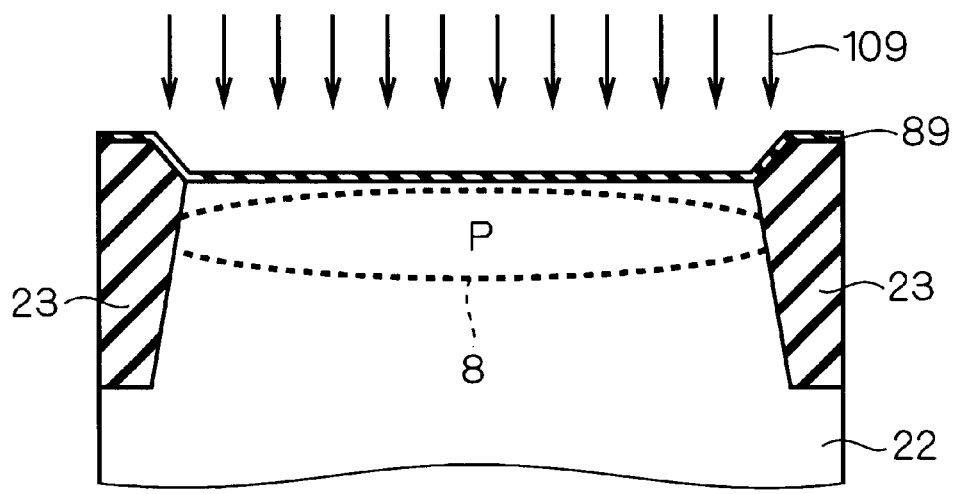
FIGS. 165 to 168 are sectional views illustrating a sequence of steps in the method of the fourteenth preferred embodiment.

Referring to FIG. 165, boron ions 109 are implanted at an energy of 300 keV and a dose of $1\times10^{13}/cm^2$, thereby to form a P well region 22 that is an NMOS transistor forming region. Then, boron ions are subsequently implanted at an energy of 120 keV and a dose of $5\times10^{12}/cm^2$, and then at an energy of 30 keV and a dose of $3\times10^{12}/cm^2$, thereby to form a channel cut region (not shown) and a channel dope region 8.

Figure 166:
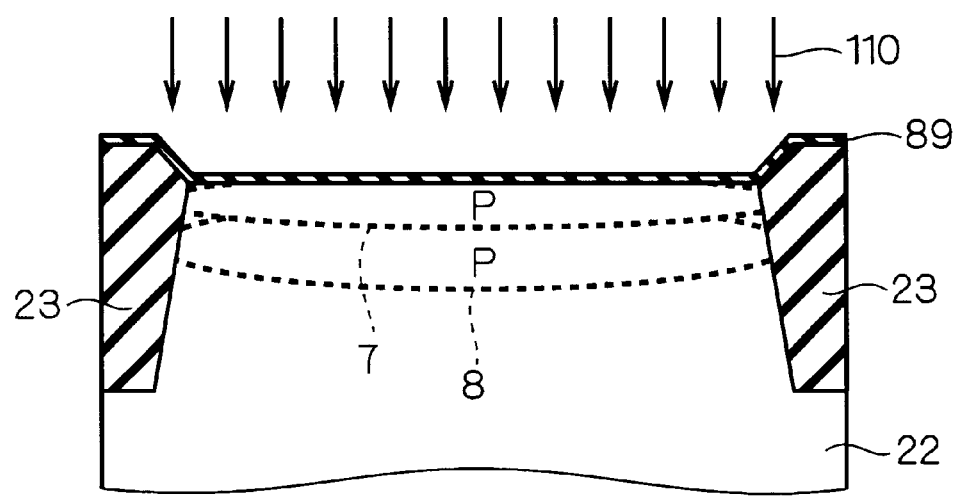

Referring to FIG. 166, boron ions 110 are implanted at an energy of 10 keV and a dose of $5\times10^{12}/cm^2$, thereby to form a channel dope region 7.

Figure 167:
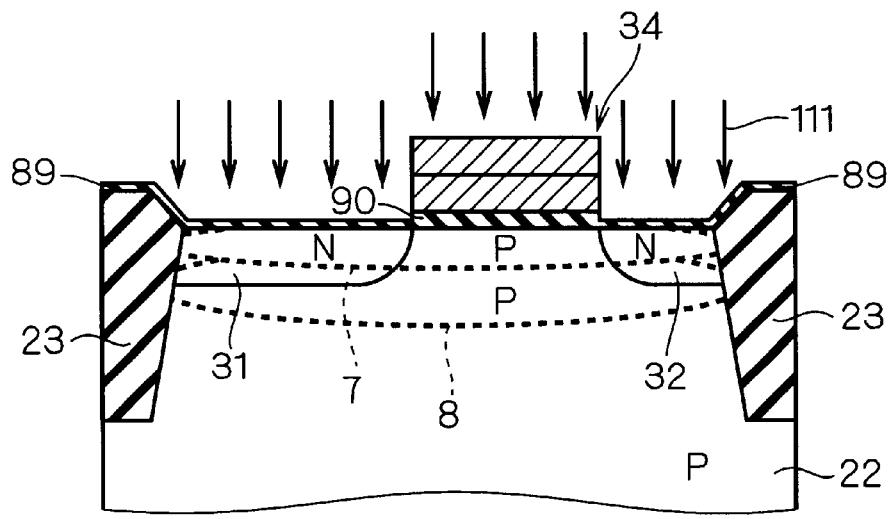

Referring to FIG. 167, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90. Thereafter, by using the gate electrode 34 as a mask, phosphorus ions 111 are implanted at an energy of 30 keV and a dose of $2 \times 10^{13}/cm^2$, thereby to form source/drain regions 31 and 32.

Figure 168:
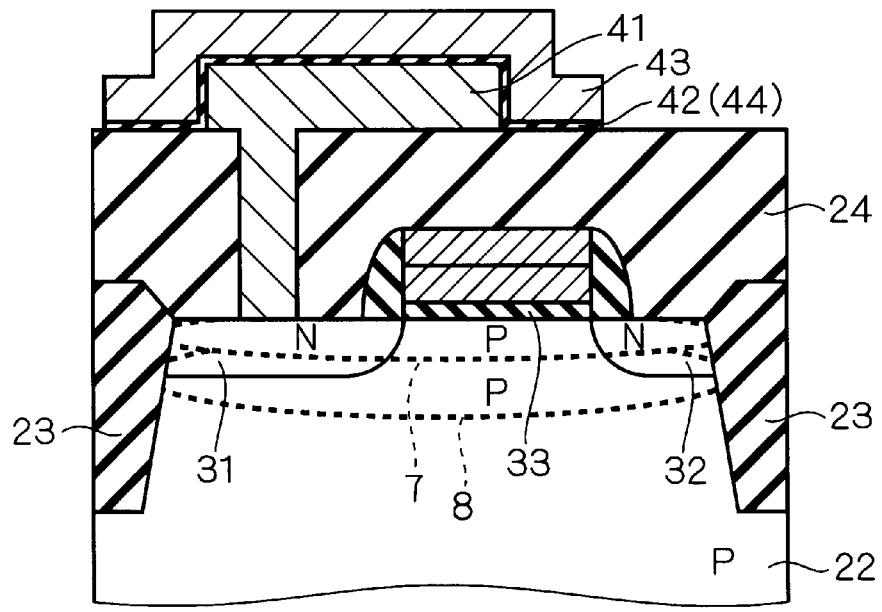

Subsequently, the same steps as in the ninth preferred embodiment as shown in FIGS. 133 to 141, are performed to complete the memory cell element of the first aspect of the fifth preferred embodiment, as shown in FIG. 168.

Fifteenth Preferred Embodiment

FIGS. 169 to 173 are sectional views illustrating a sequence of steps in a method of manufacturing a memory cell element of a DRAM according to a fifteenth preferred embodiment. The fifteenth preferred embodiment relates to a method of manufacturing a memory cell element described in the fifth preferred embodiment (i.e., the fourth aspect shown in FIG. 54). The method of the fifteenth preferred embodiment will be described hereinafter by referring to these drawings.

Referring to FIG. 169, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Referring to FIG. 170, boron ions are implanted at an energy of 300 keV and a dose of $1 \times 10^{13}/cm^2$, thereby to form a P well region 22 that is an NMOS transistor forming region. Then, boron ions 109 are subsequently implanted at an energy of 120 keV and a dose of $5 \times 10^{12}/cm^2$, and then at an energy of 30 keV and a dose of $3 \times 10^{12}/cm^2$, thereby to form a channel cut region (not shown) and a channel dope region 8.

Figure 171:
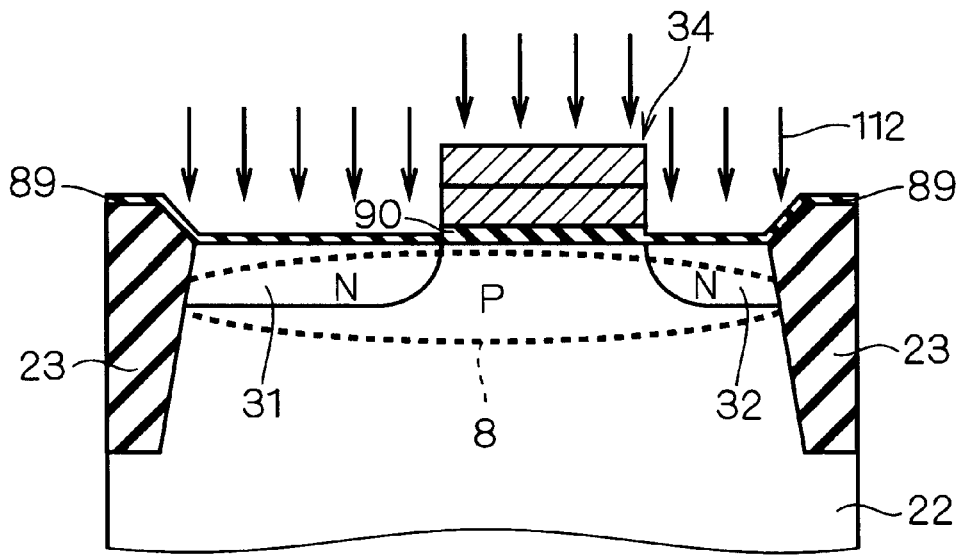

Referring to FIG. 171, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90. Thereafter, by using the gate electrode 34 as a mask, phosphorus ions 112 are implanted at an energy of 30 keV and a dose of $2 \times 10^{13/cm2}$, thereby to form source/drain regions 31 and 32.

Figure 172:
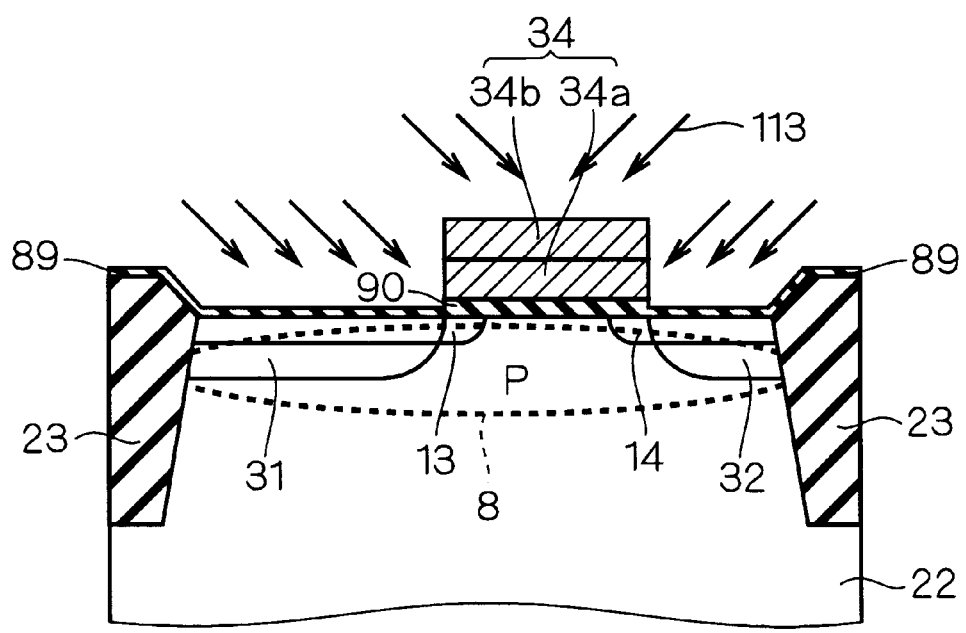

Referring to FIG. 172, by using the gate electrode 34 as a mask, phosphorus ions 113 are obliquely implanted at an angle of 45°, an energy of 50 keV and a dose of $3 \times 10^{12}/cm^2$, thereby to form shallow pocket regions 13 and 14.

Subsequently, the same steps as in the ninth preferred embodiment as shown in FIGS. 133 to 141, are performed to complete the memory cell element of the fourth aspect of the fifth preferred embodiment, as shown in FIG. 173.

Sixteenth Preferred Embodiment

FIGS. 174 to 178 are sectional views illustrating a sequence of steps in a method of manufacturing a memory cell element of a DRAM according to a sixteenth preferred embodiment. The sixteenth preferred embodiment relates to a method of manufacturing a memory cell element described in the sixth preferred embodiment (i.e., the first aspect shown in FIG. 67). The method of the sixteenth preferred embodiment will be described hereinafter by referring to these drawings.

Referring to FIG. 174, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Figure 175:
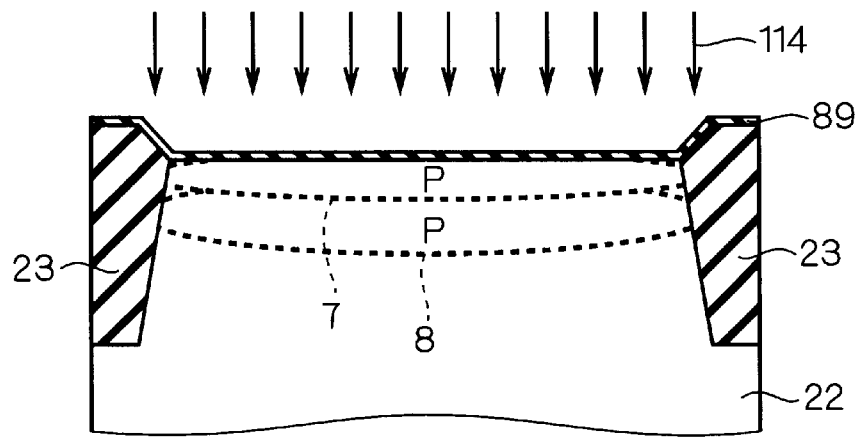

Referring to FIG. 175, boron ions are implanted at an energy of 300 keV and a dose of $1 \times 10^{13}/cm^2$, thereby to form a P well region 22 that is an NMOS transistor forming region. Then, boron ions 114 are subsequently implanted at an energy of 120 keV and a dose of $5 \times 10^{12}/cm^2$, at an energy of 30 keV and a dose of $3 \times 10^{12}/cm^2$, then at an energy of 10 keV and a dose of $5 \times 10^{12}/cm^2$, thereby to form a channel cut region (not shown), a channel dope region 8, and a channel dope region 7.

Figure 176:
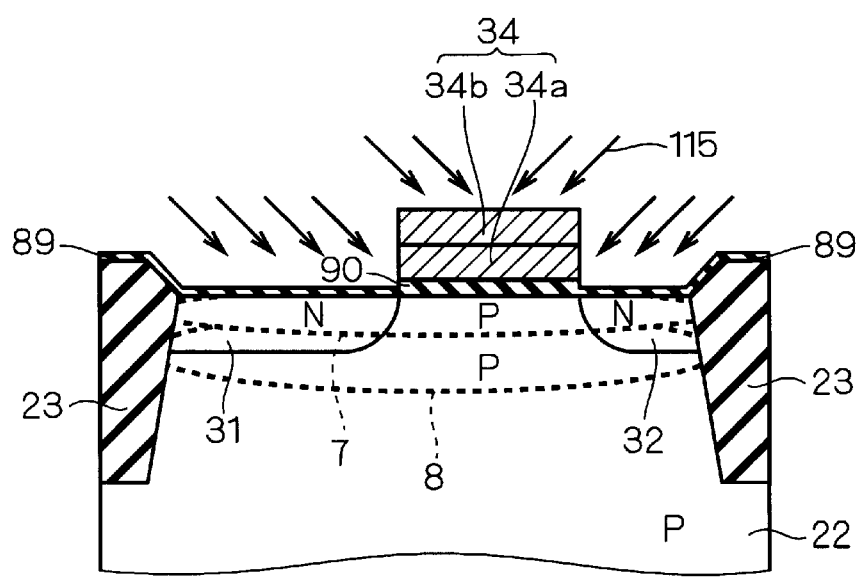

Referring to FIG. 176, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90. Thereafter, by using the gate electrode 34 as a mask, phosphorus ions 115 are implanted at an energy of 30 keV and a dose of $2 \times 10^{13}/cm^2$, thereby to form source/drain regions 31 and 32.

Referring to FIG. 177, by using the gate electrode 34 as a mask, phosphorus ions 116 are obliquely implanted at an angle of 45°, an energy of 50 keV and a dose of $3 \times 10^{12/cm2}$, thereby to form shallow pocket regions 13 and 14.

Therefore, the P type impurity concentration of the shallow pocket regions 13 and 14 is approximately the same as the P type impurity concentration of the channel dope region 8. The N type impurity concentration of the source/drain regions 31 and 32 is higher than that of the shallow pocket regions 13 and 14.

Subsequently, the same steps as in the ninth preferred embodiment as shown in FIGS. 133 to 141, are performed to complete the memory cell element of the first aspect of the sixth preferred embodiment, as shown in FIG. 178.

Seventeenth Preferred Embodiment

FIGS. 179 to 184 are sectional views illustrating a sequence of steps in a method of forming a source/drain region with an offset.

Figure 179:
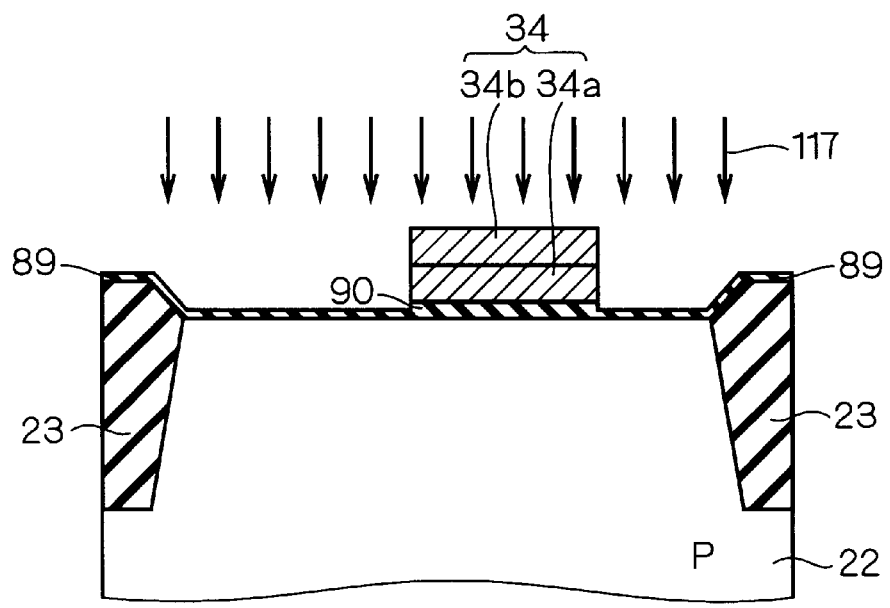
FIG. 179 is a sectional view illustrating a method of forming source/drain regions provided with offset according to a seventeenth preferred embodiment.

Referring to FIG. 179, when an offset OS is "0", a source/drain region is formed by implanting phosphorus ions 117 by using a gate electrode 34 as a mask.

Figure 180:
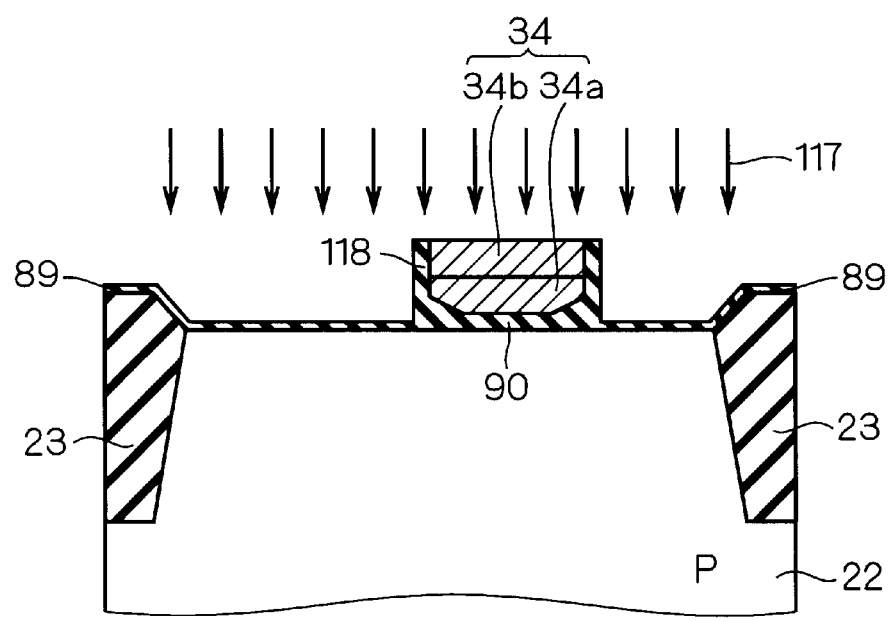
FIGS. 180 to 184 are sectional views illustrating a sequence of steps in the method of the seventeenth preferred embodiment.

Referring to FIG. 180, when the thickness of a smile oxide film 118 is used for an offset OS, a source/drain region is formed by implanting phosphorus ions 117 by using, as a mask, a gate electrode 34 and the smile oxide film 118 disposed on the side surface of the gate electrode 34.

Figure 181:
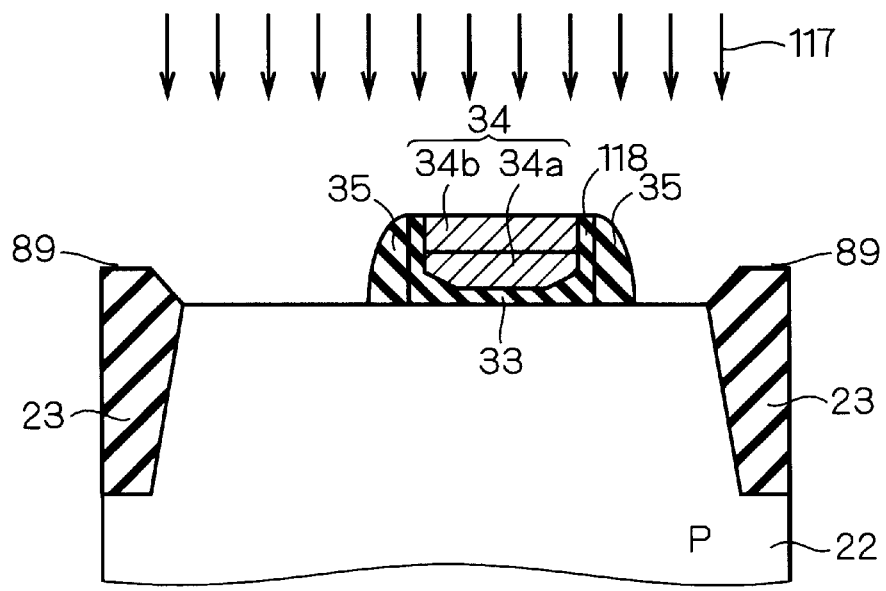
Figure 182:
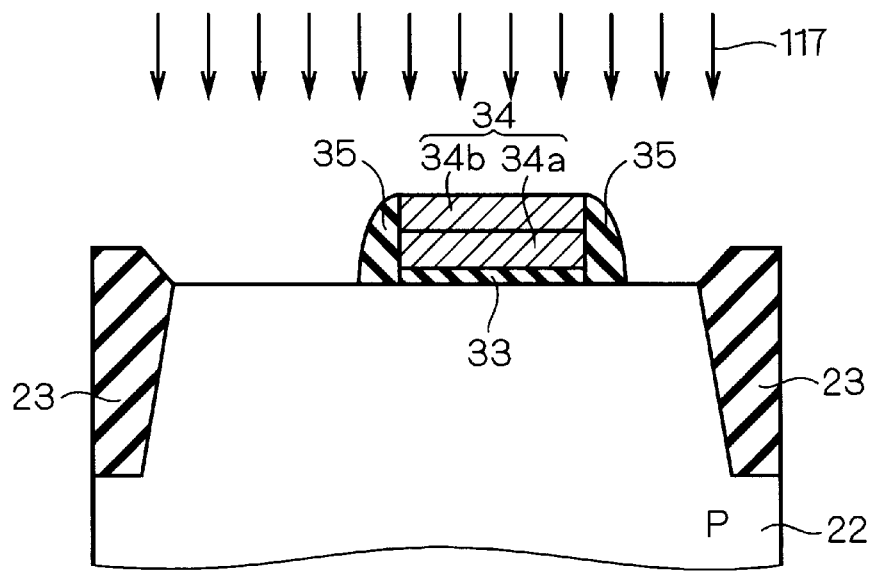

Referring to FIGS. 181 and 182, when the forming width of a sidewall 35 is used for an offset OS, a source/drain region is formed by implanting phosphorus ions 117 by using, as a mask, a gate electrode 34 and a smile oxide film 118 disposed on the side surface of the gate electrode 34 (the thickness of the smile oxide film 118 should be further added in the case of FIG. 181).

Figure 183:
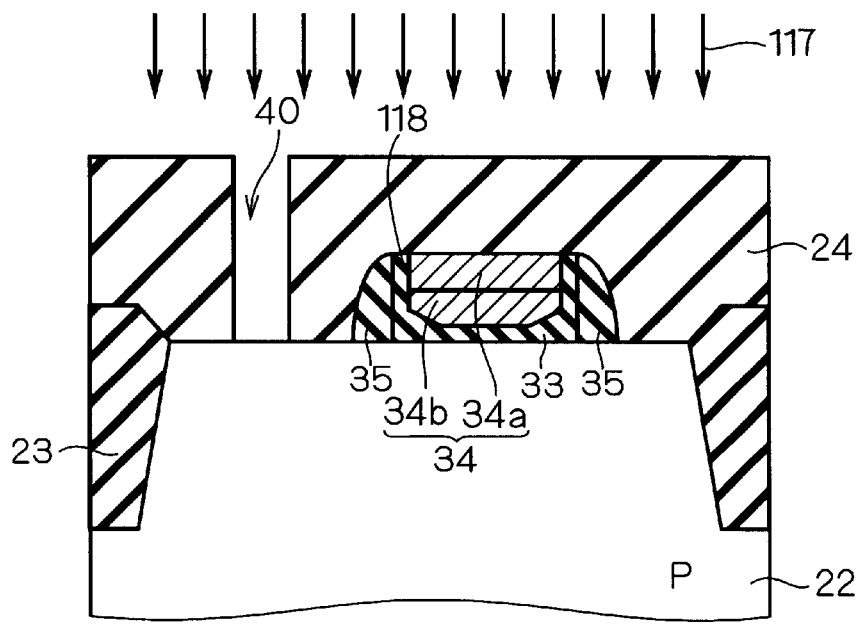
Figure 184:
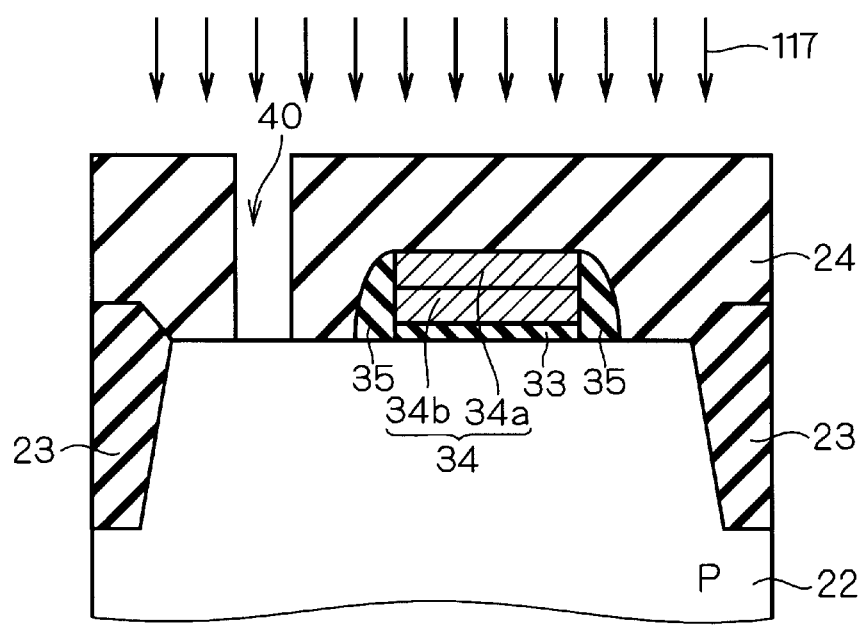

Referring to FIGS. 183 and 184, when the distance from a gate electrode 34 to a contact hole 40 is used for an offset OS, a source/drain region is formed by selectively implanting phosphorus ions 117 from the contact hole 40.

Eighteenth Preferred Embodiment

FIGS. 185 to 189 are sectional views illustrating a sequence of steps in a method of manufacturing a memory cell element of a DRAM according to an eighteenth preferred embodiment. The eighteenth preferred embodiment relates to a method of manufacturing a memory cell element described in the seventh preferred embodiment (i.e., the first aspect shown in FIG. 85). The method of the eighteenth preferred embodiment will be described hereinafter by referring to these drawings.

Figure 185:
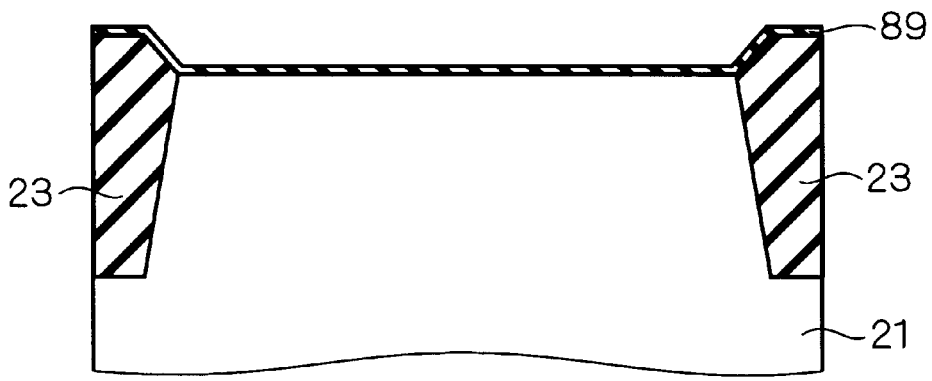
FIG. 185 is a sectional view illustrating a method of manufacturing a memory cell structure of the eight preferred embodiment, according to an eighteenth preferred embodiment.

Referring to FIG. 185, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Figure 186:
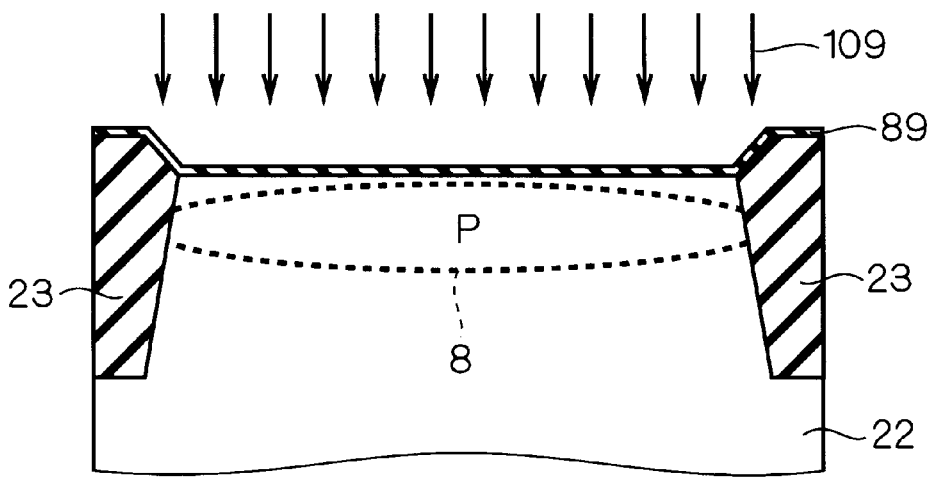
FIGS. 186 to 189 are sectional views illustrating a sequence of steps in the method of the eighteenth preferred embodiment.

Referring to FIG. 186, boron ions are implanted at an energy of 300 keV and a dose of $1\times10^{13}/cm^2$, thereby to form a P well region 22 that is an NMOS transistor forming region. Then, boron ions are subsequently implanted at an energy of 120 keV and a dose of $5\times10^{12}/cm^2$, then at an energy of 30 keV and a dose of $3\times10^{12}/cm^2$, thereby to form a channel cut region (not shown) and a channel dope region 8.

Figure 187:
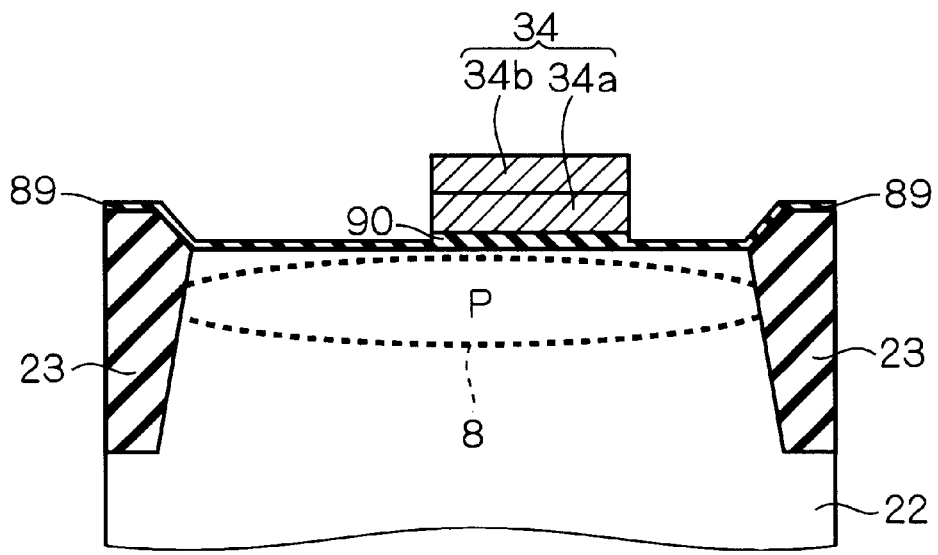

Referring to FIG. 187, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90.

Figure 188:
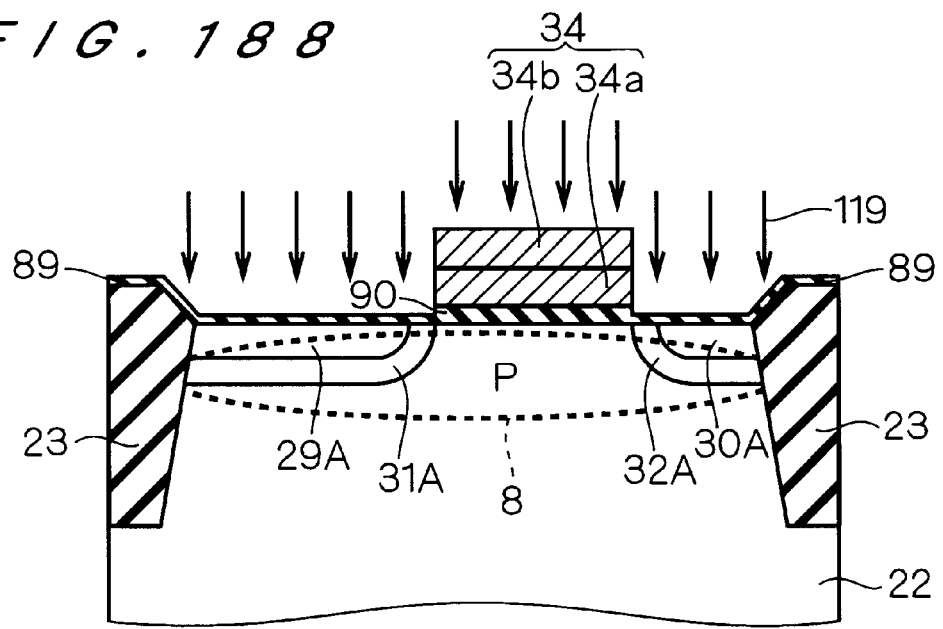

Referring to FIG. 188, by using the gate electrode 34 as a mask, phosphorus ions are implanted at an energy of 30 keV and a dose of $2\times10^{13}/cm^2$, and arsenic ions 119 are then implanted at an energy of 10 keV and a dose of $1\times10^{13}/cm^2$, thereby to form source/drain regions 31A and 32A having contact regions 29A and 30A, respectively.

Figure 189:
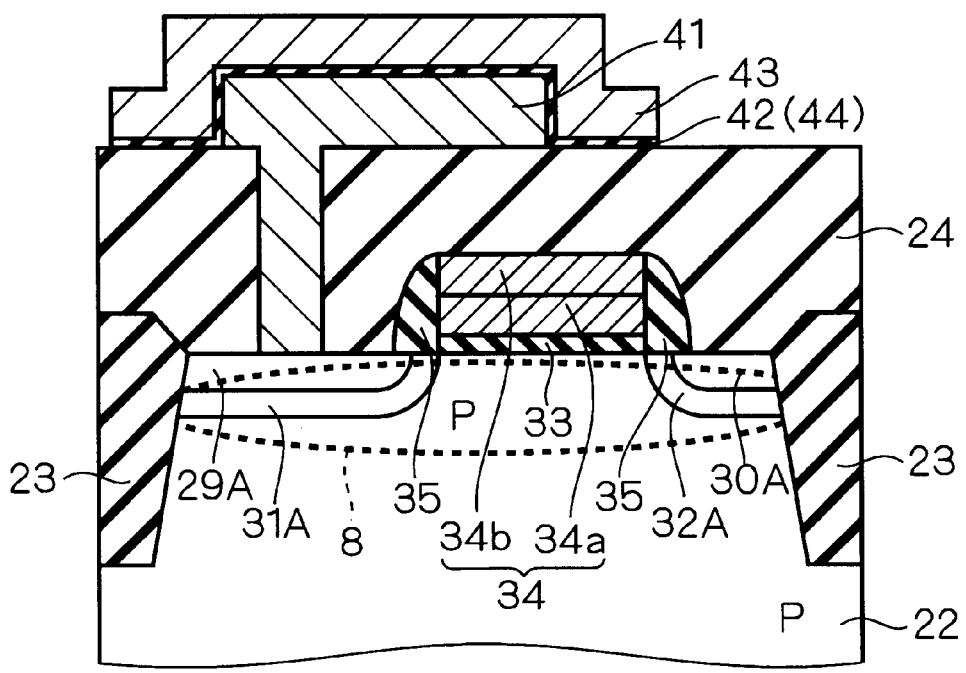

Subsequently, the same steps as in the ninth preferred embodiment as shown in FIGS. 133 to 141, are performed to complete the memory cell element of the first aspect of the seventh preferred embodiment, as shown in FIG. 189.

Nineteenth Preferred Embodiment

FIGS. 190 to 195 are sectional views illustrating a sequence of steps in a method of manufacturing a memory cell element of a DRAM according to a nineteenth preferred embodiment. The nineteenth preferred embodiment relates to a method of manufacturing a memory cell element described in the seventh preferred embodiment (i.e., the first aspect shown in FIG. 85). The method of the nineteenth preferred embodiment will be described hereinafter by referring to these drawings.

Figure 190:
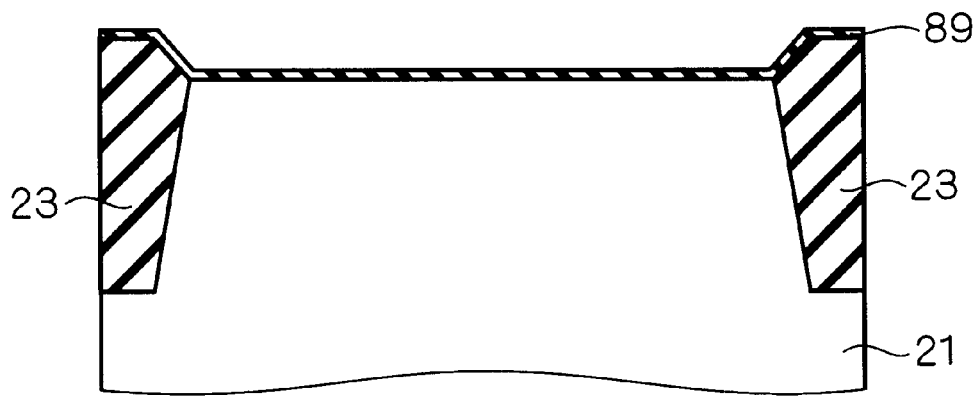
FIG. 190 is a sectional view illustrating a method of manufacturing a memory cell structure of the eighth preferred embodiment, according to a nineteenth preferred embodiment.

Referring to FIG. 190, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Figure 191:
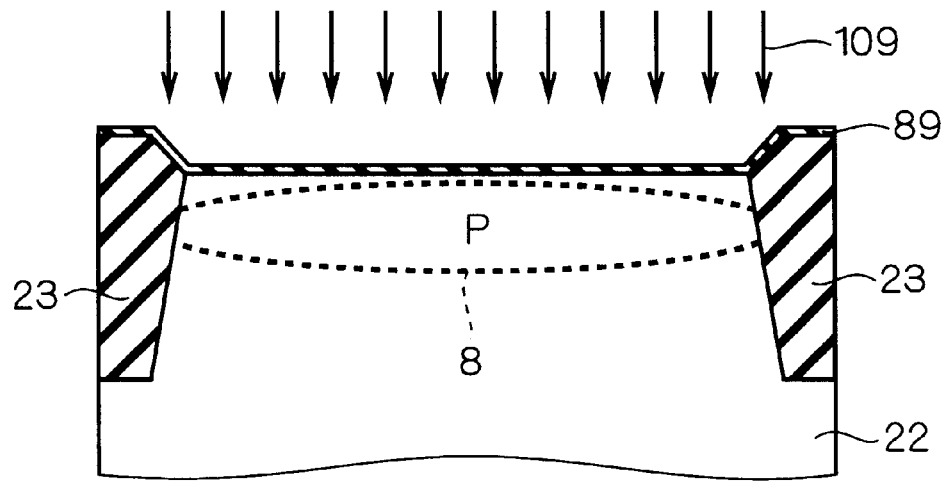

Referring to FIG. 191, boron ions are implanted at an energy of 300 keV and a dose of $1\times10^{13}/cm^2$, thereby to form a P well region 22 that is an NMOS transistor forming region. Then, boron ions 109 are subsequently implanted at an energy of 120 keV and a dose of $5\times10^{12}/cm^2$, then at an energy of 30 keV and a dose of $3\times10^{12}/cm^2$, thereby to form a channel cut region (not shown) and a channel dope region 8.

Figure 192:
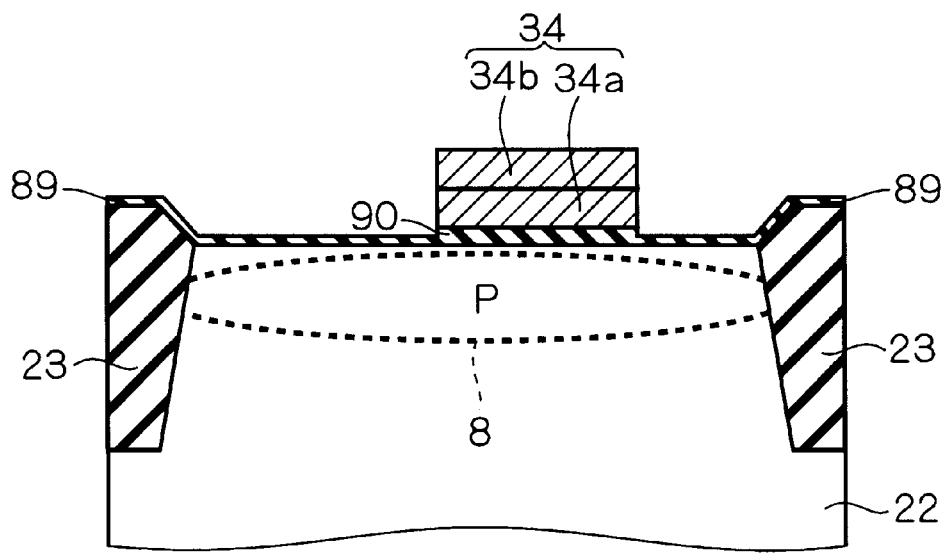

Referring to FIG. 192, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90.

Figure 193:
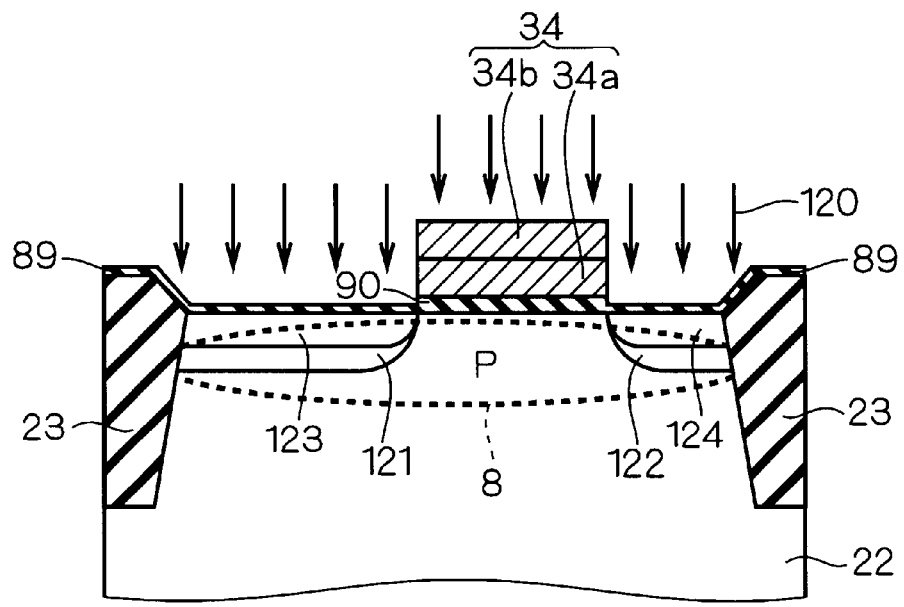

Referring to FIG. 193, by using the gate electrode 34 as a mask, phosphorus ions are implanted at an energy of 30 keV and a dose of $1\times10^{13}/cm^2$, then at an energy of 5 keV and a dose of $1\times10^{13}/cm^2$, thereby to form N type regions 121 to 124.

Figure 194:
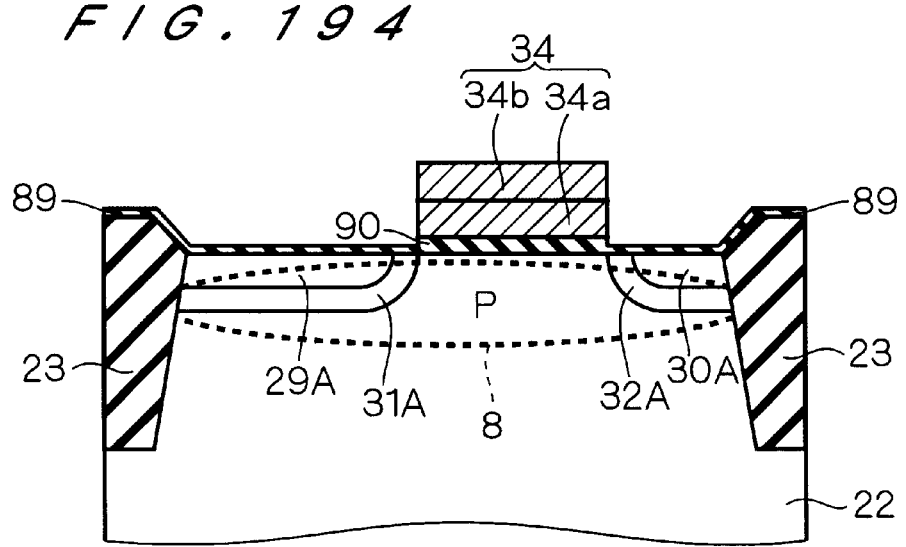

Referring to FIG. 194, an annealing process at 800° C. is performed for 15 minutes, thereby to form source/drain regions 31A and 32A having contact regions 29A and 30A, respectively.

Subsequently, the same steps as in the ninth preferred embodiment as shown in FIGS. 133 to 141, are performed to complete the memory cell element of the first aspect of the seventh preferred embodiment, as shown in FIG. 195.

Twentieth Preferred Embodiment

FIGS. 196 to 202 are sectional views illustrating a sequence of steps in a method of manufacturing a memory cell element of a DRAM according to a twentieth preferred embodiment. The twentieth preferred embodiment relates to a method of manufacturing a memory cell element described in the seventh preferred embodiment (i.e., the third aspect shown in FIG. 87). The method of the twentieth preferred embodiment will be described hereinafter by referring to these drawings.

Referring to FIG. 196, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Figure 197:
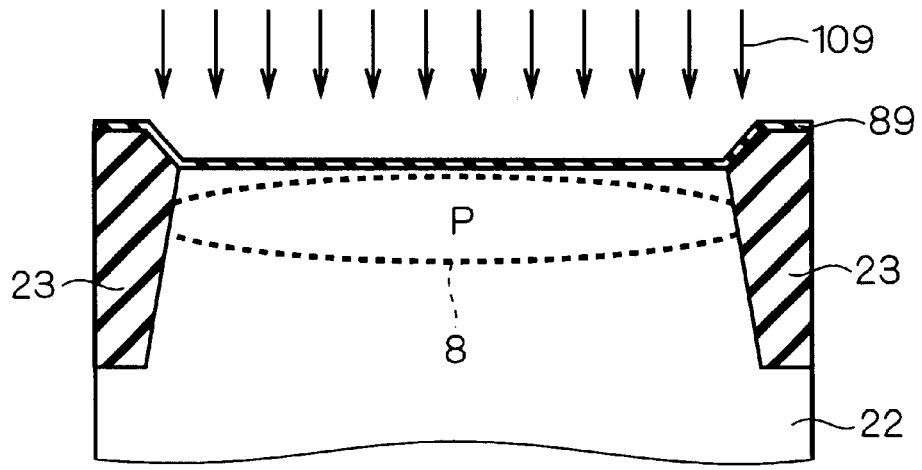
FIGS. 197 to 202 are sectional views illustrating a sequence of steps in the method of the twentieth preferred embodiment.

Referring to FIG. 197, boron ions are implanted at an energy of 300 keV and a dose of $1\times10^{13}/cm^2$, thereby to form a P well region 22 that is an NMOS transistor forming region. Then, boron ions 109 are subsequently implanted at an energy of 120 keV and a dose of $5\times10^{12}/cm^2$, then at an energy of 30 keV and a dose of $3\times10^{12}/cm^2$, thereby to form a channel cut region (not shown) and a channel dope region 8.

Figure 198:
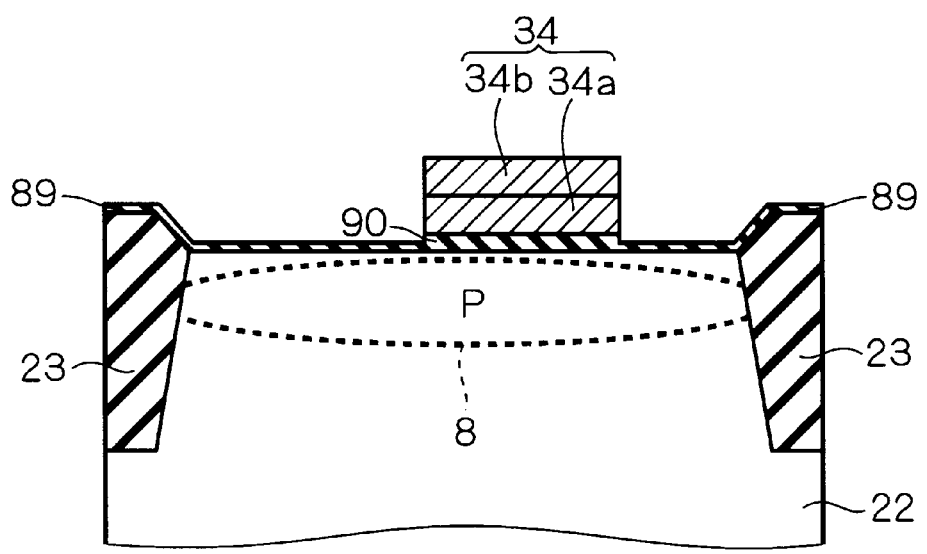

Referring to FIG. 198, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90.

Figure 199:
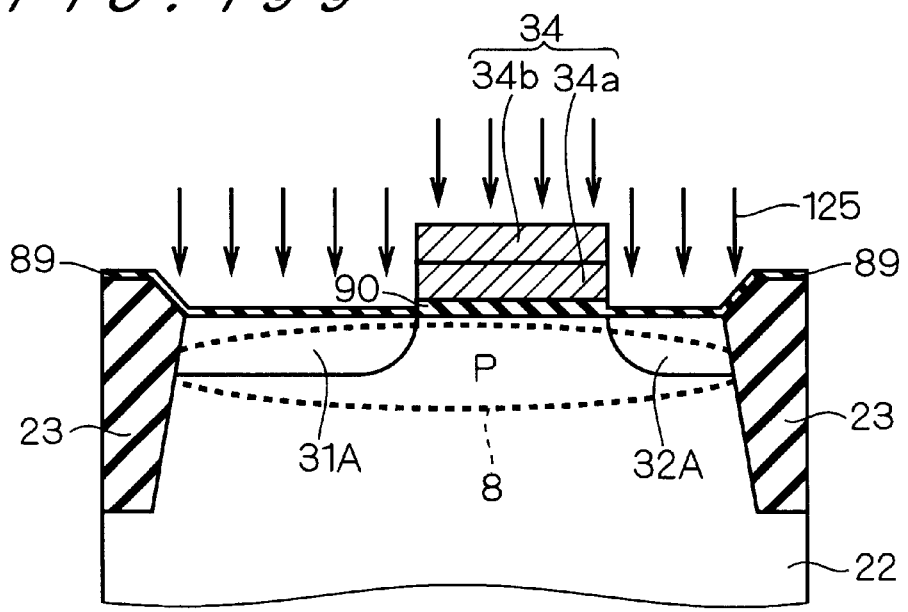

Referring to FIG. 199, by using the gate electrode 34 as a mask, phosphorus ions 125 are implanted at an energy of 30 keV and a dose of $1\times10^{13}/cm^2$, thereby to form source/drain regions 31A and 32A.

Figure 200:
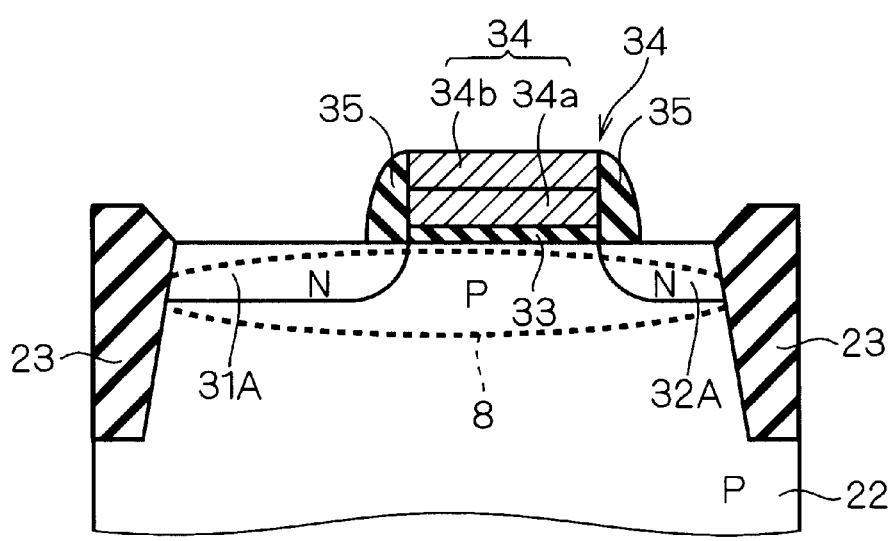

Referring to FIG. 200, a sidewall 35 composed such as of a TEOS having a thickness of 5 to 15 nm is formed on the side surface of the gate electrode 34.

Figure 201:
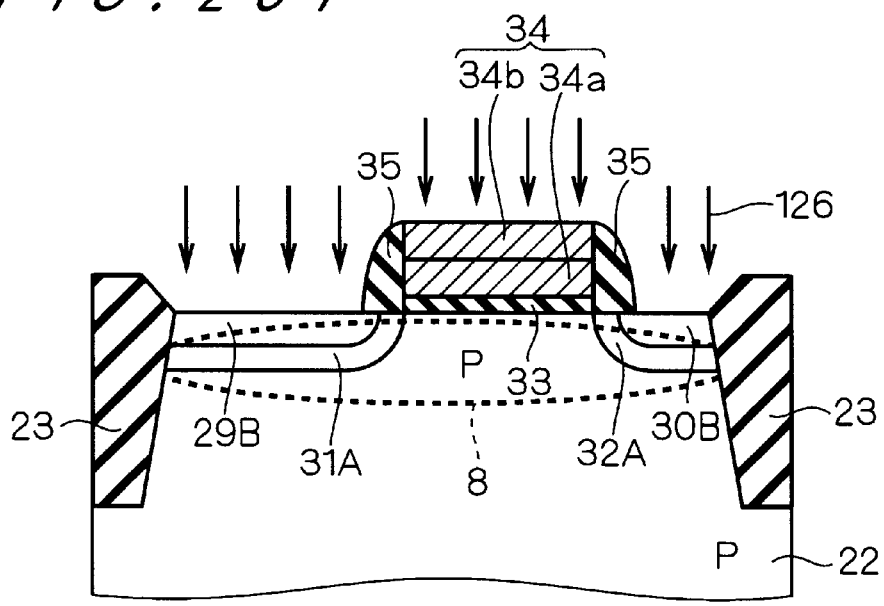

Referring to FIG. 201, by using the gate electrode 34 and sidewall 35 as a mask, arsenic ions 126 are implanted at an energy of 10 keV and a dose of $1\times10^{13}/cm^2$, thereby to form contact regions 29B and 30B in the surface of the source/drain regions 31A and 32A, respectively. Thus, the use of arsenic ions heavier than phosphorus ions and the energy of 10 keV lower than 30 keV, enables to form the shallow contact regions 29B and 30B in the surface of the source/drain regions 31A and 32A, under well-controlled conditions.

Figure 202:
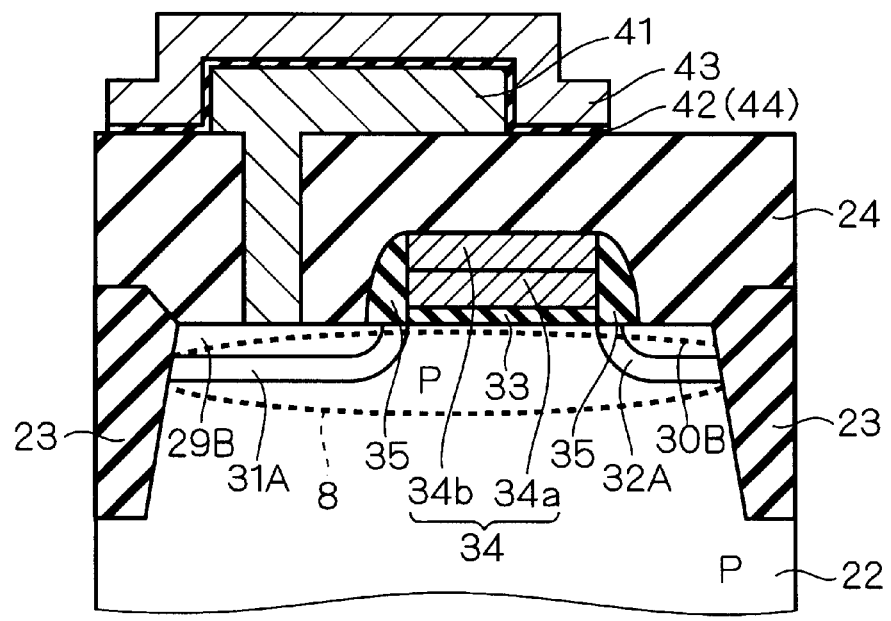

Subsequently, the same steps as in the ninth preferred embodiment as shown in FIGS. 134 to 141, are performed to complete the memory cell element of the third aspect of the seventh preferred embodiment, as shown in FIG. 202.

Twenty-first Preferred Embodiment

FIGS. 203 to 210 are sectional views illustrating a sequence of steps in a method of manufacturing a memory cell element of a DRAM according to a twenty-first preferred embodiment. The twenty-first preferred embodiment relates to a method of manufacturing a memory cell element described in the seventh preferred embodiment (i.e., a structure similar to the eighth aspect shown in FIG. 92). The method of the twenty-first preferred embodiment will be described hereinafter by referring to these drawings.

Figure 203:
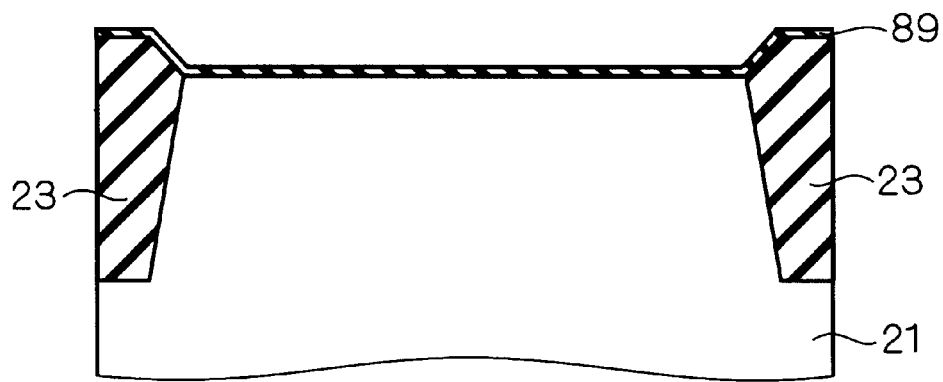
FIG. 203 is a sectional view illustrating a method of manufacturing a memory cell structure of the eighth preferred embodiment, according to a twenty-first preferred embodiment.

Referring to FIG. 203, the elements on a semiconductor substrate 21 are isolated by an isolation insulating film 23 having a forming depth of 150 to 500 nm (e.g., 300 nm), and a sacrifice oxide film 89 composed of a silicon oxide film is then formed in a thickness of 10 nm on the entire surface.

Figure 204:
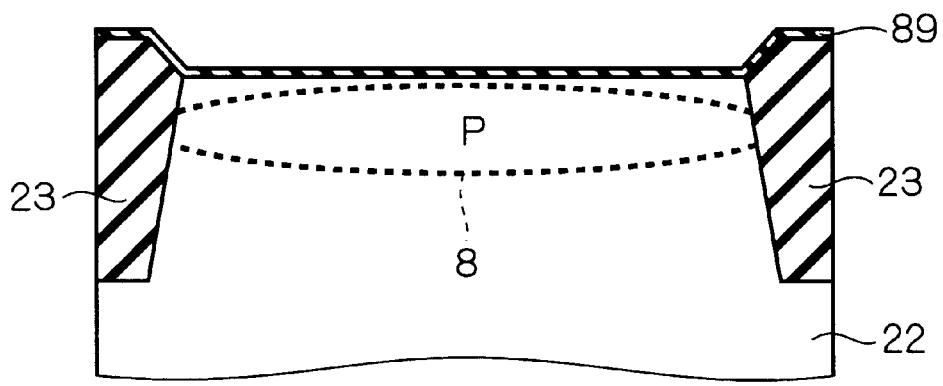
FIGS. 204 to 210 are sectional views illustrating a sequence of steps in the method of the twenty-first preferred embodiment.

Referring to FIG. 204, boron ions are implanted at an energy of 300 keV and a dose of $1\times10^{13}/\text{cm}^2$, thereby to form a P well region 22 that is an NMOS transistor forming region. Then, boron ions are subsequently implanted at an energy of 120 keV and a dose of $5\times10^{12}/\text{cm}^2$, then at an energy of 30 keV and a dose of $3\times10^{12}/\text{cm}^2$, thereby to form a channel cut region (not shown) and a channel dope region 8.

Figure 205:
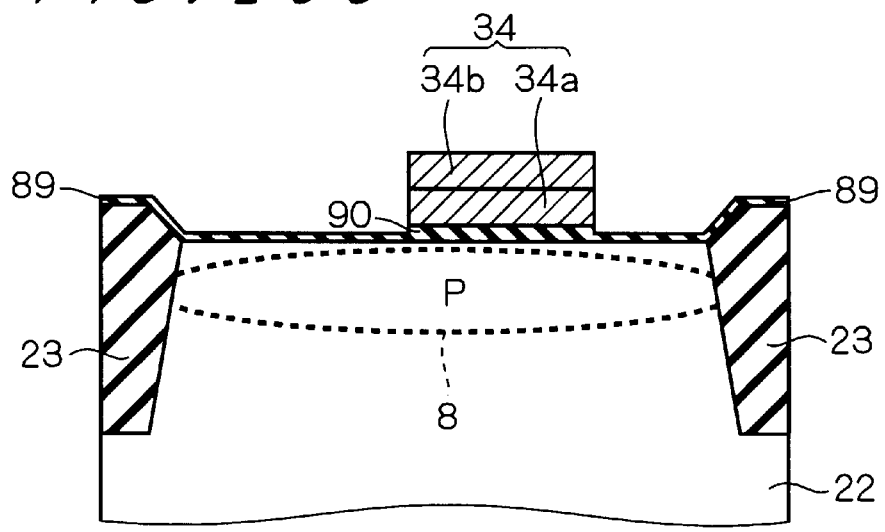

Referring to FIG. 205, an oxide film 90 composed of a silicon oxide film is formed in a thickness of 3 to 10 nm, and a gate electrode 34 of dual structure made up of a polysilicon layer and a tungsten silicon layer, each having a thickness of 50 nm, is then formed on the gate oxide film 90.

Figure 206:
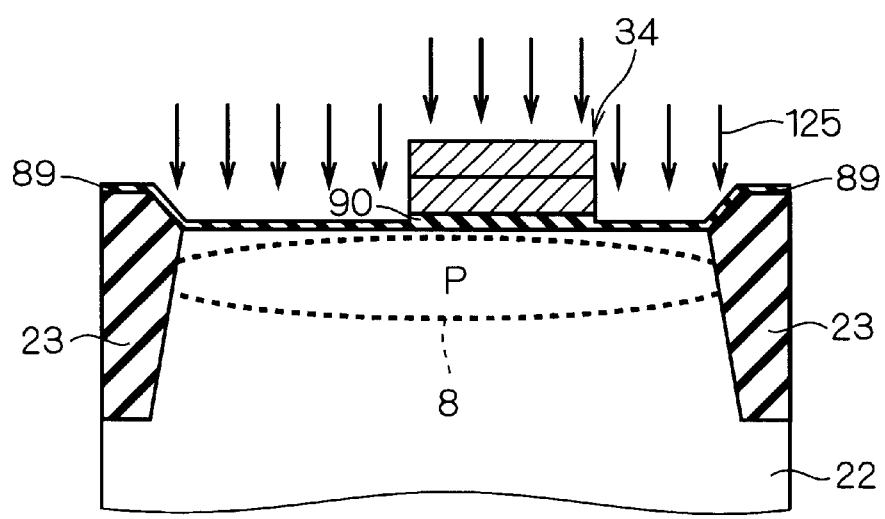

Referring to FIG. 206, by using the gate electrode 34 as a mask, phosphorus ions 125 are implanted at an energy of 30 keV and a dose of $1\times10^{13}/\text{cm}^2$, thereby to form source/drain regions 31A and 32A.

Figure 207:
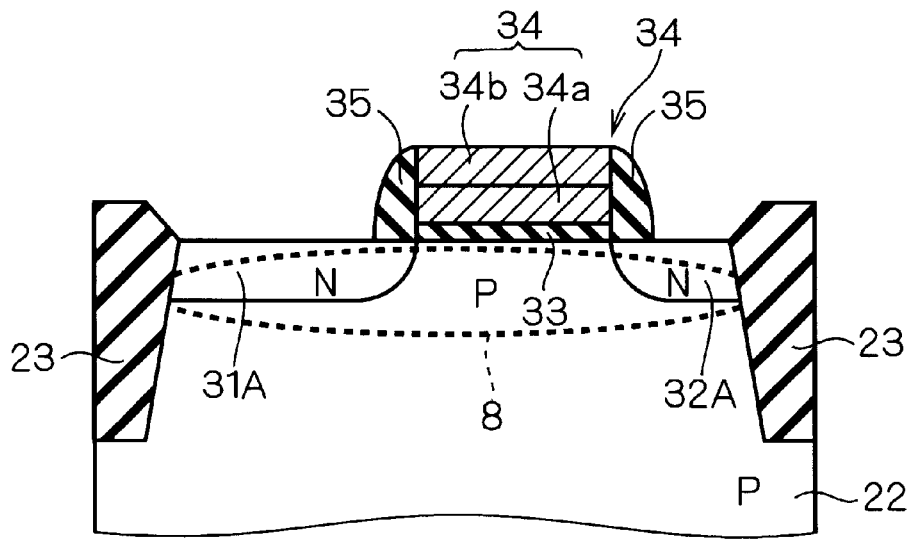

Referring to FIG. 207, a sidewall 35 composed such as of a TEOS having a thickness of 5 to 15 nm is formed on the side surface of the gate electrode 34.

Figure 208:
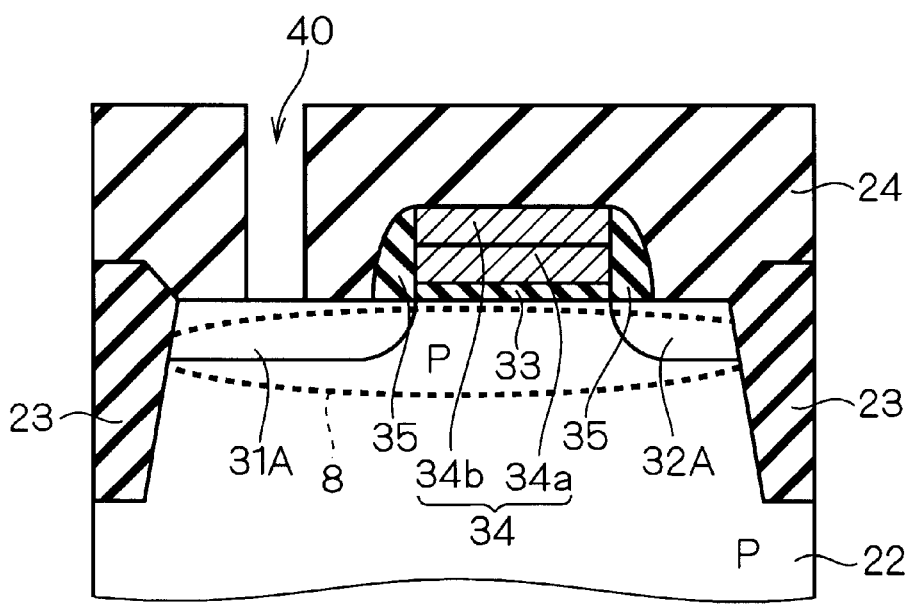

Referring to FIG. 208, an interlayer insulating film 24 is deposited on the entire surface and a patterned resist (not shown) is then formed on the interlayer insulating film 24. Subsequently, by using the resist as a mask, the interlayer insulating film 24 is selectively etched away to obtain a contact hole 40 extending through the interlayer insulating film 24 and having a diameter of 0.2 $\mu$m. The resist is then removed.

Figure 209:
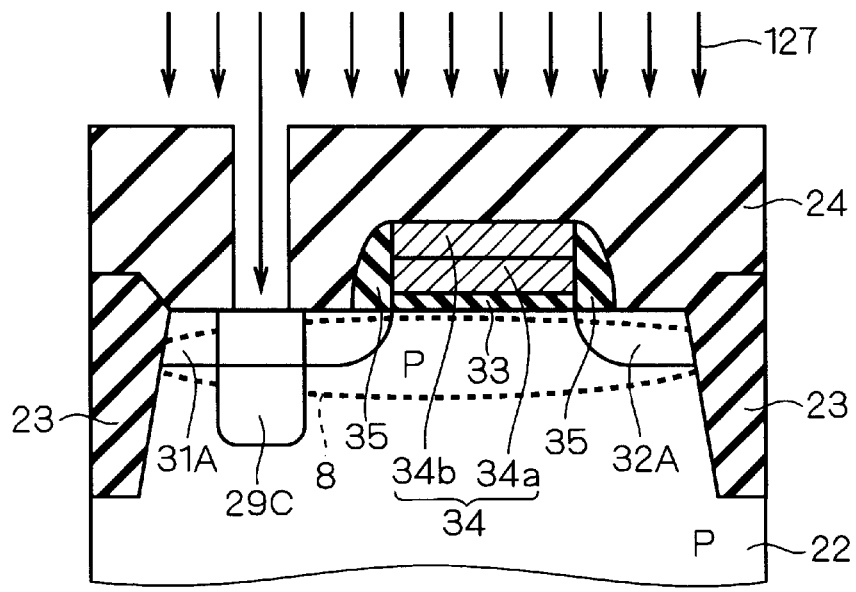

Referring to FIG. 209, phosphorus ions 127 are implanted from the contact hole 40 at an energy of 50 keV and a dose of $1\times10^{13}/\text{cm}^2$, so that a contact region 29C having a larger forming depth than a source/drain region 31A is formed in the surface of the source/drain region 31A.

Figure 210:
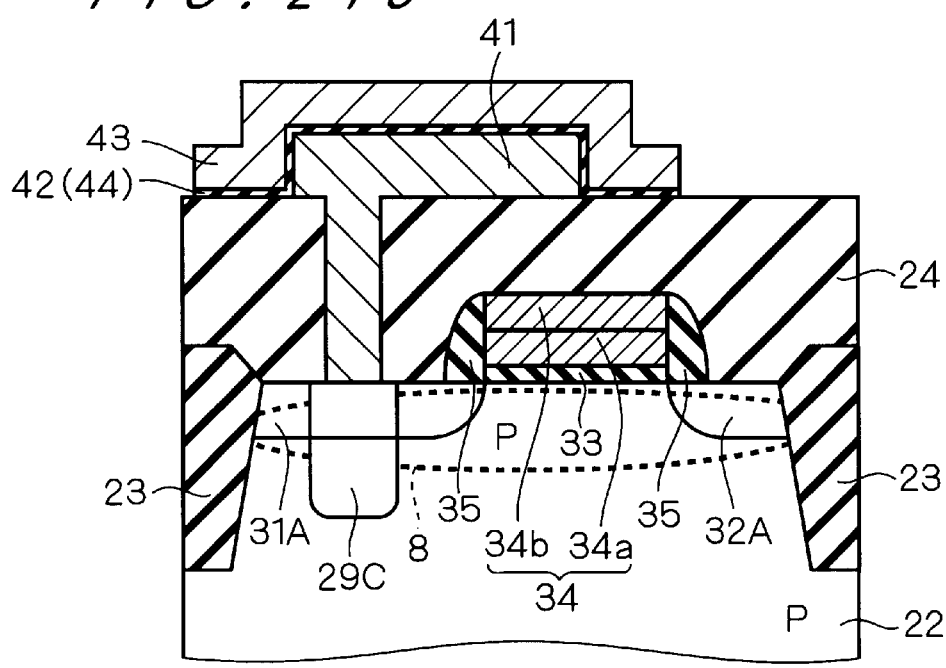

Subsequently, the same steps as in the ninth preferred embodiment as shown in FIGS. 136 to 141, are performed to complete the memory cell element of the eighth aspect of the seventh preferred embodiment, as shown in FIG. 210.

Twenty-second Preferred Embodiment

FIGS. 211 and 212 are sectional views illustrating a sequence of steps in a method of manufacturing a memory cell element of a DRAM according to a twenty-second preferred embodiment. The twenty-second preferred embodiment relates to a method of manufacturing a memory cell element described in the seventh preferred embodiment (i.e., a structure similar to the nineteenth aspect shown in FIG. 103). The method of the twenty-second preferred embodiment will be described hereinafter by referring to these drawings.

Firstly the steps shown in FIGS. 203 to 209 in the twenty-first preferred embodiment are performed. As shown in FIG. 211, a polysilicon layer is patterned to obtain a storage node electrode 41, followed by annealing at 800° C. for 15 minutes. By using the polysilicon of the storage node electrode 41 as a diffusion source, a contact region 29E is formed in the surface of a contact region 29C underlying the storage node electrode 41.

Thus, the use of the polysilicon of the storage node electrode 41 as a diffusion source makes it relatively easy to form the contact region 29E in the surface of the contact region 29C.

Subsequently, the same steps as in the ninth preferred embodiment as shown in FIGS. 139 to 141, are performed to complete the memory cell element of the nineteenth aspect of the seventh preferred embodiment, as shown in FIG. 212.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a transistor forming region of a first conductivity type disposed in a semiconductor substrate;
    first and second source/drain regions of a second conductivity type disposed selectively in the surface of said transistor forming region, said transistor forming region between said first and second source/drain regions being defined as a channel region;
    a gate insulating film disposed on said channel region;
    a gate electrode disposed on said gate insulating film; and
    a transistor characteristic adjusting region of the first conductivity type disposed in said transistor forming region so as to at least overlap in part said channel region,
    wherein an insulating gate type transistor is defined by said first and second source/drain regions, said channel region, said gate insulating film, said gate electrode and said transistor characteristic adjusting region, and
    the first conductivity type impurity concentration of said transistor characteristic adjusting region and the second conductivity type impurity concentration of said first and second source/drain regions are set so as to satisfy the following conditions:

$$10^{18} \leq C1 \leq 10^{19}/\text{cm}^3 \qquad (\text{I})$$

$$C2/10 \leq C1 \leq C2 \qquad (\text{II})$$

where C1 is the maximum value of the first conductivity type impurity concentration of said transistor characteristic adjusting region except for a surface proximate region of said transistor forming region, and C2 is the maximum value of the second conductivity type impurity concentration of said first and second source/drain regions except for said surface proximate region.

2. The semiconductor device according to claim 1, wherein
    said transistor characteristic adjusting region includes a channel dope region disposed at a predetermined depth from the surface of said transistor forming region so as to overlap said channel region in a plane view over substantially the entire surface of said channel region.

3. The semiconductor device according to claim 2, wherein
    said channel dope region includes a normal channel dope region extending over substantially the entire surface of said transistor forming region in a plane view.

4. The semiconductor device according to claim 2, wherein
    said channel dope region includes a local channel dope region disposed in little or no overlap relationship with said first and second source/drain regions.

5. The semiconductor device according to claim 1, wherein
    said transistor characteristic adjusting region includes first and second pocket regions overlapping substantially the whole of said first and second source/drain regions and extending from said first and second source/drain regions to part of said channel region.

6. The semiconductor device according to claim 5, wherein
said first and second pocket regions include first and second normal pocket regions extending also to the underside of said first and second source/drain regions.

7. The semiconductor device according to claim 5, wherein
said first and second pocket regions include first and second shallow pocket regions having approximately the same forming depth as said first and second source/drain regions.

8. The semiconductor device according to claim 1, wherein
said transistor characteristic adjusting region includes:
a first partial transistor characteristic adjusting region disposed at a predetermined depth in said transistor forming region; and
a second partial transistor characteristic adjusting region disposed in said transistor forming region so as to be deeper than said first partial transistor characteristic adjusting region.

9. The semiconductor device according to claim 1, wherein
said transistor characteristic adjusting region includes:
a first channel dope region overlapping said channel region in a plane view over substantially the entire surface of said channel region;
a second channel dope region disposed at a region deeper than said first channel dope region so as to overlap said channel region in a plane view over substantially the entire surface of said channel region; and
first and second pocket regions overlapping substantially the whole of said first and second source/drain regions and extending from said first and second source/drain regions to said channel region.

10. The semiconductor device according to claim 1, wherein
said first and second source/drain regions have in their surfaces first and second high impurity concentration regions, respectively, having a higher impurity concentration than other regions, said first and second high impurity concentration regions being spaced a predetermined distance away from said channel region.

11. The semiconductor device according to claim 1, further comprising:
a capacitor provided with one electrode electrically connected to one of said first and second source/drain regions.

12. A method of manufacturing a semiconductor device comprising the steps of:
(a) providing a semiconductor substrate having a transistor forming region of a first conductivity type;
(b) forming a gate insulating film and a gate electrode on a channel region in said transistor forming region;
(c) selectively introducing impurity of a second conductivity type into said transistor forming region, to form first and second source/drain regions of the second conductivity type sandwiching said channel region and being adjacent to said channel region; and
(d) introducing impurity of the first conductivity type into said transistor forming region to form a transistor characteristic adjusting region of the first conductivity type so as to at least overlap in part said channel region, wherein an insulating gate type transistor is defined by said first and second source/drain regions, said channel region, said gate insulating film, said gate electrode and said transistor characteristic adjusting region, and
the first conductivity type impurity concentration of said transistor characteristic adjusting region and the second conductivity type impurity concentration of said first and second source/drain regions are set so as to satisfy the following conditions:

$$10^{18} \leq C1 \leq 10^{19}/\text{cm}^3 \quad \text{(I)}$$

$$C2/10 \leq C1 \leq C2 \quad \text{(II)}$$

where C1 is the maximum value of the first conductivity type impurity concentration of said transistor characteristic adjusting region except for a surface proximate region of said transistor forming region, and C2 is the maximum value of the second conductivity type impurity concentration of said first and second source/drain regions except for said surface proximate region.

13. The method of manufacturing a semiconductor device according to claim 12, wherein
said step (d) includes the step of forming a channel dope region as said transistor characteristic adjusting region overlapping said channel region in a plane view over substantially the entire surface of said channel region, at a predetermined depth from the surface of said transistor forming region.

14. The method of manufacturing a semiconductor device according to claim 13, wherein
said channel dope region includes a normal channel dope region formed over substantially the entire surface of said transistor forming region in a plane view, and
said step (d) includes the step of introducing impurity of the first conductivity type into the entire surface of said transistor forming region.

15. The method of manufacturing a semiconductor device according to claim 13, wherein
said channel dope region includes a local channel dope region formed in little or no overlap relationship with said first and second source/drain regions, and
said step (d) includes the step of selectively introducing impurity of the first conductivity type into said channel region in said transistor forming region.

16. The method of manufacturing a semiconductor device according to claim 12, wherein
said transistor characteristic adjusting region includes first and second pocket regions overlapping substantially the whole of said first and second source/drain regions and extending from said first and second source/drain regions to said channel region, and
said step (d) includes the step, after said step (b), of forming said first and second pocket regions by introducing impurity of the first conductivity type into said transistor forming region by using said gate electrode as a mask.

17. The method of manufacturing a semiconductor device according to claim 16, wherein
said first and second pocket regions include first and second normal pocket regions extending also to the underside of said first and second source/drain regions,
said step (c) includes a process of implanting ions of the second conductivity type at a first energy by using said gate electrode as a mask, and
said step (d) includes a process of implanting ions of the first conductivity type at a second energy higher than said first energy by using said gate electrode as a mask.

18. The method of manufacturing a semiconductor device according to claim 16, wherein
said first and second pocket regions include first and second shallow pocket regions having approximately the same forming depth as said first and second source/drain regions, and said process of introducing impurity of the first conductivity type in said step (d) includes a process of obliquely implanting impurity ions of the first conductivity type.

19. The method of manufacturing a semiconductor device according to claim 12, wherein said transistor characteristic adjusting region includes:
- a first partial transistor characteristic adjusting region formed at a predetermined depth in said transistor forming region; and
- a second partial transistor characteristic adjusting region formed so as to be deeper than said first partial transistor characteristic adjusting region in said transistor forming region, said step (d) includes the steps of:
- (d-1) implanting impurity ions of the first conductivity type to form said first partial transistor characteristic adjusting region; and
- (d-2) implanting impurity ions of the first conductivity type to form said second partial transistor characteristic adjusting region, and
- ion implantation conditions of said steps (d-1) and (d-2) is set so that said second partial transistor characteristic adjusting region is deeper than said first partial transistor characteristic adjusting region.

20. The method of manufacturing a semiconductor device according to claim 12, wherein said transistor characteristic adjusting region includes:
- a first channel dope region overlapping substantially the entire surface of said channel region in a plane view;
- a second channel dope region formed at a region deeper than said first channel dope region so as to overlap substantially the entire surface of said channel region in a plane view; and
- first and second pocket regions overlapping substantially the whole of said first and second source/drain regions and extending from said first and second source/drain regions to said channel region, and said step (d) includes the steps of:
- (d-1) implanting impurity ions of the first conductivity type to form said first channel dope region;
- (d-2) implanting impurity ions of the first conductivity type to form said second channel dope region; and
- (d-3) implanting, after said step (b), impurity ions of the first conductivity type by using said gate electrode as a mask, to form said first and second pocket regions.

21. The method of manufacturing a semiconductor device according to claim 12, wherein said first and second source/drain regions have in their surfaces first and second high impurity concentration regions, respectively, having a higher impurity concentration than other regions, each of first and second high impurity concentration regions being spaced a predetermined distance away from said channel region, said step (c) includes the steps of:
- (c-1) implanting, after said step (b), impurity ions of the first conductivity type by using said gate electrode as a mask, to form said first and second source/drain regions of the first conductivity type; and
- (c-2) implanting, after said step (c-1), impurity ion of the first conductivity type by using said gate electrode as a mask, to form said first and second high impurity concentration regions in the surface of said first and second source/drain regions, and
- ion implantation conditions of said step (c-2) is set so that said first and second high impurity concentration regions are spaced said predetermined distance away from said channel region.

22. The method of manufacturing a semiconductor device according to claim 12, wherein said first and second source/drain regions have in their surfaces first and second high impurity concentration regions, respectively, having a higher impurity concentration than other regions, each of first and second high impurity concentration regions being spaced a predetermined distance away from said channel region, said method further comprising the step of:
- (e) forming a sidewall on both side surfaces of said gate electrode, wherein said step (c) includes the steps of:
- (c-1) implanting, after said step (b) and before said step (e), impurity ions of the first conductivity type by using said gate electrode as a mask, to form said first and second source/drain regions of the first conductivity type; and
- (c-2) implanting, after said step (e), impurity ions of the first conductivity type by using, as a mask, said gate electrode and said sidewall, to form said first and second high impurity concentration regions of the first conductivity type.

23. The method of manufacturing a semiconductor device according to claim 12, wherein at least one of said first and second source/drain regions has in its surface a high impurity concentration region having a higher impurity concentration than other regions, said high impurity concentration region being spaced a predetermined distance away from said channel region, said method further comprising the step of:
- (f) forming, after said step (c), a mask layer on the entire surface, said mask layer having an opening above part of at least one of said first and second source/drain regions, and wherein said step (c) includes the steps of:
- (c-1) implanting, after said step (b) and before said step (f), impurity ions of the first conductivity type by using said gate electrode as a mask, to form said source/drain regions; and
- (c-2) implanting, after said step (f), impurity ions of the first conductivity type from said opening of said mask layer, to form said high impurity concentration region in a region including the surface of said source/drain regions.

24. The method of manufacturing a semiconductor device according to claim 23, further comprising the steps of:
- (g) filling, after said step (c-1), said opening with an impurity diffusion source of the second conductivity type; and
- (h) diffusing a second impurity from said impurity diffusion source into the surface of said high impurity concentration region, to form an impurity diffusion region.

25. The method of manufacturing a semiconductor device according to claim 12, further comprising the step of:
- (i) electrically connecting one electrode to one of said first and second source/drain regions to form a capacitor.

* * * * *